United States Patent
Kimura et al.

(10) Patent No.: US 12,482,413 B2
(45) Date of Patent: Nov. 25, 2025

(54) SEMICONDUCTOR DEVICE, DISPLAY APPARATUS, AND ELECTRONIC DEVICE

(71) Applicant: Semiconductor Energy Laboratory Co., Ltd., Atsugi (JP)

(72) Inventors: Hajime Kimura, Atsugi (JP); Takayuki Ikeda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/199,433

(22) Filed: May 19, 2023

(65) Prior Publication Data

US 2023/0298517 A1 Sep. 21, 2023

Related U.S. Application Data

(63) Continuation of application No. 17/723,613, filed on Apr. 19, 2022, now Pat. No. 11,699,391.

(30) Foreign Application Priority Data

May 13, 2021 (JP) ................. 2021-081532

(51) Int. Cl.
*G09G 3/3225* (2016.01)

(52) U.S. Cl.
CPC ... *G09G 3/3225* (2013.01); *G09G 2300/0876* (2013.01); *G09G 2310/08* (2013.01)

(58) Field of Classification Search
CPC .......... G09G 3/30–3291; G09G 3/3674–3677; G09G 2310/08; G09G 2300/0876
See application file for complete search history.

(56) References Cited

U.S. PATENT DOCUMENTS 5,953,985 A    9/1999   Kobayashi
6,120,338 A    9/2000   Hirano et al.
(Continued)

FOREIGN PATENT DOCUMENTS

JP    2000-036385 A    2/2000
JP    2003-059663 A    2/2003
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Hang Lin
(74) *Attorney, Agent, or Firm* — Eric J. Robinson; Robinson Intellectual Property Law Office, P.C.

(57) ABSTRACT

A semiconductor device includes first to tenth transistors and first to fourth capacitors. Gates of the first and the fourth transistors are electrically connected to each other. First terminals of the first, second, fifth, and eighth transistors are electrically connected to a first terminal of the fourth capacitor. A second terminal of the fifth transistor is electrically connected to a gate of the sixth transistor and a first terminal of the second capacitor. A second terminal of the eighth transistor is electrically connected to a gate of the ninth transistor and a first terminal of the third capacitor. Gates of the second, seventh, and tenth transistors are electrically connected to first terminals of the third and fourth transistors and a first terminal of the first capacitor. First terminals of the sixth and seventh transistors are electrically connected to a second terminal of the second capacitor.

8 Claims, 46 Drawing Sheets

(56) References Cited

U.S. PATENT DOCUMENTS

| | | | |
|---|---|---|---|
| 7,202,863 | B2 | 4/2007 | Kimura et al. |
| 7,629,612 | B2 | 12/2009 | Kimura |
| 7,928,933 | B2 | 4/2011 | Kimura |
| 8,350,785 | B2 | 1/2013 | Kimura |
| 8,476,625 | B2 | 7/2013 | Kimura |
| 8,502,220 | B2 | 8/2013 | Yamazaki et al. |
| 8,502,225 | B2 | 8/2013 | Yamazaki et al. |
| 8,987,048 | B2 | 3/2015 | Yamazaki et al. |
| 9,083,335 | B2 | 7/2015 | Koyama |
| 9,257,085 | B2 | 2/2016 | Umezaki et al. |
| 9,268,185 | B2 | 2/2016 | Kimura et al. |
| 9,418,989 | B2 | 8/2016 | Kimura et al. |
| 9,494,830 | B2 | 11/2016 | Yamazaki et al. |
| 9,552,761 | B2 | 1/2017 | Kimura et al. |
| 9,742,378 | B2 | 8/2017 | Tanada et al. |
| 9,766,517 | B2 | 9/2017 | Kimura et al. |
| 10,002,972 | B2 | 6/2018 | Miyake |
| 10,297,331 | B2 | 5/2019 | Miyake |
| 10,416,517 | B2 | 9/2019 | Kimura |
| 10,483,293 | B2 | 11/2019 | Miyake |
| 11,222,906 | B2 | 1/2022 | Umezaki et al. |
| 2002/0072139 | A1 | 6/2002 | Kashiwabara |
| 2008/0074359 | A1 | 3/2008 | Chung |
| 2011/0148290 | A1 | 6/2011 | Oota |
| 2011/0286256 | A1 | 11/2011 | Kamata |
| 2012/0051118 | A1 | 3/2012 | Yamazaki et al. |
| 2012/0061662 | A1 | 3/2012 | Yamazaki et al. |
| 2012/0161139 | A1 | 6/2012 | Endo et al. |
| 2012/0236634 | A1 | 9/2012 | Matsubayashi |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0069068 | A1 | 3/2013 | Miyake |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2014/0068301 | A1 | 3/2014 | Watanabe |
| 2015/0054571 | A1 | 2/2015 | Watanabe et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2015/0349000 | A1 | 12/2015 | Kim et al. |
| 2016/0027809 | A1 | 1/2016 | Kobayashi |
| 2016/0099258 | A1 | 4/2016 | Yoneda |
| 2016/0172595 | A1 | 6/2016 | Malinowski et al. |
| 2016/0315133 | A1 | 10/2016 | Sato |
| 2017/0033792 | A1 | 2/2017 | Takahashi et al. |
| 2017/0084754 | A1 | 3/2017 | Shionoiri et al. |
| 2017/0110453 | A1 | 4/2017 | Ikeda |
| 2017/0125122 | A1* | 5/2017 | Miyake ............... G11C 19/287 |
| 2017/0133064 | A1 | 5/2017 | Nagatsuka et al. |
| 2017/0141167 | A1 | 5/2017 | Naganuma |
| 2017/0179294 | A1 | 6/2017 | Kato et al. |
| 2017/0186355 | A1 | 6/2017 | Takahashi et al. |
| 2017/0186473 | A1 | 6/2017 | Ikeda et al. |
| 2017/0186749 | A1 | 6/2017 | Ohshima et al. |
| 2017/0229486 | A1 | 8/2017 | Matsuda et al. |
| 2017/0230041 | A1 | 8/2017 | Kato et al. |
| 2017/0256754 | A1 | 9/2017 | Defranco et al. |
| 2018/0190908 | A1 | 7/2018 | Ke et al. |
| 2020/0193912 | A1* | 6/2020 | Park ............... G09G 3/3275 |
| 2020/0203662 | A1 | 6/2020 | Mollard et al. |
| 2020/0265887 | A1 | 8/2020 | Atsumi et al. |
| 2022/0173174 | A1 | 6/2022 | Hatsumi et al. |
| 2022/0406818 | A1 | 12/2022 | Kawashima et al. |

FOREIGN PATENT DOCUMENTS

| | | |
|---|---|---|
| JP | 2008-098106 A | 4/2008 |
| JP | 2008-147072 A | 6/2008 |
| JP | 2008-251270 A | 10/2008 |
| JP | 2010-156963 A | 7/2010 |
| JP | 2012-160473 A | 8/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2017-010000 A | 1/2017 |
| JP | 2019-179696 A | 10/2019 |
| JP | 2020-160305 A | 10/2020 |
| WO | WO-2021/105828 | 6/2021 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7, The Japan Society of Applied Physics.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

* cited by examiner

400A

400B

400C

400D

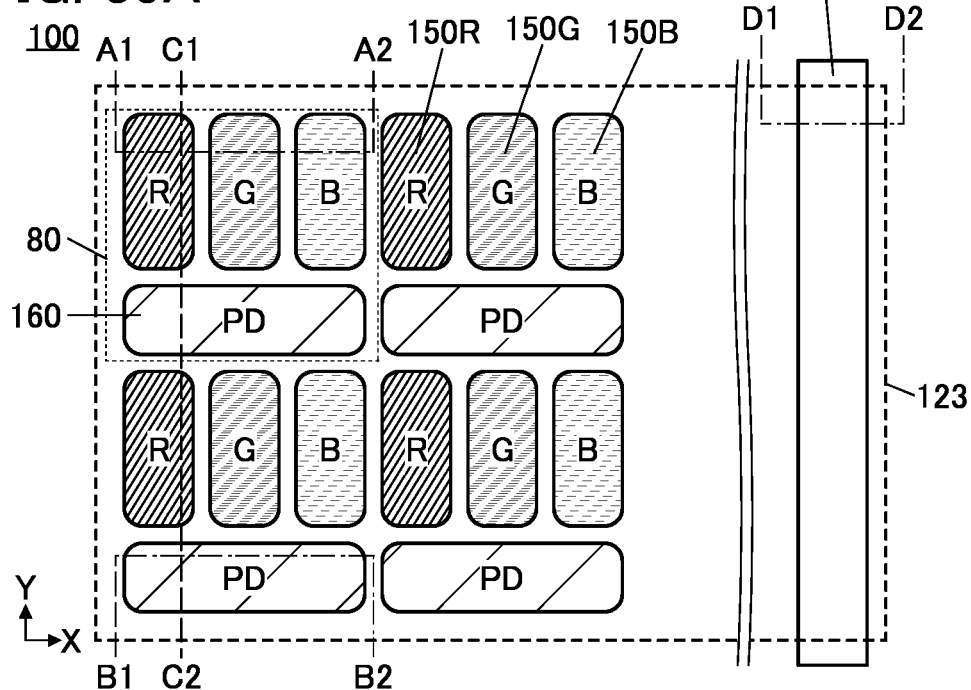
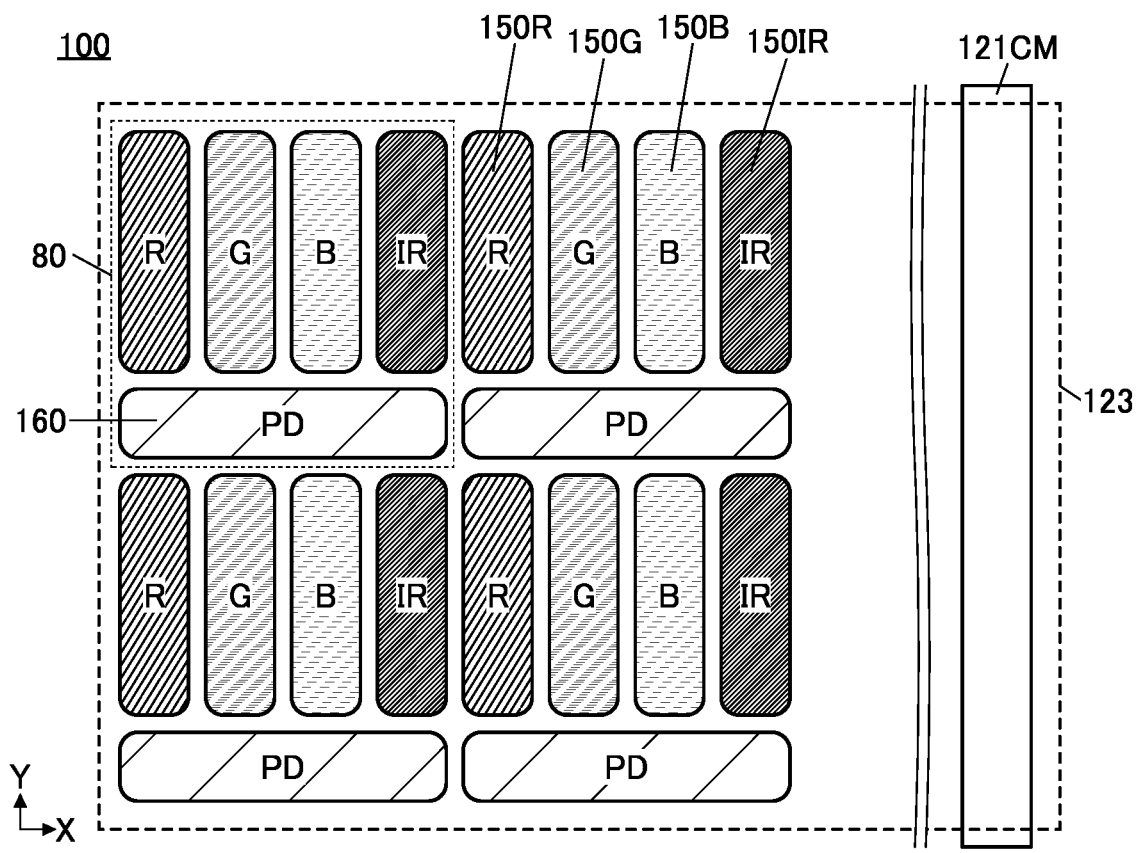

FIG. 40A
FIG. 40B
FIG. 40C
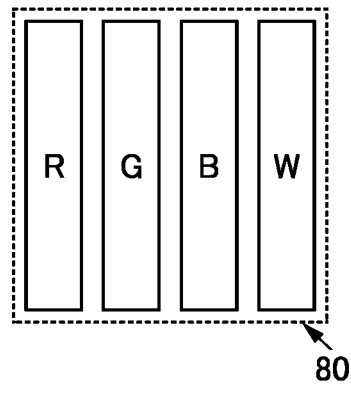
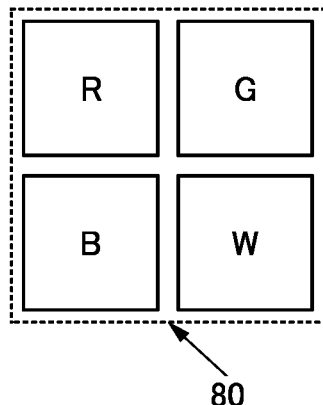
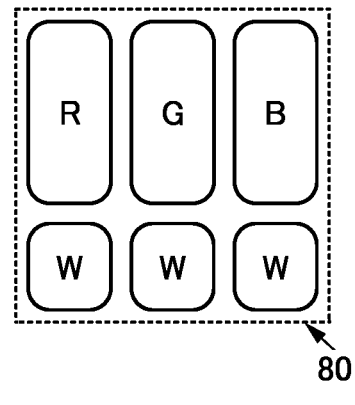
FIG. 40D
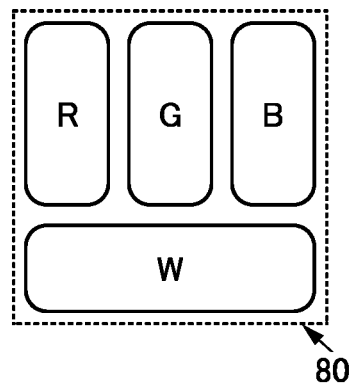

8300

8300

8300

8300

SEMICONDUCTOR DEVICE, DISPLAY APPARATUS, AND ELECTRONIC DEVICE

BACKGROUND OF THE INVENTION

1. Field of the Invention

One embodiment of the present invention relates to a semiconductor device, a display apparatus, and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a processor, an electronic device, a system, a driving method thereof, a manufacturing method thereof, and a testing method thereof.

2. Description of the Related Art

Display apparatuses included in, for example, electronic devices for extended reality or cross reality (XR) such as virtual reality (VR) or augmented reality (AR), mobile phones (e.g., smartphones), tablet information terminals, and notebook personal computers (PCs) have undergone various improvements in recent years. For example, there have been developed display apparatuses with features such as higher resolution, higher color reproducibility (higher NTSC ratio), a smaller driver circuit, and lower power consumption.

Furthermore, for example, a circuit for reducing variations in the characteristics of a driving transistor included in a pixel has been under development in order to improve the display quality of a display apparatus. In particular, Patent Document 1 discloses the invention of a pixel circuit that includes a circuit for correcting the threshold voltage of a driving transistor.

Another example is a technique of using a transistor including an oxide semiconductor in a semiconductor thin film, as a switching element included in a pixel circuit of a display apparatus.

A silicon-based semiconductor material is widely known as a material for a semiconductor thin film applicable to a transistor. Other than the silicon-based semiconductor material, an oxide semiconductor has attracted attention. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively researched.

A transistor that includes IGZO as an active layer has an extremely low off-state current (see Non-Patent Document 1), and an LSI and a display apparatus that utilize the characteristics have been reported (see Non-Patent Documents 2 and 3). Patent Document 2 discloses the invention in which a transistor including IGZO in an active layer is used in a pixel circuit of a display apparatus.

REFERENCE

Patent Document

[Patent Document 1] Japanese Published Patent Application No. 2017-10000
[Patent Document 2] Japanese Published Patent Application No. 2010-156963

Non-Patent Document

[Non-Patent Document 1] K. Kato et al., "Japanese Journal of Applied Physics", 2012, volume 51, pp. 021201-1-021201-7.
[Non-Patent Document 2] S. Matsuda et al., "2015 Symposium on VLSI Technology Digest of Technical Papers", 2015, pp. T216-T217.
[Non-Patent Document 3] S. Amano et al., "SID Symposium Digest of Technical Papers", 2010, volume 41, issue 1, pp. 626-629.

SUMMARY OF THE INVENTION

In manufacturing of a semiconductor device, the use of the same material for channel formation regions of a plurality of transistors included in the semiconductor device can shorten the manufacturing process of the semiconductor device in some cases. Specifically, the material can be, for example, a metal oxide such as IGZO described above.

However, a metal oxide containing indium (e.g., an In oxide) and a metal oxide containing zinc (e.g., a Zn oxide) which serve as n-type semiconductors have been manufactured but these metal oxides which serve as p-type semiconductors are difficult to manufacture in terms of mobility and reliability. Therefore, a single-polarity circuit composed of transistors including n-type semiconductors (n-channel transistors) is preferably employed in manufacturing of a semiconductor device.

The threshold voltage of an n-channel transistor including a metal oxide in a channel formation region is likely to be lowered by influence of the manufacturing steps and the like. In other words, leakage current that flows in an off state of the transistor is likely to increase. For this reason, in a semiconductor device including a transistor with a high leakage current, desired operation is not performed depending on circumstances in some cases.

An object of one embodiment of the present invention is to provide a semiconductor device that operates stably. Another object of one embodiment of the present invention is to provide a semiconductor device with high reliability. Another object of one embodiment of the present invention is to provide a display apparatus including any of the above semiconductor devices. Another object of one embodiment of the present invention is to provide an electronic device including the above display apparatus. Another object of one embodiment of the present invention is to provide a novel semiconductor device, a novel display apparatus, or a novel electronic device.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

(1) One embodiment of the present invention is a semiconductor device including a first transistor, a second transistor, a third transistor, a fourth transistor, a fifth transistor, a sixth transistor, a seventh transistor, an eighth transistor, a ninth transistor, a tenth transistor, a first capacitor, a second capacitor, a third capacitor, and a fourth capacitor. A first gate of the first transistor is electrically connected to a first gate of the fourth transistor. One of a source and a drain of the first transistor is electrically connected to one of a source and a drain of the second transistor, one of a source and a drain of the fifth transistor, one of a source and a drain of the eighth transistor, and a first terminal of the fourth capacitor. The other of the source and the drain of the fifth transistor is electrically connected to a first gate of the sixth transistor and a first terminal of the second capacitor. The other of the source and the drain of the eighth transistor is electrically connected to a first gate of the ninth transistor and a first terminal of the third capacitor. A first gate of the second transistor is electrically connected to a first terminal of the first capacitor, one of a source and a drain of the third transistor, one of a source and a drain of the fourth transistor, a first gate of the seventh transistor, and a first gate of the tenth transistor. One of a source and a drain of the seventh transistor is electrically connected to one of a source and a drain of the sixth transistor and a second terminal of the second capacitor. One of a source and a drain of the tenth transistor is electrically connected to one of a source and a drain of the ninth transistor and a second terminal of the third capacitor.

(2) One embodiment of the present invention is a semiconductor device including a first transistor, a second transistor, a third transistor, a fourth transistor, a fifth transistor, a sixth transistor, a seventh transistor, an eighth transistor, a ninth transistor, a tenth transistor, an eleventh transistor, a first capacitor, a second capacitor, and a third capacitor. A first gate of the first transistor is electrically connected to one of a source and a drain of the eleventh transistor. The other of the source and the drain of the eleventh transistor is electrically connected to a first gate of the fourth transistor. One of a source and a drain of the first transistor is electrically connected to one of a source and a drain of the second transistor, one of a source and a drain of the fifth transistor, and one of a source and a drain of the eighth transistor. The other of the source and the drain of the fifth transistor is electrically connected to a first gate of the sixth transistor and a first terminal of the second capacitor. The other of the source and the drain of the eighth transistor is electrically connected to a first gate of the ninth transistor and a first terminal of the third capacitor. A first gate of the second transistor is electrically connected to a first terminal of the first capacitor, one of a source and a drain of the third transistor, one of a source and a drain of the fourth transistor, a first gate of the seventh transistor, and a first gate of the tenth transistor. One of a source and a drain of the seventh transistor is electrically connected to one of a source and a drain of the sixth transistor and a second terminal of the second capacitor. One of a source and a drain of the tenth transistor is electrically connected to one of a source and a drain of the ninth transistor and a second terminal of the third capacitor.

(3) In the embodiment of the present invention described in (2), a first gate of the eleventh transistor may be electrically connected to a second gate of the eleventh transistor.

(4) One embodiment of the present invention is a semiconductor device including a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a first capacitor, a second capacitor, and a third capacitor. A first gate of the first transistor is electrically connected to one of a source and a drain of the eleventh transistor and one of a source and a drain of the twelfth transistor. The other of the source and the drain of the eleventh transistor is electrically connected to a first gate of the eleventh transistor, a first gate of the fourth transistor, and the other of the source and the drain of the twelfth transistor. One of a source and a drain of the first transistor is electrically connected to one of a source and a drain of the second transistor, one of a source and a drain of the fifth transistor, and one of a source and a drain of the eighth transistor. The other of the source and the drain of the fifth transistor is electrically connected to a first gate of the sixth transistor and a first terminal of the second capacitor. The other of the source and the drain of the eighth transistor is electrically connected to a first gate of the ninth transistor and a first terminal of the third capacitor. A first gate of the second transistor is electrically connected to a first terminal of the first capacitor, one of a source and a drain of the third transistor, one of a source and a drain of the fourth transistor, a first gate of the seventh transistor, and a first gate of the tenth transistor. One of a source and a drain of the seventh transistor is electrically connected to one of a source and a drain of the sixth transistor and a second terminal of the second capacitor. One of a source and a drain of the tenth transistor is electrically connected to one of a source and a drain of the ninth transistor and a second terminal of the third capacitor. The other of the source and the drain of the sixth transistor is electrically connected to a first gate of the twelfth transistor.

(5) In the embodiment of the present invention described in any one of (1) to (4), a first gate of the fifth transistor may be electrically connected to a second gate of the fifth transistor, and a first gate of the eighth transistor may be electrically connected to a second gate of the eighth transistor.

(6) One embodiment of the present invention is a semiconductor device including a first transistor, a second transistor, a third transistor, a fourth transistor, a fifth transistor, a sixth transistor, a seventh transistor, an eighth transistor, a ninth transistor, a tenth transistor, a first capacitor, a second capacitor, and a third capacitor. A first gate of the first transistor is electrically connected to a first gate of the fourth transistor. One of a source and a drain of the first transistor is electrically connected to one of a source and a drain of the second transistor, one of a source and a drain of the fifth transistor, and one of a source and a drain of the eighth transistor. The other of the source and the drain of the fifth transistor is electrically connected to a first gate of the sixth transistor and a first terminal of the second capacitor. The other of the source and the drain of the eighth transistor is electrically connected to a first gate of the ninth transistor and a first terminal of the third capacitor. A first gate of the second transistor is electrically connected to a first terminal of the first capacitor, one of a source and a drain of the third transistor, one of a source and a drain of the fourth transistor, a first gate of the seventh transistor, a first gate of the tenth transistor, a second gate of the fifth transistor, and a second gate of the eighth transistor. One of a source and a drain of the seventh transistor is electrically connected to one of a source and a drain of the sixth transistor and a second terminal of the second capacitor. One of a source and a drain of the tenth transistor is electrically connected to one of a source and a drain of the ninth transistor and a second terminal of the third capacitor.

(7) One embodiment of the present invention is a semiconductor device including a first transistor, a second transistor, a third transistor, a fourth transistor, a sixth transistor, a seventh transistor, a ninth transistor, a tenth transistor, a first capacitor, a second capacitor, and a third capacitor. A first gate of the first transistor is electrically connected to a first gate of the fourth transistor. One of a source and a drain of the first transistor is electrically connected to one of a source and a drain of the second transistor, a first gate of the sixth transistor, a first terminal of the second capacitor, a first gate of the ninth transistor, and a first terminal of the third capacitor. A first gate of the second transistor is electrically connected to a first terminal of the first capacitor, one of a source and a drain of the third transistor, one of a source and a drain of the fourth transistor, a first gate of the seventh transistor, and a first gate of the tenth transistor. One of a source and a drain of the seventh transistor is electrically connected to one of a source and a drain of the sixth transistor and a second terminal of the second capacitor. One of a source and a drain of the tenth transistor is electrically connected to one of a source and a drain of the ninth transistor and a second terminal of the third capacitor.

(8) In the embodiment of the present invention described in any one of (1) to (7), the first gate of the first transistor may be electrically connected to a second gate of the first transistor, a first gate of the third transistor may be electrically connected to a second gate of the third transistor, the first gate of the sixth transistor may be electrically connected to a second gate of the sixth transistor, and the first gate of the ninth transistor may be electrically connected to a second gate of the ninth transistor.

(9) In the embodiment of the present invention described in any one of (1) to (8), a second gate of the seventh transistor may be electrically connected to the other of the source and the drain of the seventh transistor, and a second gate of the tenth transistor may be electrically connected to the other of the source and the drain of the tenth transistor.

(10) In the embodiment of the present invention described in any one of (1) to (9), each of the second transistor and the fourth transistor may have a multi-gate structure.

(11) Another embodiment of the present invention is a display apparatus including a gate driver circuit including a shift register including the semiconductor device described in any one of (1) to (10), a source driver circuit, and a pixel array.

(12) Another embodiment of the present invention is an electronic device which includes the display apparatus described in (11) and a housing.

In this specification and the like, a semiconductor device means a device that utilizes semiconductor characteristics, and refers to a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display apparatus, a light-emitting apparatus, a lighting device, and an electronic device themselves might be semiconductor devices, or might each include a semiconductor device.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow(s) electrical connection between X and Y (e.g., a switch, a transistor, a capacitor element, an inductor, a resistor element, a diode, a display device, a light-emitting device, and a load) can be connected between X and Y. Note that a switch has a function of being controlled to be turned on or off That is, the switch has a function of being in a conduction state (on state) or a non-conduction state (off state) to control whether a current flows or not.

In the case where an element and a power supply line (e.g., a wiring supplying VDD (high power supply potential), VSS (low power supply potential), GND (the ground potential), or a desired potential) are both provided between X and Y, X and Y are not defined as being electrically connected. In the case where only a power supply line is provided between X and Y, there is no element between X and Y; therefore, X and Y are directly connected. Accordingly, in the case where only a power supply line is provided between X and Y, X and Y can be expressed as being "electrically connected". However, in the case where an element and a power supply line are both provided between X and Y, X and Y are not defined as being electrically connected although X and the power supply line are electrically connected (through the element), and Y and the power supply line are electrically connected. Note that in the case where X and a gate of a transistor are electrically connected and Y and a source of the transistor are electrically connected, X and Y are not defined as being electrically connected. In the case where X and a gate of a transistor are electrically connected and Y and a drain of the transistor are electrically connected, X and Y are not defined as being electrically connected. In the case where X and a drain of a transistor are electrically connected and Y and a source of the transistor are electrically connected, X and Y are defined as being electrically connected. In the case where a capacitor is provided between X and Y, X and Y are defined as being electrically connected in some cases and not defined in other cases. For example, in the case where a capacitor is provided between X and Y in a digital circuit or a logic circuit, X and Y are not defined as being electrically connected in some cases. On the other hand, for example, in the case where a capacitor is provided between X and Y in an analog circuit, X and Y are defined as being electrically connected in some cases.

For example, in the case where X and Y are functionally connected, one or more circuits that allow(s) functional connection between X and Y (e.g., a logic circuit (an inverter, a NAND circuit, a NOR circuit, or the like); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of a current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (sometimes called one of a first terminal and a second terminal) of a transistor, and a drain (sometimes called the other of the first terminal and the second terminal) of the transistor are electrically connected to each other, and X, the source of the transistor, the drain of the transistor, and Y are electrically connected to each other in this order". Alternatively, it can be expressed as "a source of a transistor is electrically connected to X; a drain of the transistor is electrically connected to Y; and X, the source of the transistor, the drain of the transistor, and Y are electrically connected to each other in this order". Alternatively, it can be expressed as "X is electrically connected to Y through a source and a drain of a transistor, and X, the source of the transistor, the drain of the transistor, and Y are provided in this connection order". When the connection order in a circuit structure is defined by an expression similar to the above examples, a source and a drain of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor element" can be, for example, a circuit element or a wiring having a resistance higher than 0Ω. Therefore, in this specification and the like, a "resistor element" includes a wiring having a resistance, a transistor in which a current flows between its source and drain, a diode, and a coil. Thus, the term "resistor element" can be sometimes replaced with the terms "resistor", "load", or "region having a resistance"; conversely, the terms "resistor", "load", or "region having a resistance" can be sometimes replaced with the term "resistor element". The resistance can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance may be higher than or equal to 1Ω and lower than or equal to $1\times10^9$Ω.

In this specification and the like, a "capacitor element" can be, for example, a circuit element having an electrostatic capacitance greater than 0 F, a region of a wiring having an electrostatic capacitance greater than 0 F, parasitic capacitance, or gate capacitance of a transistor. The terms "capacitor element", "parasitic capacitance", or "gate capacitance" can be sometimes replaced with the term "capacitor"; conversely, the term "capacitor" can be sometimes replaced with the terms "capacitor element", "parasitic capacitance", or "gate capacitance". The term "a pair of electrodes" of a capacitor can be replaced with the terms "a pair of conductors", "a pair of conductive regions", or "a pair of regions". Note that the electrostatic capacitance can be greater than or equal to 0.05 fF and less than or equal to 10 pF, for example. As another example, the electrostatic capacitance may be greater than or equal to 1 pF and less than or equal to 10 μF.

In this specification and the like, a transistor includes three terminals called a gate, a source, and a drain. The gate is a control terminal for controlling the on/off state of the transistor. The two terminals functioning as the source and the drain are input/output terminals of the transistor. Functions of the two input/output terminals of the transistor depend on the conductivity type (n-channel type or p-channel type) of the transistor and the levels of potentials applied to the three terminals of the transistor, and one of the two terminals serves as a source and the other serves as a drain. Therefore, the terms "source" and "drain" can be sometimes used interchangeably in this specification and the like. In this specification and the like, the terms "one of a source and a drain" (or a first electrode or a first terminal) and "the other of the source and the drain" (or a second electrode or a second terminal) are used to describe the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series.

Thus, with the multi-gate structure, the amount of an off-state current can be reduced, and the withstand voltage of the transistor can be increased (the reliability can be improved). Alternatively, with the multi-gate structure, a drain-source current does not change very much even if a drain-source voltage changes when the transistor operates in a saturation region, so that a flat slope of voltage-current characteristics can be obtained. By utilizing the flat slope of the voltage-current characteristics, an ideal current source circuit or an active load having an extremely high resistance can be obtained. Accordingly, a differential circuit, a current mirror circuit, or the like having excellent properties can be obtained.

A single circuit element shown in a circuit diagram may include a plurality of circuit elements. For example, a single resistor shown in a circuit diagram may be two or more resistors electrically connected to each other in series. For another example, a single capacitor shown in a circuit diagram may be two or more capacitors electrically connected to each other in parallel. For another example, a single transistor shown in a circuit diagram may be two or more transistors which are electrically connected to each other in series and whose gates are electrically connected to each other. For another example, a single switch shown in a circuit diagram may be a switch including two or more transistors which are electrically connected to each other in series or in parallel and whose gates are electrically connected to each other.

In this specification and the like, a node can be referred to as a terminal, a wiring, an electrode, a conductive layer, a conductor, an impurity region, and the like depending on the circuit configuration and the device structure. Furthermore, a terminal, a wiring, and the like can be referred to as a node.

In this specification and the like, "voltage" and "potential" can be replaced with each other as appropriate. The term "voltage" refers to a potential difference from a reference potential. When the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials that these wirings supply are not necessarily equal to each other. Similarly, in the case where two wirings are both described as "functioning as a wiring for supplying a low-level potential", the levels of the low-level potentials that these wirings supply are not necessarily equal to each other.

A current means an electric charge transfer (electrical conduction); for example, the expression "electrical conduction of positively charged particles is caused" can be rephrased as "electrical conduction of negatively charged particles is caused in the opposite direction". Therefore, unless otherwise specified, a current in this specification and the like refers to an electric charge transfer (electrical conduction) caused by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of a current in a wiring refers to the direction in which a carrier with a positive electric charge moves, and the amount of a current is expressed as a positive value. In other words, the direction in which a carrier with a negative electric charge moves is opposite to the direction of a current, and the amount of a current is expressed as a negative value. Thus, in the case where the polarity of a current (or the direction of a current) is not specified in this specification and the like, the expression "a current flows from an element A to an element B" can be replaced with "a current flows from an element B to an element A". The expression "a current is input to an element A" can be replaced with "a current is output from an element A".

Ordinal numbers such as "first", "second", and "third" in this specification and the like are used in order to avoid confusion among components. Thus, the terms do not limit the number of components. The terms do not limit the order of components, either. For example, a "first" component in one embodiment in this specification and the like can be referred to as a "second" component in other embodiments or claims. For another example, a "first" component in one embodiment in this specification and the like can be omitted in other embodiments or claims.

In this specification and the like, terms for describing arrangement, such as "over", "above", "under", and "below", are sometimes used for convenience to describe the positional relation between components with reference to drawings. The positional relation between components is changed as appropriate in accordance with the direction from which each component is described. Thus, the positional relation is not limited to that described with a term used in this specification and the like and can be explained with another term as appropriate depending on the situation. For example, the expression "an insulator over (on) a top surface of a conductor" can be replaced with the expression "an insulator on a bottom surface of a conductor" when the direction of a diagram showing these components is rotated by 180°.

The terms such as "over", "above", "under", and "below" do not necessarily mean that a component is placed directly on or under and directly in contact with another component. For example, the expression "electrode B over insulating layer A" does not necessarily mean that the electrode B is on and in direct contact with the insulating layer A, and can mean the case where another component is provided between the insulating layer A and the electrode B.

In this specification and the like, components arranged in a matrix and their positional relation are sometimes described using terms such as "row" and "column". The positional relation between components is changed as appropriate in accordance with the direction from which each component is described. Thus, the positional relation is not limited to that described with a term used in this specification and the like and can be explained with another term as appropriate depending on the situation. For example, the term "row direction" can be replaced with the term "column direction" when the direction of the diagram is rotated by 90°.

In this specification and the like, the terms "film" and "layer" can be interchanged with each other depending on circumstances. For example, the term "conductive layer" can be changed to the term "conductive film" in some cases. Moreover, the term "insulating film" can be changed into the term "insulating layer" in some cases. Moreover, such terms can be replaced with a word not including the term "film" or "layer" depending on the case or circumstances. For example, the term "conductive layer" or "conductive film" can be changed into the term "conductor" in some cases. For example, in some cases, the term "insulating layer" or "insulating film" can be changed into the term "insulator" in some cases.

In this specification and the like, the terms "electrode", "wiring", and "terminal" do not have functional limitations. For example, an "electrode" is used as part of a wiring in some cases, and vice versa. Furthermore, the term "electrode" or "wiring" can also mean a combination of a plurality of electrodes or wirings provided in an integrated manner, for example. For another example, a "terminal" can be used as part of a wiring or an electrode, and a "wiring" and an "electrode" can be used as part of a terminal. Furthermore, the term "terminal" includes the case where at least one of a plurality of electrodes, wirings, terminals, and the like are formed in an integrated manner. Therefore, for example, an "electrode" can be part of a wiring or a terminal, and a "terminal" can be part of a wiring or an electrode. Moreover, the terms "electrode", "wiring", or "terminal" is sometimes replaced with the term "region", for example.

In this specification and the like, the terms "wiring", "signal line", "power supply line", and the like can be interchanged with each other depending on the case or in accordance with circumstances. For example, the term "wiring" can be changed into the term "signal line" in some cases. Also, for example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or in accordance with circumstances. Inversely, the term "signal" or the like can be changed into the term "potential" in some cases.

In this specification and the like, an impurity in a semiconductor refers to, for example, elements other than the main components of a semiconductor layer. For instance, an element with a concentration lower than 0.1 atomic % is an impurity. When an impurity is contained, the density of defect states in the semiconductor may be increased, the carrier mobility may be decreased, or the crystallinity may be decreased. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components of the oxide semiconductor. Specific examples are hydrogen (included also in water), lithium, sodium, silicon, boron, phosphorus, carbon, and nitrogen. Specifically, when the semiconductor is silicon, examples of impurities that change the characteristics of the semiconductor include Group 1 elements, Group 2 elements, Group 13 elements, and Group 15 elements (with the exception of oxygen and hydrogen).

In this specification and the like, a switch is in a conduction state (on state) or in a non-conduction state (off state) to control whether a current flows therethrough or not. Alternatively, a switch has a function of selecting and changing a current path. Thus, a switch may have two or more terminals through which a current flows, in addition to a control terminal. For example, an electrical switch or a mechanical switch can be used. That is, a switch is not limited to a certain element and can be any element capable of controlling a current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined. In the case of using a transistor as a switch, the conduction state of the transistor refers to a state in which a source electrode and a drain electrode of the transistor are regarded as being electrically short-circuited or a state in which a current can flow between the source electrode and the drain electrode, for example. The non-conduction state of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch using a microelectromechanical systems (MEMS) technology. Such a switch includes an electrode that can be moved mechanically, and its conduction and non-conduction is controlled with movement of the electrode.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which light-emitting layers in light-emitting devices of different colors (here, blue (B), green (G), and red (R)) are separately formed or separately patterned may be referred to as a side-by-side (SBS) structure. In this specification and the like, a light-emitting device capable of emitting white light may be referred to as a white-light-emitting device. Note that a combination of such a white-light-emitting device with coloring layers (e.g., color filters) enables providing a full-color display apparatus.

Structures of light-emitting devices can be classified roughly into a single structure and a tandem structure. A light-emitting device with a single structure includes one light-emitting unit between a pair of electrodes, and the light-emitting unit preferably includes one or more light-emitting layers. To obtain white light emission, two or more light-emitting layers that emit light of complementary colors are selected. For example, when emission colors of a first light-emitting layer and a second light-emitting layer are complementary colors, the light-emitting device can be configured to emit white light as a whole. The same applies to a light-emitting device including three or more light-emitting layers.

A light-emitting device with a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to that in the case of a single structure. In the light-emitting device with a tandem structure, it is preferable that an intermediate layer such as a charge-generation layer be provided between the plurality of light-emitting units.

When the white-light-emitting device (having a single structure or a tandem structure) and a light-emitting device having an SBS structure are compared to each other, the latter can have lower power consumption than the former. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

In this specification, "parallel" indicates a state where the angle formed between two straight lines is greater than or equal to −10° and less than or equal to 10°. Thus, the case where the angle is greater than or equal to −5° and less than or equal to 5° is also included. The terms "approximately parallel" and "substantially parallel" indicate that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. The terms "approximately perpendicular" and "substantially perpendicular" indicate that the angle formed between two straight lines is greater than or equal to 60° and less than or equal to 120°.

According to one embodiment of the present invention, a semiconductor device that operates stably can be provided. According to another embodiment of the present invention, a semiconductor device with high reliability can be provided. According to another embodiment of the present invention, a display apparatus including any of the above semiconductor devices can be provided. According to another embodiment of the present invention, an electronic device including the above display apparatus can be provided. According to another embodiment of the present invention, a novel semiconductor device, a novel display apparatus, or a novel electronic device can be provided.

Note that the effects of one embodiment of the present invention are not limited to the effects mentioned above. The effects described above do not preclude the existence of other effects. The other effects are the ones that are not described above and will be described below. Effects that are not described above will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

FIGS. 35A and 35B are plan views each illustrating a structure example of a light-emitting device and a light-receiving device included in a display apparatus.

FIGS. 40A to 40D are plan views each illustrating an example of a pixel.

DETAILED DESCRIPTION OF THE INVENTION

Figure 1A:
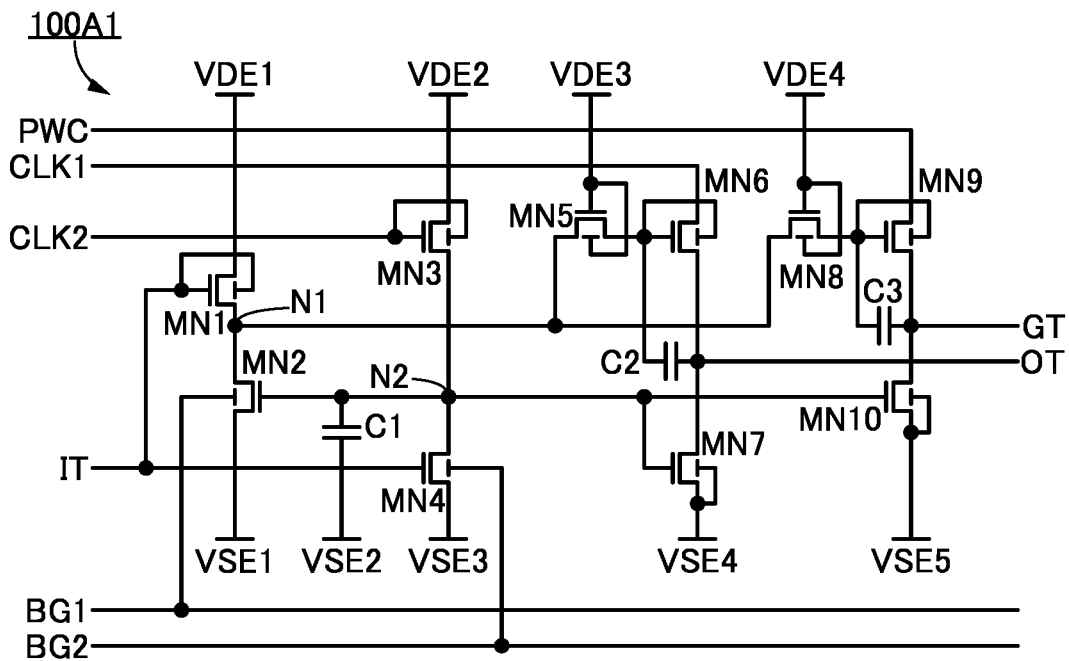
FIGS. 1A and 1B are circuit diagrams each illustrating a configuration example of a semiconductor device.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide contained in a channel formation region of a transistor is called an oxide semiconductor in some cases. That is, a metal oxide included in a channel formation region of a transistor that has at least one of an amplifying function, a rectifying function, and a switching function can be referred to as a metal oxide semiconductor. In addition, an OS transistor is a transistor including a metal oxide or an oxide semiconductor.

In this specification and the like, a metal oxide containing nitrogen is also referred to as a metal oxide in some cases. In addition, a metal oxide containing nitrogen may be referred to as a metal oxynitride.

In this specification and the like, one embodiment of the present invention can be constituted with an appropriate combination of a structure shown in one embodiment and any of the structures shown in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with text in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

The embodiments in this specification are described with reference to the drawings. Note that the embodiments can be implemented in many different modes, and it will be readily appreciated by those skilled in the art that modes and details can be changed in various ways without departing from the spirit and scope of the present invention. Therefore, the present invention should not be construed as being limited to the description of the embodiments. Note that in the structures of the invention described in the embodiments, the same portions or portions having similar functions are denoted by the same reference numerals in different drawings and the description of such portions is not repeated in some cases. In perspective views and the like, some of components might not be illustrated for clarity of the drawings.

In this specification and the like, when a plurality of components denoted by the same reference numerals need to be distinguished from each other, identification signs such as "_1", "[n]", and "[m,n]" are sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings of this specification, the size, the layer thickness, or the region is exaggerated for clarity in some cases. Therefore, the size, the layer thickness, or the region is not limited to the illustrated scale. The drawings are schematic views showing ideal examples, and embodiments of the present invention are not limited to shapes, values, or the like shown in the drawings. For example, the following can be included: a variation in a signal, a voltage, or a current due to noise or difference in timing.

Embodiment 1

In this embodiment, a semiconductor device of one embodiment of the present invention will be described.

Figure 2:
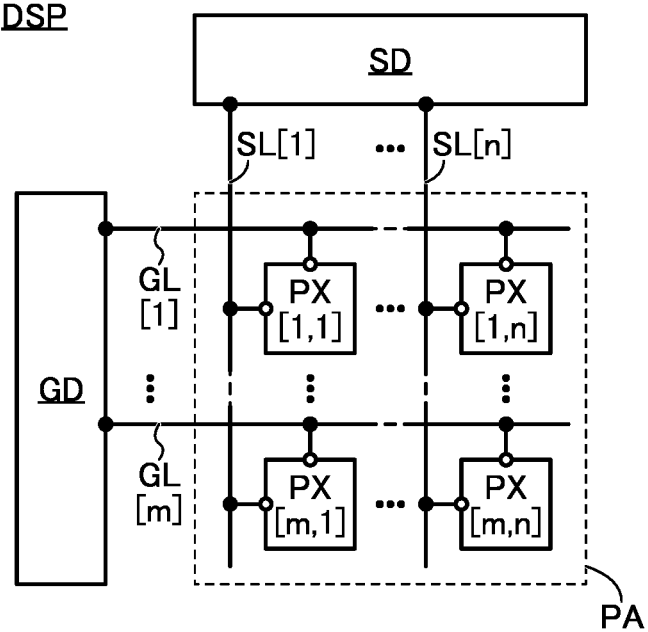
FIG. 2 is a block diagram illustrating a configuration example of a display apparatus.

FIG. 2 illustrates a configuration example of a display apparatus including a semiconductor device of one embodiment of the present invention. As an example, a display apparatus DSP includes a driver circuit GD, a driver circuit SD, and a pixel array PA.

Note that in FIG. 2, the driver circuit GD, the driver circuit SD, the pixel array PA, a wiring GL[1], a wiring GL[m], a wiring SL[1], a wiring SL[n], a pixel circuit PX[1, 1], a pixel circuit PX[m, 1], a pixel circuit PX[1, n], and a pixel circuit PX[m, n] are selectively illustrated.

The pixel array PA includes a plurality of pixel circuits PX, for example. The pixel circuits PX are arranged in a matrix of m rows and n columns in the pixel array PA.

Note that the symbol accompanying the reference characters of the pixel circuit PX in FIG. 2 represents an address in the pixel circuit. For example, the symbol in the reference characters of the pixel circuit PX[1, 1] means that the pixel circuit PX is placed in the first row and the first column in the pixel array PA. For another example, the symbol in the reference characters of the pixel circuit PX[m, 1] means that the pixel circuit PX is placed in the m-th row and the first column in the pixel array PA. For another example, the symbol in the reference characters of the pixel circuit PX[1, n] means that the pixel circuit PX is placed in the first row and the n-th column in the pixel array PA. For another example, the symbol in the reference characters of the pixel circuit PX[m, n] means that the pixel circuit PX is placed in the m-th row and the n-th column in the pixel array PA.

The pixel circuit PX placed in the i-th row and the j-th column (i is an integer greater than or equal to 1 and less than or equal to m, and j is an integer greater than or equal to 1 and less than or equal to n) in the pixel array PA is referred to as a pixel circuit PX[i, j] (not illustrated). The pixel circuit PX[i, j] is electrically connected to a wiring GL[i], for example. The pixel circuit PX[i, j] is electrically connected to a wiring SL[j], for example.

The driver circuit GD is electrically connected to the wirings GL[1] to GL[m], for example. The driver circuit SD is electrically connected to the wirings SL[1] to SL[n], for example.

The wirings GL[1] to GL[m] are extended in the row direction in the pixel array PA, for example. Furthermore, the symbol [x] accompanying the reference characters of the wiring GL represents the number of the row in which the wiring is provided. For example, the reference of the wiring GL[1] represents a wiring provided in the first row in the pixel array PA. For another example, the reference of the wiring GL[m] represents a wiring provided in the m-th row in the pixel array PA.

The wirings SL[1] to SL[n] are extended in the column direction in the pixel array PA, for example. Furthermore, the symbol [y] accompanying the reference characters of the wiring GL represents the number of the column in which the wiring is provided. For example, the reference of the wiring GL[1] represents a wiring provided in the first column in the pixel array PA. For another example, the reference of the wiring GL[n] represents a wiring provided in the n-th column in the pixel array PA.

For example, one or more selected from a liquid crystal display device, a light-emitting device including an organic EL material, and a light-emitting device including a light-emitting diode (e.g., a micro LED) can be used in the pixel circuit PX. Note that in the description in this embodiment, the pixel circuit PX in the pixel array PA includes a light-emitting device including an organic EL material. The luminance of light emitted from a light-emitting device capable of high luminance light emission can be, for example, higher than or equal to 500 cd/m$^2$, preferably higher than or equal to 1000 cd/m$^2$ and lower than or equal to 10000 cd/m$^2$, further preferably higher than or equal to 2000 cd/m$^2$ and lower than or equal to 5000 cd/m$^2$. Note that a pixel circuit applicable to the pixel circuit PX and the like will be described in detail in Embodiment 4.

The driver circuit GD has a function of selecting the pixel circuit PX to which image data is to be transmitted in the pixel array PA of the display apparatus DSP, for example. Accordingly, the driver circuit GD can be referred to as a gate driver circuit or the like.

The wiring GL, which electrically connects the driver circuit GD and the pixel circuit PX, functions as a wiring transmitting a selection signal. Note that the wiring GL may function as, for example, a wiring supplying a constant potential, not a wiring transmitting a selection signal.

The driver circuit SD has a function of transmitting image data to the pixel circuit PX in the pixel array PA of the display apparatus DSP, for example. Accordingly, the driver circuit SD can be referred to as a source driver circuit or the like.

The wiring SL, which electrically connects the driver circuit SD and the pixel circuit PX, functions as a wiring transmitting image data as a signal. Note that the wiring SL may function as, for example, a wiring supplying a constant potential, not a wiring transmitting image data.

Note that in the display apparatus DSP illustrated in FIG. 2, a wiring other than the wirings GL[1] to GL[m] and the wirings SL[1] to SL[n] may be provided. For example, a wiring supplying a constant potential to the pixel circuit PX may be provided in the display apparatus DSP.

Next, a configuration example of the driver circuit GD is described.

Figure 3A:
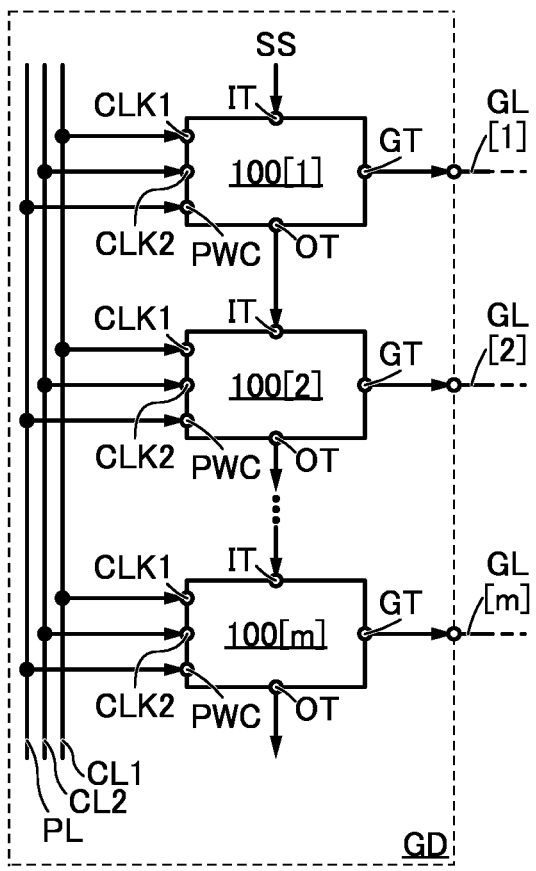
FIGS. 3A and 3B are circuit diagrams each illustrating a configuration example of a semiconductor device.

FIG. 3A illustrates a configuration example of the driver circuit GD of one embodiment of the present invention which is applicable to the display apparatus DSP in FIG. 2.

The driver circuit GD illustrated in FIG. 3A includes a circuit 100[1] to a circuit 100[m], for example.

Each of the circuits 100[1] to 100[m] includes, for example, a terminal IT, a terminal OT, a terminal CLK1, a terminal CLK2, and a terminal GT.

In each of the circuits 100[1] to 100[m], for example, the terminal CLK1 is electrically connected to a wiring CL1, the terminal CLK2 is electrically connected to a wiring CL2, and a terminal PWC is electrically connected to a wiring PL.

Each of the wirings CL1, CL2, and PL has, for example, a function of supplying a variable potential (referred to as a pulse voltage in some cases in this specification), such as a clock signal. Note that one or more of the wirings CL1, CL2, and PL may supply a constant potential, not the variable potential.

The terminal OT of the circuit 100[k] (k is an integer greater than or equal to 1 and less than or equal to m−1) is electrically connected to the terminal IT of the circuit 100[k+1], for example.

The terminal GT of the circuit 100[i] is electrically connected to the wiring GL[i], for example.

Each of the circuits 100[1] to 100[m] has functions of, for example, holding data input to the terminal IT and outputting the held data to one or both of the terminal OT and the terminal GT.

For example, the circuit 100[i] has a function of outputting data held in the circuit 100[i] to the terminal OT when the variable potential is input to the terminal CLK1. For another example, the circuit 100[i] has a function of outputting data held in the circuit 100[i] to the terminal GT when a variable potential is input to the terminal PWC. For another example, the circuit 100[i] has a function of resetting data held in the circuit 100[i] when a variable potential is input to the terminal CLK2. The circuit 100[i] is preferably configured to hold new data that is input to the terminal IT of the circuit 100[i] after the data held in the circuit 100[i] is reset.

As described above, in the circuits 100[1] to 100[m], data is input to the terminal IT of the circuit 100[1] and then a variable potential is input to the terminal CLK1 and the terminal CLK2 at an appropriate timing, whereby the data can be transmitted to the circuit 100[2] and the subsequent circuits 100[m]. Furthermore, data is input to the terminal IT of the circuit 100[1] and then a variable potential is input to the terminal PWC at an appropriate timing, whereby data held in the circuits 100[1] to 100[m] can be output from the terminals GT of the circuits 100[1] to 100[m]. Accordingly, the configuration of the circuits 100[1] to 100[m] can be referred to as a shift register in this specification and the like.

The above-described data can be, for example, a selection signal for selecting the pixel circuit PX to which image data is to be written in the pixel array PA. Note that in FIG. 3A, the selection signal is illustrated as a signal SS.

Note that although the circuit 100[m] in the driver circuit GD in FIG. 3A includes the terminal OT, the circuit 100[m] is not necessarily provided with the terminal OT because the circuits 100[1] to 100[m] form a shift register.

The configuration of the driver circuit GD applicable to the display apparatus DSP in FIG. 2 is not limited to the configuration in FIG. 3A. For example, the driver circuit GD illustrated in FIG. 3B may be employed as the driver circuit GD applicable to the display apparatus DSP in FIG. 2.

Figure 3B:
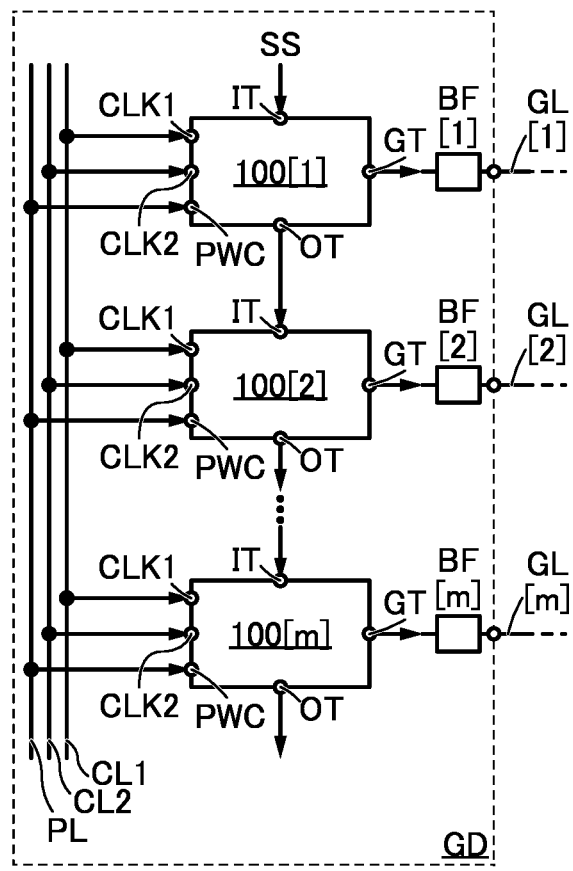

The driver circuit GD in FIG. 3B is different from the driver circuit GD in FIG. 3A in including circuits BF[1] to BF[m].

In the driver circuit GD in FIG. 3B, input terminals of the circuits BF[1] to BF[m] are electrically connected to the respective terminals GT of the circuits 100[1] to 100[*m*], and output terminals of the circuits BF[1] to BF[m] are electrically connected to the wirings GL[1] to GL[m], respectively.

Each of the circuits BF[1] to BF[m] can include an amplifier circuit such as a buffer circuit, an inverter circuit, or a latch circuit, for example. Specifically, each of the circuits BF[1] to BF[m] can have a function of referring to and amplifying a potential of the terminal GT and outputting the amplified potential to the wiring GL.

Note that a wiring other than the wiring CL1, the wiring CL2, and the wiring PL may be provided in the driver circuits GD illustrated in FIGS. 3A and 3B. For example, a wiring for supplying a constant potential to drive the circuits 100[1] to 100[*m*] may be provided.

Configuration Example 1

Next, a specific circuit configuration example of the circuits 100[1] to 100[*m*] in each of the driver circuits GD in FIGS. 3A and 3B will be described.

FIG. TA illustrates a configuration example of a circuit, which is a semiconductor device of one embodiment of the present invention, applicable to the circuits 100[1] to 100[*m*] in each of the driver circuits GD in FIGS. 3A and 3B. A circuit 100A1 includes transistors MN1 to MN10, a capacitor C1, a capacitor C2, and a capacitor C3, for example. The circuit 100A1 further includes the terminal IT, the terminal PWC, the terminal CLK1, the terminal CLK2, the terminal GT, and the terminal OT, for example.

For example, the transistors MN1 to MN10 are preferably OS transistors. In particular, as a metal oxide included in a channel formation region of the OS transistor, an In-M-Zn oxide containing indium, the element M, and zinc (the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium) or the like is preferably used. A transistor including silicon in a channel formation region (hereinafter referred to as a Si transistor) may be employed as the transistors. As the silicon, single crystal silicon, amorphous silicon (referred to as hydrogenated amorphous silicon in some cases), microcrystalline silicon, or polycrystalline silicon can be used, for example. As transistors other than the OS transistor and the Si transistor, for example, a transistor including germanium (Ge) or the like in a channel formation region, a transistor including a compound semiconductor, such as zinc selenide (ZnSe), cadmium sulfide (CdS), gallium arsenide (GaAs), indium phosphide (InP), gallium nitride (GaN), or silicon germanium (SiGe), in a channel formation region, a transistor including carbon nanotube in a channel formation region, or a transistor including an organic semiconductor in a channel formation region can be used.

The transistors MN1 to MN10 illustrated in FIG. 1A are each an n-channel transistor having a multi-gate structure including gates over and under a channel, and the transistors MN1 to MN10 each include a first gate and a second gate. Note that in this specification and the like, for convenience, the first gate is referred to as a gate (referred to as a front gate in some cases) and the second gate is referred to as a back gate so that they are distinguished from each other in some cases. In this specification and the like, the first gate and the second gate can be interchanged; thus, the term "gate" can be replaced with the term "back gate". Similarly, the term "back gate" can be replaced with the term "gate". As a specific example, a connection structure in which "a gate is electrically connected to a first wiring and aback gate is electrically connected to a second wiring" can be replaced with a connection structure in which "a back gate is electrically connected to a first wiring and a gate is electrically connected to a second wiring".

The connection of the second gate of the transistor in the semiconductor device of one embodiment of the present invention may be changed as long as an object of one embodiment of the present invention is achieved. FIG. 1A illustrates the second gate and a connection destination of the second gate in each of the transistors MN1 to MN10; however, for example, in the same transistor, in the case where a wiring, a terminal, or a circuit element is electrically connected to both the first gate and the second gate, the structure may be changed to a structure in which the wiring, the terminal, or the circuit element is electrically connected to one of the first gate and the second gate.

The semiconductor device of one embodiment of the present invention does not depend on the structure of a transistor included in the semiconductor device. For example, each of the transistors MN1 to MN10 in FIG. 1A may have a structure not including a back gate, that is, a single-gate structure. It is also possible that some transistors include back gates and the other transistors do not include back gates.

Note that the same applies to a transistor described in other parts of the specification and a transistor illustrated in other drawings, not only to the transistors in FIG. 1A.

A first terminal of the transistor MN1 is electrically connected to a wiring VDE1, a second terminal of the transistor MN1 is electrically connected to a first terminal of the transistor MN2, a first terminal of the transistor MN5, and a first terminal of the transistor MN8, and a first gate of the transistor MN1 is electrically connected to a second gate of the transistor MN1, a first gate of the transistor MN4, and the terminal IT.

A first terminal of the transistor MN3 is electrically connected to a wiring VDE2, a second terminal of the transistor MN3 is electrically connected to a first gate of the transistor MN2, a first terminal of the capacitor C1, a first terminal of the transistor MN4, a first gate of the transistor MN7, and a first gate of the transistor MN10, and a first gate of the transistor MN3 is electrically connected to a second gate of the transistor MN3 and the terminal CLK2.

A second terminal of the transistor MN5 is electrically connected to a first gate of the transistor MN6, a second gate of the transistor MN6, and a first terminal of the capacitor C2, and a first gate of the transistor MN5 is electrically connected to a second gate of the transistor MN5 and a wiring VDE3. A first terminal of the transistor MN6 is electrically connected to the terminal CLK1, a second terminal of the transistor MN6 is electrically connected to a second terminal of the capacitor C2, a first terminal of the transistor MN7, and the terminal OT.

A second terminal of the transistor MN8 is electrically connected to a first gate of the transistor MN9, a second gate of the transistor MN9, and a first terminal of the capacitor C3, and a first gate of the transistor MN8 is electrically connected to a second gate of the transistor MN8 and a wiring VDE4. A first terminal of the transistor MN9 is electrically connected to the terminal PWC, a second terminal of the transistor MN9 is electrically connected to a second terminal of the capacitor C3, a first terminal of the transistor MN10, and the terminal GT.

A second terminal of the transistor MN2 is electrically connected to a wiring VSE1, and a second gate of the transistor MN2 is electrically connected to a wiring BG1. A second terminal of the capacitor C1 is electrically connected to a wiring VSE2. A second terminal of the transistor MN4 is electrically connected to a wiring VSE3, and a second gate of the transistor MN4 is electrically connected to a wiring BG2. A second terminal of the transistor MN7 is electrically connected to a second gate of the transistor MN7 and a wiring VSE4. A second terminal of the transistor MN10 is electrically connected to a second gate of the transistor MN10 and a wiring VSE5.

In FIG. 1A, an electrical connection point between the second terminal of the transistor MN1, the first terminal of the transistor MN2, the first terminal of the transistor MN5, and the first terminal of the transistor MN8 is illustrated as a node N1. Also in FIG. 1A, an electrical connection point between the second terminal of the transistor MN3, the first gate of the transistor MN2, the first terminal of the capacitor C1, the first terminal of the transistor MN4, the first gate of the transistor MN7, and the second gate of the transistor MN10 is illustrated as a node N2.

Each of the wirings VDE1 to VDE4 functions as a wiring supplying a constant potential, for example. The constant voltage can be a high-level potential, for example. Note that the wirings VDE1 to VDE4 may supply the same constant potential or different constant potentials. Alternatively, two or more of the wirings VDE1 to VDE4 may supply the same constant potential, and the other wiring(s) may supply a potential different from the constant potential. Furthermore, the two or more of the wirings VDE1 to VDE4 which supply the same constant potential may be a single wiring. For example, in the case where the wiring VDE1 and wiring VDE2 supply the same constant potential, the wiring VDE1 and the wiring VDE2 may be a single wiring.

One or more of the wirings VDE1 to VDE4 may supply a variable potential, not a constant potential.

Each of the wirings VSE1 to VSE5 functions as a wiring supplying a constant potential, for example. The constant voltage can be, for example, a low-level potential, the ground potential, or a negative potential. Note that the wirings VSE1 to VSE5 may supply the same constant potential or different constant potentials. Alternatively, two or more of the wirings VSE1 to VSE5 may supply the same constant potential, and the other wiring(s) may supply a potential different from the constant potential. Furthermore, the two or more of the wirings VSE1 to VSE5 which supply the same constant potential may be a single wiring. For example, in the case where the wiring VSE1 and wiring VSE2 supply the same constant potential, the wiring VSE1 and the wiring VSE2 may be a single wiring.

One or more of the wirings VSE1 to VSE5 may supply a variable potential, not a constant potential.

Each of the wirings BG1 and BG2 functions as a wiring supplying a constant potential, for example. The constant voltage can be, for example, a low-level potential, the ground potential, or a negative potential. Note that the wirings BG1 and BG2 may supply the same constant potential or different constant potentials. In the case where the wirings BG1 and BG2 supply the same constant potential, the wiring BG1 and the wiring BG2 may be a single wiring.

One or both of the wirings BG1 and BG2 may supply a variable potential, not a constant potential.

Operation Example 1

Here, an operation example of the circuit 100A1 illustrated in FIG. 1A will be described.

Figure 4:
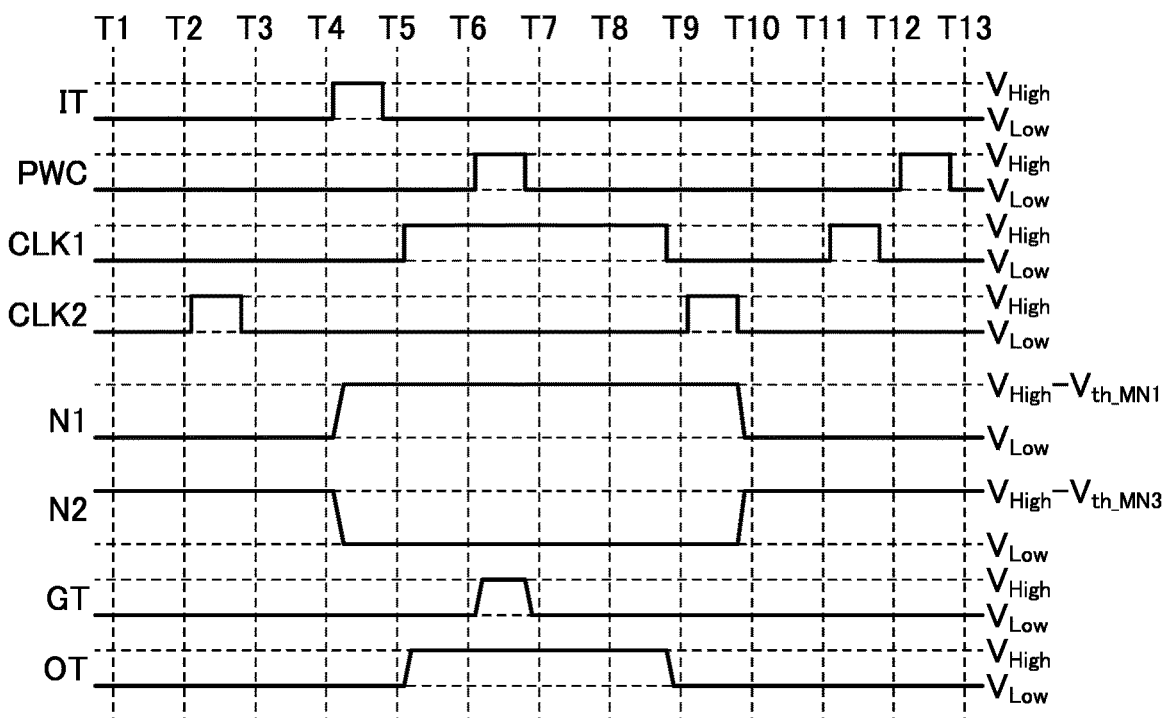
FIG. 4 is a timing chart showing an operation example of a semiconductor device.

FIG. 4 is a timing chart showing an operation example of the circuit 100A1. The timing chart in FIG. 4 shows, as an example, changes in potentials of the terminal IT, the terminal PWC, the terminal CLK1, the terminal CLK2, the node N1, the node N2, the terminal GT, and the terminal OT. In FIG. 4, high- and low-level potentials are expressed as $V_{High}$ and $V_{Low}$, respectively.

To simply describe the operation of the circuit 100A1, the lengths and the like of an input period and an output period of a signal shown in the timing chart in FIG. 4 are different from those in the actual circuit operation in some cases.

In this operation example, the constant potentials supplied by the wirings VDE1 to VDE4 are the same high-level potential ($V_{High}$). The constant potentials supplied by the wirings VSE1 to VSE5 are the same low-level potential ($V_{Low}$). The constant potential supplied by the wiring BG1 is a low-level potential ($V_{LL}$), and the constant potential supplied by the wiring BG2 is the low-level potential ($V_{Low}$). Note that $V_{LL}$ is a potential lower than $V_{Low}$. In particular, $V_{LL}$ is preferably a negative potential.

Note that each of $V_{High}$ and $V_{Low}$ is preferably set such that a difference between $V_{High}$ and $V_{Low}$ is higher than the threshold voltage of each of the transistors MN1 to MN10.

[From Time T1 to Time T2]

In a period from Time T1 to Time T2, $V_{Low}$ is supplied to the terminal IT, $V_{Low}$ is supplied to the terminal PWC, $V_{Low}$ is supplied to the terminal CLK1, and $V_{Low}$ is supplied to the terminal CLK2. At the node N2, $V_{High}-V_{th\_MN3}$ is held as an example. Note that $V_{th\_MN3}$ is a threshold voltage of the transistor MN3.

$V_{Low}$ is supplied from the terminal CLK2 to the first gate of the transistor MN3, $V_{High}$ is supplied from the wiring VDE2 to the first terminal of the transistor MN3, and the potential of the second terminal of the transistor MN3 (the node N2) is $V_{High}-V_{th\_MN3}$. At this time, the potential of the second terminal of the transistor MN3 is lower than that of the first terminal thereof; accordingly, the second terminal of the transistor MN3 serves as a source. A gate-source voltage of the transistor MN3 is $V_{Low}-(V_{High}-V_{th\_MN3})$. When $V_{th\_MN3}$ is a threshold voltage in an appropriate range, $V_{Low}-(V_{High}-V_{th\_MN3})$ is lower than 0 V, whereby the transistor MN3 is turned off.

The potential of the first gate of the transistor MN2 (the node N2) is $V_{High}-V_{th\_MN3}$, and the second terminal of the transistor MN2 is supplied with $V_{Low}$ from the wiring VSE1, whereby the transistor MN2 is turned on. Thus, electrical continuity is established between the node N1 and the wiring VSE1, so that the potential of the node N1 becomes $V_{Low}$.

The potential of the first gate of the transistor MN1 (the terminal IT) is $V_{Low}$ and the potential of the second terminal of the transistor MN1 (the node N1) is $V_{Low}$, whereby the transistor MN1 is turned off.

Furthermore, $V_{High}$ is supplied from the wiring VDE3 to the first gate of the transistor MN5 and the potential of the first terminal of the transistor MN5 (the node N1) is $V_{Low}$, whereby the transistor MN5 is turned on. Thus, electrical continuity is established between the wiring VSE1 and the first gate of the transistor MN6, so that the potential of the first gate of the transistor MN6 becomes $V_{Low}$.

Furthermore, $V_{High}$ is supplied from the wiring VDE4 to the first gate of the transistor MN8 and the potential of the first terminal of the transistor MN8 (the node N1) is $V_{Low}$, whereby the transistor MN8 is turned on. Thus, electrical continuity is established between the wiring VSE1 and the first gate of the transistor MN9, so that the potential of the first gate of the transistor MN9 becomes $V_{Low}$.

The potential of the first gate of the transistor MN7 (the node N2) is $V_{High}-V_{th\_MN3}$, and the second terminal of the transistor MN7 is supplied with $V_{Low}$ from the wiring VSE4, whereby the transistor MN7 is turned on. Thus, electrical continuity is established between the terminal OT and the wiring VSE4, so that the potential of the terminal OT becomes $V_{Low}$.

The potential of the first gate of the transistor MN6 is $V_{Low}$ and the potential of the second terminal of the transistor MN6 (the terminal OT) is $V_{Low}$, whereby the transistor MN6 is turned off.

The potential of the first gate of the transistor MN10 (the node N2) is $V_{High}-V_{th\_MN3}$, and the second terminal of the transistor MN10 is supplied with $V_{Low}$ from the wiring VSE5, whereby the transistor MN10 is turned on. Thus, electrical continuity is established between the terminal GT and the wiring VSE5, so that the potential of the terminal GT becomes $V_{Low}$.

The potential of the first gate of the transistor MN9 is $V_{Low}$ and the potential of the second terminal of the transistor MN9 (the terminal GT) is $V_{Low}$, whereby the transistor MN9 is turned off.

The potential of the first gate of the transistor MN4 (the terminal IT) is $V_{Low}$, and the second terminal of the transistor MN4 is supplied with $V_{Low}$ from the wiring VSE3, whereby the transistor MN4 is turned off.

Here, the case where the transistor MN1, the transistor MN3, the transistor MN4, the transistor MN6, or the transistor MN9, which is off, is normally on is considered.

Note that "normally on" in this specification and the like means a state where a channel exists without application of a voltage to a gate and a current flows through a transistor. Alternatively, "normally on" means a state where a channel exists even when the gate-source voltage is 0 V, and a current flows through a transistor. Furthermore, "normally off" means a state where a current does not flow through a transistor when no potential or the ground potential is applied to a gate. The term "normally off" in an OS transistor means that a current per micrometer of a channel width flowing through a transistor is lower than or equal to $1\times10^{-20}$ A at room temperature, lower than or equal to $1\times10^{-18}$ A at 85° C., or lower than or equal to $1\times10^{-16}$ A at 125° C. when no potential or the ground potential is applied to a gate.

When the transistor MN1 is normally on, a current flows from the wiring VDE1 to the node N1. Thus, the potential of the node N1 may be higher than $V_{Low}$ in some cases. Furthermore, a shoot-through current flows between the wiring VDE1 and the wiring VSE1, and thus the power consumption of the circuit 101A1 becomes high in some cases. Note that even when the transistor MN1 is normally on, the circuit 101A1 sometimes normally operates in the case where the potential of the node N1 does not change largely from $V_{Low}$ (e.g., in the case where a source-drain current of the transistor MN2 is larger than a source-drain current of the transistor MN1).

Since $V_{Low}-(V_{High}-V_{th\_MN3})$, which is the gate-source voltage of the transistor MN3, is lower than the threshold voltage $V_{th\_MN3}$, the transistor MN3 is off even when the transistor MN3 is normally on.

In the case where the transistor MN4 is normally on, current flows from the node N2 to the wiring VSE3. Therefore, the potential of the node N2 is lower than $V_{High}-V_{th\_MN3}$ in some cases. To prevent a decrease in the potential of the node N2, the electrostatic capacitance value of the capacitor C1 is preferably set high, for example. Alternatively, the number of capacitors electrically connected to the node N2 may be increased, for example. For example, it is preferable that the potential of the wiring BG2 electrically connected to the second gate of the transistor MN4 be set low to make the threshold voltage of the transistor MN4 high.

Since the potential of the first terminal of the transistor MN6 is $V_{Low}$ and the potential of the second terminal of the transistor MN6 (the terminal OT) is $V_{Low}$, the potential of the terminal OT does not change even when the transistor MN6 is normally on.

Similarly, since the potential of the first terminal of the transistor MN9 is $V_{Low}$ and the potential of the second terminal of the transistor MN9 (the terminal GT) is $V_{Low}$, the potential of the terminal GT does not change even when the transistor MN9 is normally on.

[From Time T2 to Time T3]

In a period from Time T2 to Time T3, $V_{High}$ is supplied to the terminal CLK2.

In the transistor MN3, $V_{High}$ is supplied from the terminal CLK2 to the first gate of the transistor MN3, and $V_{High}$ is supplied from the wiring VDE2 to the first terminal of the transistor MN3. At this time, for example, when the potential of the second terminal of the transistor MN3 (the node N2) is lower than $V_{High}-V_{th\_MN3}$, the transistor MN3 is turned on, whereby electrical continuity is established between the wiring VDE2 and the node N2.

When the transistor MN3 is on, a current flows from the wiring VDE2 to the node N2; thus, the potential of the node N2 becomes high. Since the threshold voltage of the transistor MN3 is $V_{th\_MN3}$, the transistor MN3 is turned off when the potential of the node N2 (the second terminal of the transistor MN3) increases up to $V_{High}-V_{th\_MN3}$.

In the period from Time T2 to Time T3, after $V_{High}$ is supplied to the terminal CLK2, $V_{Low}$ is supplied to the terminal CLK2. Thus, the gate-source voltage of the transistor MN3 becomes $V_{Low}-(V_{High}-V_{th\_MN3})$, and the transistor MN3 is turned off when $V_{th\_MN3}$ is a threshold voltage in an appropriate range.

By the above operation, in the circuit 100A1, $V_{High}$ is supplied to the terminal CLK2, whereby the potential of the node N2 can be refreshed to be $V_{High}-V_{th\_MN3}$.

[From Time T3 to Time T4]

In a period from Time T3 to Time T4, $V_{Low}$ is supplied to the terminal IT, $V_{Low}$ is supplied to the terminal PWC, $V_{Low}$ is supplied to the terminal CLK1, and $V_{Low}$ is supplied to the terminal CLK2. Potentials input to the terminal IT, the terminal PWC, the terminal CLK1, and the terminal CLK2 in the period from Time T3 to Time T4 are equal to those in the period from Time T1 to Time T2; therefore, for an operation example of the circuit 100A1 in the period from Time T3 to Time T4, the description of the operation example in the period from Time T1 to Time T2 is referred to.

[From Time T4 to Time T5]

In a period from Time T4 to Time T5, $V_{High}$ is supplied to the terminal IT.

$V_{High}$ is supplied from the terminal IT to the first gate of the transistor MN4, and $V_{Low}$ is supplied from the wiring VSE3 to the second terminal of the transistor MN4, whereby the transistor MN4 is turned on. Thus, electrical continuity is established between the node N2 and the wiring VSE3, so that the potential of the node N2 changes from $V_{High}-V_{th\_MN3}$ to $V_{Low}$.

In the above manner, the potential of the first gate of the transistor MN2 (the node N2) is $V_{Low}$ and $V_{Low}$ is supplied from the wiring VSE1 to the second terminal of the transistor MN2, whereby the transistor MN2 is turned off.

In the above manner, the potential of the first gate of the transistor MN7 (the node N2) is $V_{Low}$ and $V_{Low}$ is supplied from the wiring VSE4 to the second terminal of the transistor MN7, whereby the transistor MN7 is turned off.

In the above manner, the potential of the first gate of the transistor MN10 (the node N2) is $V_{Low}$ and $V_{Low}$ is supplied from the wiring VSE5 to the second terminal of the transistor MN10, whereby the transistor MN10 is turned off.

$V_{High}$ is supplied from the terminal IT to the first gate of the transistor MN1, $V_{High}$ is supplied from the wiring VDE1 to the first terminal of the transistor MN1, and the potential of the second terminal of the transistor MN1 (the node N2) is $V_{Low}$. At this time, the transistor MN1 is turned on, so that electrical continuity is established between the wiring VDE1 and the node N1.

When the transistor MN1 is on, a current flows from the wiring VDE1 to the node N1; thus, the potential of the node N1 becomes high. The transistor MN1 is turned off when the threshold voltage of the transistor MN1 is $V_{th\_MN1}$ and the potential of the node N1 (the second terminal of the transistor MN1) increases up to $V_{High}-V_{th\_MN1}$.

Since $V_{High}$ is input to the terminal IT in the period from Time T4 to Time T5, in the case where the potential of the node N1 (the second terminal of the transistor MN1), $V_{High}-V_{th\_MN1}$, decreases for some reason, the transistor MN1 is turned on again and a current flows from the wiring VDE1 to the node N1, so that the potential of the node N1 (the second terminal of the transistor MN1) increases up to $V_{High}-V_{th\_MN1}$. When the potential of the second terminal of the transistor MN1 increases to $V_{High}-V_{th\_MN1}$, the transistor MN1 is turned off again.

In the transistor MN5, $V_{High}$ is supplied from the wiring VDE3 to the first gate of the transistor MN5, $V_{High}-V_{th\_MN1}$ is supplied to the first terminal of the transistor MN5 (the node N1), and the potential of the second terminal of the transistor MN5 is $V_{Low}$. At this time, the potential of the second terminal of the transistor MN5 is lower than the potential of the first terminal thereof, so that the second terminal of the transistor MN5 serves as a source, and the transistor MN5 is turned on. Thus, electrical continuity is established between the node N1 and the first gate of the transistor MN6.

When the transistor MN5 is on, a current flows from the node N1 to the first gate of the transistor MN6; thus, the potential of the first gate of the transistor MN6 becomes high. Here, in the case where the threshold voltage of the transistor MN5 is $V_{th\_MN5}$ and $V_{th\_MN5}$ is, for example, a threshold voltage higher than or equal to $V_{th\_MN1}$, the transistor MN5 is turned off when the potential of the first gate of the transistor MN6 increases to $V_{High}-V_{th\_MN5}$. In contrast, for example, when $V_{th\_MN5}$ is a threshold voltage lower than $V_{th\_MN1}$, the potential of the first gate of the transistor MN6 increases up to $V_{High}-V_{th\_MN1}$. At this time, the gate-source voltage $V_{High}-(V_{High}-V_{th\_MN1})=V_{th\_MN1}$ is higher than the threshold voltage $V_{th\_MN5}$ of the transistor MN5, so that the transistor MN5 is turned on. Note that in this operation example with this configuration example, the transistor MN5 is preferably off in the period from Time T4 to Time T5. In other words, $V_{th\_MN5}$ is preferably a threshold voltage higher than or equal to $V_{th\_MN1}$. Furthermore, $V_{th\_MN5}$ is preferably a threshold voltage value which does not make the transistor normally-on. In this operation example, the case where the potential of the second terminal of the transistor MN5 (the first gate of the transistor MN6) reaches $V_{High}-V_{th\_MN5}$ (the case where $V_{th\_MN5}$ is higher than or equal to $V_{th\_MN1}$) is described.

The potential of the first gate of the transistor MN6 is $V_{High}-V_{th\_MN5}$, $V_{Low}$ is supplied from the terminal CLK1 to the first terminal of the transistor MN6, and the potential of the second terminal of the transistor MN6 is $V_{Low}$. At this time, the first or the second terminal of the transistor MN6 serves as a source, and the transistor MN6 is turned on. Thus, electrical continuity is established between the terminal CLK1 and the terminal OT. Since $V_{Low}$ is supplied to the terminal CLK1 before Time T4, the potential of the second terminal of the transistor MN6 (the terminal OT) remains $V_{Low}$ and does not change.

$V_{High}$ is supplied from the wiring VDE4 to the first gate of the transistor MN8, $V_{High}-V_{th\_MN1}$ is supplied to the first terminal of the transistor MN8 (the node N1), and the potential of the second terminal of the transistor MN8 is $V_{Low}$. At this time, the potential of the second terminal of the transistor MN8 is lower than the potential of the first terminal thereof, so that the second terminal of the transistor MN8 serves as a source, and the transistor MN8 is turned on. Thus, electrical continuity is established between the node N1 and the first gate of the transistor MN9.

When the transistor MN8 is on, a current flows from the node N1 to the first gate of the transistor MN9; thus, the potential of the first gate of the transistor MN9 becomes high. Here, in the case where the threshold voltage of the transistor MN8 is $V_{th\_MN8}$ and $V_{th\_MN8}$ is, for example, a threshold voltage higher than or equal to $V_{th\_MN1}$, the transistor MN8 is turned off when the potential of the first gate of the transistor MN9 increases to $V_{High}-V_{th\_MN8}$. In contrast, for example, when $V_{th\_MN8}$ is a threshold voltage lower than $V_{th\_MN1}$, the potential of the first gate of the transistor MN9 increases up to $V_{High}-V_{th\_MN1}$. At this time, the gate-source voltage $V_{High}-(V_{High}-V_{th\_MN1})=V_{th\_MN1}$ is higher than the threshold voltage $V_{th\_MN8}$ of the transistor MN8, so that the transistor MN8 is turned on. Note that in this operation example with this configuration example, the transistor MN8 is preferably off in the period from Time T4 to Time T5. In other words, $V_{th\_MN8}$ is preferably a threshold voltage higher than or equal to $V_{th\_MN1}$. Furthermore, $V_{th\_MN8}$ is preferably a threshold voltage value which does not make the transistor normally-on. In this operation example, the case where the potential of the second terminal of the transistor MN8 (the first gate of the transistor MN9) reaches $V_{High}-V_{th\_MN8}$ (the case where $V_{th\_MN8}$ is higher than or equal to $V_{th\_MN1}$) is described.

The potential of the first gate of the transistor MN9 is $V_{High}-V_{th\_MN8}$, $V_{Low}$ is supplied from the terminal PWC to the first terminal of the transistor MN9, and the potential of the second terminal of the transistor MN9 is $V_{Low}$. At this time, the first or the second terminal of the transistor MN9 serves as a source, and the transistor MN9 is turned on. Thus, electrical continuity is established between the terminal PWC and the terminal GT. Since $V_{Low}$ is supplied to the terminal PWC before Time T4, the potential of the terminal OT remains $V_{Low}$ and does not change.

In the period from Time T4 to Time T5, after $V_{High}$ is supplied to the terminal IT, $V_{Low}$ is supplied to the terminal IT. Thus, the gate-source voltage of the transistor MN1 becomes $V_{Low}-(V_{High}-V_{th\_MN1})$, and the transistor MN1 is turned off when $V_{th\_MN1}$ is a threshold voltage in an appropriate range.

$V_{Low}$ is supplied from the terminal IT to the first gate of the transistor MN4, and $V_{Low}$ is supplied from the wiring VSE3 to the second terminal of the transistor MN4, whereby the transistor MN4 is turned off. Thus, the potential $V_{Low}$ is held in the node N2.

[From Time T5 to Time T6]

In a period from Time T5 to Time T6, $V_{High}$ is supplied to the terminal CLK1.

The potential of the first gate of the transistor MN6 is $V_{High}-V_{th\_MN5}$, $V_{High}$ is supplied from the terminal CLK1 to the first terminal of the transistor MN6, and the potential of the second terminal of the transistor MN6 is $V_{Low}$. When the threshold voltage of the transistor MN6 is $V_{th\_MN6}$, the gate-source voltage of the transistor MN6, $V_{High}-V_{Low}-V_{th\_MN5}$, is higher than the threshold voltage $V_{th\_MN6}$ of the transistor MN6, whereby the transistor MN6 is turned on. Thus, electrical continuity is established between the terminal CLK1 and the terminal OT.

When the transistor MN6 is on, a current flows from the terminal CLK1 to the terminal OT; thus, the potential of the second terminal of the transistor MN6 (the terminal OT) becomes high. When the potential of the second terminal of the transistor MN6 (the terminal OT) becomes high, the potential of the first gate of the transistor MN6 also becomes high due to capacitive coupling by the capacitor C2. Accordingly, the potential of the second terminal of the transistor MN6 (the terminal OT) becomes higher than $V_{High}-V_{th\_MN6}$, and eventually equals to the potential $V_{High}$ supplied by the terminal CLK1 in this operation example. The potential of the first gate of the transistor MN6 at this time increases up to $(V_{High}-V_{th\_MN5})+(V_{High}-V_{Low})=2V_{High}-V_{Low}-V_{th\_MN5}$. Note that in this operation example, increasing a gate potential of a transistor with an increase in a potential of a first or a second terminal of the transistor by utilizing capacitive coupling in such a manner is called bootstrap.

Here, the case where the transistor MN1, the transistor MN3, or the transistor MN4, which is off in the period from Time T5 to Time T6, is normally on is considered.

In the transistor MN1, the gate-source voltage of the transistor MN1, $V_{Low}-(V_{High}-V_{th\_MN1})$, is lower than the threshold voltage $V_{th\_MN1}$, and thus the transistor MN1 is off even when the transistor MN1 is normally on.

When the transistor MN3 is normally on, a current flows from the wiring VDE2 to the node N2. For this reason, the potential of the node N2 is higher than $V_{Low}$ in some cases. The increase in the potential of the node N2 sometimes brings an increase in the potential of the first gate of the transistor MN2. Note that even when the transistor MN3 is normally on, in the case where the potential of the node N2 becomes slightly higher than $V_{Low}$, the gate-source voltage of the transistor MN3 becomes lower than or equal to the threshold voltage and the transistor MN3 is turned off in some cases. Furthermore, in the case where the threshold voltage of the transistor MN2 is sufficiently high, the transistor MN2 can be kept off even when the potential of the node N2 increases because of the influence of the normally-on characteristics of the transistor MN3; as a result, the circuit 101A1 operates normally in some cases.

In the transistor MN4, the potential of the first terminal of the transistor MN4 (the node N2) is $V_{Low}$ and the potential of the second terminal of the transistor MN4 (the wiring VSE3) is $V_{Low}$; thus, the potential of the node N2 does not change even when the transistor MN4 is normally on.

[From Time T6 to Time T7]

In a period from Time T6 to Time T7, $V_{High}$ is supplied to the terminal PWC.

The potential of the first gate of the transistor MN9 is $V_{High}-V_{th\_MN8}$, $V_{High}$ is supplied from the terminal PWC to the first terminal of the transistor MN9, and the potential of the second terminal of the transistor MN9 is $V_{Low}$. When the threshold voltage of the transistor MN9 is $V_{th\_MN9}$, the gate-source voltage of the transistor MN9, $V_{High}-V_{Low}-V_{th\_MN8}$, is higher than the threshold voltage $V_{th\_MN9}$ of the transistor MN9, whereby the transistor MN9 is turned on. Thus, electrical continuity is established between the terminal PWC and the terminal GT.

When the transistor MN9 is on, a current flows from the terminal PWC to the terminal GT; thus, the potential of the second terminal of the transistor MN9 (the terminal GT) becomes high. When the potential of the second terminal of the transistor MN9 (the terminal GT) becomes high, the potential of the first gate of the transistor MN9 also becomes high due to capacitive coupling by the capacitor C3. By this bootstrap, the potential of the second terminal of the transistor MN9 (the terminal GT) becomes higher than $V_{High}-V_{th\_MN8}$, and eventually equals to the potential $V_{High}$ supplied by the terminal PWC in this operation example. The potential of the first gate of the transistor MN9 at this time increases up to $(V_{High}-V_{th\_MN8})+(V_{High}-V_{Low})=2V_{High}-V_{Low}-V_{th\_MN8}$.

In the period from Time T6 to Time T7, after $V_{High}$ is supplied to the terminal PWC, $V_{Low}$ is supplied thereto. Thus, the potential of the second terminal of the transistor MN9 (the terminal GT) becomes $V_{Low}$ as in the operation example in the period from Time T5 to Time T6, and the gate-source voltage becomes $V_{High}-V_{th\_MN8}$.

For the case where the transistor MN1, the transistor MN3, or the transistor MN4, which is off in the period from Time T6 to Time T7, is normally on, the description of the operation example in the period from Time T5 to Time T6 is referred to.

[From Time T8 to Time T9]

In a period from Time T8 to Time T9, $V_{Low}$ is supplied to the terminal CLK1.

The potential of the first gate of the transistor MN6 is $2V_{High}-V_{Low}-V_{th\_MN5}$, $V_{Low}$ is supplied from the terminal CLK1 to the first terminal of the transistor MN6, and the potential of the second terminal of the transistor MN6 is $V_{High}$. At this time, the potential of the first terminal of the transistor MN6 is lower than the potential of the second terminal thereof, so that the first terminal of the transistor MN6 serves as a source, and the transistor MN6 is turned on. Thus, electrical continuity is established between the terminal CLK1 and the terminal OT.

When the transistor MN6 is on, a current flows from the terminal OT to the terminal CLK1; thus, the potential of the terminal OT becomes low. The potential of the terminal OT eventually equals to the potential $V_{Low}$ supplied by the terminal CLK1 in this operation example. Therefore, the potential of the first gate of the transistor MN6 decreases to $V_{High}-V_{th\_MN5}$.

[From Time T9 to Time T10]

In a period from Time T9 to Time T10, $V_{High}$ is supplied to the terminal CLK2. At this time, operation of the circuit 101A1 in the period from Time T9 to Time T10 is the same as that in the period from Time T2 to Time T3.

For example, when $V_{High}$ is supplied to the terminal CLK2, the transistor MN3 is turned on, and the potential of the node N2 changes from $V_{Low}$ to $V_{High}-V_{th\_MN3}$. Thus, the transistor MN2, the transistor MN7, and the transistor MN10 are turned on, and each of the potentials of the node N1, the terminal OT, and the terminal GT becomes $V_{Low}$.

Furthermore, the potential of the node N1 decreases to $V_{Low}$, whereby the transistor MN5 and the transistor MN8 are turned on. Accordingly, each of the potentials of the second terminal of the transistor MN5 (the first gate of the transistor MN6) and the second terminal of the transistor MN8 (the first gate of the transistor MN9) decreases to $V_{Low}$.

As a result, each of the potentials of the first terminal and the second terminal of the transistor MN5 becomes $V_{Low}$, and similarly, each of the potentials of the first terminal and the second terminal of the transistor MN8 becomes $V_{Low}$.

[After Time T10]

After Time T10, for example, a variable potential with $V_{Low}$ is input to the terminal CLK2 to set the potential of the node N1 to $V_{Low}$ and the potential of the node N2 to $V_{High}-V_{th\_MN3}$, and after that, $V_{High}$ is supplied to the terminal CLK1 or the terminal PWC without input of $V_{High}$ to the terminal IT. A specific operation example is described below.

[From Time T11 to Time T12]

In a period from Time T11 to Time T12, $V_{High}$ is supplied to the terminal CLK1.

The potential of the first gate of the transistor MN6 is $V_{Low}$, $V_{High}$ is supplied from the terminal CLK1 to the first terminal of the transistor MN6, and the potential of the second terminal of the transistor MN6 is $V_{Low}$. At this time, the potential of the second terminal of the transistor MN6 is lower than the potential of the first terminal thereof, so that the second terminal of the transistor MN6 serves as a source, and the transistor MN6 is turned off. Thus, electrical continuity is not established between the terminal CLK1 and the terminal OT.

The potential of the first gate of the transistor MN7 is $V_{High}-V_{th\_MN3}$, and the second terminal of the transistor MN7 is supplied with $V_{Low}$ from the wiring VSE4, whereby the transistor MN7 is turned on. Thus, electrical continuity is established between the terminal OT and the wiring VSE4, so that the potential of the terminal OT becomes $V_{Low}$.

In the period from Time T11 to Time T12, after $V_{High}$ is supplied to the terminal CLK1, $V_{Low}$ is supplied to the terminal CLK1. The potential of the first gate of the transistor MN6 is $V_{Low}$, the first terminal of the transistor MN6 is supplied with $V_{Low}$ from the terminal CLK1, and the potential of the second terminal of the transistor MN6 is $V_{Low}$; thus, the transistor MN6 is turned off when the threshold voltage of the transistor MN6 is in an appropriate range.

The transistor MN6 remains off even when the variable potential with $V_{Low}$ is input to the terminal CLK2 to set the potential of the node N1 to $V_{Low}$ and the potential of the node N2 to $V_{High}-V_{th\_MN3}$, and then $V_{High}$ is supplied to the terminal CLK1 without input of $V_{High}$ to the terminal IT as described above. After that, even when $V_{Low}$ is supplied to the terminal CLK1, the transistor MN6 remains off.

[From Time T12 to Time T13]

In a period from Time T12 to Time T13, $V_{High}$ is supplied to the terminal PWC.

The potential of the first gate of the transistor MN9 is $V_{Low}$, $V_{High}$ is supplied from the terminal PWC to the first terminal of the transistor MN9, and the potential of the second terminal of the transistor MN9 is $V_{Low}$. At this time, the potential of the second terminal of the transistor MN9 is lower than the potential of the first terminal thereof, so that the second terminal of the transistor MN9 serves as a source and the transistor MN9 is turned off. Thus, electrical continuity is not established between the terminal PWC and the terminal GT.

The potential of the first gate of the transistor MN10 is $V_{High}-V_{th\_MN3}$, and the second terminal of the transistor MN10 is supplied with $V_{Low}$ from the wiring VSE5, whereby the transistor MN10 is turned on. Thus, electrical continuity is established between the terminal GT and the wiring VSE5, so that the potential of the terminal GT becomes $V_{Low}$.

In the period from Time T12 to Time T13, after $V_{High}$ is supplied to the terminal PWC, $V_{Low}$ is supplied thereto. The potential of the first gate of the transistor MN9 is $V_{Low}$, the first terminal of the transistor MN9 is supplied with $V_{Low}$ from the terminal PWC, and the potential of the second terminal of the transistor MN9 is $V_{Low}$, whereby the transistor MN9 is turned off.

The transistor MN9 remains off even when the variable potential with $V_{Low}$ is input to the terminal CLK2 to set the potential of the node N1 to $V_{Low}$ and the potential of the node N2 to $V_{High}-V_{th\_MN3}$, and then $V_{High}$ is supplied to the terminal PWC without input of $V_{High}$ to the terminal IT as described above. After that, even when $V_{Low}$ is supplied to the terminal PWC, the transistor MN9 remains off.

<<Comparison 1>>

Figure 5:
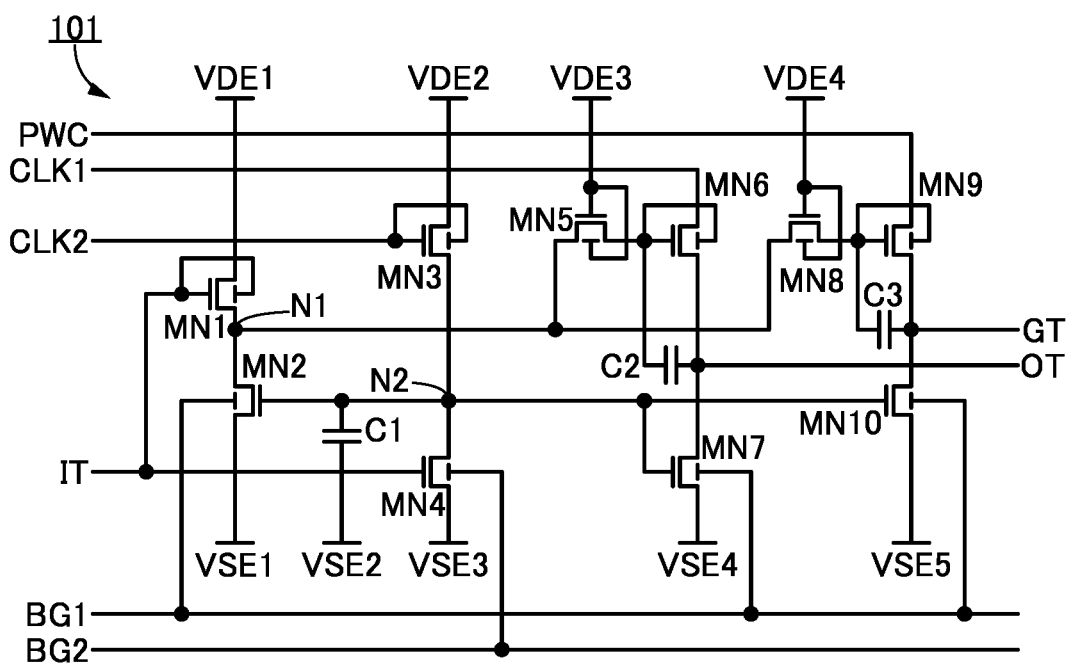
FIG. 5 is a circuit diagram illustrating a configuration example of a semiconductor device.

Here, the circuit 100A1 is compared with the circuit 101 in FIG. 5.

The circuit configuration of the circuit 101 in FIG. 5 underlies the development into the circuit 100A1 in FIG. 7A and circuits and the like described later in Configuration examples 2 to 8. For example, when the circuit configurations of the circuit 101 and the circuit 100A1 are compared, in the circuit 100A1, the second gate of the transistor MN7 is electrically connected to the second terminal of the transistor MN7 and the second gate of the transistor MN10 is electrically connected to the second terminal of the transistor MN10; in the circuit 101, the second gate of the transistor MN7 is electrically connected to the wiring BG1 and the second gate of the transistor MN10 is electrically connected to the wiring BG1.

The operation example of the circuit 100A1 described above can be applied to the operation of the circuit 101.

Here, the case where the transistor MN7 or the transistor MN10, which is off in the period from Time T5 to Time T6 in the above operation example, is normally on is considered.

When the transistor MN7 is normally on in the circuit 101, a current flows from the terminal OT to the wiring VSE4. Thus, the potential of the terminal OT may be lower than $V_{High}$ in some cases. Furthermore, a shoot-through current flows between the terminal CLK1 and the wiring VSE4, and thus the power consumption of the circuit 101 becomes high in some cases. Note that even when the transistor MN7 is normally on, the circuit 101 sometimes normally operates in the case where the potential of the terminal OT does not change largely from $V_{High}$ (e.g., in the case where a source-drain current of the transistor MN6 is larger than a source-drain current of the transistor MN7).

In the circuit 101, since the potential of the first terminal of the transistor MN10 (the terminal GT) is $V_{Low}$ and the potential of the second terminal of the transistor MN10 (the wiring VSE5) is $V_{Low}$, the potential of the terminal GT does not change even when the transistor MN10 is normally on.

In the circuit 101 in FIG. 5, each of the second gates of the transistor MN2, the transistor MN7, and the transistor MN10 is electrically connected to the wiring BG1. For this reason, in the case where, for example, a negative potential ($V_{LL}$) is supplied to the wiring BG1 in order to make the transistor MN2 normally-off, the transistor MN7 and the transistor MN10 also become normally off in some cases. As described above, the circuit 101 operates normally in some cases even when the transistor MN7 and the transistor MN10 are normally on, and thus the negative potential is not necessarily supplied from the wiring BG1 to the second gates of the transistor MN7 and the transistor MN10. Furthermore, in the case where the transistor MN7 and the transistor MN10 are normally off, the amounts of currents flowing through the transistors MN7 and MN10 when the transistors MN7 and MN10 are on are small in some cases, which might lower the driving speed of the circuit 101. Therefore, potentials supplied to the second gates of the transistor MN7 and the transistor MN10 are preferably different from the potential supplied to the second gate of the transistor MN2.

In the circuit 100A1 in FIG. TA, the second gate of the transistor MN7 is electrically connected to the wiring VSE4 and the second gate of the transistor MN10 is electrically connected to the wiring VSE5; thus, a potential as low as the negative potential supplied from the wiring BG1 can be prevented from being supplied to the second gates of the transistors MN7 and MN10. Accordingly, in the circuit 100A1, only the transistor MN2 among the transistors MN2, MN7, and MN10 can be normally off, which is different from the circuit 101. Therefore, the amounts of currents flowing through the transistors MN7 and MN10 in the on state can be larger in the circuit 100A1 than in the circuit 101. Accordingly, when the circuit 100A1 in FIG. TA is employed for each of the circuits 100[1] to 100[*m*] in the driver circuit GD in FIG. 3A or FIG. 3B, the driving speed of the driver circuit GD can be higher than that in the case where the circuit 101 in FIG. 5 is employed.

The configuration of the semiconductor device of one embodiment of the present invention is not limited to the configuration in FIG. TA. For example, the configuration of the semiconductor device of one embodiment of the present invention may be modified in accordance with circumstances as long as an object of one embodiment of the present invention is achieved.

Figure 1B:
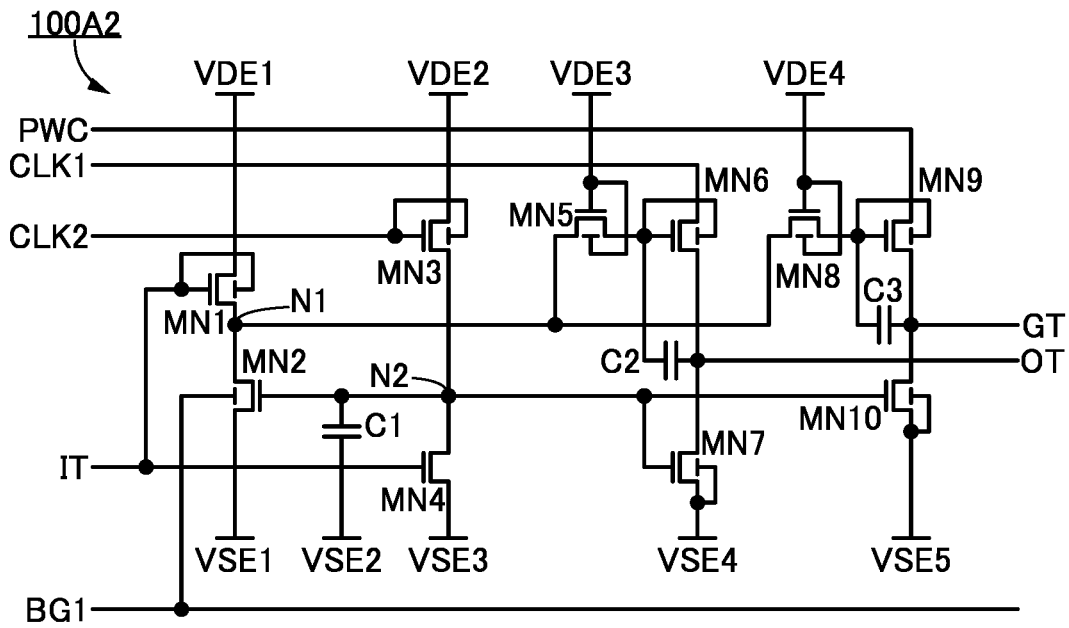

For example, in the case where the potential of the node N2 can be sufficiently held in the capacitor C1 in the circuit 100A1 in FIG. TA, the configuration of the circuit 100A1 can be changed to the configuration of a circuit 100A2 in FIG. 1B where the transistor MN4 does not have the second gate.

Figure 6A:
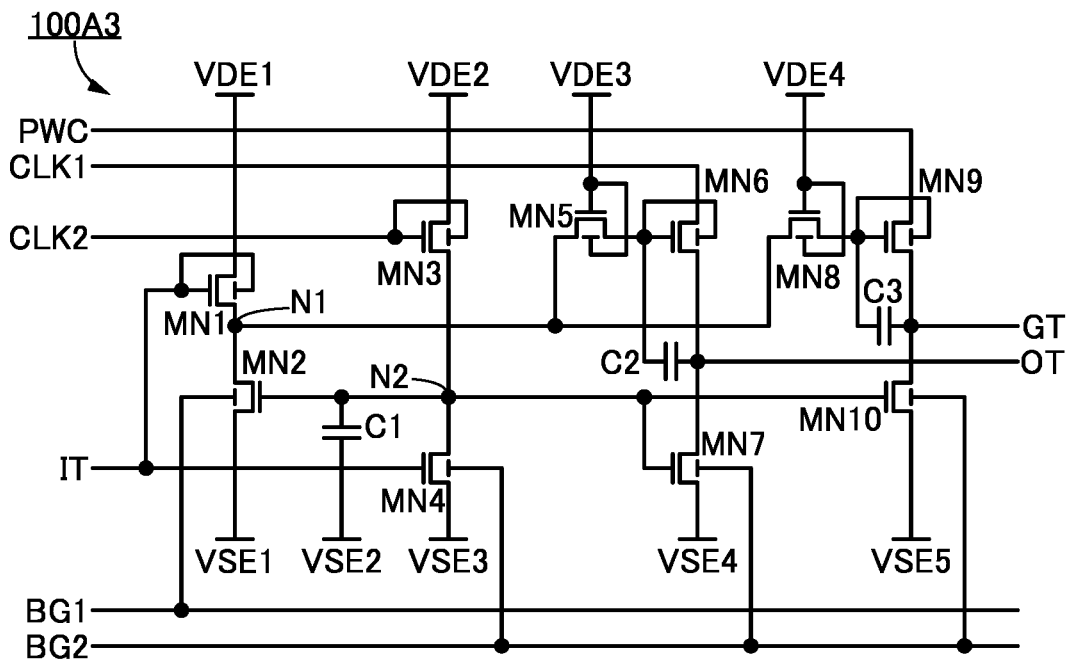
FIGS. 6A and 6B are circuit diagrams each illustrating a configuration example of a semiconductor device.

For example, the configuration of the circuit 100A1 in FIG. TA may be modified to the configuration of a circuit 100A3 in FIG. 6A. The circuit 100A3 in FIG. 6A is different from the circuit 100A1 in FIG. TA in that the second gate of the transistor MN7 is electrically connected to the wiring BG2 and the second gate of the transistor MN10 is electrically connected to the wiring BG2.

In the circuit 100A3 in FIG. 6A, the second gate of the transistor MN2 is electrically connected to the wiring BG1, and each of the second gates of the transistors MN7 and MN10 is electrically connected to the wiring BG2; thus, for example, even when a constant potential is supplied to the wiring BG1, the constant potential is not supplied to the second gates of the transistors MN7 and MN10. That is, the threshold voltage of the transistor MN2 can be controlled independently of the threshold voltages of the transistors MN7 and MN10. With this configuration, for example, when a negative potential is supplied to the second gate of the transistor MN2 and the ground potential or a low-level potential (a potential higher than the negative potential) is supplied to the second gates of the transistors MN7 and MN10, the amounts of off-state currents of the transistors MN7 and MN10 can be larger than the amount of an off-state current of the transistor MN2. Accordingly, as in the case where the circuit 100A1 in FIG. 1A is employed, in the case where the circuit 100A3 in FIG. 6A is employed for each of the circuits 100[1] to 100[*m*] in the driver circuit GD in FIG. 3A or FIG. 3B, the driving speed of the driver circuit GD can be increased.

Figure 6B:
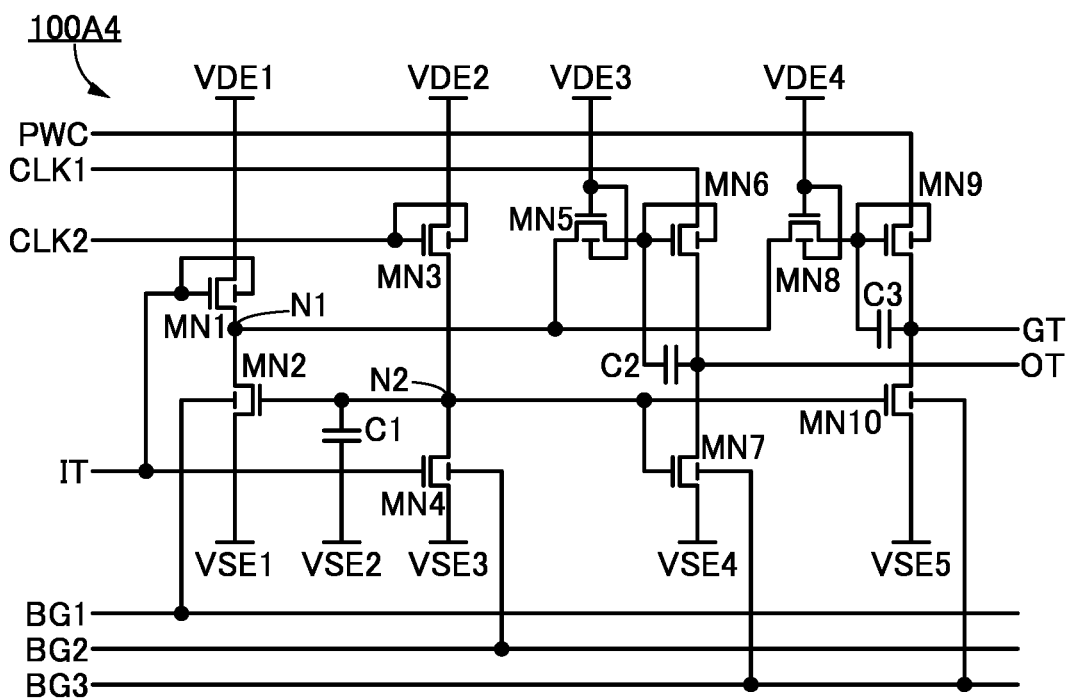

Furthermore, for example, the configuration of the circuit 100A1 in FIG. 1A may be modified to the configuration of a circuit 100A4 in FIG. 6B. In the circuit 100A4 in FIG. 6B, each of the second gates of the transistors MN7 and MN3 is electrically connected to the wiring BG3.

Like the wirings BG1 and BG2, the wiring BG3 functions as a wiring supplying a constant potential, for example. The constant voltage can be, for example, a low-level potential, the ground potential, or a negative potential. The wiring BG3 may supply a variable potential, not a constant potential.

Also in the circuit 100A4 in FIG. 6B, as in the circuit 100A3 in FIG. 6A, the threshold voltage of the transistor MN2 can be controlled independently of the threshold voltages of the transistors MN7 and MN10. With this configuration, for example, when a negative potential is supplied from the wiring BG1 to the second gate of the transistor MN2 and the ground potential or a low-level potential (a potential higher than the negative potential) is supplied from the wiring BG3 to the second gates of the transistors MN7 and MN10, the amounts of off-state currents of the transistors MN7 and MN10 can be larger than the amount of an off-state current of the transistor MN2. Accordingly, as in the case where the circuit 100A1 in FIG. TA is employed, in the case where the circuit 100A4 in FIG. 6A is employed for each of the circuits 100[1] to 100[*m*] in the driver circuit GD in FIG. 3A or FIG. 3B, the driving speed of the driver circuit GD can be increased.

Configuration Example 2

Next, an example of configuration of a circuit applicable to the circuits 100[1] to 100[*m*] in each of the driver circuits GD in FIGS. 3A and 3B, which is different from the circuits described in Configuration example 1, will be described.

Figure 7A:
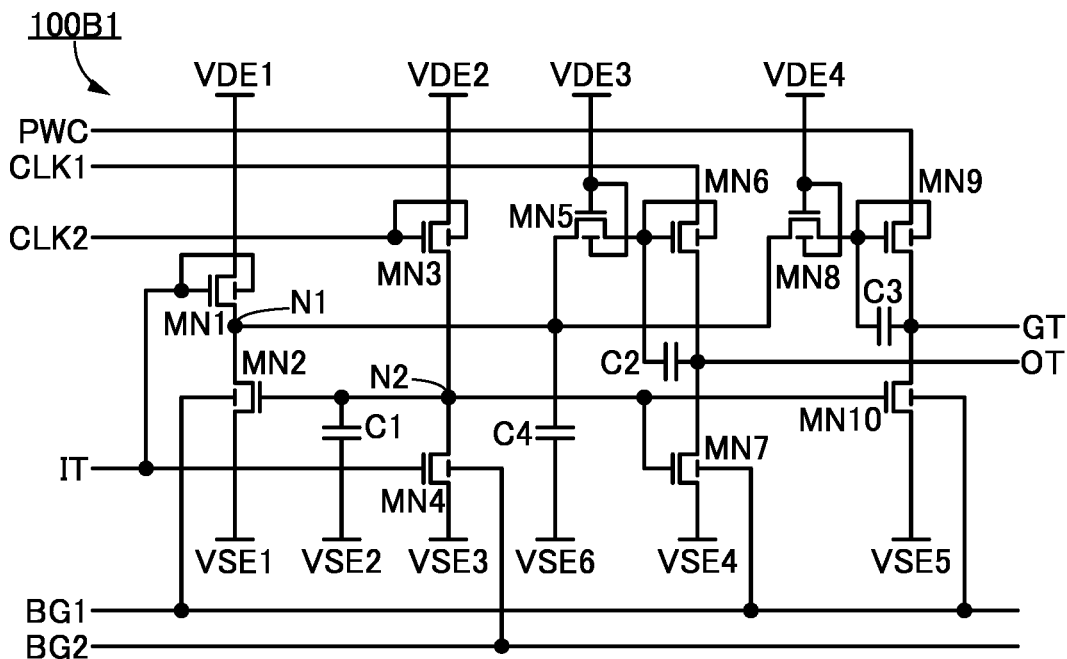
FIGS. 7A and 7B are circuit diagrams each illustrating a configuration example of a semiconductor device.

FIG. 7A illustrates a configuration example of a circuit applicable to the circuits 100[1] to 100[*m*], which are semiconductor devices of one embodiment of the present invention, in each of the driver circuits GD in FIGS. 3A and 3B. A circuit 100B1 has a configuration modified from that of the circuit 100A1 in FIG. TA, and is different from the circuit 100A1 in including a capacitor C4.

Although each of the second gates of the transistors MN7 and MN10 is electrically connected to the wiring BG1 in the circuit 100B1, the connection destination of the second gates of the transistors MN7 and MN10 in the circuit 100B1 may be changed to match any one of the configurations of the circuit 100A1 in FIG. TA, the circuit 100A3 in FIG. 6A, and the circuit 100A4 in FIG. 6B.

A first terminal of the capacitor C4 is electrically connected to the second terminal of the transistor MN1, the first terminal of the transistor MN2, the first terminal of the transistor MN5, and the first terminal of the transistor MN8, for example. A second terminal of the capacitor C4 is electrically connected to a wiring VSE6, for example.

Like the wirings VSE1 to VSE5, the wiring VSE6 functions as a wiring supplying a constant potential, for example. The constant voltage can be, for example, a low-level potential, the ground potential, or a negative potential. In the case where the constant potential supplied by the wiring VSE6 is the same as a potential supplied by at least one of the wirings VSE1 to VSE5, the wiring VSE6 and the wiring may be a single wiring.

The wiring VSE6 may supply a variable potential, not a constant potential.

The operation example of the circuit 100A1 described above can be applied to the operation of the circuit 100B1.

<<Comparison 2>>

Here, differences in configuration and operation between the circuit 100B1 in FIG. 7A and the above-described circuit 101 in FIG. 5 are described as in Configuration example 1.

As described above, the circuit 100B1 in FIG. 7A includes the capacitor C4, while the circuit 101 in FIG. 5 does not include the capacitor C4.

The case where the transistor MN2, which is off in the period from Time T5 to Time T6 in the above operation example, is normally on is considered.

When the transistor MN2 is normally on in the circuit 101, a current flows from the node N1 to the wiring VSE1. Thus, the potential of the node N1 may be lower than $V_{High}-V_{th\_MN1}$ in some cases. In particular, in the case where the potential of the node N1 becomes lower than $V_{High}-V_{th\_MN1}$, one or both of the transistors MN5 and MN8 are turned on, and one or both of the potentials of the first gates of the transistors MN6 and MN9 decrease; as a result, the effect of the bootstrap described above might be small. Thus, the circuit 101 does not operate normally in some cases.

In contrast, in the circuit 100B1 in FIG. 7A, the first terminal of the capacitor C4 is electrically connected to the second terminal of the transistor MN1, the first terminal of the transistor MN2, the first terminal of the transistor MN5, and the first terminal of the transistor MN8; thus, the potential of the first terminal of the capacitor C4 (the node N1) is less likely to decrease in the case where the transistor MN2 is normally on. Accordingly, the circuit 100B1 can operate more stably than the circuit 101.

Accordingly, when the circuit 100B1 in FIG. 7A is employed for each of the circuits 100[1] to **100[*m*] in the driver circuit GD in FIG. 3A or FIG. 3B, the driver circuit GD can operate more stably than that in the case where the circuit 101 in FIG. 5** is employed.

Figure 7B:
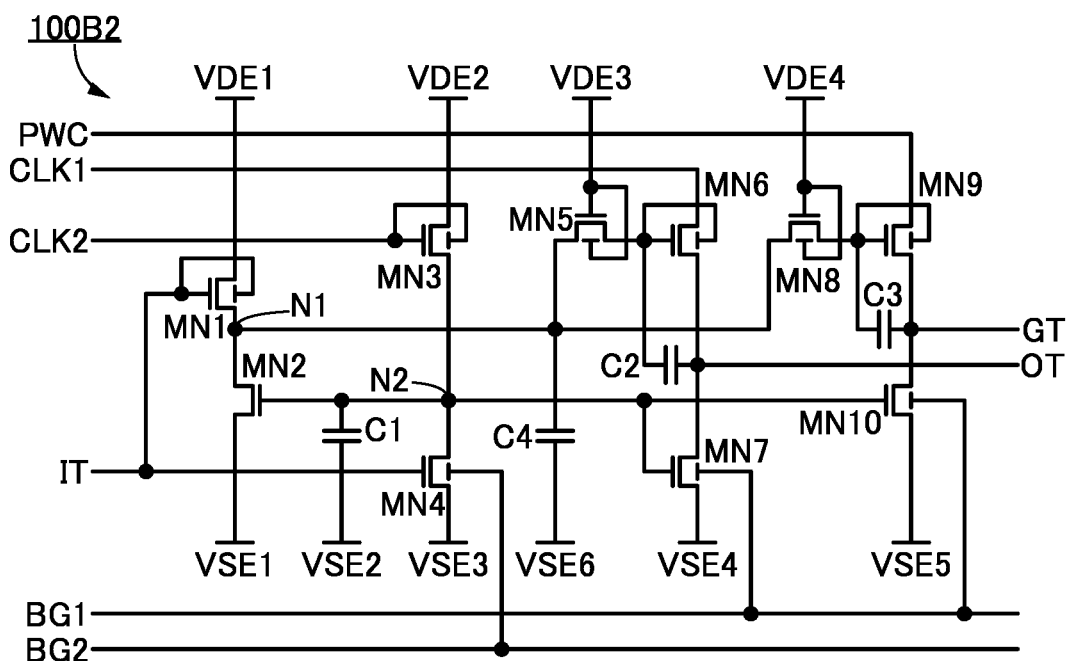

Note that in the case where the potential of the node N1 can be sufficiently held in the capacitor C4 in the circuit 100B1 in FIG. 7A, the configuration of the circuit 100B1 can be changed to the configuration of a circuit 100B2 in FIG. 7B where the transistor MN2 does not have the second gate.

Configuration Example 3

Figure 8:
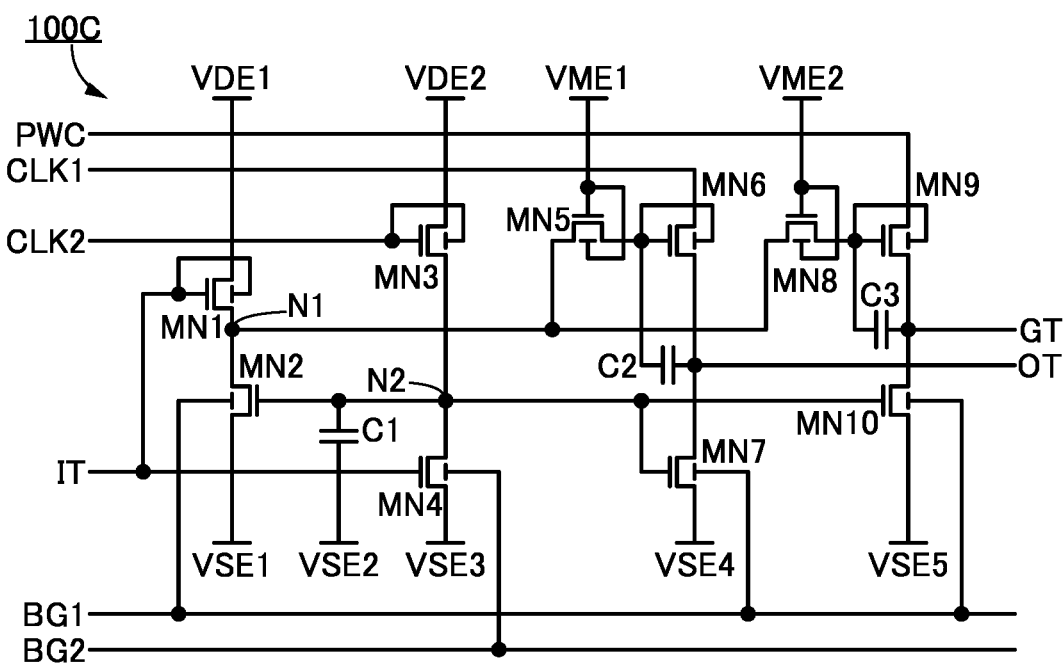
FIG. 8 is a circuit diagram illustrating a configuration example of a semiconductor device.

FIG. 8 illustrates a configuration example of a circuit applicable to the circuits 100[1] to **100[*m*], which are semiconductor devices of one embodiment of the present invention, in each of the driver circuits GD in FIGS. 3A and 3B. The circuit in FIG. 8 is different from the circuit 100A1 in FIG. 1A, the circuit 100A2 in FIG. 1B, the circuit 100A3 in FIG. 6A, the circuit 100A4 in FIG. 6B, and the circuit 100B1 in FIG. 7A**.

A circuit 100C has a configuration modified from that of the circuit 100A1 in FIG. 1A, and is different from the circuit 100A1 in that the first gate of the transistor MN5 is electrically connected to a wiring VME1 and the first gate of the transistor MN8 is electrically connected to a wiring VME2.

Although each of the second gates of the transistors MN7 and MN10 is electrically connected to the wiring BG1 in the circuit 100C, the connection destination of the second gates of the transistors MN7 and MN10 in the circuit 100C may be changed to match any one of the configurations of the circuit 100A1 in FIG. 1A, the circuit 100A3 in FIG. 6A, and the circuit 100A4 in FIG. 6B.

Each of the wirings VME1 and VME2 functions as a wiring supplying a constant potential, for example. The constant potentials are preferably lower than the potentials supplied by the wirings VDE1 to VDE4, for example. Note that the constant potentials supplied by the wirings VME1 and VME2 may be the same or different. For example, when the constant potentials supplied by the wirings VDE1 and VDE2 are 5 V, the constant potentials supplied by the wirings VME1 and VME2 are preferably 4 V.

The operation example of the circuit 100A1 described above can be applied to the operation of the circuit 100C.

<<Comparison 3>>

Here, differences in configuration and operation between the circuit 100C in FIG. 8 and the above-described circuit 101 in FIG. 5 are described as in Configuration examples 1 and 2.

The circuit 100C in FIG. 8 is different from the circuit 101 in FIG. 5 in that the first gate of the transistor MN5 is electrically connected to the wiring VME1 and the first gate of the transistor MN8 is electrically connected to the wiring VME2.

The case where the transistor MN5, which is off in the period from Time T5 to Time T6 in the above operation example, is normally on is considered.

In the circuit 101, when the transistor MN5 is normally on, electric charge held in the second terminal of the transistor MN5 (the first gate of the transistor MN6) flows to the node N1; as a result, the potential of the second terminal of the transistor MN5 (the first gate of the transistor MN6) is sometimes lower than $2V_{High}-V_{Low}-V_{th\_MN5}$. Accordingly, the effect of the bootstrap described above might be small and the potential of the terminal OT might be lower than $V_{High}$.

The case where the transistor MN8, which is off in the period from Time T6 to Time T7 in the above operation example, is normally on is considered.

In the circuit 101, when the transistor MN8 is normally on, electric charge held in the second terminal of the transistor MN8 (the first gate of the transistor MN9) flows to the node N1; as a result, the potential of the second terminal of the transistor MN8 (the first gate of the transistor MN9) is sometimes lower than $2V_{High}-V_{Low}-V_{th\_MN8}$. Accordingly, the effect of the bootstrap described above might be small and the potential of the terminal GT might be lower than $V_{High}$.

In the circuit 100C in FIG. 8, when each of potentials supplied to the first gates of the transistors MN5 and MN8 (potentials supplied by the wirings VME1 and VME2) is set to be lower than a potential supplied by the wiring VDE1, timings when the transistors MN5 and MN8 are turned off at the time of increasing the potential of the node N1 are earlier than those in the circuit 101 in FIG. 5. Even after the transistors MN5 and MN8 are turned off, the potential of the node N1 ideally increases up to a potential difference between the potential supplied by the wiring VDE1 and the threshold voltage of the transistor MN1. Thus, the gate-source voltage of each of the transistors MN5 and MN8 becomes lower than 0 V, and off-state currents of the transistors MN5 and MN8 can be lower. Accordingly, the potential of the first gate of each of the transistors MN6 and MN9 can be held for a long time.

At this time, the potential of the first gate of the transistor MN6 is a difference between the potential supplied by the wiring VME1 and the threshold voltage of the transistor MN5, and the potential of the first gate of the transistor MN9 is a difference between the potential supplied by the wiring VME2 and the threshold voltage of the transistor MN9. Accordingly, the potentials of the first gates of the transistors MN6 and MN9 in the circuit 100C in FIG. 8 are lower than the potentials of the first gates of the transistors MN6 and MN9 in the circuit 101 in FIG. 5, respectively, but can be increased by bootstrap using the capacitors C2 and C3.

Accordingly, when the circuit 100C in FIG. 8 is employed for each of the circuits 100[1] to 100[m] in the driver circuit GD in FIG. 3A or FIG. 3B, the driver circuit GD can operate more stably than that in the case where the circuit 101 in FIG. 5 is employed.

Configuration Example 4

Figure 9A:
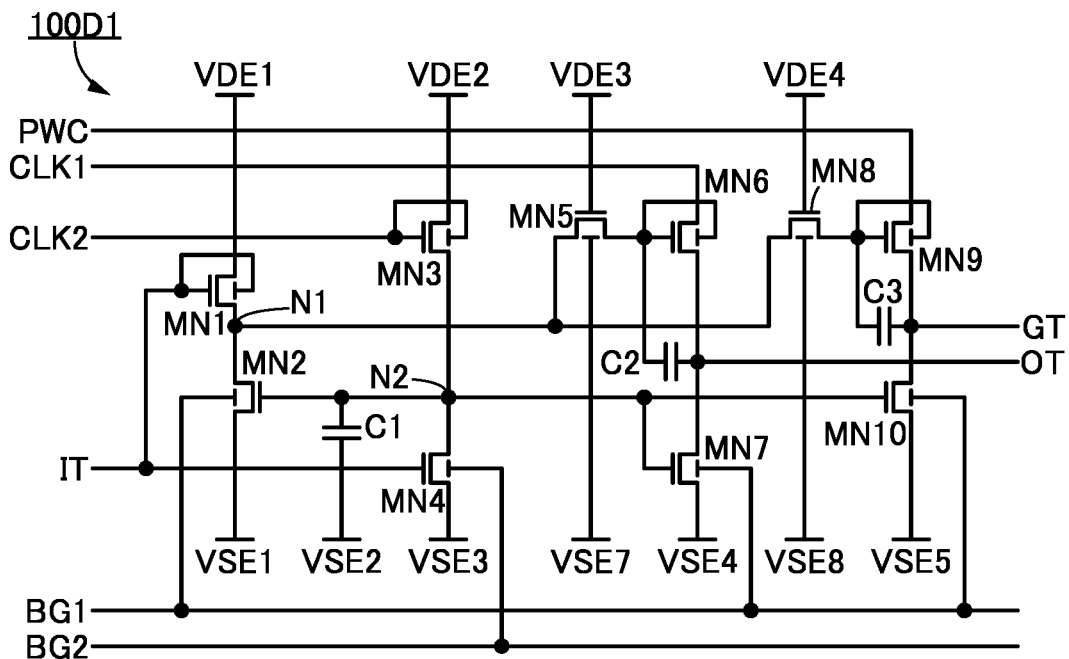
FIGS. 9A and 9B are circuit diagrams each illustrating a configuration example of a semiconductor device.

FIG. 9A illustrates a configuration example of a circuit, which is a semiconductor device of one embodiment of the present invention and different from the circuits described in Configuration examples 1 to 3, applicable to the circuits 100[1] to 100[m] in each of the driver circuits GD in FIGS. 3A and 3B.

A circuit 100D1 has a configuration modified from that of the circuit 100A1 in FIG. 1A, and is different from the circuit 100A1 in that the second gate of the transistor MN5 is electrically connected to a wiring VSE7 and the second gate of the transistor MN8 is electrically connected to a wiring VSE8.

Although each of the second gates of the transistors MN7 and MN10 is electrically connected to the wiring BG1 in the circuit 100D1, the connection destination of the second gates of the transistors MN7 and MN10 in the circuit 100D1 may be changed to match any one of the configurations of the circuit 100A1 in FIG. 1A, the circuit 100A3 in FIG. 6A, and the circuit 100A4 in FIG. 6B.

Like the wirings VSE1 to VSE5, each of the wirings VSE7 and VSE8 functions as a wiring supplying a constant potential, for example. The constant voltage can be, for example, a low-level potential, the ground potential, or a negative potential. In the case where the constant potential supplied by the wiring VSE7 is the same as a potential supplied by at least one of the wirings VSE1 to VSE5 and VSE8, the wiring VSE7 and the wiring may be a single wiring. In the case where the constant potential supplied by the wiring VSE8 is the same as a potential supplied by at least one of the wirings VSE1 to VSE5 and VSE7, the wiring VSE8 and the wiring may be a single wiring.

One or both of the wirings VSE7 and VSE8 may supply a variable potential, not a constant potential.

The operation example of the circuit 100A1 described above can be applied to the operation of the circuit 100D1.
<<Comparison 4>>

Here, differences in configuration and operation between the circuit 100D1 in FIG. 9A and the above-described circuit 101 in FIG. 5 are described as in Configuration examples 1 to 3.

As described above, in the circuit 100D1 in FIG. 9A, the second gate of the transistor MN5 is electrically connected to the wiring VSE7, and the second gate of the transistor MN8 is electrically connected to the wiring VSE8. In the circuit 101 in FIG. 5, the second gate of the transistor MN5 is electrically connected to the first gate of the transistor MN5, and the second gate of the transistor MN8 is electrically connected to the first gate of the transistor MN8.

The case where the transistor MN5, which is off in the period from Time T5 to Time T6 in the above operation example, is normally on is considered.

In the circuit 101, when the transistor MN5 is normally on, the potential of the second terminal of the transistor MN5 (the first gate of the transistor MN6) is sometimes lower than $2V_{High} - V_{Low} - V_{th\_MN5}$ as described in Comparison 3. Accordingly, the effect of the bootstrap described above might be small and the potential of the terminal OT might be lower than $V_{High}$.

The case where the transistor MN8, which is off in the period from Time T6 to Time T7 in the above operation example, is normally on is considered.

In the circuit 101, when the transistor MN8 is normally on, the potential of the second terminal of the transistor MN8 (the first gate of the transistor MN9) is sometimes lower than $2V_{High} - V_{Low} - V_{th\_MN8}$ as described in Comparison 3. Accordingly, the effect of the bootstrap described above might be small and the potential of the terminal GT might be lower than $V_{High}$.

Unlike the threshold voltages of the transistors MN5 and MN8 in the circuit 101 in FIG. 5, the threshold voltages of the transistors MN5 and MN8 in the circuit 100D1 in FIG. 9A can be changed by the potentials supplied to the wirings VSE7 and VSE8. For example, when the potentials supplied to the wirings VSE7 and VSE8 are set to a low-level potential, the ground potential, or a negative potential, the threshold voltages of the transistors MN5 and MN8 can be increased, and thus the transistors MN5 and MN8 can be changed from normally-on to normally-off. Thus, the amount of off-state current of each of the transistors MN5 and MN8 in the circuit 100D1 can be smaller than the amount of off-state current of the transistors MN5 and MN8 in the circuit 101. That is, the potential of the first gate of each of the transistors MN6 and MN9 can be held for a long time.

Figure 9B:
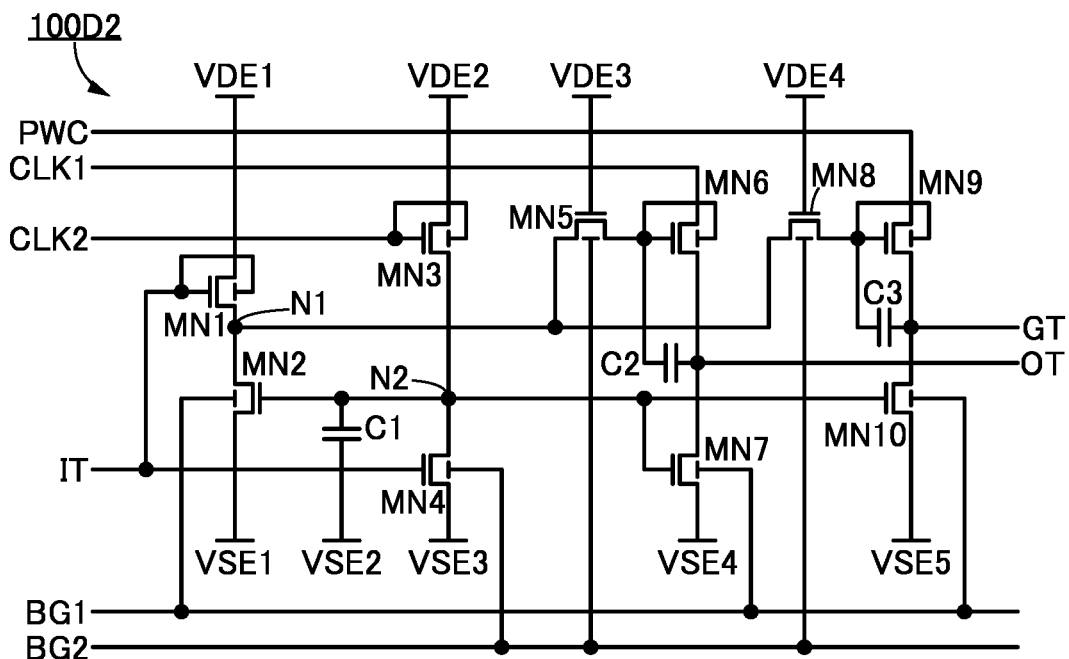

The circuit configuration of the circuit 100D1 may be modified to the circuit configuration of a circuit 100D2 in FIG. 9B. The circuit 100D2 is different from the circuit 100D1 in that the second gate of the transistor MN5 is electrically connected to the wiring BG2 and the second gate of the transistor MN8 is electrically connected to the wiring BG2, for example.

When the ground potential, a low-level potential, or a negative potential is supplied to the wiring BG2, the transistors MN5 and MN8 can be normally off also in the circuit 100D2 as in the circuit 100D1.

Figure 10A:
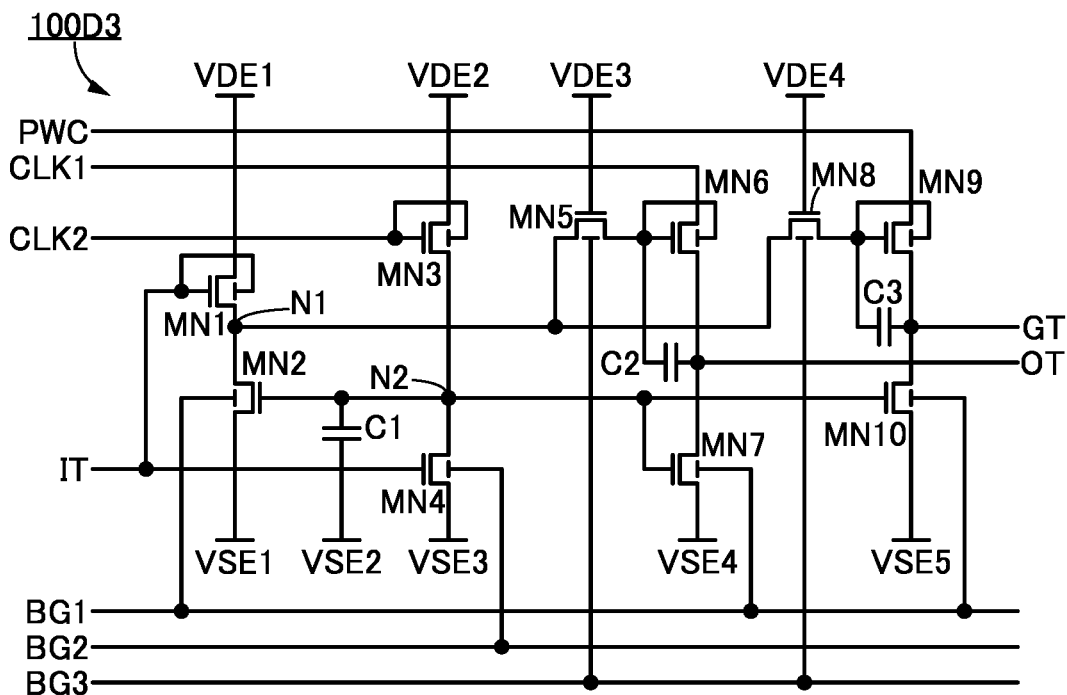
FIGS. 10A and 10B are circuit diagrams each illustrating a configuration example of a semiconductor device.

The circuit configuration of the circuit 100D1 may be modified to the circuit configuration of a circuit 100D3 in FIG. 10A, instead of the circuit 100D2. The circuit 100D3 is different from the circuit 100D1 in that the second gate of the transistor MN5 is electrically connected to the wiring BG3 and the second gate of the transistor MN8 is electrically connected to the wiring BG3, for example.

For the wiring BG3, the description of the wiring BG3 used in the circuit 100A4 described in Configuration example 1 is referred to.

When the ground potential, a low-level potential, or a negative potential is supplied to the wiring BG3, the transistors MN5 and MN8 can be normally off also in the circuit 100D3 as in the circuit 100D1.

Figure 10B:
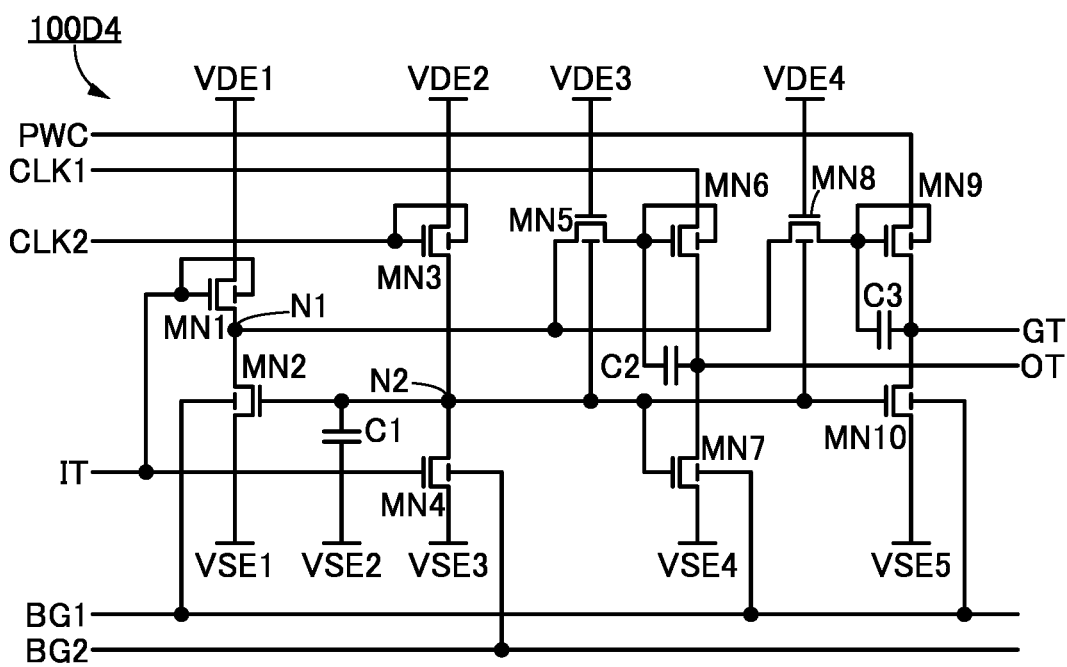

The circuit configuration of the circuit 100D1 may be modified to the circuit configuration of a circuit 100D4 in FIG. 10B. The circuit 100D4 is different from the circuit 100D1, for example, in that the second gate of each of the transistors MN5 and MN8 is electrically connected to the first gate of the transistor MN2, the first terminal of the capacitor C1, the first terminal of the transistor MN4, the first gate of the transistor MN7, and the first gate of the transistor MN10.

In the circuit 100D4 in FIG. 10B, for example, when a low-level potential is input to the terminal IT and a high-level potential is input to the terminal CLK2, the transistor MN1 is turned off, the transistor MN3 is turned on, and the transistor MN4 is turned off; thus, the potentials of the first gate of the transistor MN2, the first terminal of the capacitor C1, the first terminal of the transistor MN4, the first gate of the transistor MN7, and the first gate of the transistor MN10 become high. At this time, each of the transistors MN5 and MN8 becomes normally on and is brought into an on state.

Furthermore, the potential of the first gate of the transistor MN2 becomes a high-level potential and thus the transistor MN2 is turned on, and the potential of the first gate of each of the transistors MN6 and MN9 becomes a low-level potential.

For example, when a high-level potential is input to the terminal IT and a low-level potential is input to the terminal CLK2, the transistor MN3 is turned off and the transistor MN4 is turned on; thus, the potentials of the first gate of the transistor MN2, the first terminal of the capacitor C1, the first terminal of the transistor MN4, the first gate of the transistor MN7, and the first gate of the transistor MN10 become low. At this time, each of the transistors MN5 and MN8 becomes normally on and is brought into an on state. At this time, since the transistor MN1 is on, the transistor MN2 is off, the transistor MN5 is on, and the transistor MN8 is on, the potential of the first gate of each of the transistors MN6 and MN8 becomes high. Then, when the potential of the first terminal of each of the transistors MN5 and MN8 (the node N1) reaches a certain level, the transistors MN5 and MN8 are turned off.

As described above, with the configuration of the circuit 100D4, the transistors MN5 and MN8 can be temporarily normally-off at a necessary timing during the operation of the circuit 100D4. Thus, the potential of the first gate of each of the transistors MN6 and MN9 can be held for a long period.

Therefore, when the circuit 100D1 in FIG. 9A, the circuit 100D2 in FIG. 9B, the circuit 100D3 in FIG. 10A, or the circuit 100D4 in FIG. 10B is used as each of the circuits 100[1] to 100[m] in the driver circuit GD in FIG. 3A or FIG. 3B, the driver circuit GD can operate more stably than when the circuit 101 in FIG. 5 is used.

Configuration Example 5

Figure 11:
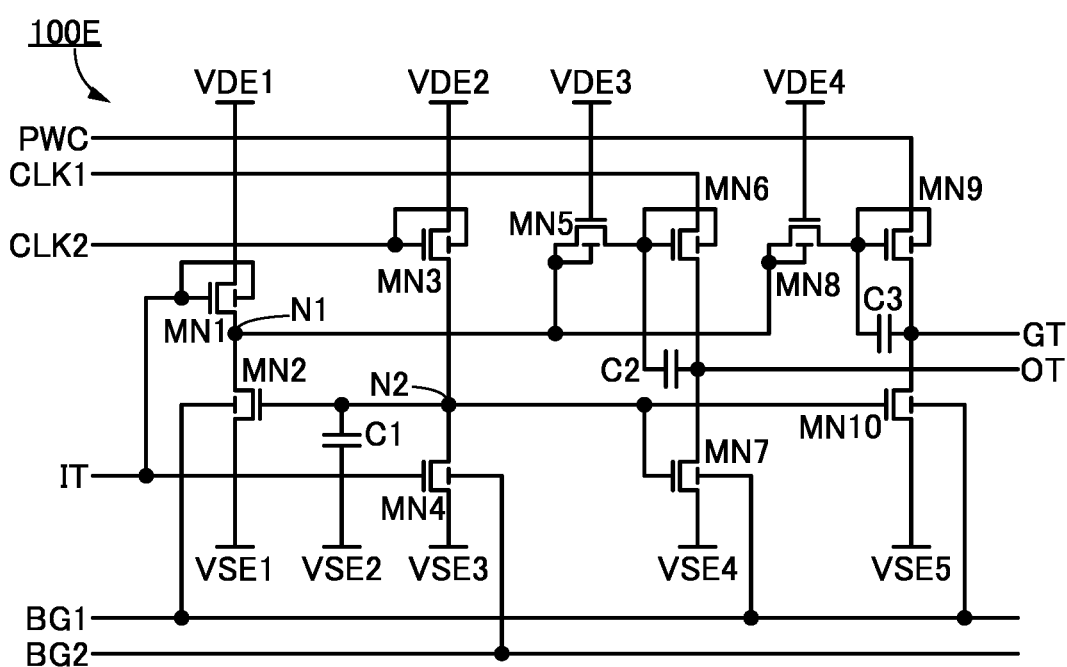
FIG. 11 is a circuit diagram illustrating a configuration example of a semiconductor device.

FIG. 11 illustrates a configuration example of a circuit, which is a semiconductor device of one embodiment of the present invention and different from the circuits described in Configuration examples 1 to 4, applicable to the circuits 100[1] to 100[m] in each of the driver circuits GD in FIGS. 3A and 3B.

A circuit 100E has a configuration modified from that of the circuit 100A1 in FIG. 7A, and is different from the circuit 100A1 in that the second gate of the transistor MN5 is electrically connected to the first terminal of the transistor MN5 and the second gate of the transistor MN8 is electrically connected to the first terminal of the transistor MN8.

Although each of the second gates of the transistors MN7 and MN10 is electrically connected to the wiring BG1 in the circuit 100E, the connection destination of the second gates of the transistors MN7 and MN10 in the circuit 100E may be changed to match any one of the configurations of the circuit 100A1 in FIG. 7A, the circuit 100A3 in FIG. 6A, and the circuit 100A4 in FIG. 6B.

The operation example of the circuit 100A1 described above can be applied to the operation of the circuit 100E.
<<Comparison 5>>

Here, differences in configuration and operation between the circuit 100E in FIG. 11 and the above-described circuit 101 in FIG. 5 are described as in Configuration examples 1 to 4.

As described above, in the circuit 100E in FIG. 11, the second gate of the transistor MN5 is electrically connected to the first terminal of the transistor MN5 and the second gate of the transistor MN8 is electrically connected to the first terminal of the transistor MN8. In the circuit 101 in FIG. 5, the second gate of the transistor MN5 is electrically connected to the first gate of the transistor MN5 and the second gate of the transistor MN8 is electrically connected to the first gate of the transistor MN8.

The case where the circuit 101 operates as in the operation example of the timing chart in FIG. 4 is considered. In a period in which a high-level potential is input to the terminal IT (in a period from Time T4 to Time T5), the potential of the node N1 (an electrical connection point between the second terminal of the transistor MN1, the first terminal of the transistor MN2, the first terminal of the transistor MN5, and the first terminal of the transistor MN8) is increased and in the case where the gate-source voltages of the transistors MN5 and MN8 become lower than the respective threshold voltages, the transistors MN5 and MN8 are turned off.

At this time, when the configuration of the circuit 101 is modified to that of the circuit 100E, the potential of the second gate of each of the transistors MN5 and MN8 becomes the potential of the node N1. That is, the potential of the second gate of each of the transistors MN5 and MN8 (the node N1) in the circuit 100E is lower than that in the above operation example, and thus the threshold voltage of each of the transistors MN5 and MN8 in the circuit 100E is higher than that in the circuit 101. Accordingly, with the configuration modification of the circuit 101 to the circuit 100E, when a high-level potential is input to the terminal IT so that the potential of the node N1 (in the period from Time T4 to Time T5) increases, each of the transistors MN5 and MN8 is likely to be turned off and thus the amount of the off-state current of each of the transistors MN5 and MN8 can be small. That is, the potential of the first gate of each of the transistors MN6 and MN9 can be held for a long time.

Accordingly, when the circuit 100E in FIG. 11 is employed for each of the circuits 100[1] to 100[m] in the driver circuit GD in FIG. 3A or FIG. 3B, the driver circuit GD can operate more stably than that in the case where the circuit 101 in FIG. 5 is employed.

Configuration Example 6

Figure 12A:
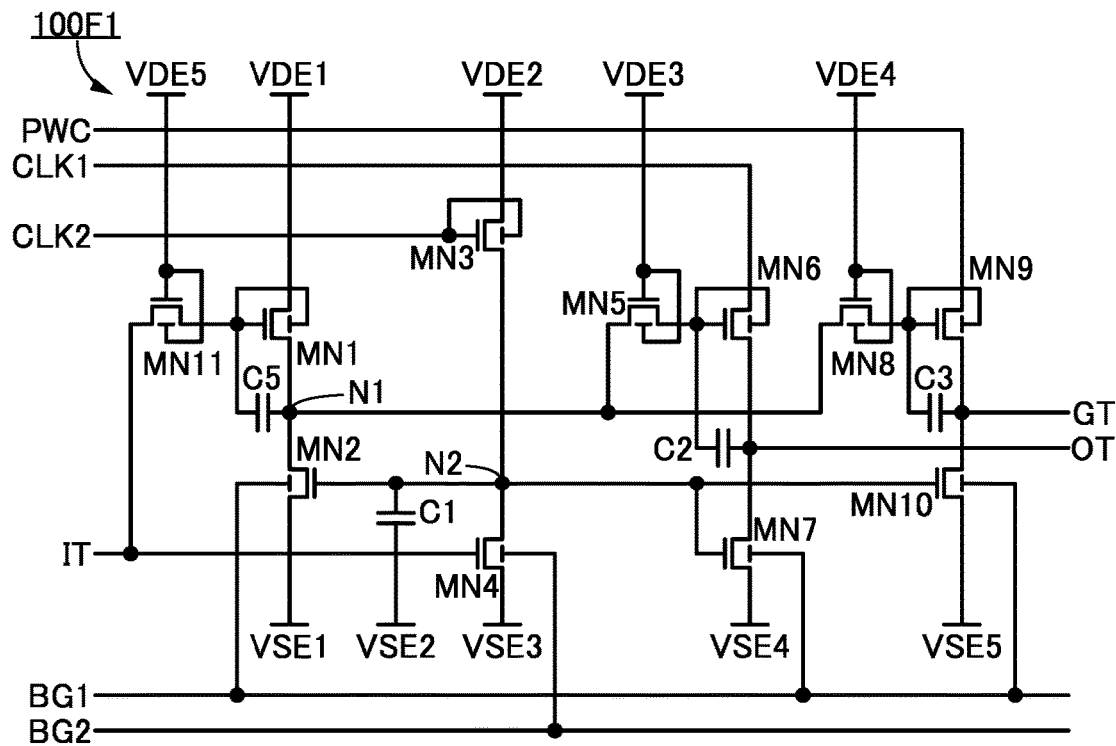
FIGS. 12A and 12B are circuit diagrams each illustrating a configuration example of a semiconductor device.

FIG. 12A illustrates a configuration example of a circuit, which is a semiconductor device of one embodiment of the present invention and different from the circuits described in Configuration examples 1 to 5, applicable to the circuits 100[1] to 100[m] in each of the driver circuits GD in FIGS. 3A and 3B.

The circuit configuration of a circuit 100F1 is modified from that of the circuit 100A1 in FIG. 1A, and different from the circuit 100A1 in including a transistor MN11 and a capacitor C5. Specifically, in the circuit 100F1, a first terminal of the transistor MN11 is electrically connected to the terminal IT; a second terminal of the transistor MN11 is electrically connected to the first gate of the transistor MN1, the second gate of the transistor MN1, and a first terminal of the capacitor C5; and a first gate of the transistor MN11 is electrically connected to a second gate of the transistor MN11 and a wiring VDE5. A second terminal of the capacitor C5 is electrically connected to the second terminal of the transistor MN1, the first terminal of the transistor MN2, the first terminal of the transistor MN5, and the first terminal of the transistor MN8.

Although each of the second gates of the transistors MN7 and MN10 is electrically connected to the wiring BG1 in the circuit 100F1, the connection destination of the second gates of the transistors MN7 and MN10 in the circuit 100F1 may be changed to match any one of the configurations of the circuit 100A1 in FIG. 1A, the circuit 100A3 in FIG. 6A, and the circuit 100A4 in FIG. 6B.

Like the wirings VDE1 to VDE4, the wiring VDE5 functions as a wiring supplying a constant potential, for example. The constant voltage can be a high-level potential, for example. In the case where the constant potential supplied by the wiring VDE5 is the same as a potential supplied by at least one of the wirings VDE1 to VDE4, the wiring VDE5 and the wiring may be a single wiring.

The wiring VDE5 may supply a variable potential, not a constant potential.

The operation example of the circuit 100A1 described above can be applied to the operation of the circuit 100F1.

<<Comparison 6>>

Here, differences in configuration and operation between the circuit 100F1 in FIG. 12A and the above-described circuit 101 in FIG. 5 are described as in Configuration examples 1 to 5.

As described above, the circuit 100F1 in FIG. 12A includes the transistor MN11 and the capacitor C5. In contrast, the circuit 101 in FIG. 5 does not include the transistor MN11 and the capacitor C5.

The case where the circuit 101 operates as in the operation example of the timing chart in FIG. 4 is considered. In a period in which a high-level potential is input to the terminal IT (in the period from Time T4 to Time T5), the potential of the node N1 (an electrical connection point between the second terminal of the transistor MN1, the first terminal of the transistor MN2, the first terminal of the transistor MN5, and the first terminal of the transistor MN8) is increased and in the case where the gate-source voltages of the transistors MN5 and MN8 become lower than the respective threshold voltages, the transistors MN5 and MN8 are turned off.

The case where the circuit 100F1 operates as in the operation example of the timing chart in FIG. 4 is considered. In a period in which a high-level potential is input to the terminal IT (in the period from Time T4 to Time T5), the potentials of the first terminal of the transistor MN11 and the second terminal of the transistor MN11 (the first gate of the transistor MN1) become high. When the gate-source voltage of the transistor MN11 becomes lower than the threshold voltage of the transistor MN11, the transistor MN11 is turned off. In addition, the gate-source voltage of the transistor MN1 becomes higher than the threshold voltage of the transistor MN1, whereby the transistor MN1 is turned on and the potential of the node N1 becomes high. At this time, since the transistor MN11 is off, bootstrap by the capacitor C5 further increases the potential of the first gate of the transistor MN1. Thus, the gate-source voltage of the transistor MN1 is sufficiently higher than the threshold voltage, and the potential of the node N1 is increased up to the potential supplied by the wiring VDE1.

That is, the amount in increase in the potential of the node N1 by supplying a high-level potential to the terminal IT in the circuit 100F1 in FIG. 12A is larger than that in the circuit 101 in FIG. 5.

Thus, the potential of the first terminal of each of the transistors MN5 and MN8 in the circuit 100F1 increases up to the potential supplied by the wiring VDE1, whereby a difference between the gate-source voltage and the threshold voltage of the transistors MN5 and MN8 in the off state is larger than that in the circuit 101. Thus, the amount of off-state current of each of the transistors MN5 and MN8 in the circuit 100F1 can be smaller than the amount of off-state current of the transistors MN5 and MN8 in the circuit 101. That is, the potential of the first gate of each of the transistors MN6 and MN9 can be held for a long time.

Figure 12B:
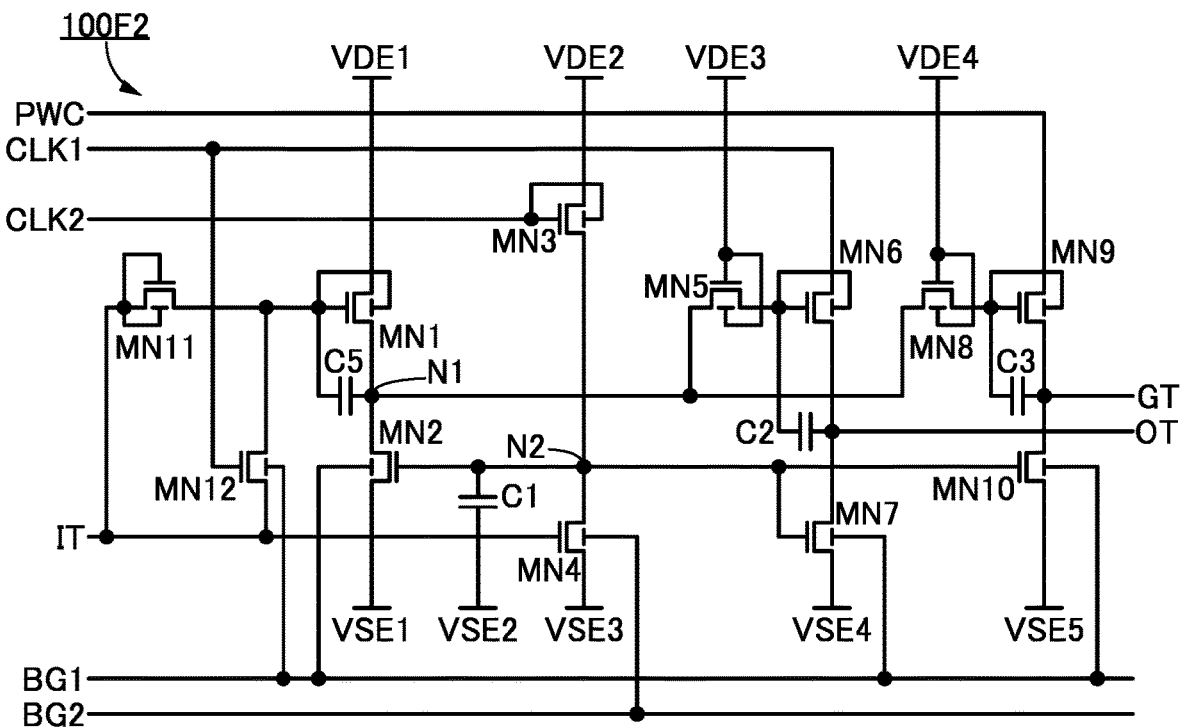

The circuit configuration of the circuit 100F1 may be modified to the circuit configuration of a circuit 100F2 in FIG. 12B. The circuit 100F2 is different from the circuit 100F1 in the connection of the transistor MN11 and including a transistor MN12.

Specifically, the first gate of the transistor MN11 is not electrically connected to the wiring VDE5 and is electrically connected to the second gate of the transistor MN11. A first terminal of the transistor MN12 is electrically connected to the first gate and the second gate of the transistor MN1 and the second terminal of the transistor MIN 1; a second terminal of the transistor MN12 is electrically connected to the terminal IT, the first terminal of the transistor MN11, and the first gate of the transistor MN4; a first gate of the transistor MN12 is electrically connected to the terminal CLK1; and a second gate of the transistor MN12 is electrically connected to the wiring BG1.

When a low-level potential is input to the terminal CLK1 and the transistor MN12 is turned off, by an input of a high-level potential to the terminal IT, the potential of the first gate of the transistor MN1 becomes a potential obtained by subtracting the threshold voltage of the transistor MN11 from the high-level potential supplied to the terminal IT. Since the transistor MN11 is diode-connected, when the potential of the second terminal of the transistor MN11 becomes a potential obtained by subtracting the threshold voltage of the transistor MN11 from the high-level potential supplied to the terminal IT, the transistor MN11 is turned off. For the following operations in which the transistor MN1 is turned on and the potential of the node N1 is increased due to bootstrap by the capacitor C5, the description of the operation of the circuit 100F1 is referred to.

In the case where the potential of the first gate of the transistor MN1 is set to be a low-level potential, for example, a low-level potential is input to the terminal IT and a high-level potential is input to the terminal CLK1. This corresponds to operations in a period from Time T5 to Time T9 in the operation example of the circuit 100A in Embodiment 1. With this operation, the transistor MN12 is turned on and electrical continuity is established between the terminal IT and the first gate of the transistor MN1, whereby the potential of the first gate of the transistor MN1 can be set to be a low-level potential. At this time, the gate-source voltage of the transistor MN1 is lower than the threshold voltage of the transistor MN1; thus, the transistor MN1 is turned off, the node N1 is brought into floating, and the capacitor C5 holds the high-level potential supplied by the wiring VDE1.

In the configuration of the circuit 100F2, as in the circuit 100F1, the amount of off-state current of each of the transistors MN5 and MN8 in the circuit 100F2 can be smaller than that in the circuit 101, and thus the potential of the first gate of each of the transistors MN6 and MN9 can be held for a long time.

Accordingly, when the circuit 100F1 in FIG. 12A or the circuit 100F2 in FIG. 12B is employed for each of the circuits 100[1] to 100[m] in the driver circuit GD in FIG. 3A or FIG. 3B, the driver circuit GD can operate more stably than that in the case where the circuit 101 in FIG. 5 is employed.

Configuration Example 7

Figure 13:
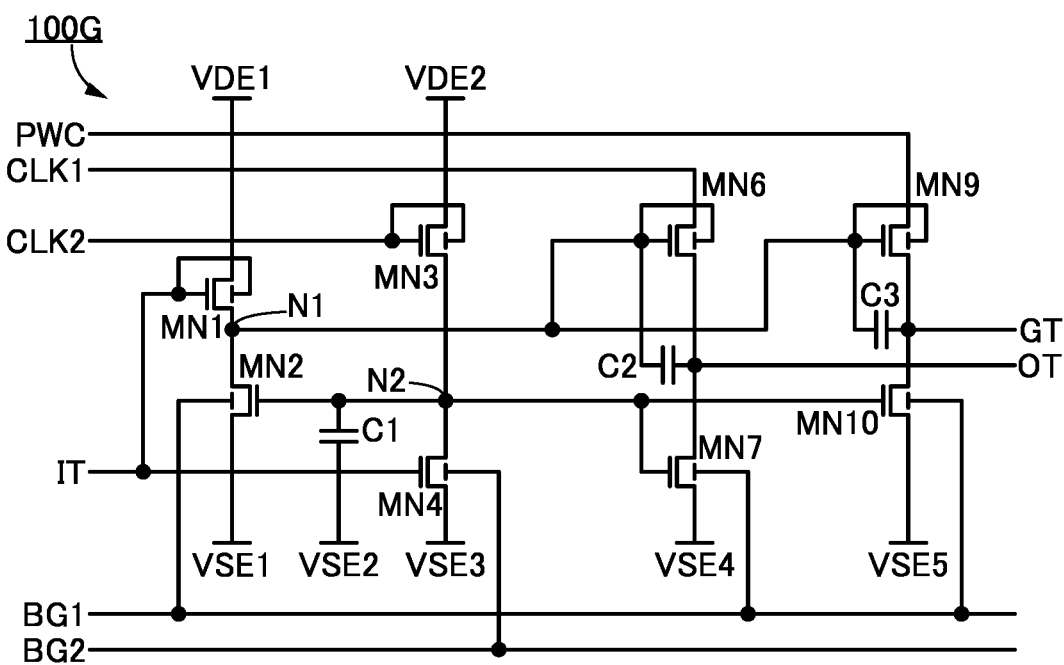
FIG. 13 is a circuit diagram illustrating a configuration example of a semiconductor device.

FIG. 13 illustrates a configuration example of a circuit, which is a semiconductor device of one embodiment of the present invention and different from the circuits described in Configuration examples 1 to 6, applicable to the circuits 100[1] to 100[m] in each of the driver circuits GD in FIGS. 3A and 3B.

The circuit configuration of a circuit 100G is modified from that of the circuit 100A1 in FIG. TA, and different from the circuit 100A1 in that the transistors MN5 and MN8 are not provided.

Although each of the second gates of the transistors MN7 and MN10 is electrically connected to the wiring BG1 in the circuit 10G, the connection destination of the second gates of the transistors MN7 and MN10 in the circuit 100G may be changed to match any one of the configurations of the circuit 100A1 in FIG. 1A, the circuit 100A3 in FIG. 6A, and the circuit 100A4 in FIG. 6B.

The configuration without the transistor MN5 can reduce the parasitic capacitance in the periphery of the first gate of the transistor MN6. Similarly, the configuration without the transistor MN8 can reduce the parasitic capacitance in the periphery of the first gate of the transistor MN8.

The circuit 100G is preferably configured such that the parasitic capacitance in the periphery of the first gates of the transistors MN6 and MN9 (the node N1) is as small as possible. Specifically, for example, a wiring that electrically connects the first gates of the transistors MN6 and MN9 to the second terminal of the transistor MN1 and the first terminal of the transistor MN2 is preferably short.

When the parasitic capacitance in the periphery of the first gates of the transistors MN6 and MN9 (the node N1) is made small, the amount of increase in the potential of the first gate of each of the transistors MN6 and MN9 caused by bootstrap by the capacitors C2 and C3 can be even larger. Therefore, the transistors MN6 and MN9 can have high driving capability, the potential from the terminal CLK1 is output to the terminal OT while decreasing very little, and the potential from the terminal PWC is output to the terminal GT while decreasing very little.

Accordingly, when the circuit 100G in FIG. 13 is employed for each of the circuits 100[1] to 100[m] in the driver circuit GD in FIG. 3A or FIG. 3B, the driver circuit GD can operate more stably than that in the case where the circuit 101 in FIG. 5 is employed.

Configuration Example 8

Figure 14A:
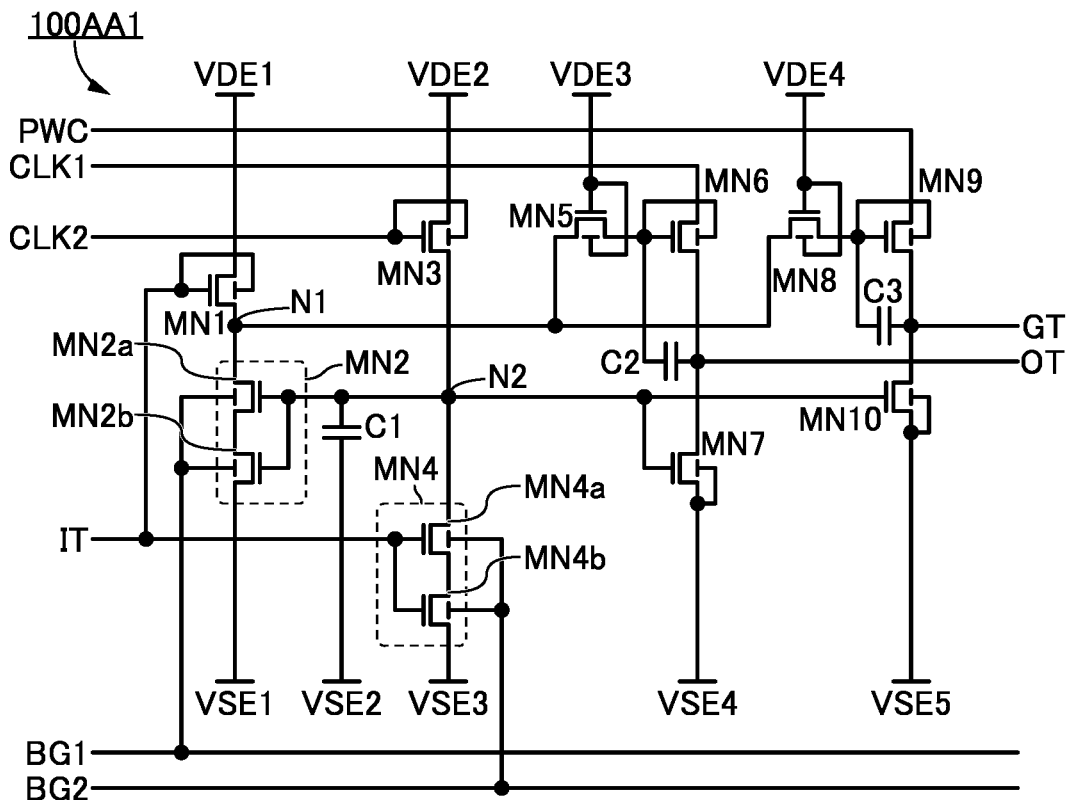
FIGS. 14A and 14B are circuit diagrams each illustrating a configuration example of a semiconductor device.
Figure 14B:
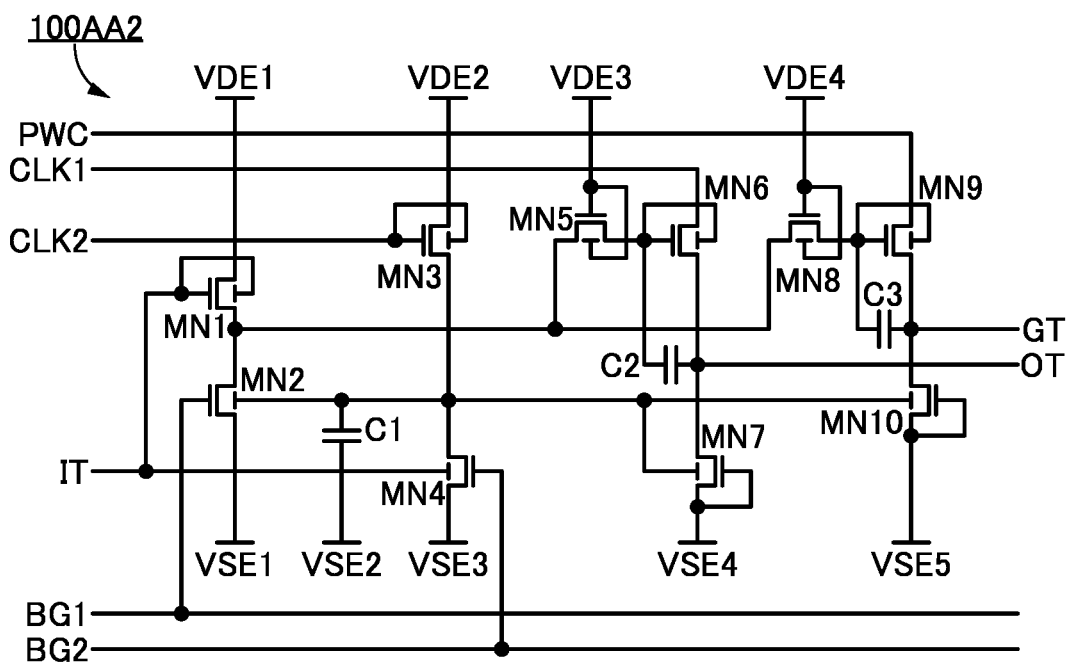
Figure 15A:
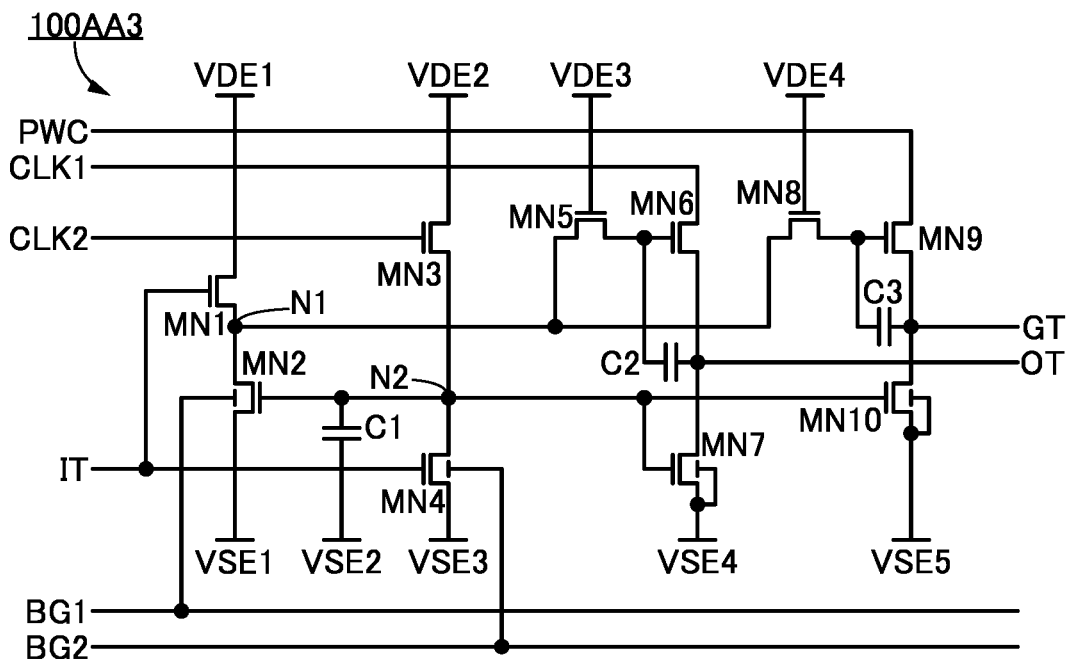
FIGS. 15A and 15B are circuit diagrams each illustrating a configuration example of a semiconductor device.
Figure 15B:
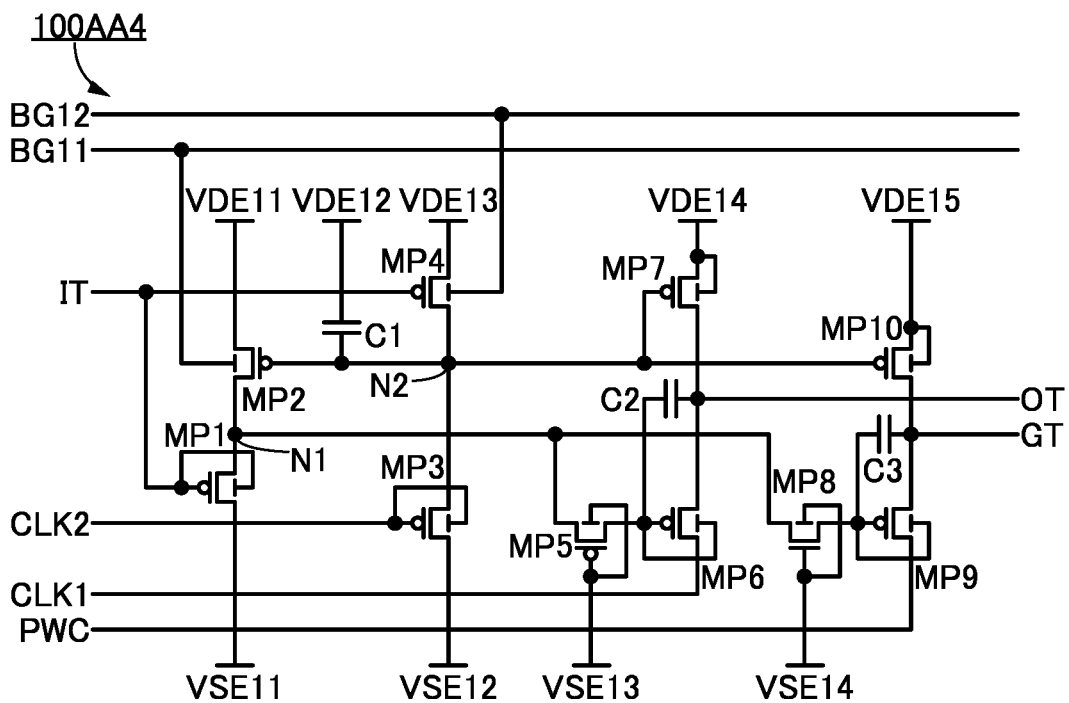
Figure 16:
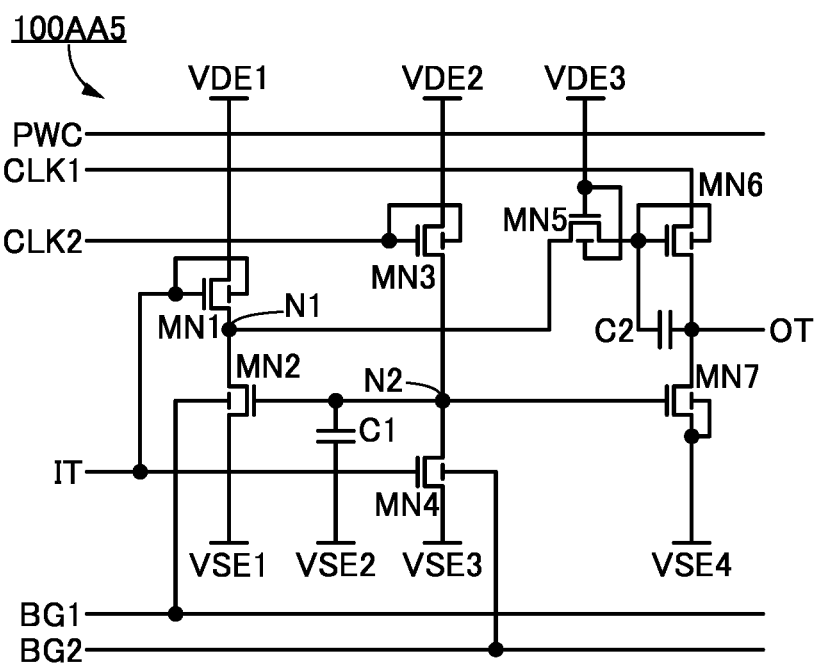
FIG. 16 is a circuit diagram illustrating a configuration example of a semiconductor device.

Each of a circuit 100AA1 in FIG. 14A, a circuit 100AA2 in FIG. 14B, a circuit 100AA3 in FIG. 15A, a circuit 100AA4 in FIG. 15B, and a circuit 100AA5 in FIG. 16 is a modification example of the circuit 100A1 described in Configuration example 1, and can be used as the circuits 100[1] to 100[m], which are semiconductor devices of one embodiment of the present invention, in each of the driver circuits GD in FIGS. 3A and 3B.

The circuit 100AA1 in FIG. 14A has a configuration in which each of the transistors MN2 and MN4 in the circuit 100A1 in FIG. 1A has a multi-gate structure, for example.

Specifically, for example, the transistor MN2 includes a transistor MN2a and a transistor MN2b, first terminals of the transistors MN2a and MN2b are electrically connected to each other, first gates of the transistors MN2a and MN2b are electrically connected to each other, and second gates of the transistors MN2a and MN2b are electrically connected to each other. Thus, the first gates of the transistors MN2a and MN2b function as the first gate of the transistor MN2, and the second gates of the transistors MN2a and MN2b function as the second gate of the transistor MN2. A second terminal of the transistor MN2a corresponds to the first terminal of the transistor MN2, and a second terminal of the transistor MN2b corresponds to the second terminal of the transistor MN2.

For example, the transistor MN4 includes a transistor MN4a and a transistor MN4b, first terminals of the transistors MN4a and MN4b are electrically connected to each other, first gates of the transistors MN4a and MN4b are electrically connected to each other, and second gates of the transistors MN4a and MN4b are electrically connected to each other. Thus, the first gates of the transistors MN4a and MN4b function as the first gate of the transistor MN4, and the second gates of the transistors MN4a and MN4b function as the second gate of the transistor MN4. A second terminal of the transistor MN4a corresponds to the first terminal of the transistor MN4, and a second terminal of the transistor MN4b corresponds to the second terminal of the transistor MN4.

The use of a transistor with a multi-gate structure as the transistor MN2 can reduce the off-state current flowing between the first terminal and the second terminal of the transistor MN2 when the transistor MN2 is off. Similarly, the use of a transistor with a multi-gate structure as the transistor MN4 can reduce the off-state current flowing between the first terminal and the second terminal of the transistor MN4 when the transistor MN4 is off.

Although each of the transistors MN2 and MN4 in the circuit 100AA1 in FIG. 14A has a multi-gate structure including two transistors, each of the transistors MN2 and MN4 may have a multi-gate structure including three or more transistors.

In the circuit 100AA1 in FIG. 14A, each of the transistors MN2 and MN4 has a multi-gate structure; however, the circuit 100AA1 may have a configuration in which one or more selected from the transistors MN1 to MN10 have a multi-gate structure.

A multi-gate structure can be applied to not only the transistors MN2 and MN4 in the circuit 100AA1 in FIG. 14A but also transistors in the other drawings in this specification.

Note that the circuit 100AA1 has a configuration in which the second gate of the transistor MN7 is electrically connected to the second terminal of the transistor MN7 and the second gate of the transistor MN10 is electrically connected to the second terminal of the transistor MN10; however, each of the second gates of the transistors MN7 and MN10 in the circuit 100AA1 may be electrically connected to the wiring BG1. Alternatively, the connection destination of each of the second gates of the transistors MN7 and MN10 in the circuit 100AA1 may be changed to match the circuit 100A3 in FIG. 6A or the circuit 100A4 in FIG. 6B.

The circuit 100AA2 in FIG. 14B has a configuration in which the connection destinations of the first gates and the second gates of the transistors MN2, MN4, MN7, and MN10 in the circuit 100A1 in FIG. TA are exchanged, as an example.

Specifically, in the circuit 100AA2 in FIG. 14B, for example, the first gate of the transistor MN2 is electrically connected to the wiring BG1, and the second gate of the transistor MN2 is electrically connected to the first terminal of the capacitor C1, the second terminal of the transistor MN3, the first terminal of the transistor MN4, the second gate of the transistor MN7, and the second gate of the transistor MN10. For example, the first gate of the transistor MN4 is electrically connected to the wiring BG2. For example, the first gate of the transistor MN7 is electrically connected to the second terminal of the transistor MN7 and the wiring VSE4. For example, the first gate of the transistor MN10 is electrically connected to the second terminal of the transistor MN10 and the wiring VSE5.

Even when the connection destinations of the first gates and the second gates of the transistors MN2, MN4, MN7, and MN10 are exchanged as illustrated in the circuit 100AA2 in FIG. 14B, the circuit 100AA2 can sometimes perform a desired operation as well as the circuit 100A1 does.

Although in the circuit 100AA2 in FIG. 14B, the connection destinations of the first gates and the second gates of the transistors MN2, MN4, MN7, and MN10 are exchanged, connection destinations of first gates and second gates of transistors other than the transistors MN2, MN4, MN7, and MN10 in the circuit 100AA2 may be exchanged.

Not only for the transistors MN2, MN4, MN7, and MN10 in the circuit 100AA2 in FIG. 14B, but also for transistors in the other drawings in this specification, the connection destinations of a first gate and a second gate may be exchanged.

Note that the circuit 100AA2 has a configuration in which the second gate of the transistor MN7 is electrically connected to the second terminal of the transistor MN7 and the second gate of the transistor MN10 is electrically connected to the second terminal of the transistor MN10; however, each of the second gates of the transistors MN7 and MN10 in the circuit 100AA2 may be electrically connected to the wiring BG1. Alternatively, the connection destination of each of the second gates of the transistors MN7 and MN10 in the circuit 100AA2 may be changed to match the circuit 100A3 in FIG. 6A or the circuit 100A4 in FIG. 6B.

The circuit 100AA3 in FIG. 15A has a configuration in which each of the transistors MN1, MN3, MN5, MN6, MN8, and MN9 does not have a second gate, as an example.

A transistor whose first gate and second gate are electrically connected to each other can have a high on-state current. On the other hand, in the case where a transistor does not need to have a high on-state current, a second gate is not necessarily provided in the transistor. Specifically, for example, in the circuit 100A1 in FIG. 1A, in the case where the transistors MN1, MN3, MN5, MN6, MN8, and MN9 have sufficiently high on-state currents, the transistors do not necessarily have second gates as illustrated in the circuit 100AA3 in FIG. 15A.

Note that the circuit 100AA3 has a configuration in which the second gate of the transistor MN7 is electrically connected to the second terminal of the transistor MN7 and the second gate of the transistor MN10 is electrically connected to the second terminal of the transistor MN10; however, each of the second gates of the transistors MN7 and MN10 in the circuit 100AA3 may be electrically connected to the wiring BG1. Alternatively, the connection destination of each of the second gates of the transistors MN7 and MN10 in the circuit 100AA3 may be changed to match the circuit 100A3 in FIG. 6A or the circuit 100A4 in FIG. 6B.

The circuit 100AA4 in FIG. 15B has a configuration in which the n-channel transistors MN1 to MN10 in the circuit 100A1 in FIG. TA are changed to transistors MP1 to MP10, which are p-channel transistors, as an example.

For example, the transistors MP1 to MP10 can be p-channel transistors with a silicon-on-insulator (SOI) structure.

Specifically, a first terminal of the transistor MPT is electrically connected to a wiring VSE11, a second terminal of the transistor MPT is electrically connected to a first terminal of the transistor MP2, a first terminal of the transistor MP5, and a first terminal of the transistor MP8, and a first gate of the transistor MPT is electrically connected to a second gate of the transistor MPT, the terminal IT, and a first gate of the transistor MP4.

A first terminal of the transistor MP3 is electrically connected to a wiring VSE12, a second terminal of the transistor MP3 is electrically connected to a first gate of the transistor MP2, a first terminal of the capacitor C1, a first terminal of the transistor MP4, a first gate of the transistor MP7, and a first gate of the transistor MP10, and a first gate of the transistor MP3 is electrically connected to a second gate of the transistor MP3 and the terminal CLK2.

A second terminal of the transistor MP5 is electrically connected to a first gate of the transistor MP6, a second gate of the transistor MP6, and a first terminal of the capacitor C2, and a first gate of the transistor MP5 is electrically connected to a second gate of the transistor MP5 and a wiring VSE13. A first terminal of the transistor MP6 is electrically connected to the terminal CLK1, a second terminal of the transistor MP6 is electrically connected to a second terminal of the capacitor C2, a first terminal of the transistor MP7, and the terminal OT.

A second terminal of the transistor MP8 is electrically connected to a first gate of the transistor MP9, a second gate of the transistor MP9, and a first terminal of the capacitor C3, and a first gate of the transistor MP8 is electrically connected to a second gate of the transistor MP8 and a wiring VSE14. A first terminal of the transistor MP9 is electrically connected to the terminal PWC, a second terminal of the transistor MP9 is electrically connected to a second terminal of the capacitor C3, a first terminal of the transistor MP10, and the terminal GT.

A second terminal of the transistor MP2 is electrically connected to a wiring VDE11, and a second gate of the transistor MP2 is electrically connected to a wiring BG11. A second terminal of the capacitor C1 is electrically connected to a wiring VDE12. A second terminal of the transistor MP4 is electrically connected to a wiring VDE13, and a second gate of the transistor MP4 is electrically connected to a wiring BG12. A second terminal of the transistor MP7 is electrically connected to a second gate of the transistor MP7 and a wiring VDE14. A second terminal of the transistor MP10 is electrically connected to a second gate of the transistor MP10 and a wiring VDE15.

Like the wirings VDE1 to VDE4 described in Configuration example 1, each of the wirings VDE11 to VDE15 functions as a wiring supplying a constant potential, for example. The constant voltage can be a high-level potential, for example. Note that the wirings VDE11 to VDE15 may supply the same constant potential or different constant potentials. Alternatively, two or more of the wirings VDE11 to VDE15 may supply the same constant potential, and the other wiring(s) may supply a potential different from the constant potential. Furthermore, the two or more of the wirings VDE11 to VDE15 which supply the same constant potential may be a single wiring. For example, in the case where the wiring VDE11 and wiring VDE12 supply the same constant potential, the wiring VDE11 and the wiring VDE12 may be a single wiring.

One or more of the wirings VDE1 to VDE15 may supply a variable potential, not a constant potential.

Like the wirings VSE1 to VSE5 described in Configuration example 1, each of the wirings VSE11 to VSE14 functions as a wiring supplying a constant potential, for example. The constant voltage can be a low-level potential or the ground potential, for example. Note that the wirings VSE11 to VSE14 may supply the same constant potential or different constant potentials. Alternatively, two or more of the wirings VSE11 to VSE14 may supply the same constant potential, and the other wiring(s) may supply a potential different from the constant potential. Furthermore, the two or more of the wirings VSE11 to VSE14 which supply the same constant potential may be a single wiring. For example, in the case where the wiring VSE11 and wiring VSE12 supply the same constant potential, the wiring VSE11 and the wiring VSE12 may be a single wiring.

One or more of the wirings VSE11 to VSE14 may supply a variable potential, not a constant potential.

Like the wirings BG1 and BG2 described in Configuration example 1, each of the wirings BG11 and BG12 functions as a wiring supplying a constant potential, for example. The constant voltage can be a high-level potential, for example. Note that the wirings BG11 and BG12 may supply the same constant potential or different constant potentials. In the case where the wiring BG11 and wiring BG12 supply the same constant potential, the wiring BG11 and the wiring BG12 may be a single wiring.

One or both of the wirings BG11 and BG12 may supply a variable potential, not a constant potential.

As illustrated in the circuit 100AA4 in FIG. 15B, the transistors MN1 to MN10 in the circuit 100A1 are changed to the transistors MP1 to MP10, the wirings VDE1 to VDE4 are changed to the wirings VSE11 to VSE14, and the wirings VSE1 to VSE5 are changed to the wirings VDE11 to VDE15, whereby the circuit 100AA4 can perform a desired operation as well as the circuit 100A1 in some cases.

Note that the circuit 100AA4 in FIG. 15B has a configuration in which the transistors MN1 to MN10 in the circuit 100A1 in FIG. 1A are changed to the transistors MP1 to MP10; similarly, the polarities (n-channel and p-channel) of transistors included in circuits illustrated in the other drawings in this specification may be changed. In the case where the polarities of the transistors are changed, the levels of constant potentials supplied by the wirings VDE1 to VDE4, the wirings VSE1 to VSE5, the wirings BG1 and BG2, and the like may be changed.

Note that the circuit 100AA4 has a configuration in which the second gate of the transistor MP7 is electrically connected to the second terminal of the transistor MP7 and the second gate of the transistor MP10 is electrically connected to the second terminal of the transistor MP10; however, each of the second gates of the transistors MP7 and MP10 in the circuit 100AA4 may be electrically connected to the wiring BG11. Alternatively, the second gate of each of the transistors MP7 and MP10 in the circuit 100AA4 may be electrically connected to the wiring BG12, as in the circuit 100A3 in FIG. 6A. Alternatively, the second gate of each of the transistors MP7 and MP10 in the circuit 100AA4 may be electrically connected to an additional wiring, as in the circuit 100A4 in FIG. 6B. Note that the additional wiring can supply a constant potential, such as a high-level potential, or a variable potential.

The circuit 100AA5 in FIG. 16 has a configuration without including the transistors MN8 to MN10, the capacitor C3, and the terminal GT in the circuit 100A1 in FIG. 1A, for example.

The circuit 100AA5 in FIG. 16 is configured to output a signal only to the terminal OT, not to the terminal GT because of not including the terminal GT. For example, when the circuit 100A1 in FIG. TA and the circuit 100AA5 in FIG. 16 are combined to form a shift register in FIG. 3A or FIG. 3B, the shift register can have a configuration in which a signal is not output from the terminal GT of the circuit 100 corresponding to the circuit 100AA5. Note that the shift register is sometimes used for adjusting timings of a clock signal input to the shift register and signals output from the terminal OT, the terminal GT, and the like. The timings can be adjusted in the design phase of the shift register.

Although the circuit 100AA5 in FIG. 16 has a configuration without including the transistors MN8 to MN10, the capacitor C3, and the terminal GT in the circuit 100A1 in FIG. TA, the circuit 100AA5 may have a configuration without including the transistors MN5 to MN7, the capacitor C2, and the terminal OT (not illustrated).

With use of the circuit 100A1 or the like described in Configuration examples 1 to 8 for the shift register in the driver circuit GD in FIG. 3A or FIG. 3B, the shift register can be formed with single-polarity circuits with only n-channel transistors (in the case of the circuit 100AA4 in FIG. 15B, a single-polarity circuit with only p-channel transistors). In particular, when the circuit configuration of any of Configuration examples 1 to 8, or a circuit configuration formed by combining two or more of the circuits of Configuration examples 1 to 8 is used for the shift register, a circuit with stable operation is achieved.

Note that this embodiment can be combined with any of the other embodiments in this specification as appropriate.

Embodiment 2

In this embodiment, a specific circuit configuration of the circuit 100A1 described in Embodiment 1 will be described.

Figure 17:
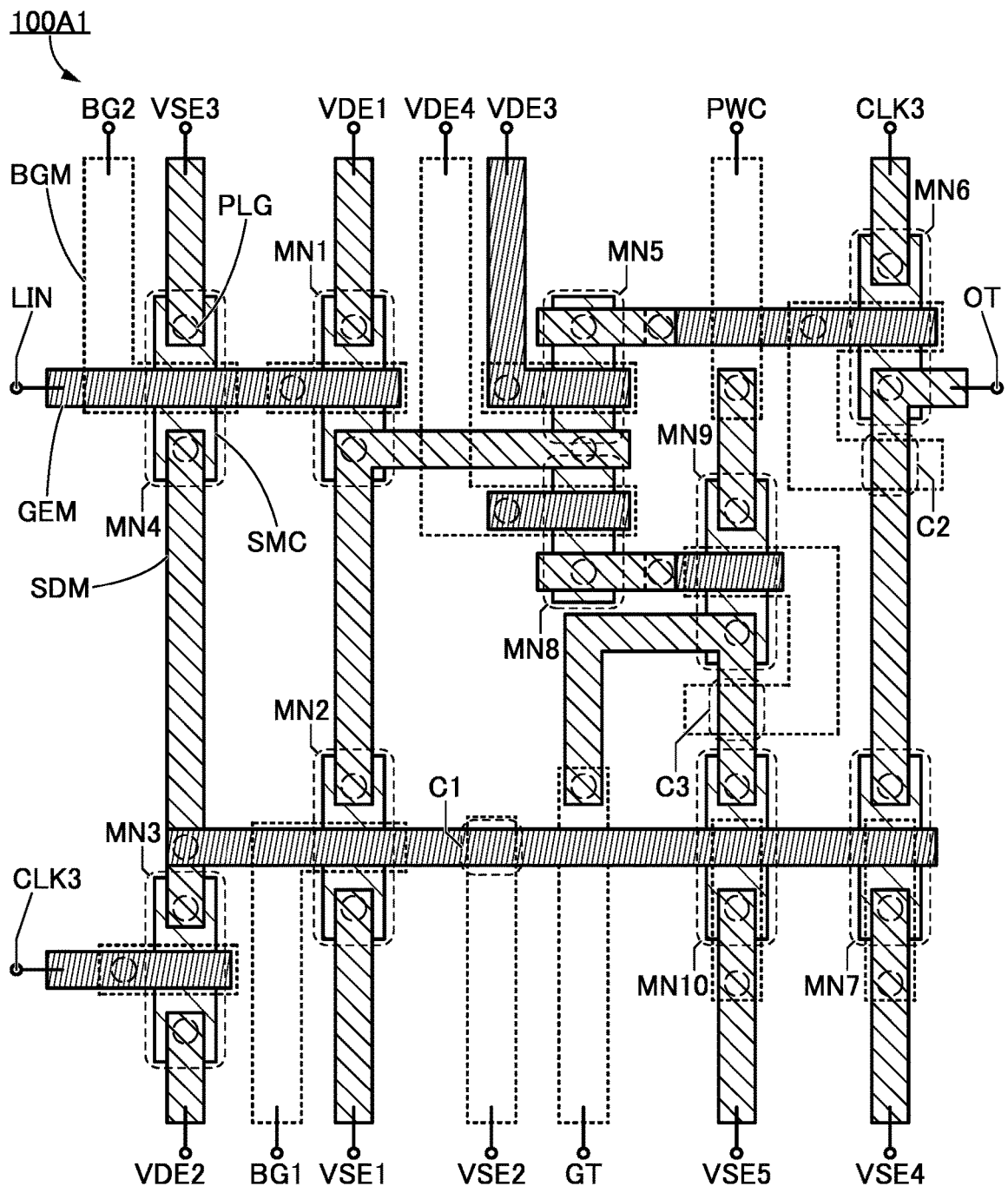
FIG. 17 is a layout view illustrating a configuration example of a semiconductor device.

FIG. 17 is a layout view (a plan view) illustrating an example of a circuit configuration of the circuit 100A1 in FIG. TA. The circuit 100A1 in FIG. 17 includes a conductor GEM, a conductor BGM, a conductor PLG, a conductor SDM, and a semiconductor SMC, for example. Note that an insulator included in the circuit 100A1 is not illustrated in FIG. 17.

The conductor BGM is positioned below the semiconductor SMC, for example. The semiconductor SMC is positioned below the conductor GEM, for example. The conductor GEM is positioned below the conductor SDM, for example. That is, in the circuit 100A1 in FIG. 17, the conductor BGM, the semiconductor SMC, the conductor GEM, and the conductor SDM are formed in this order from the bottom.

Part of the conductor BGM functions as second gates of the transistors MN1 to MN10, for example. Part of the conductor GEM functions as first gates of the transistors MN1 to MN10, for example.

The conductor BGM, the semiconductor SMC, the conductor GEM, and the conductor SDM can be formed through photolithography, for example. Specifically, for example, in the case where the conductor BGM is formed, a conductive material to be the conductor BGM is deposited by a sputtering method, a chemical vapor deposition (CVD) method, a pulsed laser deposition (PLD) method, or an atomic layer deposition (ALD) method, and then a desired pattern is formed through photolithography. The semiconductor SMC, the conductor GEM, and the conductor SDM can also be formed in a manner similar to that of the conductor BGM.

An insulator may be provided between the conductor BGM and the semiconductor SMC, between the semiconductor SMC and the conductor GEM, and between the conductor GEM and the conductor SDM. In particular, the insulator provided between the conductor BGM and the semiconductor SMC functions as a first gate insulating film (referred to as a back gate insulating film in some cases), the insulator provided between the semiconductor SMC and the conductor GEM functions as a second gate insulating film (referred to as a gate insulating film or a front gate insulating film in some cases).

The conductor PLG is positioned between the conductor BGM and the conductor GEM, between the conductor BGM and the conductor SDM, between the conductor GEM and the conductor SDM, or between the semiconductor SMC and the conductor SDM, and functions as a wiring or a plug electrically connect them. The conductor PLG is formed, for example, in such a manner that an opening is formed in the insulator, and the opening is filled with a conductive material to be the conductor PLG. Note that after the formation of the conductor PLG, planarization using chemical mechanical polishing or the like may be performed to align the levels of film surfaces of the conductor PLG and peripheral insulators.

Each of the transistors MN1 to MN10 included in the circuit 100A1 in FIG. 17 includes, for example, part of the conductor BGM, part of the semiconductor SMC, part of the conductor GEM, and part of the insulator. In other words, materials such as part of the conductor BGM, part of the semiconductor SMC, part of the conductor GEM, and part of the insulator form the transistors MN1 to MN10.

The capacitor C1 included in the circuit 100A1 in FIG. 17 includes part of the conductor BGM and part of the conductor GEM. Each of the capacitors C2 and C3 included in the circuit 100A1 in FIG. 17 includes part of the conductor BGM and part of the conductor SDM. Note that an insulator with high dielectric constant is preferably provided between the conductor BGM and the conductor GEM which are included in the capacitor C1. Similarly, an insulator with high dielectric constant is preferably provided between the conductor BGM and the conductor SDM which are included in the capacitors C2 and C3.

Note that this embodiment can be combined with any of the other embodiments in this specification as appropriate.

Embodiment 3

In this embodiment, configuration examples of a display apparatus combining the semiconductor device of one embodiment of the present invention with a display portion will be described.

Figure 18:
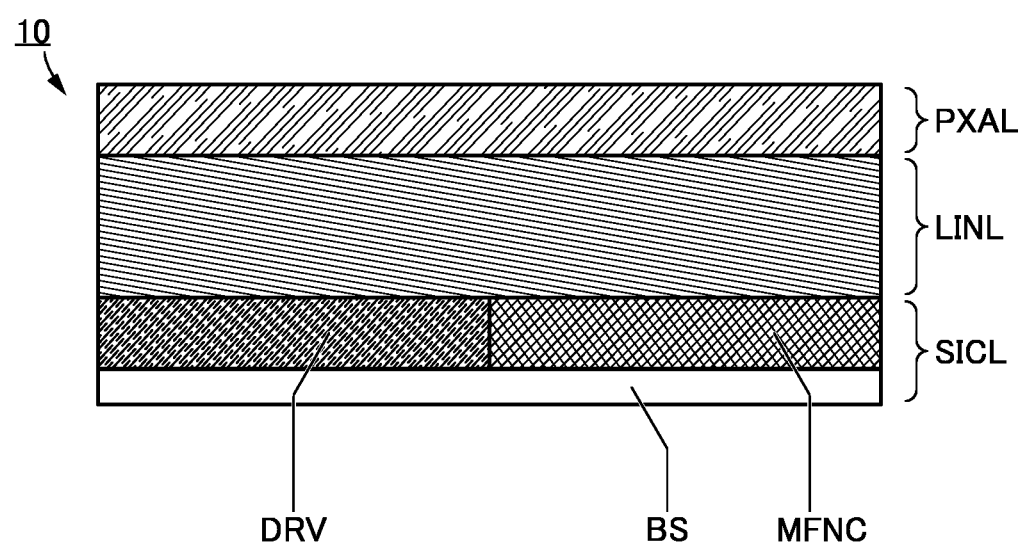
FIG. 18 is a schematic cross-sectional view illustrating a structure example of a display apparatus.

FIG. 18 is a schematic cross-sectional view of a display apparatus of one embodiment of the present invention. A display apparatus 10 includes a pixel layer PXAL, a wiring layer LINL, and a circuit layer SICL.

The wiring layer LINL is provided over the circuit layer SICL, and the pixel layer PXAL is provided over the wiring layer LINL.

The circuit layer SICL includes a substrate BS, a driver circuit region DRV, and a functional circuit region MFNC.

As the substrate BS, a semiconductor substrate (e.g., a single crystal substrate) formed of silicon or germanium can be used, for example. Besides such a semiconductor substrate, any of the following can be used as the substrate BS: a silicon on insulator (SOI) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base film. Examples of the glass substrate include a barium borosilicate glass substrate, an aluminoborosilicate glass substrate, and a soda lime glass substrate. Examples of a material for the flexible substrate, the attachment film, the base film, or the like include plastic typified by polyethylene terephthalate (PET), polyethylene naphthalate (PEN), polyethersulfone (PES), and polytetrafluoroethylene (PTFE). Another example is a synthetic resin such as an acrylic resin. Other examples are polypropylene, polyester, polyvinyl fluoride, and polyvinyl chloride. Other examples are polyamide, polyimide, aramid, an epoxy resin, an inorganic film formed by evaporation, and paper. Note that in the case where the manufacturing process of the display apparatus 10 involves heat treatment, a highly heat-resistant material is preferably used for the substrate BS.

For example, in the case where a semiconductor substrate including silicon as a material is used as the substrate BS, transistors included in the driver circuit region DRV and the functional circuit region MFNC can be Si transistors.

For example, in the case where a glass substrate is used as the substrate BS, transistors included in the driver circuit region DRV and the functional circuit region MFNC can be OS transistors.

The driver circuit region DRV and the functional circuit region MFNC are provided over the substrate BS.

The driver circuit region DRV includes, for example, a driver circuit for driving a pixel included in the pixel layer PXAL to be described later. A specific configuration example of the driver circuit region DRV will be described later.

The functional circuit region MFNC includes a graphics processing unit (GPU), as an example. In the case where the display apparatus 10 includes a touch panel, the functional circuit region MFNC may include a sensor controller for controlling a touch sensor included in the touch panel. In the case where a light-emitting device using an EL material is used as a display element of the display apparatus 10, an EL correction circuit may be included in the functional circuit region MFNC. In the case where a liquid crystal element is used as the display element of the display apparatus 10, a gamma correction circuit may be included in the functional circuit region MFNC.

The wiring layer LINL is provided over the circuit layer SICL.

The wiring layer LINL includes wirings. The wiring included in the wiring layer LINL functions as, for example, a wiring that electrically connects a driver circuit included in the driver circuit region DRV provided below the wiring layer LINL and a circuit included in the pixel layer PXAL provided above the wiring layer LINL.

The pixel layer PXAL includes, for example, a plurality of pixels. The plurality of pixels may be arranged in a matrix in the pixel layer PXAL.

Each of the plurality of pixels can express one color or a plurality of colors. In particular, the plurality of colors can be, for example, three colors of red (R), green (G), and blue (B). Alternatively, the plurality of colors may be two or more colors selected from, for example, red (R), green (G), blue (B), cyan, magenta, yellow, and white. Note that in the case where each of pixels expressing different colors is called a subpixel and white is expressed by a plurality of subpixels expressing different colors, the plurality of subpixels are collectively called a pixel in some cases. In this specification and the like, a subpixel is referred to as a pixel for convenience.

Figure 19:
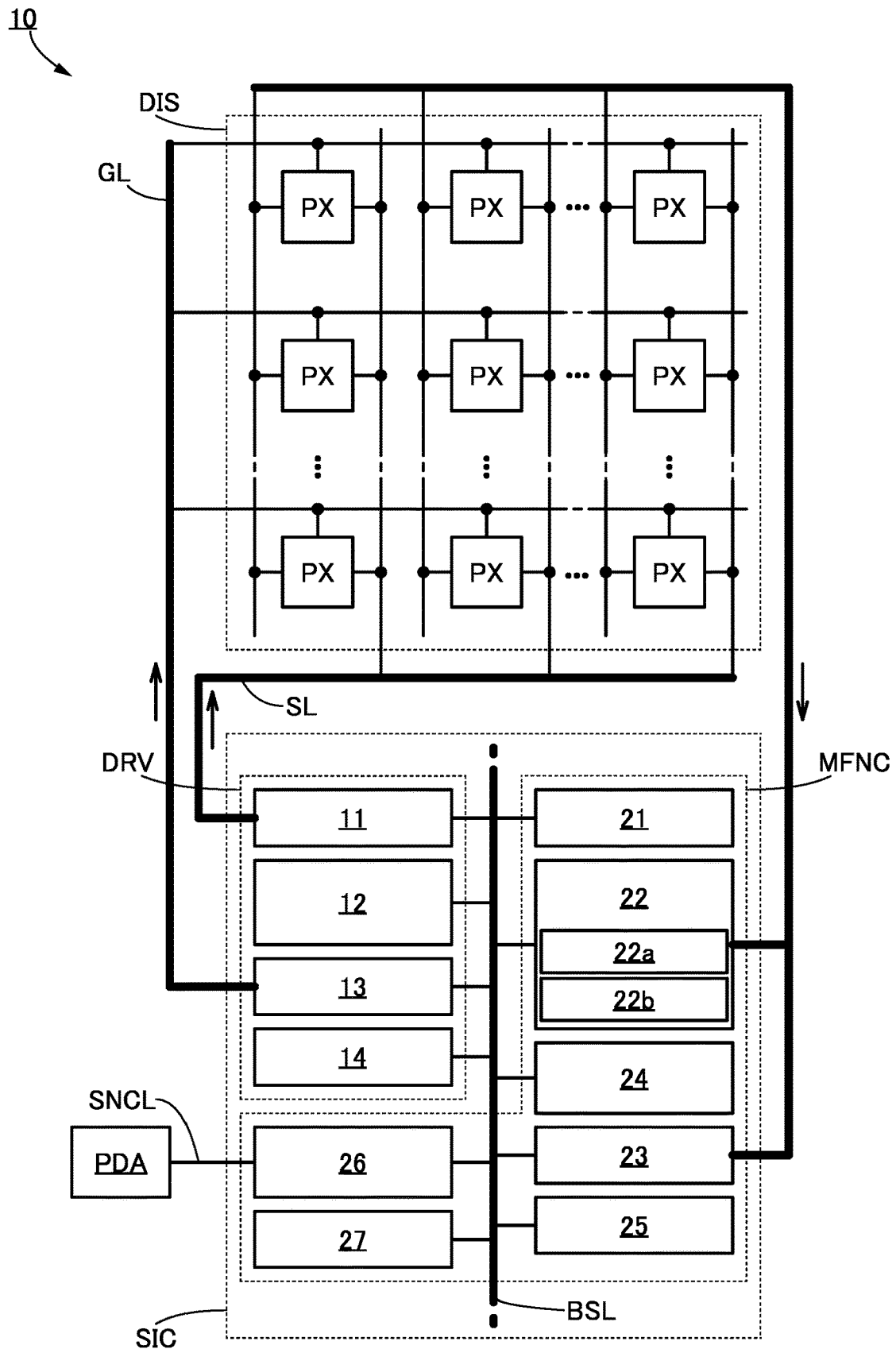
FIG. 19 is a block diagram illustrating a configuration example of a display apparatus.

FIG. 19 is a block diagram illustrating a configuration example of the display apparatus 10 illustrated in FIG. 18. The display apparatus 10 illustrated in FIG. 19 includes a display portion DIS and a circuit portion SIC, for example. A sensor PDA illustrated in FIG. 19 may be placed inside or outside the display apparatus 10.

In FIG. 19, the thick solid lines denote a plurality of wirings or bus wirings.

In FIG. 19, the display portion DIS includes a plurality of pixel circuits PX arranged in a matrix, for example. For example, one or more selected from a liquid crystal display device, a light-emitting device including an organic EL material, and a light-emitting device including a light-emitting diode (e.g., a micro LED) can be used in the pixel circuit PX. Note that in the description in this embodiment, the pixel circuit PX in the display portion DIS includes a light-emitting device including an organic EL material. Note that a pixel circuit applicable to the display portion DIS, the pixel circuit PX, and the like will be described in detail in Embodiment 4.

In FIG. 19, the circuit portion SIC includes the driver circuit region DRV and the functional circuit region MFNC.

The driver circuit region DRV functions as a peripheral circuit for driving the display portion DIS, for example. Specifically, the driver circuit region DRV includes, for example, a source driver circuit 11, a digital-to-analog converter circuit 12, a gate driver circuit 13, and a level shifter 14. Note that the source driver circuit 11 corresponds to the driver circuit SD in FIG. 2, and the gate driver circuit 13 corresponds to the driver circuit GD in FIG. 2, for example.

The functional circuit region MFNC can be provided with, for example, a memory device storing image data to be displayed on the display portion DIS, a decoder for decoding encoded image data, a graphics processing unit (GPU) for processing image data, a power supply circuit, a correction circuit, and a CPU. In FIG. 19, the functional circuit region MFNC includes a memory device 21, a GPU (AI accelerator) 22, an EL correction circuit 23, a timing controller 24, a CPU (NoffCPU (registered trademark)) 25, a sensor controller 26, and a power supply circuit 27, for example.

In the display apparatus 10 shown in FIG. 19, for example, a bus wiring BSL is electrically connected to each of the circuits included in the driver circuit region DRV and each of the circuits included in the functional circuit region MFNC.

The source driver circuit 11 has a function of transmitting image data to the pixel circuit PX included in the display portion DIS, for example. Thus, the source driver circuit 11 is electrically connected to the pixel circuit PX through a wiring SL.

The digital-to-analog converter circuit 12 has a function of, for example, converting image data that has been digitally processed by the GPU, correction circuit, or the like described later, into analog data. The image data converted into analog data is transmitted to the display portion DIS through the source driver circuit 11. Note that the digital-to-analog converter circuit 12 may be included in the source driver circuit 11, and the image data may be transmitted to the source driver circuit 11, the digital-to-analog converter circuit 12, and the display portion DIS in this order.

The gate driver circuit 13 has a function of selecting the pixel circuit PX to which image data is to be transmitted in the display portion DIS, for example. Thus, the gate driver circuit 13 is electrically connected to the pixel circuit PX through a wiring GL.

The level shifter 14 has a function of converting the signals to be input to the source driver circuit 11, the digital-to-analog converter circuit 12, the gate driver circuit 13, and the like into signals having appropriate levels, for example.

The memory device 21 has a function of storing image data to be displayed on the display portion DIS, for example.

Note that the memory device 21 can be configured to store the image data as digital data or analog data.

In the case where the memory device 21 stores image data, the memory device 21 is preferably a nonvolatile memory. In this case, the memory device 21 can be a NAND memory or the like.

In the case where the memory device 21 stores temporary data generated in the GPU 22, the EL correction circuit 23, the CPU 25, or the like, the memory device 21 is preferably a volatile memory. In that case, a static random access memory (SRAM), a dynamic random access memory (DRAM), or the like can be used as the memory device 21.

The GPU 22 has a function of performing processing for plotting the image data read from the memory device 21 on the display portion DIS, for example. Specifically, the GPU 22 is configured to perform pipeline processing in parallel and can thus perform high-speed processing of the image data to be displayed on the display portion DIS. The GPU 22 can also function as a decoder for decoding an encoded image.

The functional circuit region MFNC may include a plurality of circuits that can increase the display quality of the display portion DIS. As such circuits, for example, correction circuits (dimming or toning circuits) that detect and correct color irregularity of an image displayed on the display portion DIS to optimize the image may be provided. In the case where the pixel in the display portion DIS includes a light-emitting device including an organic EL material, the functional circuit region MFNC may be provided with an EL correction circuit. The luminance of light emitted from the light-emitting device including an organic EL material is determined depending on the amount of current flowing through the light-emitting device. Accordingly, when the amount of current flowing through the light-emitting device is changed due to transistor characteristics or the like, the luminance of the light-emitting device is also changed unintentionally. The EL correction circuit has a function of measuring the amount of current flowing through the light-emitting device, comparing it with a desired amount of current, and adjusting the amount of current flowing through the light-emitting device when necessary. Thus, the luminance of light emitted from the light-emitting device can be set appropriate. Note that because the description in this embodiment is made on the assumption that the pixel circuit PX in the display portion DIS includes the light-emitting device including an organic EL material, the functional circuit region MFNC in this example is provided with the EL correction circuit 23.

The above-described image correction may be performed using artificial intelligence in the following manner, for example. A current flowing in the display device included in the pixel (or a voltage applied to the display device) is monitored and acquired, an image displayed on the display portion DIS is acquired with an image sensor or the like, the current (or voltage) and the image are used as input data in an arithmetic operation of the artificial intelligence (e.g., an artificial neural network), and the output result is used to determine whether the image should be corrected.

Such an arithmetic operation of artificial intelligence can be applied to not only image correction but also upconversion of image data. In this case, upconversion of low-resolution image data in accordance with the resolution of the display portion DIS allows a high-display-quality image to be displayed on the display portion DIS. The arithmetic operation of artificial intelligence can also be applied to downconversion of image data.

Note that the above-described arithmetic operation of the artificial intelligence can be performed using the GPU 22 included in the functional circuit region MFNC. That is, the GPU 22 can be used to perform arithmetic operations for various kinds of correction (e.g., a color irregularity correction circuit 22a and an upconversion circuit 22b).

Note that in this specification and the like, a GPU performing an arithmetic operation of the artificial intelligence is referred to as an AI accelerator. That is, the GPU included in the functional circuit region MFNC may be replaced with an AI accelerator in the description in this specification and the like.

The timing controller 24 has a function of changing the frame rate at which an image is displayed on the display portion DIS. For example, the display apparatus 10 can be driven at a frame rate reduced by the timing controller 24 in the case where the display portion DIS displays a still image; for another example, the display apparatus 10 can be driven at a frame rate increased by the timing controller 24 in the case where the display portion DIS displays a moving image. In other words, the display apparatus 10 provided with the timing controller 24 can be driven at a frame rate that is changed depending on which of a still image and a moving image is displayed. Specifically, since the frame rate when the display portion DIS displays a still image can be lowered, the power consumption of the display apparatus 10 can be reduced.

The CPU 25 has a function of, for example, performing general-purpose processing such as execution of an operating system, control of data, and execution of various arithmetic operations and programs. In the display apparatus 10, the CPU 25 has a function of, for example, giving an instruction for an operation for writing or reading image data to/from the memory device 21, an operation for correcting image data, an operation for a later-described sensor, or the like. Furthermore, the CPU 25 may have a function of, for example, transmitting a control signal to at least one of the circuits included in the functional circuit region MFNC, such as the memory device, the GPU, the correction circuit, the timing controller, and a high frequency circuit.

The CPU 25 may include a circuit for temporarily backing up data (hereinafter referred to as a backup circuit). The backup circuit is preferably capable of holding the data even after supply of a power supply voltage is stopped. For example, in the case where the display portion DIS displays a still image, the CPU 25 can cease to work until an image different from the currently displayed still image is displayed. Accordingly, dynamic power consumption by the CPU 25 can be reduced in such a manner that the data under processing by the CPU 25 is backed up in the backup circuit and then supply of a power supply voltage to the CPU 25 is stopped to stop the CPU 25. In this specification and the like, a CPU including a backup circuit is referred to as an NoffCPU.

The sensor controller 26 has a function of, for example, controlling the sensor PDA. FIG. 19 shows a wiring SNCL as a wiring for electrically connecting the sensor PDA to the sensor controller 26.

The sensor PDA is, for example, a touch sensor that can be provided above, below, or inside the display portion DIS. Alternatively, the sensor PDA may be an illuminance sensor, for example. Specifically, the illuminance sensor acquiring the intensity of the external light with which the display portion DIS is irradiated makes it possible to change the brightness (luminance) of an image displayed on the display portion DIS in accordance with the intensity of the external light. For example, under intense external light, the luminance of an image displayed on the display portion DIS can be increased to enhance the viewability of the image. By contrast, under weak external light, the luminance of an image displayed on the display portion DIS can be lowered to reduce the power consumption.

Further alternatively, the sensor PDA can be an image sensor, for example. For example, an image or the like acquired with the image sensor can be displayed on the display portion DIS.

The power supply circuit 27 has a function of, for example, generating voltages to be supplied to the circuits included in the driver circuit region DRV, the circuits included in the functional circuit region MFNC, the pixels included in the display portion DIS, and the like. Note that the power supply circuit 27 may have a function of selecting a circuit to which a voltage is to be supplied. For example, the power supply circuit 27 stops supply of a voltage to the CPU 25, the GPU 22, and the like during a period in which the display portion DIS displays a still image, whereby the power consumption of the whole display apparatus 10 can be reduced.

Configuration Example of Image Sensor

Here, an image sensor that can be used as the sensor PDA of the display apparatus 10 is described.

Figure 20:
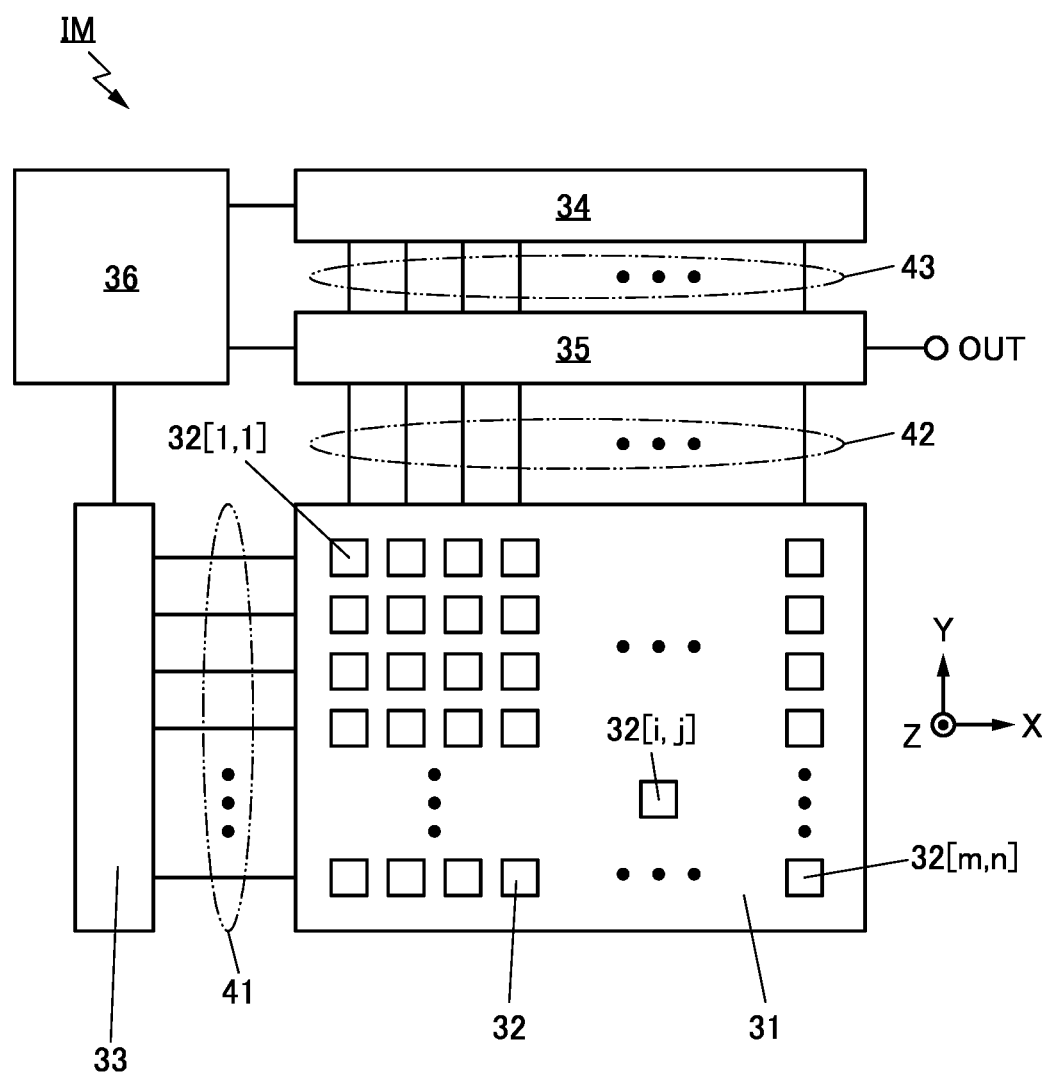
FIG. 20 is a block diagram illustrating a configuration example of an imaging device.

As the image sensor that can be used as the sensor PDA, for example, an imaging device IM illustrated in FIG. 20 can be employed.

FIG. 20 is a block diagram illustrating an example of a circuit configuration of the imaging device IM. The imaging device IM includes an imaging unit 31, a first driver circuit unit 33, a second driver circuit unit 34, a reading circuit unit 35, and a control circuit unit 36. Note that the first driver circuit unit 33, the second driver circuit unit 34, the reading circuit unit 35, and the control circuit unit 36 are collectively called a "functional circuit" in some cases. Any of a variety of circuits such as a shift register, a level shifter, an inverter, a latch, an analog switch, and a logic circuit can be used as the functional circuit.

Transistors used in the imaging unit 31 and the functional circuit which are provided in the imaging device IM may be n-channel transistors or p-channel transistors. Both n-channel transistors and p-channel transistors may be used. A CMOS structure in which n-channel transistors and p-channel transistors are combined may be employed for the imaging unit 31 and the functional circuit.

The imaging unit 31 includes imaging pixels 32 arranged in a matrix of m rows and n columns (each of m and n is an integer greater than or equal to 1). The imaging unit 31 is electrically connected to the first driver circuit unit 33 through a plurality of wirings 41. The imaging unit 31 is electrically connected to the reading circuit unit 35 through a plurality of wirings 42. The reading circuit unit 35 is electrically connected to the second driver circuit unit 34 through a plurality of wirings 43. For example, the imaging pixel 32 in the i-th row (here, i is an integer greater than or equal to 1 and less than or equal to m) is electrically connected to the first driver circuit unit 33 through the i-th wiring 41. The imaging pixel 32 in the j-th column (here, j is an integer greater than or equal to 1 and less than or equal to n) is electrically connected to the reading circuit unit 35 through the j-th wiring 42.

In FIG. 20, the imaging pixel 32 placed in the first row and the first column is shown as the imaging pixel 32[1, 1], and the imaging pixel 32 placed in the m-th row and the n-th column is shown as the imaging pixel 32[m, n]. The imaging pixel 32 placed in the i-th row and the j-th column is shown as the imaging pixel 32[i,j].

Note that wirings connected to one imaging pixel 32 are not limited to the wiring 41 and the wiring 42. A wiring other than the wiring 41 and the wiring 42 may be connected to the imaging pixel 32.

The pixel density (also referred to as "resolution") of the imaging unit 31 is preferably higher than or equal to 100 ppi and lower than or equal to 10000 ppi, and more preferably higher than or equal to 1000 ppi and lower than or equal to 10000 ppi. For example, the resolution may be higher than or equal to 2000 ppi and lower than or equal to 6000 ppi, or higher than or equal to 3000 ppi and lower than or equal to 5000 ppi.

The aspect ratio of the imaging unit 31 is not particularly limited. The imaging unit 31 in the imaging device IM can correspond to various aspect ratios, such as 1:1 (a square), 4:3, 16:9, and 16:10.

The diagonal of the imaging unit 31 is greater than or equal to 0.1 inches and less than or equal to 100 inches. Depending on the circumstances, the diagonal may be greater than or equal to 100 inches.

The control circuit unit 36 has a function of controlling the operation of a circuit included in the imaging device IM. The first driver circuit unit 33 has a function of selecting the imaging pixels 32 row by row. The imaging pixels 32 in the row selected by the first driver circuit unit 33 output imaging data to the reading circuit unit 35 through the wirings 42.

The reading circuit unit 35 holds imaging data supplied by the imaging pixels 32 in every column, and performs noise removal and the like. As the noise removal, for example, correlated double sampling (CDS) treatment may be performed. The reading circuit unit 35 may have a function of amplifying imaging data or a function of converting imaging data from analog to digital.

The second driver circuit unit 34 has functions of sequentially selecting imaging data held in the reading circuit unit 35, and outputting the imaging data from an output terminal OUT to the outside.

One or more selected from the first driver circuit unit 33, the second driver circuit unit 34, the reading circuit unit 35, and the control circuit unit 36 may be provided with the shift register in FIG. 3A or FIG. 3B described in Embodiment 1, for example. As the circuits 100[1] to 100[m] in the shift register, for example, the circuit 100A1 described in Configuration examples 1 to 8 in Embodiment 1 may be used.

Circuit Configuration Example of Imaging Pixel

Figure 21A:
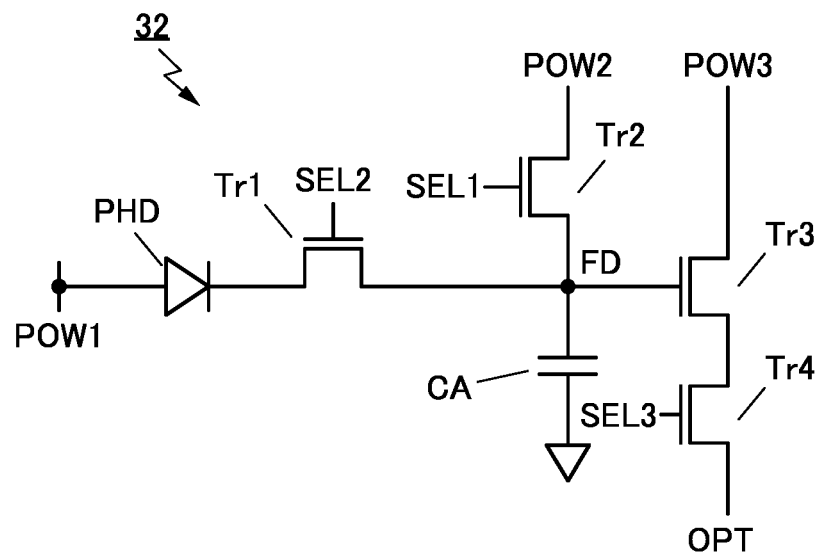
FIGS. 21A and 21B are circuit diagrams each illustrating an example of an imaging pixel.

FIG. 21A is a circuit diagram illustrating a circuit configuration example of the imaging pixel 32. The imaging pixel 32 includes a photoelectric conversion device PHD (also referred to as a "photoelectric conversion element" or an "imaging element"), a transistor Tr1, a transistor Tr2, a transistor Tr3, a transistor Tr4, and a capacitor CA. Note that the capacitor CA is not necessarily provided. In this specification and the like, a configuration in which the photoelectric conversion device PHD is removed from the above components is referred to as an "imaging pixel circuit" in some cases.

One electrode (cathode) of the photoelectric conversion device PHD is electrically connected to one of a source and a drain of the transistor Tr1. The other of the source and the drain of the transistor Tr1 is electrically connected to one of a source and a drain of the transistor Tr2. The one of the source and the drain of the transistor Tr2 is electrically connected to one electrode of the capacitor CA. The one electrode of the capacitor CA is electrically connected to a gate of the transistor Tr3. One of a source and a drain of the transistor Tr3 is electrically connected to one of a source and a drain of the transistor Tr4.

Here, a node where the other of the source and the drain of the transistor Tr1, the one electrode of the capacitor CA, and the gate of the transistor Tr3 are electrically connected is referred to as a node FD. The node FD can function as a charge detection portion.

The other electrode (anode) of the photoelectric conversion device PHD is electrically connected to a wiring POW1. A gate of the transistor Tr1 is electrically connected to a wiring SEL2. The other of the source and the drain of the transistor Tr2 is electrically connected to a wiring POW2. The other of the source and the drain of the transistor Tr3 is electrically connected to a wiring POW3. A gate of the transistor Tr2 is electrically connected to a wiring SEL1. A gate of the transistor Tr4 is electrically connected to a wiring SEL3. The other electrode of the capacitor CA is electrically connected to a reference potential line such as a GND wiring, for example. The other of the source and the drain of the transistor Tr4 is electrically connected to a wiring OPT.

The wirings SEL2, SEL1, and SEL3 each have a function of a signal line controlling on/off states of the corresponding transistor. The wiring OPT has a function of an output line.

The wirings POW1, POW2, and POW3 each have a function of a power supply line. The imaging pixel 32 in FIG. 21A has a configuration in which the cathode of the photoelectric conversion device PHD is electrically connected to the transistor Tr1, and is capable of taking an image by resetting the node FD to a high potential. Thus, the wiring POW2 is at a high potential (a potential higher than that of the wiring POW1).

Although the cathode of the photoelectric conversion device PHD is electrically connected to the node FD in FIG. 21A, the anode of the photoelectric conversion device PHD may be electrically connected to the one of the source and the drain of the transistor Tr1. In that case, the imaging pixel 32 is capable of taking an image by resetting the node FD to a low potential. Thus, the wiring POW2 is set at a low potential (a potential lower than that of the wiring POW1).

The transistor Tr1 has a function of controlling the potential of the node FD. The transistor Tr1 is also referred to as a "transfer transistor". The transistor Tr2 has a function of resetting the potential of the node FD. The transistor Tr2 is also referred to as a "reset transistor". The transistor Tr3 functions as a source follower circuit, and can output the potential of the node FD as imaging data to the wiring OPT. The transistor Tr4 has a function of selecting a pixel from which the imaging data is output. The transistor Tr3 is also referred to as an "amplifier transistor". The transistor Tr4 is also referred to as a "selection transistor".

Figure 21B:
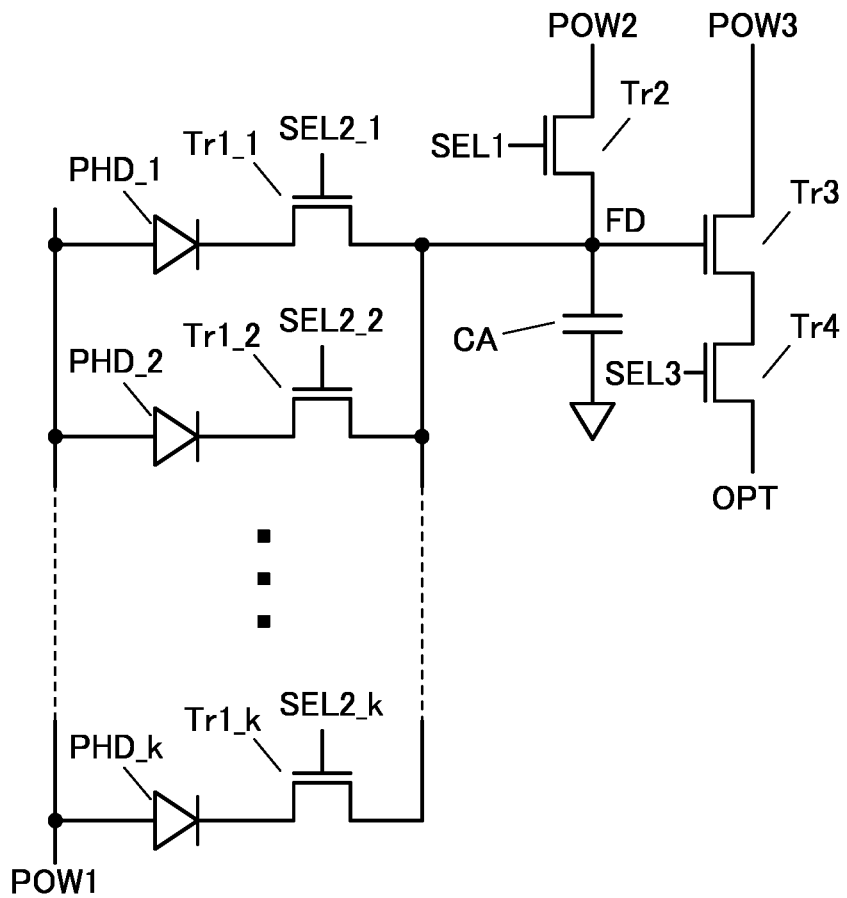

The photoelectric conversion device PHD and the transistor Tr1 are regarded as one set as illustrated in FIG. 21B, and a plurality of sets each including the photoelectric conversion device PHD and the transistor Tr1 may be connected to the node FD. With the circuit configuration illustrated in FIG. 21B, the area occupied by one imaging pixel 32 can be reduced. Thus, the packing density of the imaging pixels 32 can be increased.

In FIG. 21B, the photoelectric conversion device PHD and the transistor Tr1 of the first set are shown as a photoelectric conversion device PHD_1 and a transistor Tr1_1. A gate of the transistor Tr1_1 is electrically connected to a wiring SEL2_1. The photoelectric conversion device PHD and the transistor Tr1 of the second set are shown as a photoelectric conversion device PHD_2 and a transistor Tr1_2. A gate of the transistor Tr1_2 is electrically connected to a wiring SEL2_2. The photoelectric conversion device PHD and the transistor Tr1 of the k-th set (k is an integer greater than or equal to 1) are shown as a photoelectric conversion device PHD_k and a transistor Tr1_k. A gate of the transistor Tr1_k is electrically connected to a wiring SEL2_k.

As an example, all transistors included in the imaging device IM can be formed through the same process.

Note that the functional circuit included in the imaging device IM does not necessarily include all the components described in this embodiment and the like, and can include components other than these.

Configuration Example of Display Apparatus and Imaging Device

Next, a configuration of the display apparatus 10 in which the display apparatus and the imaging device are integrated is described.

Figure 22:
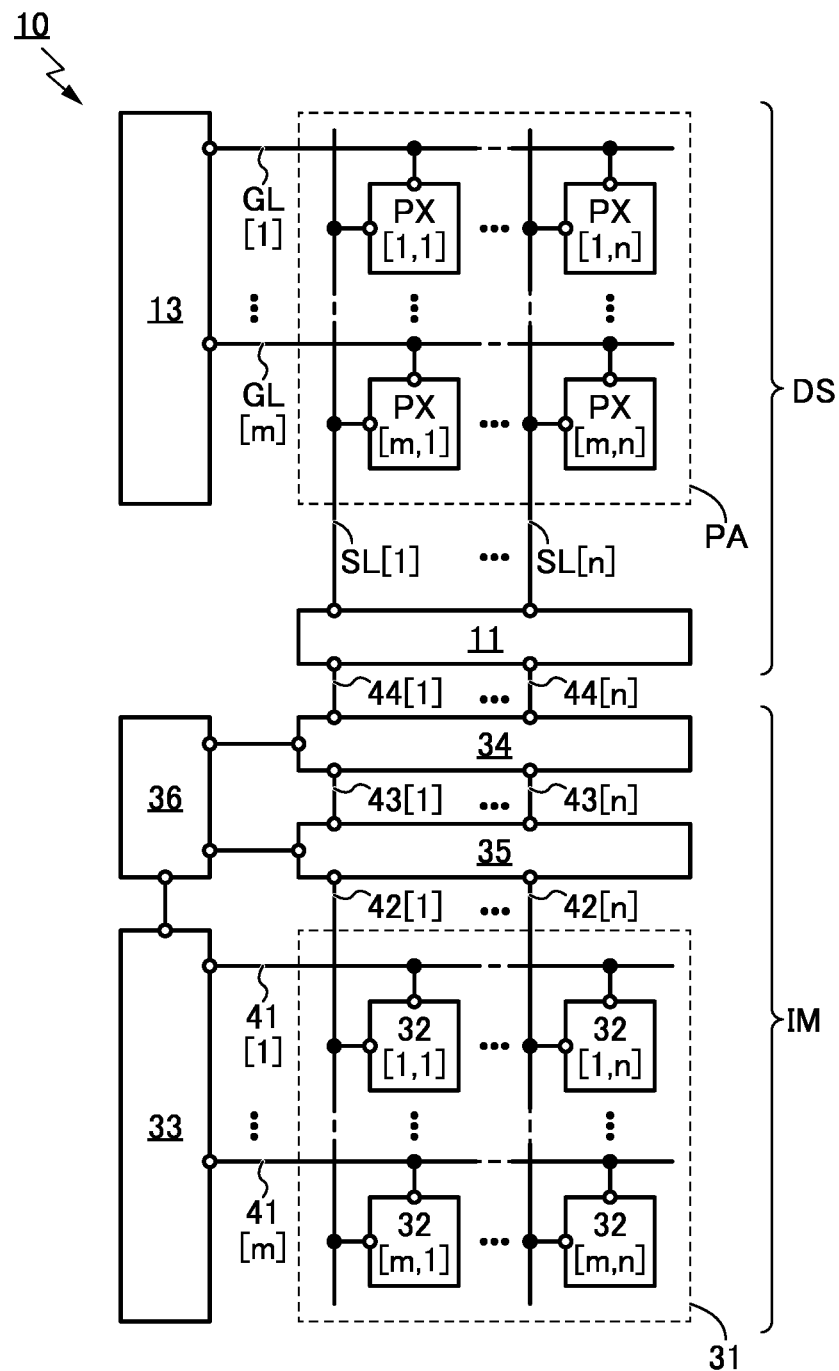
FIG. 22 is a block diagram illustrating a configuration example of a display apparatus.

FIG. 22 illustrates a configuration of the display apparatus 10 formed by combining the imaging device IM in FIGS. 21A and 21B and a display apparatus in FIG. 19 (hereinafter referred to as a display apparatus DS) including the pixel array PA, the source driver circuit 11, and the gate driver circuit 13.

Note that in FIG. 22, the plurality of wirings 41 are shown as wirings 41[1] to 41[m], the plurality of wirings 42 are shown as wirings 42[1] to 42[n], and the plurality of wirings 43 are shown as wirings 43[1] to 43[n].

In FIG. 22, for example, the second driver circuit unit 34 and the source driver circuit 11 are electrically connected to each other through the wirings 44[1] to 44[n].

For example, imaging data read by the reading circuit unit 35 is transmitted to the source driver circuit 11 through the wirings 43[1] to 43[n], the second driver circuit unit 34, and the wirings 44[1] to 44[n].

Thus, the source driver circuit 11 may have functions of executing the voltage adjustment, the polarity conversion, the power amplification, and the like of imaging data supplied from the imaging device IM. That is, the source driver circuit 11 may have a function of converting imaging data into an image signal. Thus, the source driver circuit 11 can output an image signal converted from imaging data to the pixel array PA.

With this structure, imaging data obtained by the imaging unit 31 can be converted into an image signal that is suitable to be displayed on the pixel array PA, by the source driver circuit 11. As a result, for example, a display apparatus which is hardly affected by noise and has favorable display quality is achieved.

In the display apparatus 10, the pixel array PA and the imaging unit 31 may be arranged in the same array. For example, as illustrated in FIG. 23, the display apparatus may have a configuration in which a pixel circuit and an imaging circuit may be arranged in the same array.

Figure 23:
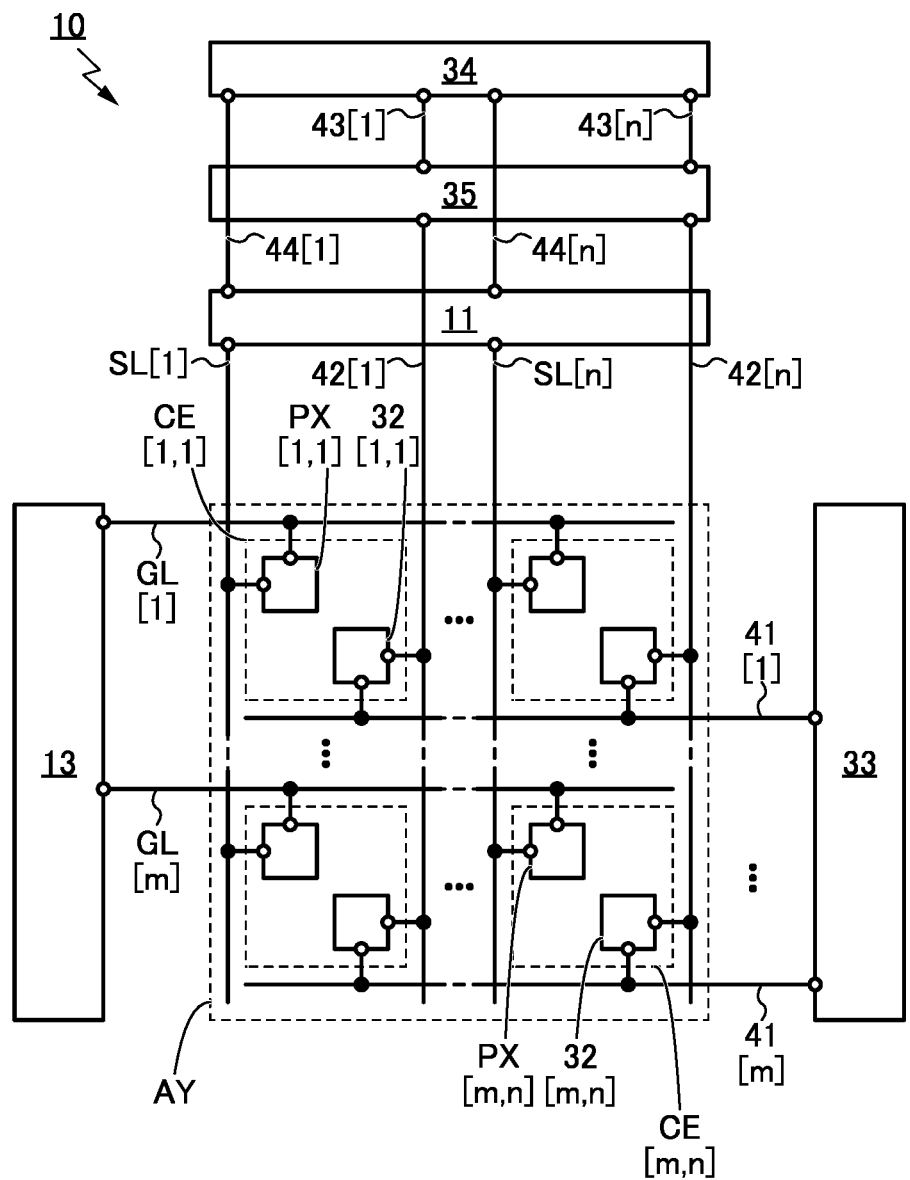
FIG. 23 is a block diagram illustrating a configuration example of a display apparatus.

In a cell array AY in the display apparatus 10 in FIG. 23, circuits CE[1, 1] to CE[m, n] are arranged in a matrix of m rows and n columns. When i is an integer greater than or equal to 1 and less than or equal to m and j is an integer greater than or equal to 1 and less than or equal to n, a circuit CE[i, j] includes a pixel circuit PX[i, j] and an imaging pixel 32[i, j], for example. Note that in the cell array AY in FIG. 23, only the circuit CE[1, 1] and the circuit CE[m, n] are shown with references.

With the configuration of the display apparatus 10 in which the pixel circuits PX and the imaging pixels 32 are arranged in the same array as illustrated in FIG. 23, the whole of the display portion can be used as a sensor region. For example, an image of a finger is captured by the imaging pixels 32[1, 1] to 32[m, n]; thus, the display apparatus 10 can have a function of fingerprint identification. When the imaging pixels 32[1, 1] to 32[m, n] continuously take images of a user's finger, the display apparatus 10 or an electronic device including the display apparatus 10 can recognize movement of the user's finger. The display apparatus 10 or the electronic device including the display apparatus 10 may be configured to perform various operations in accordance with movement of the user's finger (e.g., zoom-in/zoom-out of an image and scrolling on a displayed image). That is, the display apparatus 10 may have a function of a touch panel.

Note that this embodiment can be combined with any of the other embodiments in this specification as appropriate.

Embodiment 4

In this embodiment, a display apparatus that can be provided in an electronic device of one embodiment of the present invention will be described. Note that the display apparatus described in this embodiment can be used in the display portion DIS described in the above embodiment.

Structure Example of Display Apparatus

Figure 24:
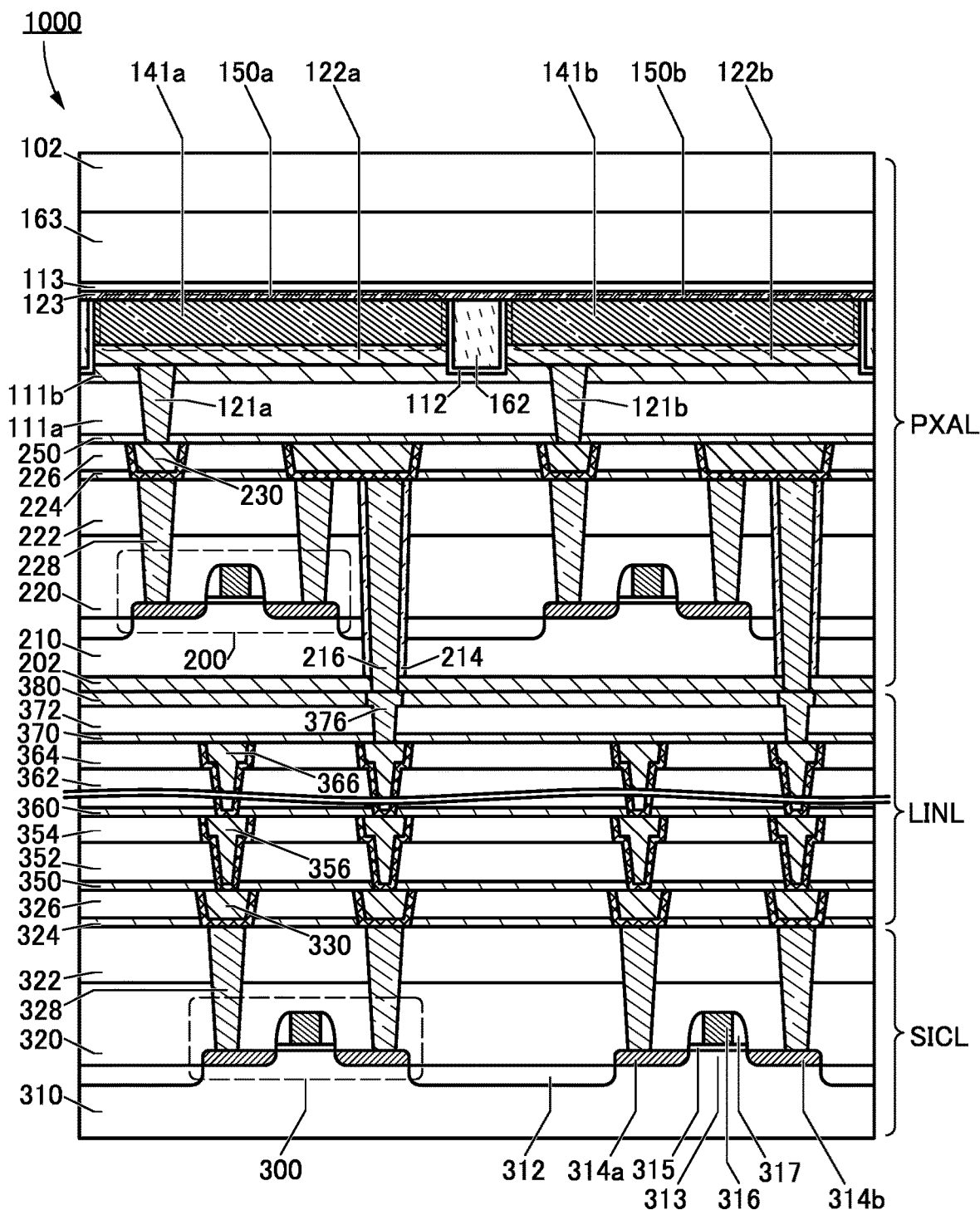
FIG. 24 is a schematic cross-sectional view illustrating a structure example of a display apparatus.

FIG. 24 is a cross-sectional view illustrating an example of a display apparatus of one embodiment of the present invention. A display apparatus 1000 in FIG. 24 includes a pixel circuit and a driver circuit over a substrate 310, for example. Note that the display apparatus DSP, the display apparatus 10, and the like described in the above embodiment can have a structure of the display apparatus 1000 in FIG. 24.

Specifically, for example, the circuit layer SICL, the wiring layer LINL, and the pixel layer PXAL in the display apparatus 10 can be formed as illustrated by the display apparatus 1000 in FIG. 24. For example, the circuit layer SICL includes the substrate 310 on which a transistor 300 is formed. Above the transistor 300 is provided the wiring layer LINL that includes wirings that electrically connect the transistor 300, a transistor 200 to be described later, light-emitting devices 150a and 150b to be described later, and the like. Above the wiring layer LINL is provided the pixel layer PXAL that includes, for example, the transistor 200 and a light-emitting device 150 (the light-emitting devices 150a and 150b in FIG. 24).

As the substrate 310, a substrate that can be used as the substrate BS can be used, for example. Note that in the case where the manufacturing process of the display apparatus 1000 involves heat treatment, a highly heat-resistant material is preferably selected for the substrate 310.

In the description of this embodiment, the substrate 310 is a semiconductor substrate containing silicon as a material.

The transistor 300 is provided over the substrate 310 and includes an element isolation layer 312, a conductor 316, an insulator 315, an insulator 317, a semiconductor region 313 that is part of the substrate 310, and low-resistance regions 314a and 314b functioning as source and drain regions. Thus, the transistor 300 is a Si transistor. Although FIG. 24 illustrates a structure in which one of a source and a drain of the transistor 300 is electrically connected to conductors 330, 356, and 366 to be described later through a conductor 328 to be described later, the electrical connection in the semiconductor device of one embodiment of the present invention is not limited thereto. In the semiconductor device of one embodiment of the present invention, for example, a gate of the transistor 300 may be electrically connected to the conductors 330, 356, and 366 through the conductor 328.

The transistor 300 can have a fin-type structure when, for example, a top surface of the semiconductor region 313 and a side surface thereof in the channel width direction are covered with the conductor 316 with the insulator 315 as a gate insulating film therebetween. The effective channel width is increased in the fin-type transistor 300, whereby the on-state characteristics of the transistor 300 can be improved. In addition, contribution of the electric field of the gate electrode can be increased, so that the off-state characteristics of the transistor 300 can be improved.

Note that the transistor 300 can be a p-channel transistor or an n-channel transistor. Alternatively, both the p-channel transistor 300 and the n-channel transistor 300 may be included.

A region in the semiconductor region 313 where a channel is formed, a region in the vicinity thereof, and the low-resistance regions 314*a* and 314*b* functioning as the source and drain regions preferably contain a semiconductor such as a silicon-based semiconductor, and preferably contain single crystal silicon. Alternatively, a material including germanium (Ge), silicon germanium (SiGe), gallium arsenide (GaAs), aluminum gallium arsenide (GaAlAs), or gallium nitride (GaN) may be used. Alternatively, silicon whose effective mass is controlled by applying stress to the crystal lattice and thereby changing the lattice spacing may be used for the above regions in the transistor 300. Alternatively, the transistor 300 may be a high-electron-mobility transistor (HEMT) including gallium arsenide and aluminum gallium arsenide.

For the conductor 316 functioning as a gate electrode, a semiconductor material such as silicon that contains an element imparting n-type conductivity (e.g., arsenic or phosphorus) or an element imparting p-type conductivity (e.g., boron) can be used. Alternatively, for the conductor 316, a conductive material such as a metal material, an alloy material, or a metal oxide material can be used.

Note that a material used for a conductor determines the work function; thus, selecting the material used for the conductor can adjust the threshold voltage of a transistor. Specifically, titanium nitride, tantalum nitride, or the like is preferably used for the conductor. Furthermore, in order to ensure the conductivity and embeddability of the conductor, a metal material such as tungsten or aluminum is preferably stacked over the conductor. In particular, tungsten is preferable in terms of heat resistance.

The element isolation layer 312 is provided to separate a plurality of transistors on the substrate 310 from each other. The element isolation layer can be formed by a local oxidation of silicon (LOCOS) method, a shallow trench isolation (STI) method, a mesa isolation method, or the like.

Note that the transistor 300 shown in FIG. 24 is only an example and is not limited to having the structure shown in FIG. 24; a transistor appropriate for a circuit configuration, a driving method, or the like can be used. For example, the transistor 300 may have a planar structure instead of a fin-type structure.

Over the transistor 300 shown in FIG. 24, an insulator 320, an insulator 322, an insulator 324, and an insulator 326 are stacked in this order from the substrate 310 side.

For the insulators 320, 322, 324, and 326, silicon oxide, silicon oxynitride, silicon nitride oxide, silicon nitride, aluminum oxide, aluminum oxynitride, aluminum nitride oxide, or aluminum nitride can be used, for example.

The insulator 322 may function as a planarization film for eliminating a level difference caused by the transistor 300 covered with the insulators 320 and 322. For example, a top surface of the insulator 322 may be planarized by planarization treatment using a chemical mechanical polishing (CMP) method or the like to increase the level of planarity.

For the insulator 324, it is preferable to use a barrier insulating film preventing diffusion of impurities such as water and hydrogen from the substrate 310, the transistor 300, or the like to a region above the insulator 324 (e.g., the region including the transistor 200, the light-emitting devices 150*a* and 150*b*, and the like). Accordingly, the insulator 324 is preferably formed using an insulating material having a function of inhibiting diffusion of impurities such as a hydrogen atom, a hydrogen molecule, and a water molecule, that is, an insulating material which does not easily transmit the above impurities. Alternatively, depending on circumstances, the insulator 324 is preferably formed using an insulating material having a function of inhibiting diffusion of impurities such as a nitrogen atom, a nitrogen molecule, a nitrogen oxide molecule (e.g., $N_2O$, NO, and $NO_2$), and a copper atom, that is, an insulating material which does not easily transmit the above oxygen. The insulator 324 preferably has a function of inhibiting diffusion of oxygen (e.g., at least one of an oxygen atom and an oxygen molecule).

For the film having a barrier property against hydrogen, for example, silicon nitride deposited by a CVD method can be used.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. When a material with a low dielectric constant is used for an interlayer film, the parasitic capacitance generated between wirings can be reduced.

In addition, the conductors 328 and 330 that are connected to a circuit element or the light-emitting devices above the insulator 326 are embedded in the insulators 320, 322, 324, and 326. Note that each of the conductors 328 and 330 functions as a plug or a wiring. A plurality of conductors functioning as plugs or wirings are collectively denoted by the same reference numeral in some cases. In this specification and the like, a wiring and a plug connected to the wiring may be a single component. That is, in some cases, part of a conductor functions as a wiring or part of a conductor functions as a plug.

As a material for each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 24, an insulator 350, an insulator 352, and an insulator 354 are sequentially stacked above the insulator 326 and the conductor 330. Furthermore, the conductor 356 is formed in the insulators 350, 352, and 354. The conductor 356 functions as a plug or a wiring that is connected to the transistor 300. Note that the conductor 356 can be formed using a material similar to that for the conductor 328 and the conductor 330.

Note that for example, the insulator 350 is preferably formed using an insulator having a barrier property against impurities such as hydrogen and water, like the insulator 324. The insulators 352 and 354 are preferably formed using an insulator having a relatively low dielectric constant to reduce the parasitic capacitance generated between wirings, like the insulator 326. The insulator 362 and the insulator 364 have functions of an interlayer insulating film and a planarization film. Furthermore, the conductor 356 preferably includes a conductor having a barrier property against hydrogen, oxygen, and water.

Note that as the conductor having a barrier property against hydrogen, for example, tantalum nitride is preferably used. A stacked structure of tantalum nitride and tungsten having high conductivity can inhibit hydrogen diffusion from the transistor 300 while the conductivity of a wiring is ensured. In this case, a tantalum nitride layer having a barrier property against hydrogen is preferably in contact with the insulator 350 having a barrier property against hydrogen.

An insulator 360, an insulator 362, and an insulator 364 are sequentially stacked over the insulator 354 and the conductor 356.

The insulator 360 is preferably formed using an insulator having a barrier property against impurities such as water and hydrogen, like the insulator 324 and the like. Thus, the insulator 360 can be formed using any of the materials usable for the insulator 324 and the like, for example.

The insulator 362 and the insulator 364 have functions of an interlayer insulating film and a planarization film. The insulators 362 and 364 are preferably formed using an insulator having a barrier property against impurities such as water and hydrogen, like the insulator 324. Thus, the insulator 362 and/or the insulator 364 can be formed using any of the materials usable for the insulator 324.

The conductor 366 is embedded to fill an opening portion provided in regions of the insulator 360, the insulator 362, and the insulator 364 that overlap with part of the conductor 356. The conductor 366 is also formed over the insulator 362. The conductor 366 functions as a plug or a wiring that is connected to the transistor 300, for example. Note that the conductor 366 can be formed using a material similar to that for the conductor 328 and the conductor 330.

An insulator 370 and an insulator 372 are sequentially stacked over the insulator 364 and the conductor 366.

The insulator 370 is preferably formed using an insulator having a barrier property against impurities such as water and hydrogen, like the insulator 324 and the like. Thus, the insulator 370 can be formed using any of the materials usable for the insulator 324 and the like, for example.

The insulator 372 has functions of an interlayer insulating film and a planarization film. The insulator 372 is preferably formed using an insulator having a barrier property against impurities such as water and hydrogen, like the insulator 324. Thus, the insulator 372 can be formed using any of the materials usable for the insulator 324.

The conductor 376 is provided to fill an opening provided in regions of the insulator 370 and the insulator 372 that overlap with part of the conductor 366. The conductor 376 is also formed over the insulator 372. After that, the conductor 376 is patterned into a form of a wiring, a terminal, a pad, or the like by etching treatment or the like.

The conductor 376 can be formed using, for example, copper, aluminum, tin, zinc, tungsten, silver, platinum, or gold. The material used for the conductor 376 preferably contains the same component as the material used for a later-described conductor 216 in the pixel layer PXAL.

Then, an insulator 380 is formed to cover the insulator 372 and the conductor 376 and is subsequently subjected to planarization treatment by a chemical mechanical polishing (CMP) method or the like until the conductor 376 is exposed. In this manner, the conductor 376 serving as a wiring, a terminal, or a pad can be formed over the substrate 310.

Like the insulator 324, the insulator 380 is preferably formed using a film with a barrier property inhibiting diffusion of impurities such as water and hydrogen, for example. In other words, the insulator 380 is preferably formed using any of the materials usable for the insulator 324. Like the insulator 326, the insulator 380 may be formed using an insulator having a relatively low dielectric constant to reduce the parasitic capacitance generated between wirings, for example. In other words, the insulator 380 may be formed using any of the materials usable for the insulator 326.

The pixel layer PXAL is provided with a substrate 210, the transistor 200, the light-emitting device 150 (the light-emitting devices 150*a* and 150*b* in FIG. 24), and a substrate 102. Moreover, the pixel layer PXAL is provided with an insulator 220, an insulator 222, an insulator 226, an insulator 250, insulators 111*a* and 111*b*, an insulator 112, an insulator 113, an insulator 162, and a resin layer 163, for example. Furthermore, the pixel layer PXAL is provided with a conductor 216, a conductor 228, a conductor 230, a conductor 121 (conductors 121*a* and 121*b* in FIG. 24), a conductor 122 (conductors 122*a* and 122*b* in FIG. 24), and a conductor 123, for example.

An insulator 202 in FIG. 24 functions as a bonding layer together with the insulator 380, for example. The insulator 202 preferably contains, for example, the same component as the material used for the insulator 380.

The substrate 210 is provided above the insulator 202. In other words, the insulator 202 is provided on a bottom surface of the substrate 210. The substrate 210 is preferably a substrate usable for the substrate 310, for example. Note that in the description of the display apparatus 1000 shown in FIG. 24, the substrate 310 is a semiconductor substrate containing silicon.

Over the substrate 210, the transistor 200 is formed, for example. Being formed on the substrate 210 that is a semiconductor substrate containing silicon, the transistor 200 functions as a Si transistor. For the structure of the transistor 200, refer to the description of the transistor 300.

Above the transistor 200, the insulator 220 and the insulator 222 are provided. The insulator 220 has functions of an interlayer insulating film and a planarization film, for example, like the insulator 320. The insulator 222 has functions of an interlayer insulating film and a planarization film, for example, like the insulator 322.

A plurality of opening portions are provided in the insulators 220 and 222. The plurality of opening portions are formed in regions overlapping with a source and a drain of the transistor 200, a region overlapping with the conductor 376, and the like. Of the plurality of opening portions, the opening portions formed in the regions overlapping with the source and the drain of the transistor 200 are each filled with the conductor 228. Of the other opening portions, the opening portion formed in the region overlapping with the conductor 376 has a side surface provided with an insulator 214, and the conductor 216 fills the space inside the insulator 214. The conductor 216 is sometimes particularly referred to as a through silicon via (TSV).

For the conductor 216 or the conductor 228, any of the materials usable for the conductor 328 can be used, for example. In particular, the conductor 216 is preferably formed using the same material as the conductor 376.

The insulator 214 has a function of insulating the conductor 216 from the substrate 210, for example. Note that the insulator 214 is preferably formed using, for example, any of the materials usable for the insulator 320, or the insulator 324.

The insulator 380 and the conductor 376 that are formed over the substrate 310 are bonded to the insulator 202 and the conductor 216 that are formed on the substrate 210 by a bonding step, for example.

Before the bonding step, for example, planarization treatment is performed to make surfaces of the insulator 380 and the conductor 376 level with each other on the substrate 310 side. In a similar manner, planarization treatment is performed to make surfaces of the insulator 202 and the conductor 216 level with each other on the substrate 210 side.

In the bonding step, hydrophilic bonding or the like can be employed for bonding of the insulator 380 and the insulator 202, i.e., bonding of insulators; in the hydrophilic bonding, after high planarity is obtained by polishing or the like, the surfaces of the insulators are subjected to hydrophilicity treatment with oxygen plasma or the like, arranged in contact with and bonded to each other temporarily, and then dehydrated by heat treatment to perform final bonding. The hydrophilic bonding can also cause bonding at an atomic level; thus, bonding with excellent mechanical strength can be obtained.

Surface activated bonding, diffusion bonding, or the like can be employed for bonding of the conductor 376 and the conductor 216, i.e., bonding of conductors. Surface activated bonding is a method in which an oxide film and a layer adsorbing impurities over the surface of each conductor are removed by sputtering treatment or the like and the cleaned and activated surfaces of the conductors are made to be in contact with and bonded to each other. Diffusion bonding is a method in which the surfaces of the conductors are bonded to each other by adjusting temperature and pressure together. Both methods can cause bonding at an atomic level and therefore the bonding with excellent electric and mechanical strength can be achieved.

Through the above-described bonding step, the conductor 376 on the substrate 310 side can be electrically connected to the conductor 216 on the substrate 210 side. In addition, mechanically strong connection can be established between the insulator 380 on the substrate 310 side and the insulator 202 on the substrate 210 side.

The insulating layers and the metal layers are mixed on the bonding surfaces of the substrates 310 and 210; therefore, for example, surface activated bonding and hydrophilic bonding are preferably performed in combination when the substrates 310 and 210 are bonded to each other. For example, the following method can be used: the surfaces of the metal layers are made clean after polishing, the surfaces of the metal layers are subjected to antioxidant treatment and hydrophilicity treatment, and then bonding is performed. Alternatively, hydrophilicity treatment may be performed with the metal layers having surfaces of a hardly oxidizable metal such as gold.

Note that the substrate 310 and the substrate 210 may be bonded by a bonding method different from the above-described methods. For example, the substrate 310 and the substrate 210 may be bonded by flip-chip bonding. In the case of employing flip-chip bonding, a connection terminal such as a bump may be provided above the conductor 376 on the substrate 310 side or provided below the conductor 216 on the substrate 210 side. Flip-chip bonding can be performed by, for example, injecting a resin containing anisotropic conductive particles between the insulator 380 and the insulator 202 and between the conductor 376 and the conductor 216, or by using a Sn—Ag solder. Alternatively, ultrasonic wave bonding can be used in the case where the bump and a conductor connected to the bump are gold. To reduce thermal stress, physical stress such as an impact, or the like, the above-described flip-chip bonding may be combined with injection of an underfill agent between the insulator 380 and the insulator 202 and between the conductor 376 and the conductor 216. Furthermore, a die bonding film may be used in bonding of the substrate 310 and the substrate 210, for example.

An insulator 224 and the insulator 226 are sequentially stacked over the insulator 222, the insulator 214, the conductor 216, and the conductor 228.

Like the insulator 324, the insulator 224 is preferably a barrier insulating film inhibiting diffusion of impurities such as water and hydrogen to the region above the insulator 224. Thus, the insulator 224 is preferably formed using, for example, any of the materials usable for the insulator 324.

Like the insulator 326, the insulator 226 is preferably an interlayer film with a low dielectric constant. Thus, the insulator 226 is preferably formed using, for example, any of the materials usable for the insulator 326.

In the insulators 224 and 226, the conductor 230 and the like that are electrically connected to the transistor 200, the light-emitting device 150, and the like are embedded. Note that the conductor 230 functions as a plug or a wiring. For the conductor 230, any of the materials usable for the conductor 328 or the conductor 330 can be used, for example.

Over the insulators 224 and 226, the insulators 250, 111a, and 111b are sequentially stacked.

The insulator 250 is preferably formed using an insulator having a barrier property against impurities such as water and hydrogen, like the insulator 324. Thus, the insulator 250 can be formed using any of the materials usable for the insulator 324 and the like, for example.

As each of the insulators 111a and 111b, any of a variety of inorganic insulating films such as an oxide insulating film, a nitride insulating film, an oxynitride insulating film, and a nitride oxide insulating film can be suitably used. As the insulator 111a, an oxide insulating film or an oxynitride insulating film, such as a silicon oxide film, a silicon oxynitride film, or an aluminum oxide film, is preferably used. As the insulator 111b, a nitride insulating film or a nitride oxide insulating film, such as a silicon nitride film or a silicon nitride oxide film, is preferably used. More specifically, it is preferable to use a silicon oxide film as the insulator 111a and a silicon nitride film as the insulator 111b. The insulator 111b preferably has a function of an etching protective film. Alternatively, a nitride insulating film or a nitride oxide insulating film may be used as the insulator 111a, and an oxide insulating film or an oxynitride insulating film may be used as the insulator 111Tb. Although this embodiment shows an example in which a depressed portion is provided in the insulator 111b, the depressed portion is not necessarily provided in the insulator 111b.

The conductor 121 is embedded to fill an opening portion provided in regions of the insulator 250, the insulator 111a, and the insulator 111b that overlap with part of the conductor 230. Note that in this specification and the like, the conductors 121a and 121b in FIG. 24 are collectively referred to as the conductor 121. The conductor 121 can be formed using a material similar to that for the conductor 328 and the conductor 330.

A pixel electrode and a counter electrode described in this embodiment contain, for example, a material reflecting visible light and a material transmitting visible light, respectively.

The display apparatus 1000 has a top-emission structure. Light emitted from the light-emitting device is emitted toward the substrate 102. For the substrate 102, a material having a high visible-light-transmitting property is preferably used.

The light-emitting devices 150a and 150b are provided above the conductor 121.

Here, the light-emitting devices 150a and 150b are described.

The light-emitting device described in this embodiment is a self-luminous light-emitting device such as an organic EL element (also referred to as an organic light-emitting diode (OLED)). Note that the light-emitting device electrically connected to a pixel circuit can be a self-luminous light-emitting device such as a light-emitting diode (LED), a micro LED, a quantum-dot light-emitting diode (QLED), or a semiconductor laser.

The conductors 122a and 122b can be formed in such a manner that, for example, a conductive film is formed over the insulator 111b, the conductor 121a, and the conductor 121b and the conductive film is subjected to a patterning step and an etching step.

The conductors 122a and 122b function as anodes of the light-emitting devices 150a and 150b of the display apparatus 1000, for example.

The conductors 122a and 122b can be formed using indium tin oxide (sometimes referred to as ITO), for example.

Each of the conductors 122a and 122b may have a stacked-layer structure of two or more layers instead of a single-layer structure. For example, the first conductor can be formed using a conductor with high visible-light reflectance and the uppermost conductor can be formed using a conductor with a high light-transmitting property. Examples of a conductor with high visible-light reflectance include silver, aluminum, and an alloy film of silver (Ag), palladium (Pd), and copper (Cu) (an Ag—Pd—Cu (APC) film). Examples of a conductor with a high light-transmitting property include indium tin oxide described above. The conductors 122a and 122b can each be a stacked-layer film in which a pair of titanium films sandwich aluminum (a film in which Ti, Al, and Ti are stacked in this order), or a stacked-layer film in which a pair of indium tin oxide films sandwich silver (a film in which ITO, Ag, and ITO are stacked in this order).

An EL layer 141a is provided over the conductor 122a. An EL layer 141b is provided over the conductor 122b.

The EL layers 141a and 141b preferably include light-emitting layers emitting light of different colors. For example, the EL layer 141a includes a light-emitting layer emitting light of any one of red (R), green (G), and blue (B), and the EL layer 141b includes a light-emitting layer emitting light of one of the other two colors. Although not illustrated in FIG. 24, in the case where an EL layer different from the EL layers 141a and 141b is provided, the EL layer can include a light-emitting layer emitting light of the remaining one color. Thus, the display apparatus 1000 may have such an SBS structure in which light-emitting layers for respective colors are provided over a plurality of pixel electrodes (e.g., the conductors 121a and 121b).

Note that the combination of the colors of light emitted by the light-emitting layers of the EL layers 141a and 141b is not limited to the above example, and cyan, magenta, or yellow may also be used, for example. The number of colors of light emitted by the light-emitting devices 150 of the display apparatus 1000, which is three in the above example, may be two or four or more.

The EL layers 141a and 141b may each include one or more of an electron-injection layer, an electron-transport layer, a hole-injection layer, and a hole-transport layer in addition to a layer containing a light-emitting organic compound (the light-emitting layer).

The EL layers 141a and 141b can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

In the case where the coating method or the printing method is employed, a high molecular compound (e.g., an oligomer, a dendrimer, or a polymer), a middle molecular compound (a compound between a low molecular compound and a high molecular compound with a molecular weight of 400 to 4000), or an inorganic compound (e.g., a quantum dot material) can be used. The quantum dot material can be a colloidal quantum dot material, an alloyed quantum dot material, a core-shell quantum dot material, or a core quantum dot material.

Figure 25A:
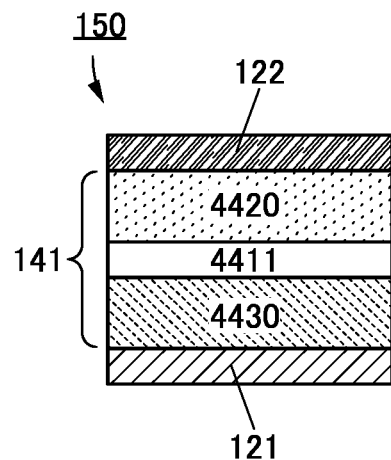
FIGS. 25A to 25D are schematic views each illustrating a structure example of a light-emitting device.

Like the light-emitting device 150 shown in FIG. 25A, the light-emitting devices 150a and 150b in FIG. 24 can include a plurality of layers such as a light-emitting layer 4411 and a layer 4430.

The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes (the conductor 121 and a later-described conductor 122), can function as a single light-emitting unit, and the structure in FIG. 25A is referred to as a single structure in this specification and the like.

Figure 25B:
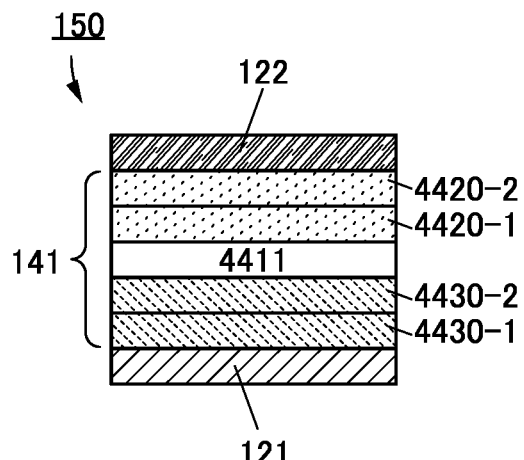

FIG. 25B is a modification example of the EL layer 141 included in the light-emitting device 150 illustrated in FIG. 25A. Specifically, the light-emitting device 150 illustrated in FIG. 25B includes a layer 4430-1 over the conductor 121, a layer 4430-2 over the layer 4430-1, a light-emitting layer 4411 over the layer 4430-2, a layer 4420-1 over the light-emitting layer 4411, a layer 4420-2 over the layer 4420-1, and the conductor 122 over the layer 4420-2. For example, in the case where the conductor 121 serves as an anode and the conductor 122 serves as a cathode, the layer 4430-1 serves as a hole-injection layer, the layer 4430-2 serves as a hole-transport layer, the layer 4420-1 serves as an electron-transport layer, and the layer 4420-2 serves as an electron-injection layer. Alternatively, in the case where the conductor 121 serves as a cathode and the conductor 122 serves an anode, the layer 4430-1 serves as an electron-injection layer, the layer 4430-2 serves as an electron-transport layer, the layer 4420-1 serves as a hole-transport layer, and the layer 4420-2 serves as a hole-injection layer. With such a layer structure, carriers can be efficiently injected to the light-emitting layer 4411, and the efficiency of the recombination of carriers in the light-emitting layer 4411 can be enhanced.

Figure 25C:
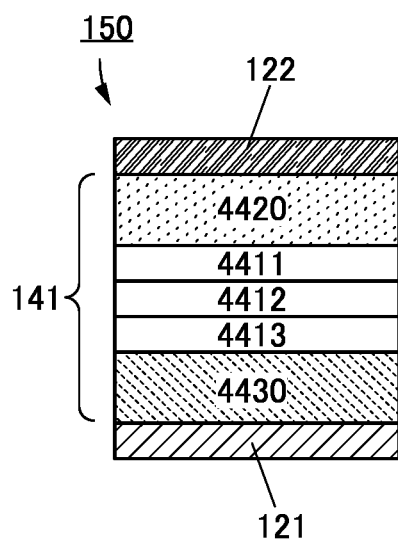

Note that the structure in which a plurality of light-emitting layers (e.g., light-emitting layers 4411, 4412, and 4413) are provided between the layer 4420 and the layer 4430 as illustrated in FIG. 25C is another variation of the single structure.

Figure 25D:
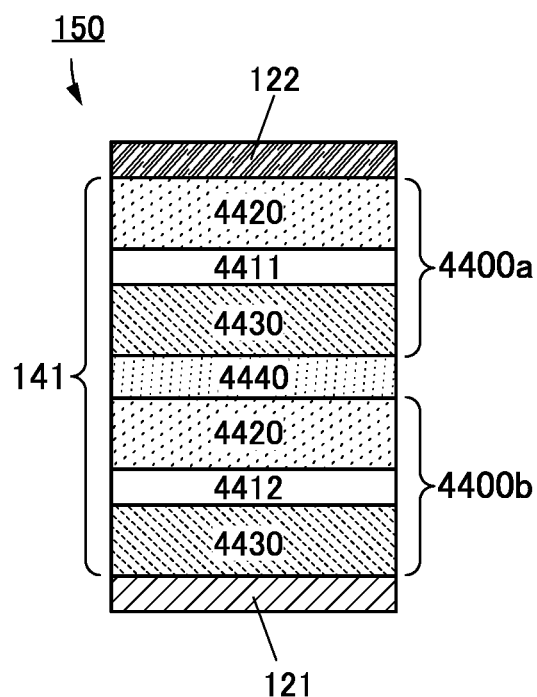

A stack including a plurality of layers such as the layer 4420, the light-emitting layer 4411, and the layer 4430 is sometimes referred to as a light-emitting unit. A plurality of light-emitting units can be connected in series with an intermediate layer (a charge-generation layer) therebetween. Specifically, a light-emitting unit 4400*a* and a light-emitting unit 4400*b* can be connected in series with an intermediate layer (charge-generation layer) 4440 therebetween as shown in FIG. 25D. Such a structure is referred to as a tandem structure in this specification. A tandem structure may be rephrased as a stack structure in this specification and the like. By having a tandem structure, a light-emitting device can emit light at high luminance. By having a tandem structure, a light-emitting device presumably has increased emission efficiency and an extended lifetime, for example. In the case where the light-emitting device 150 of the display apparatus 1000 in FIG. 24 has a tandem structure, the EL layer 141 can include, for example, the layer 4420, the light-emitting layer 4411, and the layer 4430 that are included in the light-emitting unit 4400*a*, the intermediate layer 4440, and the layer 4420, the light-emitting layer 4412, and the layer 4430 that are included in the light-emitting unit 4400*b*.

In displaying white, the aforementioned SBS structure consumes lower power than the aforementioned single structure and tandem structure. To reduce power consumption, the SBS structure is thus preferably used. Meanwhile, the single structure and the tandem structure are preferable in that the manufacturing cost is low or the manufacturing yield is high because the manufacturing processes of the single structure and the tandem structure are simpler than that of the SBS structure.

The emission color of the light-emitting device 150 can be changed to red, green, blue, cyan, magenta, yellow, white, or the like depending on the material of the EL layer 141. When the light-emitting device 150 has a microcavity structure, the color purity can be further increased.

A light-emitting device exhibiting white light preferably contains two or more kinds of light-emitting substances in its light-emitting layers. To obtain white light emission, two light-emitting substances that emit light of complementary colors are selected. For example, when emission colors of a first light-emitting layer and a second light-emitting layer are complementary colors, the light-emitting device can be configured to exhibit white light as a whole. When three or more light-emitting layers are used to obtain white light emission, a structure in which the light-emitting device exhibits white light as a whole by combination of emission colors of the three or more light-emitting layers is employed.

The light-emitting layer preferably contains two or more selected from light-emitting substances that emit light of red (R), green (G), blue (B), yellow (Y), and orange (O). Alternatively, the light-emitting layer preferably contains two or more light-emitting substances that emit light containing two or more of spectral components of R, G, and B.

As illustrated in FIG. 24, a gap is provided between the two EL layers of the adjacent light-emitting devices. Specifically, in FIG. 24, a depressed portion is formed between the adjacent light-emitting devices, and the insulator 112 is provided to cover side surfaces (side surfaces of the conductors 121*a* and 122*a* and the EL layer 141*a* and side surfaces of the conductors 121*b* and 122*b* and the EL layer 141*b*) and a bottom surface (a region in the insulator 111*b*) of the depressed portion. The insulator 162 is formed over the insulator 112 to fill the depressed portion. In this manner, the EL layers 141*a* and 141*b* are preferably provided so as not to be in contact with each other. This suitably prevents unintentional light emission (also referred to as crosstalk) from being caused by a current (also referred to as lateral leakage current or side leakage current) flowing through two adjacent EL layers. As a result, the contrast can be increased to achieve a display apparatus with high display quality. Furthermore, with the structure with extremely low lateral leakage current between light-emitting devices, the display apparatus can perform black display with as little light leakage as possible (such display is also referred to as completely black display).

The EL layers 141*a* and 141*b* can be formed through photolithography, for example. For example, the EL layers 141*a* and 141*b* can be formed in such a manner that an EL film to be the EL layers 141*a* and 141*b* is formed over the conductor 122 and then subjected to patterning through photolithography. Accordingly, a gap can be provided between the two EL layers of the adjacent light-emitting devices.

The insulator 112 can be an insulating layer containing an inorganic material. As the insulator 112, an inorganic insulating film such as an oxide insulating film, a nitride insulating film, an oxynitride insulating film, or a nitride oxide insulating film can be used, for example. The insulator 112 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, an aluminum oxide film is preferable because it has high etching selectivity with the EL layer and has a function of protecting the EL layer during formation of the insulator 162 to be described later. An inorganic insulating film such as an aluminum oxide film, a hafnium oxide film, or a silicon oxide film is formed by an ALD method as the insulator 112, whereby the insulator 112 can have few pinholes and an excellent function of protecting the EL layer.

Note that in this specification and the like, oxynitride refers to a material that contains more oxygen than nitrogen, and nitride oxide refers to a material that contains more nitrogen than oxygen. For example, a silicon oxynitride refers to a material that contains oxygen at a higher proportion than nitrogen, and a silicon nitride oxide refers to a material that contains nitrogen at a higher proportion than oxygen.

The insulator 112 can be formed by, for example, a deposition method such as a sputtering method, a CVD method, a PLD method, or an ALD method. In particular, the insulator 112 is preferably formed by an ALD method capable of film deposition with good coverage.

The insulator 162 provided over the insulator 112 has a function of filling the depressed portion of the insulator 112, which is formed between the adjacent light-emitting devices. In other words, the insulator 162 has an effect of improving the planarity of the formation surface of the conductor 123 to de described later. As the insulator 162, an insulating layer containing an organic material can be favorably used. For example, the insulator 162 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The insulator 162 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the insulator 162 can be formed using, for example, a photosensitive resin. A photoresist may be used as the photosensitive resin. The photosensitive resin can be of positive or negative type.

A difference between a top surface of the insulator 162 and a top surface of the EL layer 141a or 141b is preferably less than or equal to 0.5 times the thickness of the insulator 162, more preferably less than or equal to 0.3 times the thickness of the insulator 162. The insulator 162 may be, for example, provided such that the top surface of the EL layer 141a or 141b is higher than the top surface of the insulator 162. Alternatively, the insulator 162 may be, for example, provided such that the top surface of the insulator 162 is higher than a top surface of the light-emitting layer included in the EL layer 141a or 141b.

The conductor 123 is provided over the EL layer 141a, the EL layer 141b, the insulator 112, and the insulator 162. The insulator 113 is provided over the light-emitting devices 150a and 150b.

The conductor 123 functions as, for example, a common electrode of the light-emitting devices 150a and 150b. The conductor 123 preferably contains a conductive material having a light-transmitting property so that light from the light-emitting device 150 can be extracted to above the display apparatus 1000.

The conductor 123 is preferably formed using a light-transmitting and light-reflective material having high conductivity (sometimes referred to as a transflective electrode). The conductor 123 can be formed using, for example, an alloy of silver and magnesium, or indium tin oxide.

The insulator 113 is referred to as a protective layer in some cases. By the insulator 113 provided above the light-emitting devices 150a and 150b, the light-emitting devices can have higher reliability. That is, the insulator 113 functions as a passivation film protecting the light-emitting devices 150a and 150b. Thus, the insulator 113 is preferably formed using a material preventing entry of water and the like. The insulator 113 can be formed using a material usable for the insulator 11a or the insulator 111b, for example. Specifically, aluminum oxide, silicon nitride, or silicon nitride oxide can be used.

A resin layer 163 is provided over the insulator 113. A substrate 102 is provided over the resin layer 163.

The substrate 102 is preferably a light-transmitting substrate, for example. Using a light-transmitting substrate as the substrate 102 enables extraction of light emitted from the light-emitting devices 150a, and 150b to above the substrate 102.

Note that the display apparatus of one embodiment of the present invention does not necessary have the structure of the display apparatus 1000 in FIG. 24. The structure of the display apparatus of one embodiment of the present invention may be changed as appropriate as long as an object of one embodiment of the present invention is achieved.

For example, the transistor 200 included in the pixel layer PXAL in the display apparatus 1000 in FIG. 24 may be a transistor including a metal oxide in a channel formation region (hereinafter referred to as an OS transistor). The display apparatus 1000 in FIG. 26 is provided with the light-emitting device 150 and a transistor 500 (an OS transistor), instead of the transistor 200 in the display apparatus 1000 in FIG. 24, above the circuit layer SICL and the wiring layer LINL.

Figure 26:
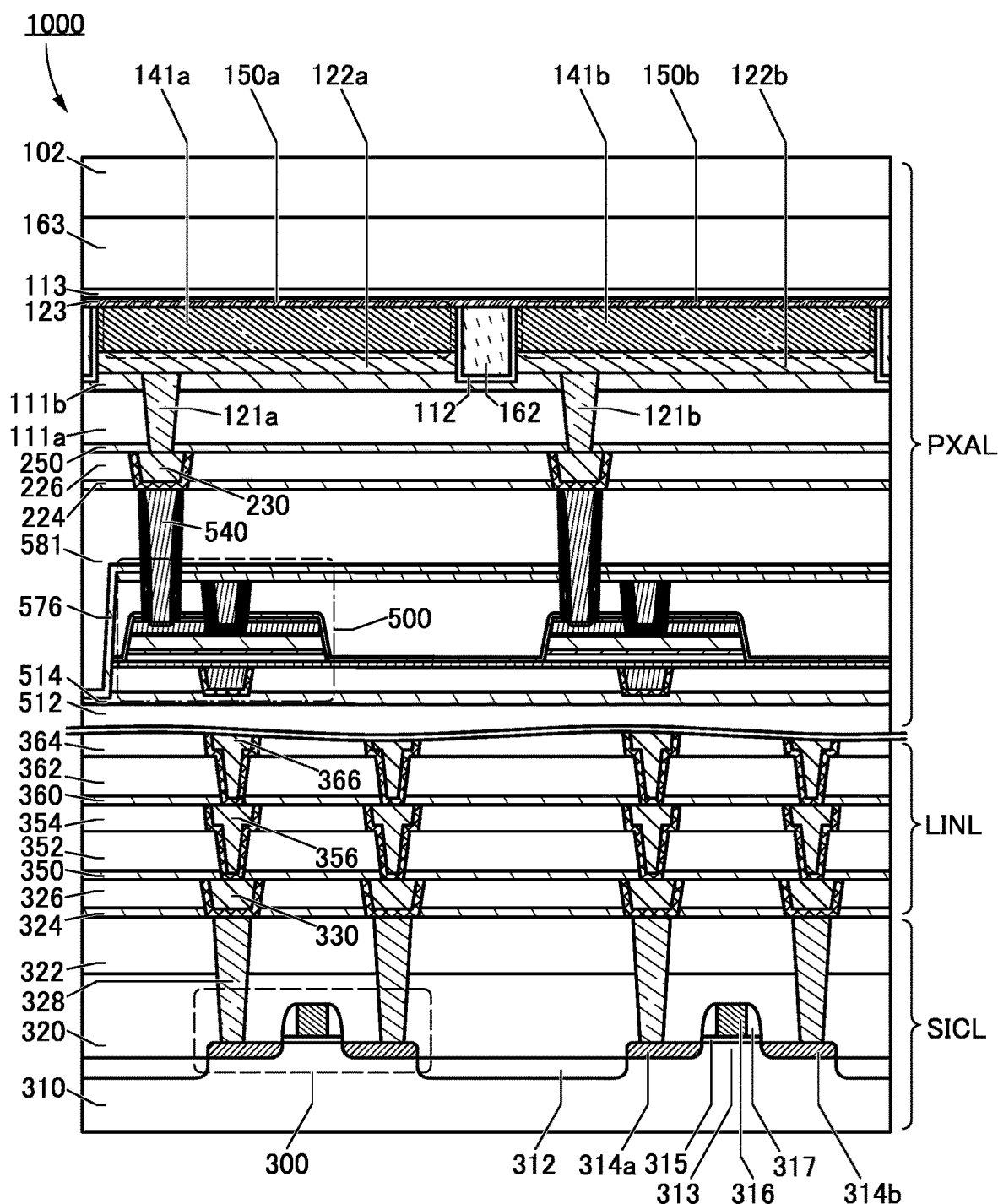
FIG. 26 is a schematic cross-sectional view illustrating a structure example of a display apparatus.

In FIG. 26, the transistor 500 is provided over an insulator 512. The insulator 512 is provided above the insulator 364 and the conductor 366. The insulator 512 is preferably formed with a substance having a barrier property against oxygen and hydrogen, for example. Specifically, silicon oxide, silicon oxynitride, silicon nitride oxide, silicon nitride, aluminum oxide, aluminum oxynitride, aluminum nitride oxide, or aluminum nitride may be used, for example.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. Specifically, the film that inhibits hydrogen diffusion is a film from which a small amount of hydrogen is released.

The insulator 512 can be formed using a material similar to that for the insulator 320, for example. In the case where a material with a relatively low dielectric constant is used for these insulators, the parasitic capacitance between wirings can be reduced. A silicon oxide film or a silicon oxynitride film can be used as the insulator 512, for example.

An insulator 514 is provided over the insulator 512, and the transistor 500 is provided over the insulator 514. An insulator 576 is formed over the insulator 512 so as to cover the transistor 500. An insulator 581 is formed over the insulator 576 to cover the insulator 576.

The insulator 514 is preferably formed using a film having a barrier property inhibiting diffusion of impurities such as hydrogen or water from the substrate 310 or the region below the insulator 512 where circuit elements and the like are provided to the region where the transistor 500 is provided. Thus, the insulator 514 can be formed using silicon nitride deposited by a CVD method, for example.

The transistor 500 in FIG. 26 is an OS transistor that includes a metal oxide in a channel formation region, as described above. As the metal oxide, an In-M-Zn oxide containing indium, the element M, and zinc can be used; the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium. Specifically, the metal oxide may be an oxide containing indium, gallium, and zinc (referred to as IGZO in some cases), for example. Alternatively, the metal oxide may be an oxide containing indium, aluminum, and zinc (referred to as IAZO in some cases), for example. Alternatively, the metal oxide may be an oxide containing indium, aluminum, gallium, and zinc (referred to as IAGZO in some cases), for example. Other than the above, the metal oxide may be an In—Ga oxide, an In—Zn oxide, or an indium oxide.

The metal oxide functioning as a semiconductor preferably has a band gap of 2 eV or more, preferably 2.5 eV or more. The use of such a metal oxide having a wide band gap can reduce the off-state current (referred to as leakage current in some cases) of the transistor.

In particular, as a driving transistor included in a pixel circuit, a transistor having a sufficiently low off-state current, for example, an OS transistor is preferably used even when the source-drain voltage is high. When the driving transistor is an OS transistor, the off-state current flowing through the light-emitting device can be reduced when the driving transistor is off, whereby the luminance of light emitted from the light-emitting device through which off-state current flows can be sufficiently reduced. In the case where a driving transistor having high off-state current and a driving transistor having low off-state current are compared, a pixel circuit including the driving transistor having low off-state current can have lower emission luminance than a pixel circuit including the driving transistor having high off-state current when black display is performed on the pixel circuits. That is, with use of an OS transistor, black blurring when black display is performed by the pixel circuit can be inhibited.

The value of off-state current of an OS transistor per channel width of 1 µm at room temperature can be less than or equal to 1 aA ($1\times10^{-18}$ A), less than or equal to 1 zA ($1\times10^{-21}$ A), or less than or equal to 1 yA ($1\times10^{-24}$ A). Note that the value of off-state current of a Si transistor per channel width of 1 µm at room temperature can be greater than or equal to 1 fA ($1\times10^{-15}$ A) and less than or equal to 1 pA ($1\times10^{-12}$ A). Therefore, the off-state current of the OS transistor can be lower than that of the Si transistor by approximately 10 digits.

In order to increase the emission luminance of the light-emitting device included in the pixel circuit, the amount of current flowing through the light-emitting device needs to be increased. For that purpose, the source-drain voltage of the driving transistor included in the pixel circuit needs to be increased. Since an OS transistor has a higher withstand voltage between a source and a drain than a Si transistor, a high voltage can be applied between the source and the drain of the OS transistor. Thus, with use of an OS transistor as the driving transistor included in the pixel circuit, a high voltage can be applied between a source and a drain of the OS transistor, so that the amount of current flowing through the light-emitting device can be increased and the emission luminance of the light-emitting device can be increased.

In the case where the transistor operates in a saturation region, a change in source-drain current with respect to a change in gate-source voltage can be smaller in an OS transistor than in a Si transistor. Therefore, when an OS transistor is used as the driving transistor included in the pixel circuit, the current flowing between the source and the drain can be determined minutely by the change in the gate-source voltage, so that the amount of current flowing through the light-emitting device can be controlled minutely. Therefore, the emission luminance of the light-emitting device can be controlled minutely (the number of gray levels in the pixel circuit can be increased).

As to saturation characteristics of a current flowing when a transistor operates in a saturation region, the OS transistor enables a stabler constant current (saturation current) to flow than the Si transistor even when the source-drain voltage gradually increases. Accordingly, with use of an OS transistor as the driving transistor, for example, a stable constant current can flow through the light-emitting device even when current-voltage characteristics of light-emitting device containing an EL material vary. That is, in the case where the OS transistor operates in a saturation region, the source-drain current of the OS transistor hardly change even when the source-drain voltage is increased; thus, the emission luminance of the light-emitting device can be stabilized.

As described above, the use of an OS transistor as the driving transistor included in the pixel circuit enables "inhibition of black blurring", "an increase in emission luminance", "an increase in gray levels", "inhibition of variations in the luminance of the light-emitting device", and the like. Thus, a display apparatus including the pixel circuit can display a clear and smooth image; as a result, image clearness (image sharpness) and/or a high contrast ratio can be observed. Note that image clearness (image sharpness) refers to the state where motion blur is inhibited and/or the state where black blurring is inhibited in some cases. When the driving transistor included in the pixel circuit has extremely low off-state current, the display apparatus can perform black display with as little light leakage as possible (completely black display).

One or both of the insulator 576 and the insulator 581 preferably function as a barrier insulating film that prevents impurities such as water and hydrogen from diffusing from above the transistor 500 into the transistor 500. Accordingly, it is preferable to use, for one or both of the insulator 576 and the insulator 581, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass). Alternatively, the insulator 576 and/or the insulator 581 is preferably formed using an insulating material having a function of inhibiting diffusion of oxygen (e.g., oxygen atoms and/or oxygen molecules) (an insulating material through which the oxygen is less likely to pass).

An insulator having a function of inhibiting diffusion of oxygen and impurities such as water and hydrogen is preferably used for the insulator 576 and/or the insulator 581; for example, aluminum oxide, magnesium oxide, hafnium oxide, gallium oxide, indium-gallium-zinc oxide, silicon nitride, or silicon nitride oxide can be used.

An opening for forming a plug or a wiring is provided in the insulator 581, the insulator 576, and one of a source electrode and a drain electrode of the transistor 500. A conductor 540 functioning as a plug or a wiring is formed in the opening.

The insulator 581 preferably functions as an interlayer film and/or a planarization film.

The insulator 224 and the insulator 226 are formed above the insulator 581 and the conductor 540. For the insulator 224 and components positioned above the insulator 224, such as an insulator, a conductor, and a circuit element, description of the display apparatus 1000 in FIG. 24 is referred to.

Note that FIG. 24 illustrates a display apparatus formed by bonding the semiconductor substrate provided with the light-emitting device 150, the pixel circuit, and the like and the semiconductor substrate provided with a driver circuit and the like; FIG. 26 illustrates a display apparatus in which the light-emitting device 150, the pixel circuit, and the like are formed over a semiconductor substrate provided with a driver circuit. However, one embodiment of the present invention is not limited to the display apparatuses in FIG. 24 and FIG. 26. The display apparatus of one embodiment of the present invention may have a structure in which transistors are formed in only one layer, not a stacked-layer structure in which transistors are formed in two or more layers.

Figure 27A:
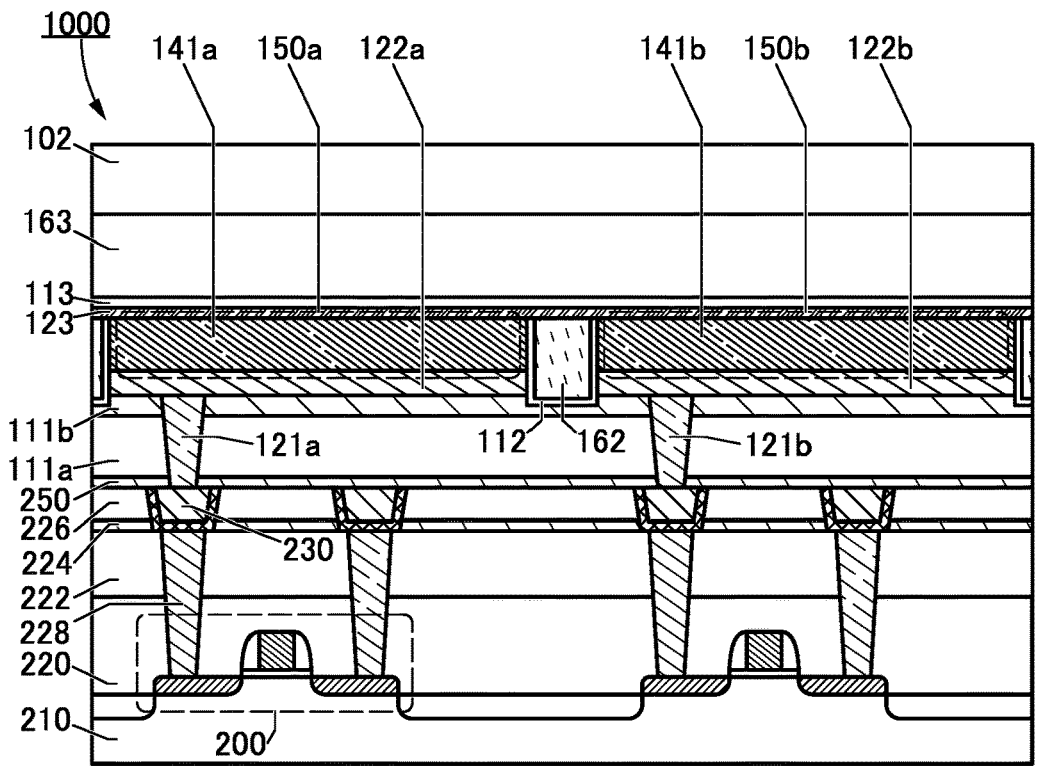
FIGS. 27A and 27B are schematic cross-sectional views each illustrating a structure example of a display apparatus.

Specifically, for example, the display apparatus of one embodiment of the present invention may include a circuit including the transistor 200 formed over the substrate 210 and the light-emitting device 150 provided above the transistor 200, as in the display apparatus 1000 in FIG. 27A. For another example, the display apparatus of one embodiment of the present invention may have a structure in which the insulator 512 is formed over a substrate 501, the transistor 500 is provided over the insulator 512, and the light-emitting device 150 is provided above the transistor 500, as in the display apparatus 1000 in FIG. 27B. Note that as the substrate 501, a substrate that can be used as the substrate 310 can be used, for example, and in particular, a glass substrate is preferably used.

Figure 27B:
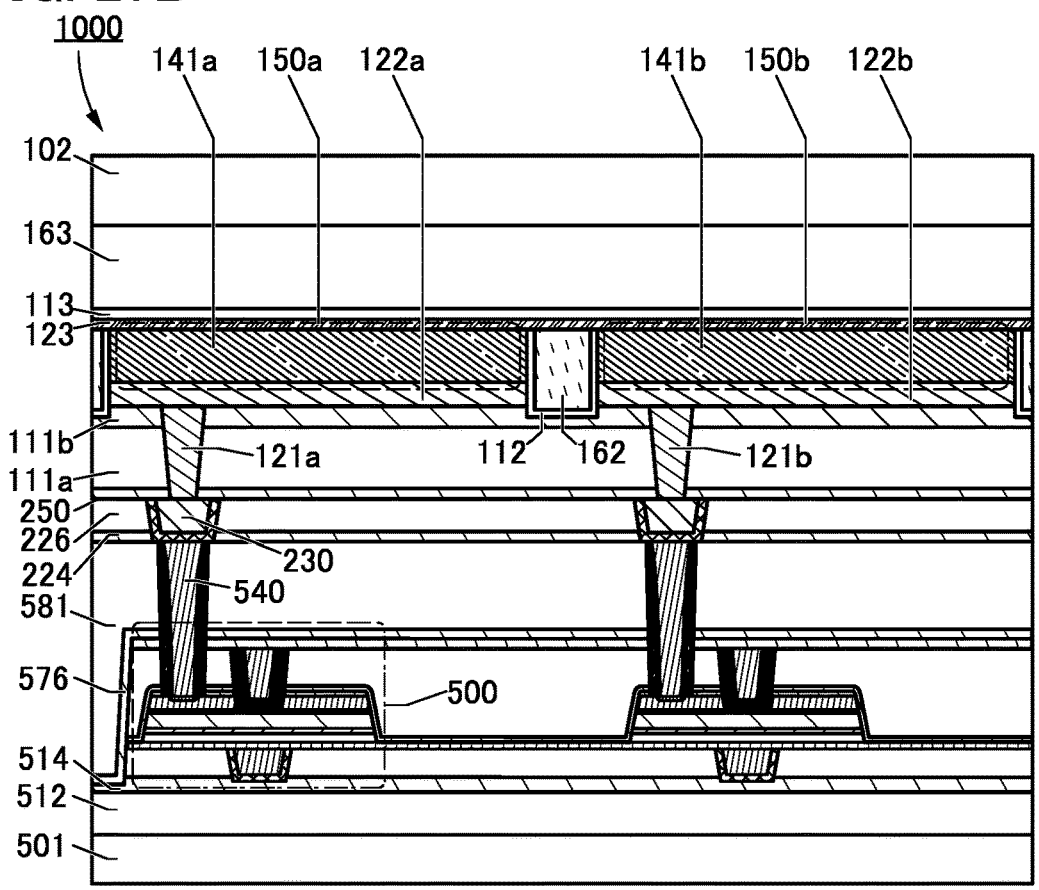

The display apparatus of one embodiment of the present invention may have a structure in which transistors are provided in only one layer and the light-emitting device 150 is provided above the transistors, as in the display apparatus 1000 in FIG. 27A or FIG. 27B. Although not illustrated, the display apparatus of one embodiment of the present invention may have a stacked-layer structure in which transistors are formed in three or more layers.

Sealing Structure Example of Display Apparatus

Next, a sealing structure for the light-emitting device 150 applicable to the display apparatus 1000 in FIG. 24 is described.

Figure 28A:
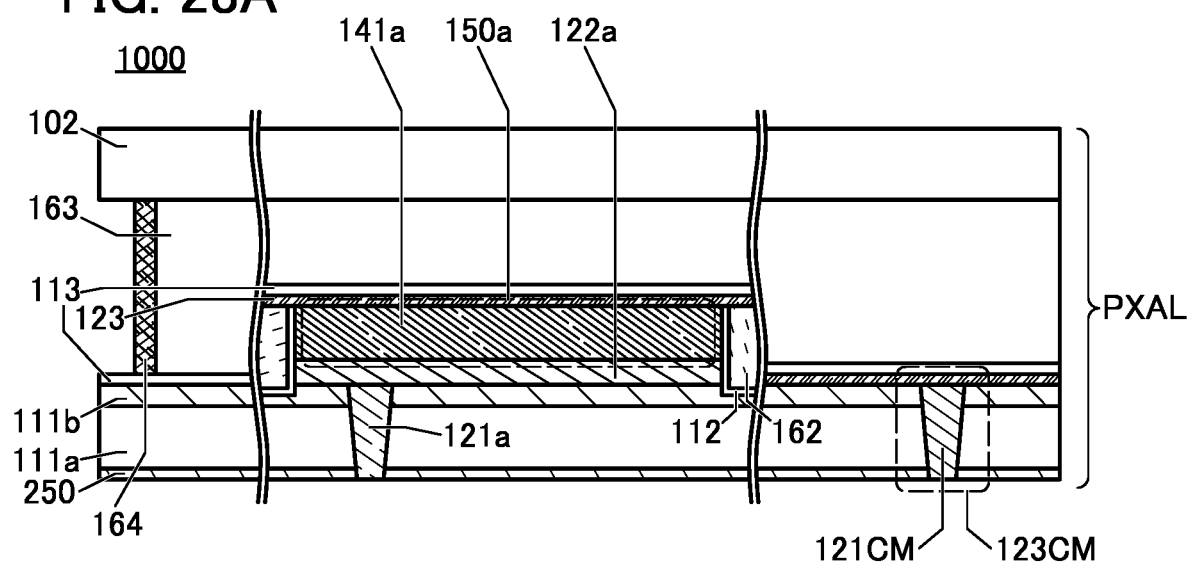
FIGS. 28A and 28B are schematic cross-sectional views each illustrating a structure example of a display apparatus.

FIG. 28A is a cross-sectional view of an example of a sealing structure applicable to the display apparatus 1000 in FIG. 24. Specifically, FIG. 28A shows an end portion of the display apparatus 1000 in FIG. 24 and components provided around the end portion. FIG. 28A illustrates part of the pixel layer PXAL of the display apparatus 1000. Specifically, FIG. 28A illustrates the insulator 250, and insulators, conductors, and the light-emitting device 150a which are positioned above the insulator 250.

In a region 123CM illustrated in FIG. 28A, for example, an opening is provided. In the opening, a conductor 121CM is provided, for example. The conductor 123 is electrically connected to a wiring provided below the insulator 250 through the conductor 121CM. With this structure, the potential (e.g., an anode potential and a cathode potential of the light-emitting device 150a) can be supplied to the conductor 123 functioning as the common electrode. Note that at least one of a conductor included in the region 123CM and a conductor near the region 123CM is referred to as a connection electrode in some cases.

For the conductor 121CM, any of the materials usable for the conductor 121 can be used, for example.

In the display apparatus 1000 shown in FIG. 28A, an adhesive layer 164 is provided at or around the end portion of the resin layer 163. Specifically, the display apparatus 1000 is fabricated such that the adhesive layer 164 is placed between the insulator 113 and the substrate 102.

The adhesive layer 164 is preferably formed using, for example, a material inhibiting transmission of an impurity such as moisture. Using the material for the adhesive layer 164 can increase the reliability of the display apparatus 1000.

The structure in which the adhesive layer 164 is used to bond the insulator 113 and the substrate 102 with the resin layer 163 positioned between the insulator 113 and the substrate 102 is sometimes referred to as a solid sealing structure. In the case where the resin layer 163 in the solid sealing structure has a function of bonding the insulator 113 and the substrate 102 like the adhesive layer 164, the adhesive layer 164 is not necessarily provided.

A structure in which the adhesive layer 164 is used to bond the insulator 113 and the substrate 102 with not the resin layer 163 but an inert gas filling the space between the insulator 113 and the substrate 102 is sometimes referred to as a hollow sealing structure (not shown). Examples of an inert gas include a nitrogen gas and an argon gas.

Figure 28B:
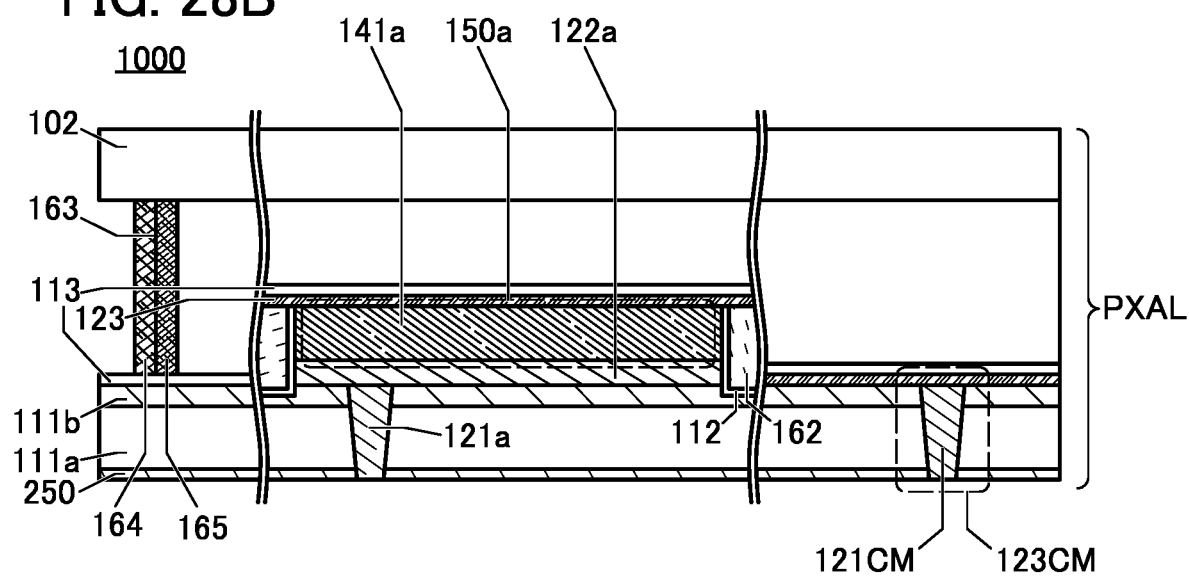

In the sealing structure of the display apparatus 1000 shown in FIG. 28A, two or more overlapping adhesive layers may be used. For example, as shown in FIG. 28B, an adhesive layer 165 may be provided inward from the adhesive layer 164 (may be provided between the adhesive layer 164 and the resin layer 163). Two or more overlapping adhesive layers can inhibit transmission of an impurity such as moisture more, further increasing the reliability of the display apparatus 1000.

A desiccant may be mixed into the adhesive layer 165. In this case, the desiccant adsorbs moisture contained in the resin layer 163, insulators, conductors, EL layers, and the like that are provided inward from the adhesive layers 164 and 165, increasing the reliability of the display apparatus 1000.

Although the solid sealing structure of the display apparatus 1000 is shown in FIG. 28B, a hollow sealing structure may be employed.

Furthermore, the resin layer 163 filling the space in each of the sealing structures of the display apparatus 1000 shown in FIGS. 28A and 28B may be replaced with an inert liquid. Examples of an inert liquid include a fluorine-based inert liquid.

Modification Example of Display Apparatus

One embodiment of the present invention is not limited to the above-described structures, and the above-described structures can be modified as appropriate in accordance with circumstances. A modification example of the display apparatus 1000 in FIG. 24 is described with reference to FIG. 29A to FIG. 30B. Note that FIG. 29A to FIG. 30B illustrate part of the pixel layer PXAL of the display apparatus 1000. Specifically, each of FIG. 29A to FIG. 30B illustrates the insulator 250, the insulator 11a, and insulators, conductors, the light-emitting device 150a, and the light-emitting device 150b which are positioned above the insulator 111a. In particular, each of FIG. 29A to FIG. 30B also illustrates alight-emitting device 150c, a conductor 121c, a conductor 122c, and an EL layer 141c.

Note that, for example, the color of light emitted from the EL layer 141c may be different from those of light emitted from the EL layers 141a and 141b. For example, in the display apparatus 1000, the number of colors of light emitted from the light-emitting devices 150a to 150c may be two. For another example, the display apparatus 1000 may have a structure in which the number of light-emitting devices 150 is increased and the number of colors of light emitted from the plurality of light-emitting devices is four or more (not illustrated).

Figure 29A:
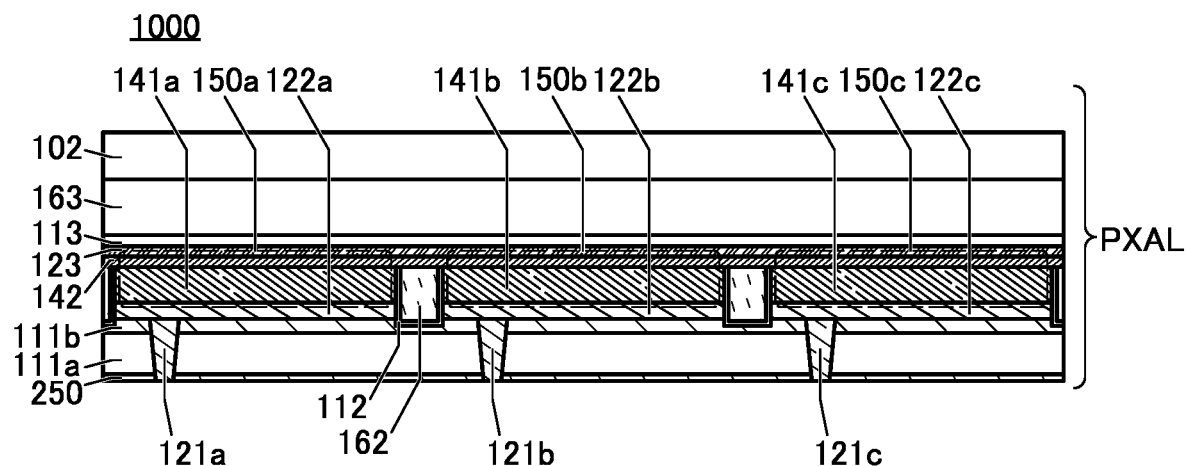
FIGS. 29A and 29B are schematic cross-sectional views each illustrating a structure example of a display apparatus.

The display apparatus 1000 may have a structure in which, for example, an EL layer 142 is provided over the EL layers 141*a* to 141*c* as shown in FIG. 29A. Specifically, for example, the EL layer 142 can include the layer 4420 shown in FIG. 25A when the EL layers 141*a* to 141*c* each include the layer 4430 and the light-emitting layer 4411 shown in FIG. 25A. In this case, the layer 4420 of the EL layer 142 functions as a common layer shared by the light-emitting devices 150*a* to 150*c*. In a similar manner, for another example, the EL layer 142 can include the layer 4420 shown in FIG. 25C when the EL layers 141*a* to 141*c* each include the layer 4430, the light-emitting layer 4411, the light-emitting layer 4412, and the light-emitting layer 4413 shown in FIG. 25C. In this case, the layer 4420 of the EL layer 142 functions as a common layer shared by the light-emitting devices 150*a* to 150*c*. For another example, the EL layer 142 can include the layer 4420 of the light-emitting unit 4400*b* shown in FIG. 25D when the EL layers 141*a* to 141*c* each include the layer 4430, the light-emitting layer 4412, and the layer 4420 that are included in the light-emitting unit 4400*b*, the intermediate layer 4440, and the layer 4430 and the light-emitting layer 4411 that are included in the light-emitting unit 4400*a* in FIG. 25D. In this case, the layer 4420 of the light-emitting unit 4400*a* in the EL layer 142 functions as a common layer shared by the light-emitting devices 150*a* to 150*c*.

Figure 29B:
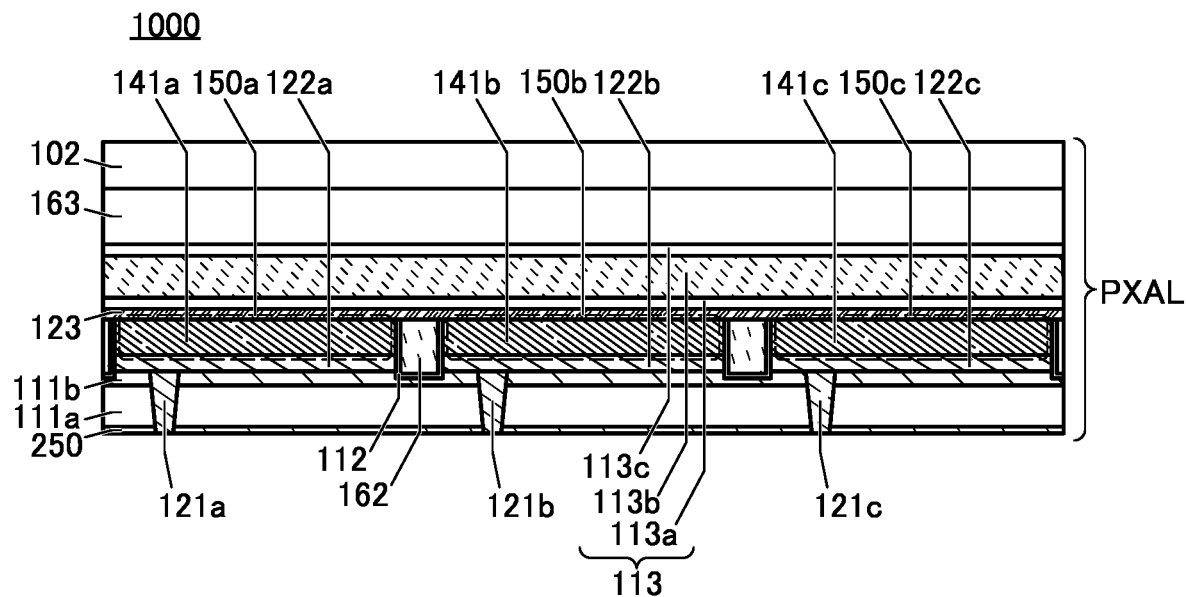

In the display apparatus 1000, for example, the insulator 113 may have a stacked-layer structure including two or more layers, instead of a single-layer structure. The insulator 113 may have a three-layer structure that includes an insulator made of an inorganic material as the first layer, an insulator made of an organic material as the second layer, and an insulator made of an inorganic material as the third layer. FIG. 29B shows a cross-sectional view of part of the display apparatus 1000 in which the insulator 113 has a multilayer structure including an insulator 113*a* that is an insulator made of an inorganic material, an insulator 113*b* that is an insulator made of an organic material, and an insulator 113*c* that is an insulator made of an inorganic material.

In the display apparatus 1000, for example, the EL layers 141*a* to 141*c* may each have a microcavity structure. In the microcavity structure, for example, the conductor 122 as an upper electrode (common electrode) is formed using a light-transmitting and light-reflective conductive material, the conductor 121 as a lower electrode (pixel electrode) is formed using a light-reflective conductive material, and the distance between a bottom surface of the light-emitting layer and a top surface of the lower electrode, i.e., the thickness of the layer 4430 in FIG. 25A, is set to the value corresponding to the wavelength of the color of light emitted by the light-emitting layer of the EL layer 141.

For example, light that is reflected back by the lower electrode (reflected light) considerably interferes with light that directly enters the upper electrode from the light-emitting layer (incident light). For this reason, the optical path length between the lower electrode and the light-emitting layer is preferably adjusted to $(2n-1)\lambda/4$ (n is a natural number greater than or equal to 1 and $\lambda$ is the wavelength of light to be amplified). By adjusting the optical path length, the phases of the reflected light and the incident light each having the wavelength $\lambda$ can be aligned with each other, and the light emitted from the light-emitting layer can be further amplified. In the case where the reflected light and the incident light have a wavelength other than the wavelength $\lambda$, their phases are not aligned with each other, resulting in attenuation without resonation.

In the above structure, the EL layer may include a plurality of light-emitting layers or a single light-emitting layer. It is also possible to, for example, combine the microcavity structure with the aforementioned tandem structure; specifically, a structure in which one light-emitting device includes a plurality of EL layers sandwiching a charge-generation layer and each EL layer includes one or more light-emitting layers can be applied to the microcavity structure.

With the microcavity structure, emission intensity with a specific wavelength in the front direction can be increased, whereby power consumption can be reduced. Particularly in the case of a device for XR such as VR and AR, light emitted from the light-emitting device in the front direction often enters the eyes of the user wearing the device; thus, a display apparatus of a device for XR preferably includes a microcavity structure. Note that in the case of a display apparatus which displays images with subpixels of four colors, red, yellow, green, and blue, the display apparatus can have favorable characteristics because the luminance can be increased owing to yellow light emission and each subpixel can employ a microcavity structure suitable for the wavelength of the corresponding color.

Figure 30A:
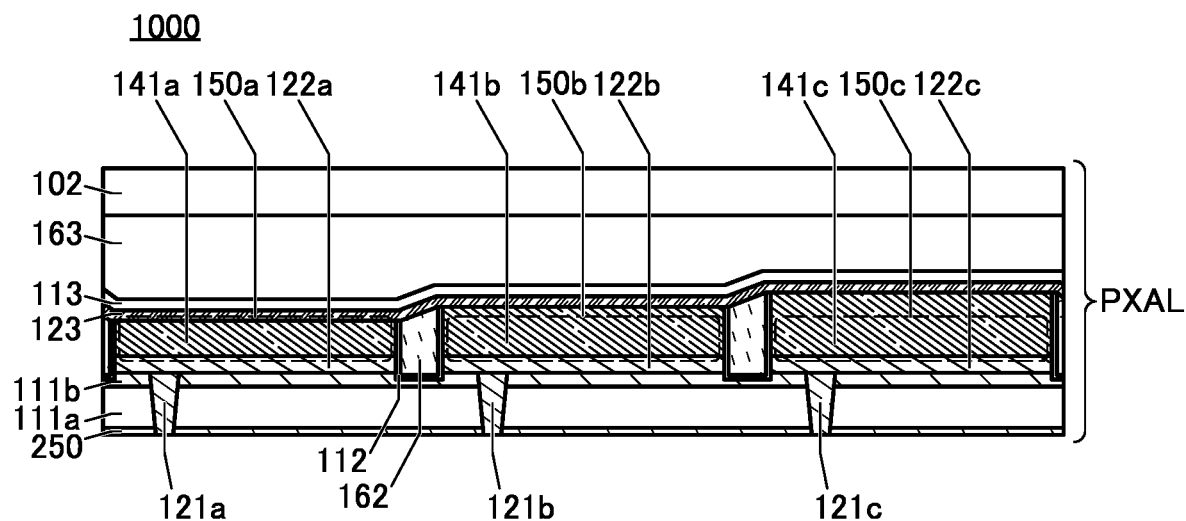
FIGS. 30A and 30B are schematic cross-sectional views each illustrating a structure example of a display apparatus.

As an example, FIG. 30A shows a cross-sectional view of part of the display apparatus 1000 including a microcavity structure. In the case where the light-emitting device 150*a* includes a blue (B)-light-emitting layer, the light-emitting device 150*b* includes a green (G)-light-emitting layer, and the light-emitting device 150*c* includes a red (R)-light-emitting layer, it is preferable that the EL layer 141*a* have the smallest thickness, the EL layer 141*b* have the second largest thickness, and the EL layer 141*c* have the largest thickness as shown in FIG. 30A. Specifically, the thicknesses of the layers 4430 included in the EL layers 141*a*, 141*b*, and 141*c* are determined depending on the color of the light emitted by the corresponding light-emitting layer. In this case, the layer 4430 of the EL layer 141*a* has the smallest thickness and the layer 4430 of the EL layer 141*c* has the largest thickness.

Figure 30B:
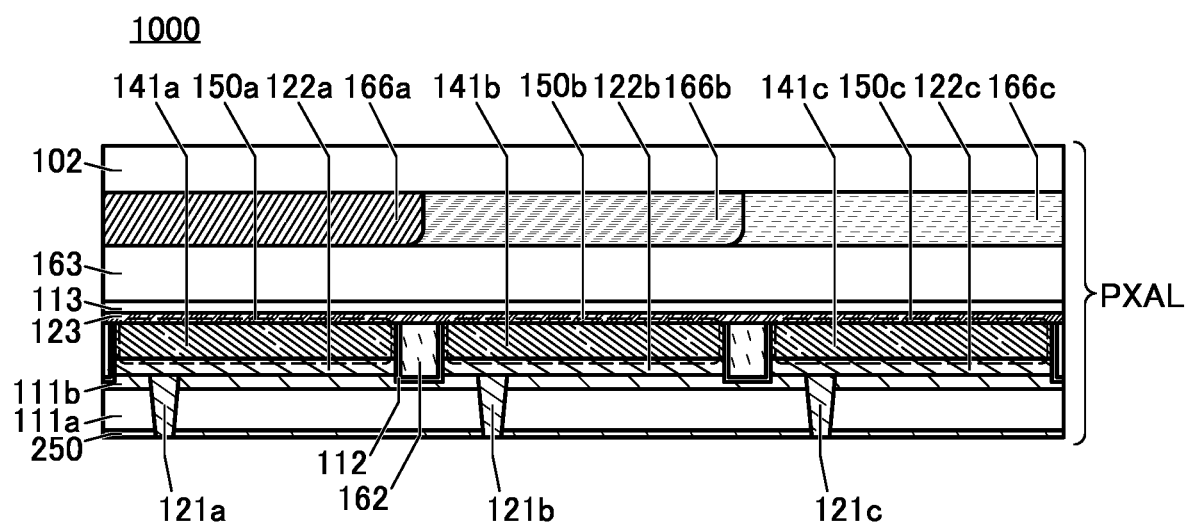

In the display apparatus 1000, for example, a coloring layer (color filter) or the like may be provided. As an example, FIG. 30B shows a structure in which a coloring layer 166*a*, a coloring layer 166*b*, and a coloring layer 166*c* are provided between the resin layer 163 and the substrate 102. Note that the coloring layers 166*a* to 166*c* can be formed on the substrate 102, for example. In the case where the light-emitting device 150*a* includes a blue (B)-light-emitting layer, the light-emitting device 150*b* includes a green (G)-light-emitting layer, and the light-emitting device 150*c* includes a red (R)-light-emitting layer, the coloring layer 166*a* is a blue coloring layer, the coloring layer 166*b* is a green coloring layer, and the coloring layer 166*c* is a red coloring layer.

The display apparatus 1000 shown in FIG. 30B can be fabricated in such a manner that the substrate 102 provided with the coloring layers 166*a* to 166*c* and the substrate 310 over which components up to the light-emitting devices 150*a* to 150*c* are formed are bonded to each other with the resin layer 163 therebetween. This bonding is preferably performed such that the light-emitting device 150*a* and the coloring layer 166*a* overlap with each other, the light-emitting device 150*b* and the coloring layer 166*b* overlap with each other, and the light-emitting device 150*c* and the coloring layer 166c overlap with each other. In the display apparatus 1000 provided with the coloring layers 166a to 166c, for example, the light emitted by the light-emitting device 150b is extracted to above the substrate 102 through the coloring layer 166b instead of through the coloring layer 166a or the coloring layer 166c. That is, light emitted from the light-emitting device 150 in an oblique direction (a direction at an elevation angle with a top surface of the substrate 102 used as a horizontal plane) can be blocked in the display apparatus 1000; thus, the viewing angle dependence of the display apparatus 1000 can be reduced, inhibiting the display quality of an image displayed by the display apparatus 1000 from decreasing when the image is viewed from an oblique direction.

The coloring layers 166a to 166c formed on the substrate 102 may be covered with, for example, a resin which is also referred to as an overcoat layer. Specifically, the resin layer 163, the overcoat layer, the coloring layers 166a to 166c, and the substrate 102 may be stacked in this order in the display apparatus 1000 (not shown). Note that examples of the resin usable for the overcoat layer include a thermosetting material having a light-transmitting property and based on an acrylic or epoxy resin.

In the display apparatus 1000, for example, a black matrix (not shown) may be provided in addition to the coloring layers. A black matrix provided between the coloring layer 166a and the coloring layer 166b, between the coloring layer 166b and the coloring layer 166c, and between the coloring layer 166c and the coloring layer 166a can enhance blockage of the light emitted from the light-emitting devices 150 of the display apparatus 1000 in an oblique direction (a direction at an elevation angle with the top surface of the substrate 102 used as a horizontal plane), further inhibiting the display quality of an image displayed by the display apparatus 1000 from decreasing when the image is viewed from an oblique direction.

In the case where the display apparatus includes coloring layers as shown in FIG. 30B or the like, the light-emitting devices 150a to 150c of the display apparatus may each be a white-light-emitting device (not shown). The structure of the light-emitting device can be a single structure or a tandem structure, for example.

In the above-described structures of the display apparatus 1000, the conductors 121a to 121c serve as the anodes and the conductor 122 serves as a cathode; however, the display apparatus 1000 may have a structure in which the conductors 121a to 121c serve as cathodes and the conductor 122 serves as an anode. In other words, in the above-described manufacturing process, the stacking order of the hole-injection layer, hole-transport layer, light-emitting layer, electron-transport layer, and electron-injection layer that are included in the EL layers 141a to 141c and the EL layer 142 can be reversed.

Structure Example of Insulator 162

Next, cross-sectional structures of a region including the insulator 162 and its periphery in the display apparatus 1000 are described.

Figure 31A:
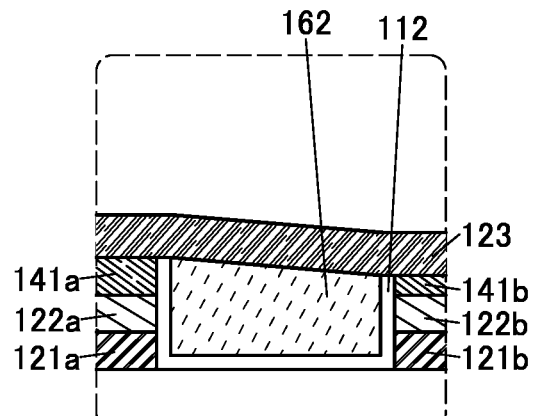
FIGS. 31A to 31F are cross-sectional views each illustrating an example of a manufacturing method of a display apparatus.

FIG. 31A illustrates an example in which the EL layer 141a and the EL layer 141b have different thicknesses. The height of the top surface of the insulator 112 is aligned with or substantially aligned with the height of the top surface of the EL layer 141a on the EL layer 141a side, and aligned with or substantially aligned with the height of the top surface of the EL layer 141b on the EL layer 141b side. The top surface of the insulator 112 has a gentle slope such that the side closer to the EL layer 141a is higher and the side closer to the EL layer 141b is lower. In this manner, the heights of the insulators 112 and 162 are preferably aligned with the height of the top surface of the adjacent EL layer. Alternatively, the height of the insulators may be aligned with the height of the top surface of any adjacent EL layer so that their top surfaces can have a flat portion.

Figure 31B:
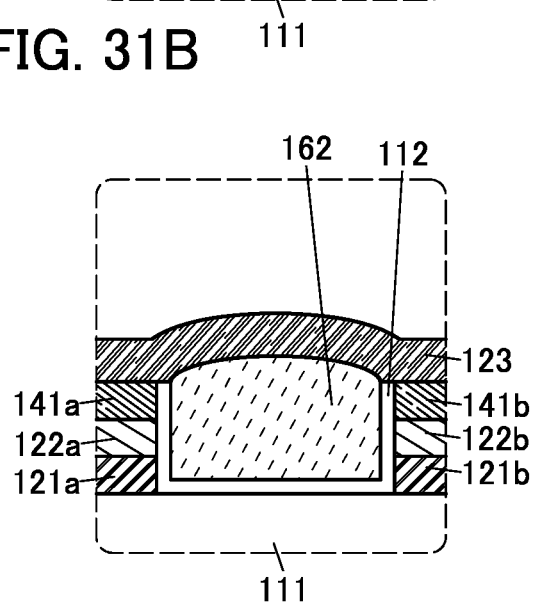

In FIG. 31B, the top surface of the insulator 112 includes a region whose height is higher than the height of the top surfaces of the EL layers 141a and 141b. Moreover, the top surface of the insulator 112 has a convex shape that is gently curved outward toward the center.

Figure 31C:
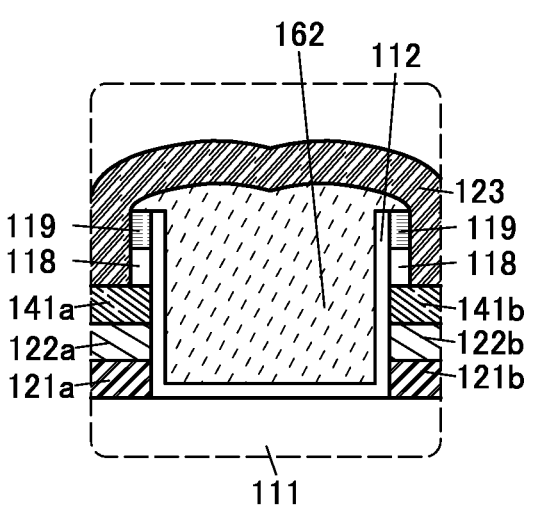

In FIG. 31C, the top surface of the insulator 112 has a region which is higher than the top surfaces of the EL layers 141a and 141b. Specifically, in the region including the insulator 162 and its periphery, the display apparatus 1000 includes a sacrificial layer 118 and/or a sacrificial layer 119. The display apparatus 1000 has a first region where the top surface of the insulator 112 is higher than the top surfaces of the EL layers 141a and 141b and the insulator 112 is positioned outside the insulator 162. The first region is positioned over the sacrificial layer 118 and/or the sacrificial layer 119. In the region including the insulator 162 and its periphery, the display apparatus 1000 includes the sacrificial layer 118 and/or the sacrificial layer 119. The display apparatus 1000 has a second region where the insulator 162 is higher than the top surfaces of the EL layers 141a and 141b and is positioned outside the insulator 112. The second region is positioned over the sacrificial layer 118 and/or the sacrificial layer 119.

Figure 31D:
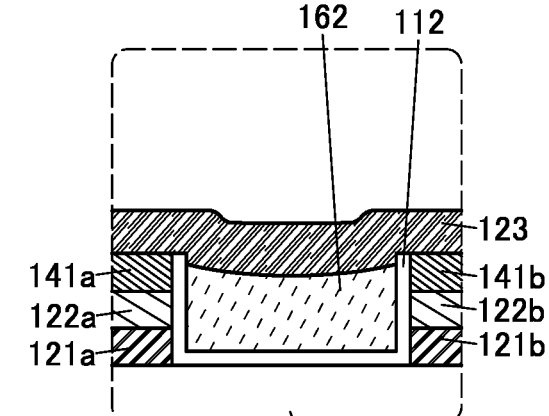

In FIG. 31D, the top surface of the insulator 162 includes a region whose height is lower than the height of the top surface of the EL layer 141a and the top surface of the EL layer 141b. Moreover, the top surface of the insulator 162 has a concave shape that is gently recessed toward the center.

Figure 31E:
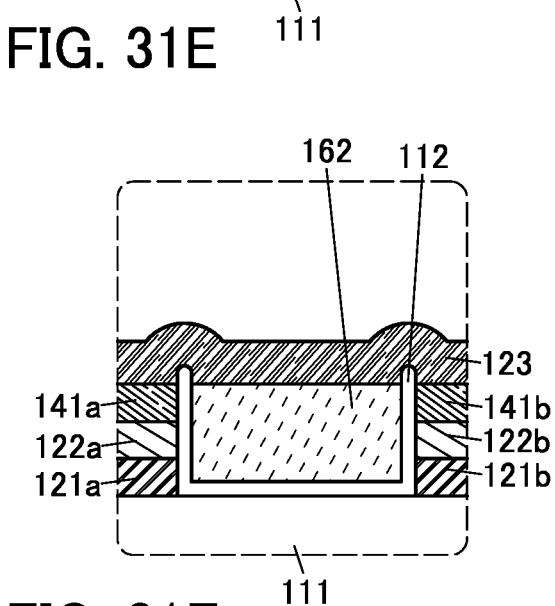

In FIG. 31E, the top surface of the insulator 112 includes a region whose height is higher than the height of the top surfaces of the EL layers 141a and 141b. That is, the insulator 112 protrudes from the formation surface of the EL layer 141 and forms a projection.

For example, when the insulator 112 is formed so that its height is aligned with or substantially aligned with the height of the sacrificial layer, the insulator 112 may protrude as illustrated in FIG. 31E.

Figure 31F:
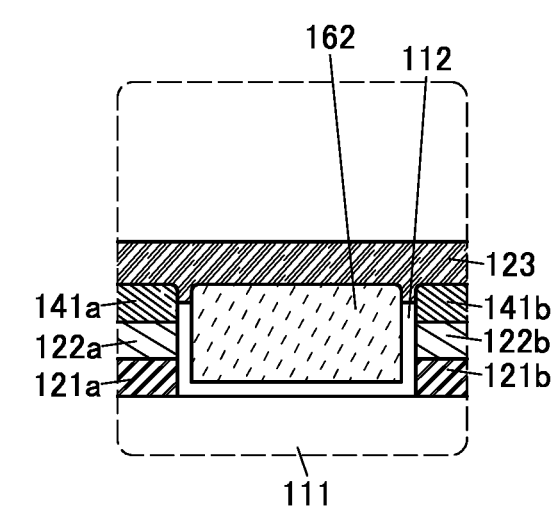

In FIG. 31F, the top surface of the insulator 112 includes a region whose height is less than the height of the top surfaces of the EL layer 141a and 141b. That is, the insulator 112 forms a depressed portion on the formation surface of the EL layer 141.

As described above, the insulator 112 and insulator 162 can have a variety of shapes.

Configuration Example of Pixel Circuit

Here, configuration examples of a pixel circuit that can be included in the pixel layer PXAL are described.

Figure 32A:
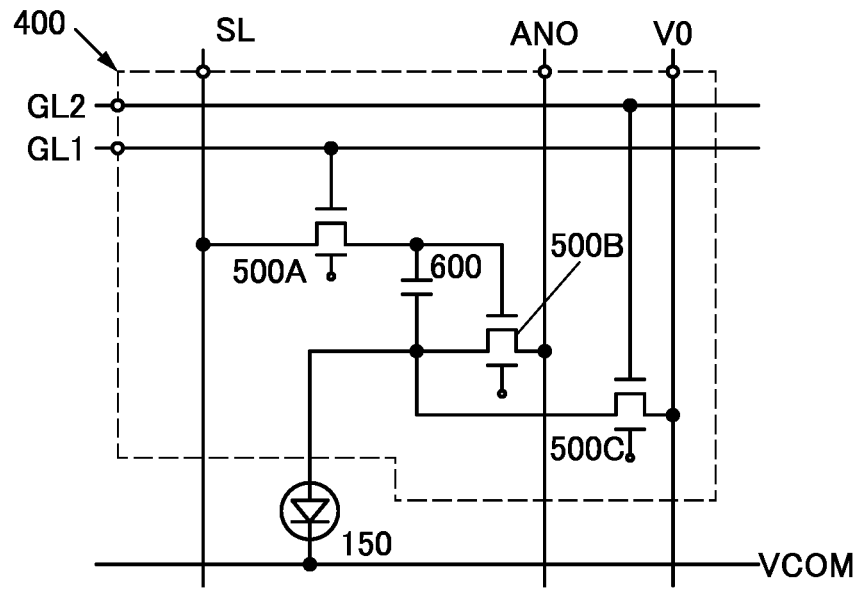
FIGS. 32A and 32B are a circuit diagram and a schematic perspective view, respectively, illustrating a configuration example of a pixel circuit included in a display apparatus.
Figure 32B:
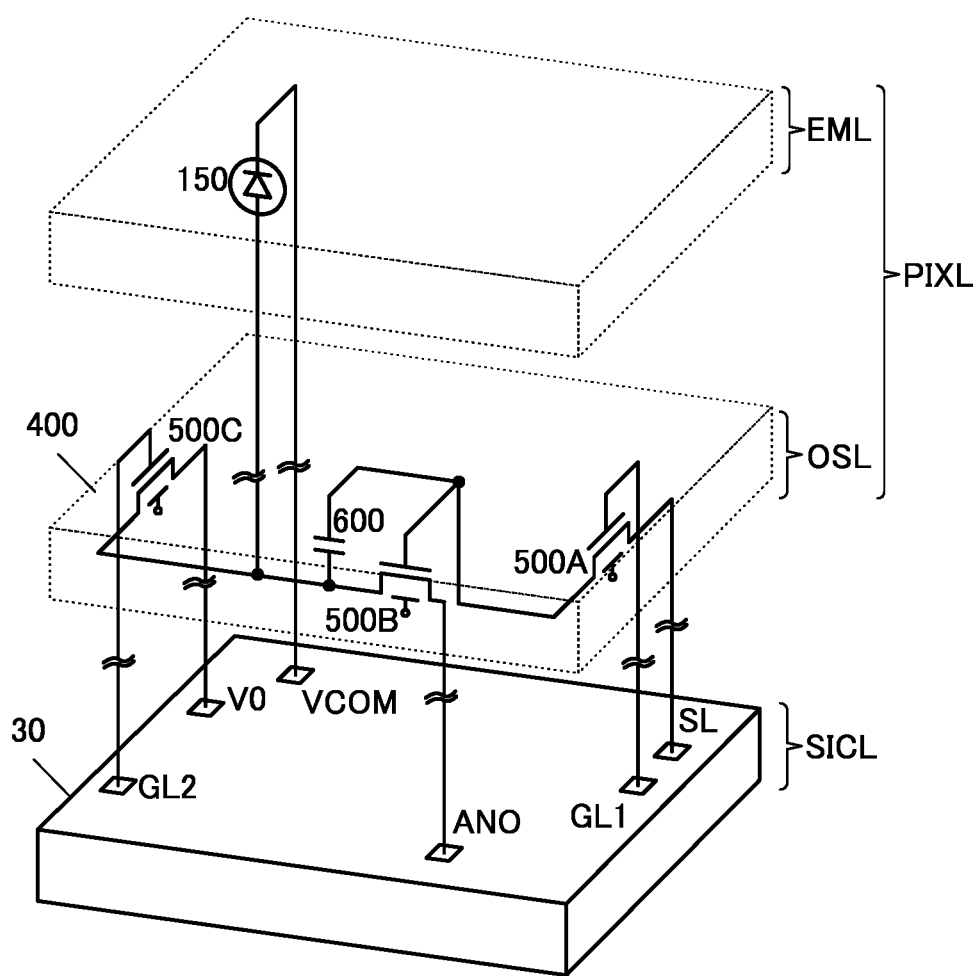

FIGS. 32A and 32B show a configuration example of a pixel circuit that can be included in the pixel layer PXAL and the light-emitting device 150 connected to the pixel circuit. FIG. 32A shows connection of circuit elements of a pixel circuit 400 included in the pixel layer PXAL, and FIG. 32B schematically shows the positional relation of the circuit layer SICL including a driver circuit 30 and the like, a layer OSL including a plurality of transistors of the pixel circuit, and a layer EML including the light-emitting device 150. Note that the pixel layer PXAL in the display apparatus 1000 in FIG. 32B includes the layer OSL and the layer EML, for example. A transistor 500A, a transistor 500B, and a transistor 500C included in the layer OSL illustrated in FIG. 32B each correspond to the transistor 200 in FIG. 24. The light-emitting device 150 included in the layer EML illustrated in FIG. 32B corresponds to the light-emitting device 150a or the light-emitting device 150b in FIG. 24.

The pixel circuit 400 illustrated as an example in FIGS. 32A and 32B includes the transistor 500A, the transistor 500B, the transistor 500C, and a capacitor 600. As the transistors 500A, 500B, and 500C, for example, transistors usable as the above-described transistor 200 can be used. That is, the transistors 500A, 500B, and 500C can be Si transistors. Alternatively, as the transistors 500A, 500B, and 500C, for example, transistors usable as the above-described transistor 500 can be used. That is, the transistors 500A, 500B, and 500C can be OS transistors. In particular, in the case where the transistors 500A, 500B, and 500C are OS transistors, each of the transistors 500A, 500B, and 500C preferably includes a back gate electrode, in which case the back gate electrode and a gate electrode can be supplied with the same signals or different signals. Although each of the transistors 500A, 500B, and 500C in FIGS. 32A and 32B includes a back gate electrode, each of the transistors 500A, 500B, and 500C does not necessarily include a back gate electrode.

The transistor 500B includes the gate electrode electrically connected to the transistor 500A, a first electrode electrically connected to the light-emitting device 150, and a second electrode electrically connected to a wiring ANO. The wiring ANO supplies a potential for supplying a current to the light-emitting device 150.

The transistor 500A includes a first terminal electrically connected to the gate electrode of the transistor 500B, a second terminal electrically connected to the wiring SL functioning as a source line, and the gate electrode having a function of controlling the conduction state or the non-conduction state based on the potential of a wiring GL1 functioning as a gate line.

The transistor 500C includes a first terminal electrically connected to a wiring V0, a second terminal electrically connected to the light-emitting device 150, and the gate electrode having a function of controlling the conduction state or the non-conduction state based on the potential of a wiring GL2 functioning as a gate line. The wiring V0 supplies a reference potential and outputs a current flowing in the pixel circuit 400 to the driver circuit 30.

The capacitor 600 includes a conductive film electrically connected to the gate electrode of the transistor 500B and a conductive film electrically connected to the second electrode of the transistor 500C.

The light-emitting device 150 includes a first electrode electrically connected to the first electrode of the transistor 500B and a second electrode electrically connected to a wiring VCOM. The wiring VCOM supplies a potential for supplying a current to the light-emitting device 150.

Accordingly, the intensity of light emitted by the light-emitting device 150 can be controlled in accordance with an image signal supplied to the gate electrode of the transistor 500B. Furthermore, variations in the gate-source voltage of the transistor 500B can be reduced by the reference potential of the wiring V0 supplied through the transistor 500C.

A current value that can be used for setting of pixel parameters can be output from the wiring V0. Specifically, the wiring V0 can function as a monitor line for outputting a current flowing in the transistor 500B or a current flowing in the light-emitting device 150 to the outside. A current output to the wiring V0 is converted into a voltage by a current voltage conversion circuit and output to the outside. Alternatively, the current is converted into a digital signal by an A/D converter, and can be output to the AI accelerator described in the above embodiment.

In the configuration illustrated as an example in FIG. 32B, the wirings electrically connecting the pixel circuit 400 and the driver circuit 30 can be short, so that the wiring resistance of the wirings can be low. Thus, data writing can be performed at a high speed, leading to high-speed operation of the display apparatus 1000. Therefore, even when the number of pixel circuits 400 included in the display apparatus 1000 is large, a sufficiently long frame period can be ensured and thus the pixel density of the display apparatus 1000 can be increased. In addition, the increased pixel density of the display apparatus 1000 can increase the resolution of an image displayed by the display apparatus 1000. For example, the pixel density of the display apparatus 1000 can be higher than or equal to 1000 ppi, higher than or equal to 5000 ppi, or higher than or equal to 7000 ppi. Thus, the display apparatus 1000 can be, for example, a display apparatus for VR or AR and can be suitably used in a head-mounted display with a short distance between the display portion and the user.

Although FIGS. 32A and 32B illustrate, as an example, the pixel circuit 400 including three transistors in total, one embodiment of the present invention is not limited thereto. Configuration examples which can be used for the pixel circuit 400 will be described below.

Figure 33A:
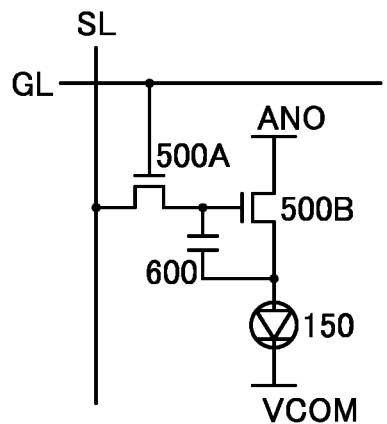
FIGS. 33A to 33D are circuit diagrams each illustrating a configuration example of a pixel circuit included in a display apparatus.

A pixel circuit 400A illustrated in FIG. 33A includes the transistor 500A, the transistor 500B, and the capacitor 600. FIG. 33A illustrates the light-emitting device 150 connected to the pixel circuit 400A. The wirings SL, GL, ANO, and VCOM are electrically connected to the pixel circuit 400A.

The gate of the transistor 500A is electrically connected to the wiring GL, one of the source and the drain of the transistor 500A is electrically connected to the wiring SL, and the other of the source and the drain of the transistor 500A is electrically connected to the gate of the transistor 500B and one electrode of the capacitor 600. One of the source and the drain of the transistor 500B is electrically connected to the wiring ANO and the other of the source and the drain of the transistor 500B is electrically connected to the anode of the light-emitting device 150. The other electrode of the capacitor 600 is electrically connected to the anode of the light-emitting device 150. The cathode of the light-emitting device 150 is electrically connected to the wiring VCOM.

Figure 33B:
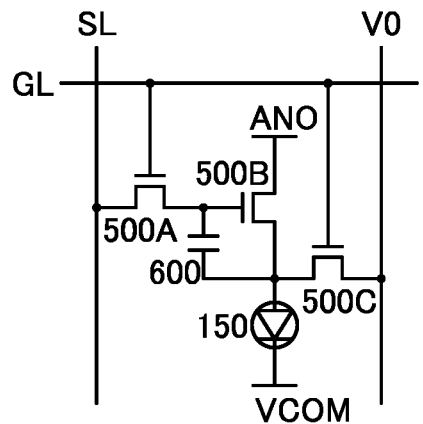

A pixel circuit 400B illustrated in FIG. 33B has a configuration in which the transistor 500C is added to the pixel circuit 400A. In addition, the wiring V0 is electrically connected to the pixel circuit 400B.

Figure 33C:
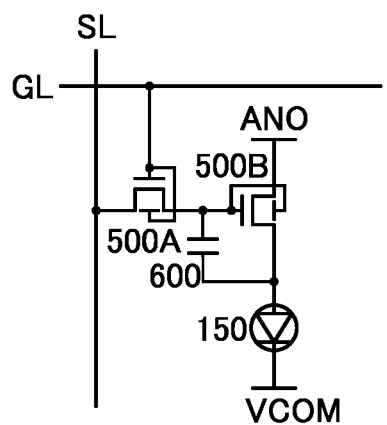
Figure 33D:
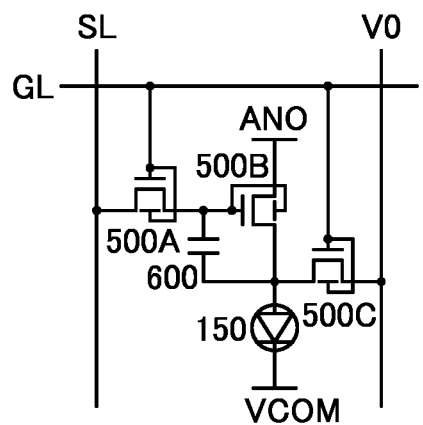

A pixel circuit 400C illustrated in FIG. 33C is an example in which a transistor including a gate and a back gate that are electrically connected to each other is used as each of the transistor 500A and the transistor 500B of the pixel circuit 400A. A pixel circuit 400D illustrated in FIG. 33D is an example in the case where such transistors are used in the pixel circuit 400B. With these structures, a current that can flow in the transistors can be increased. Although a transistor in which a pair of gates are electrically connected to each other is used as every transistor here, one embodiment of the present invention is not limited thereto. A transistor that includes a pair of gates electrically connected to different wirings may be used. When, for example, a transistor in which one of the gates is electrically connected to the source is used, the reliability can be increased.

Figure 34A:
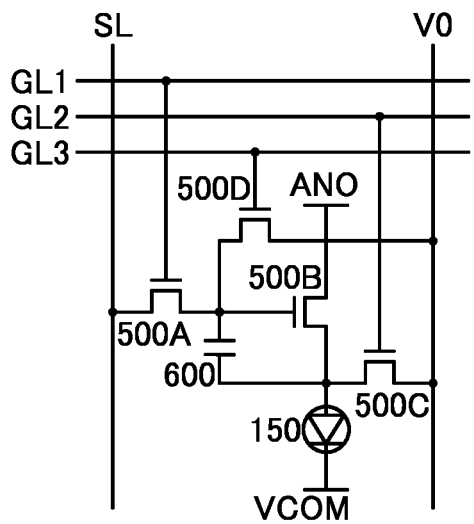
FIGS. 34A to 34D are circuit diagrams each illustrating a configuration example of a pixel circuit included in a display apparatus.

A pixel circuit 400E illustrated in FIG. 34A has a configuration in which a transistor 500D is added to the pixel circuit 400B. Three wirings (wirings GL1, GL2, and GL3) functioning as gate lines are electrically connected to the pixel circuit 400E.

A gate of the transistor 500D is electrically connected to the wiring GL3, one of a source and a drain of the transistor 500D is electrically connected to the gate of the transistor 500B, and the other of the source and the drain of the transistor 500D is electrically connected to the wiring V0. The gate of the transistor 500A is electrically connected to the wiring GL1, and the gate of the transistor 500C is electrically connected to the wiring GL2.

When the transistors 500C and 500D are turned on at the same time, the source and the gate of the transistor 500B have the same potential, so that the transistor 500B can be turned off. Thus, a current flowing to the light-emitting device 150 can be blocked forcibly. Such a pixel circuit is suitable for the case of using a display method in which a display period and an off period are alternately provided.

Figure 34B:
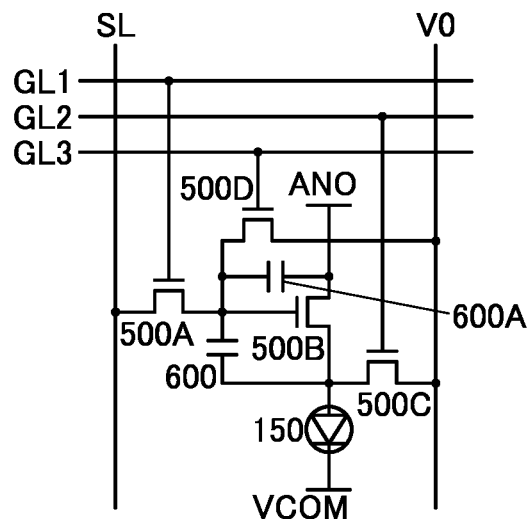

A pixel circuit 400F illustrated in FIG. 34B is an example in which a capacitor 600A is added to the pixel circuit 400E. The capacitor 600A functions as a storage capacitor.

Figure 34C:
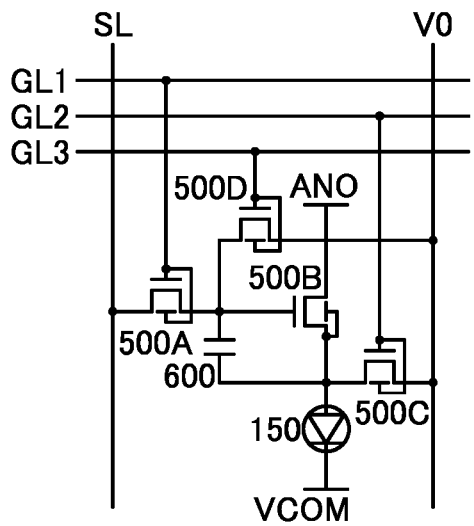
Figure 34D:
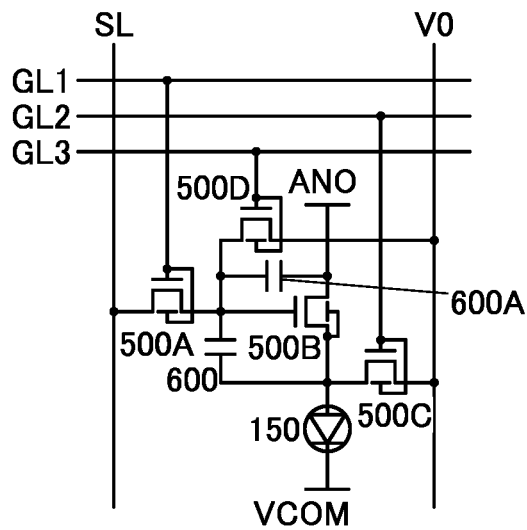

A pixel circuit 400G illustrated in FIG. 34C and a pixel circuit 400H illustrated in FIG. 34D are respectively examples of the cases where transistors each including a gate and a back gate that are electrically connected to each other are used in the pixel circuit 400E and the pixel circuit 400F. A transistor including a gate and a back gate that are electrically connected to each other is used as each of the transistors 500A, 500C, and 500D, and a transistor in which one of gates is electrically connected to a source is used as the transistor 500B.

<Schematic Plan View and Cross-Sectional View of Light-Emitting Device>

FIG. 35A is a schematic plan view illustrating a structure example of the case where light-emitting devices and a light-receiving device are provided in one pixel in the display apparatus 1000 of one embodiment of the present invention. The display apparatus 1000 includes light-emitting devices 150R that emit red light, light-emitting devices 150G that emit green light, light-emitting devices 150B that emit blue light, and light-receiving devices 160. In FIG. 35A, light-emitting regions of the light-emitting devices 150 are denoted by R, G, and B to easily differentiate the light-emitting devices 150. In addition, light-receiving regions of the light-receiving devices 160 are denoted by PD.

The light-emitting devices 150R, the light-emitting devices 150G, the light-emitting devices 150B, and the light-receiving devices 160 are arranged in a matrix. FIG. 35A illustrates an example where the light-emitting devices 150R, the light-emitting devices 150G, and the light-emitting devices 150B are arranged in the X direction and the light-receiving devices 160 are arranged thereunder. FIG. 35A illustrates a structure example where the light-emitting devices 150 that emit light of the same color are arranged in the Y direction intersecting the X direction. In the display apparatus 1000 in FIG. 35A, a pixel 80 can be composed of a sub-pixel including the light-emitting device 150R, a sub-pixel including the light-emitting device 150G, and a sub-pixel including the light-emitting device 150B, which are arranged in the X direction, and a sub-pixel including the light-receiving device 160 provided under the sub-pixels, for example.

As each of the light-emitting devices 150R, 150G, and 150B, an EL element such as an organic light-emitting diode (OLED) or a quantum-dot light-emitting diode (QLED) is preferably used. Examples of a light-emitting substance included in the EL elements include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). Note that as the TADF material, a TADF material whose singlet excited state and triplet excited state are in a thermal equilibrium state may be used. Because such a TADF material has a short emission lifetime (a short excitation lifetime), it inhibits a reduction in the efficiency of the light-emitting device in a high luminance region.

As the light-receiving devices 160, a PN photodiode or a PIN photodiode can be used, for example. The light-receiving devices 160 each function as a photoelectric conversion element that senses light incident on the corresponding light-receiving device 160 and generates electric charges. The amount of generated electric charges depends on the amount of incident light.

It is particularly preferable to use an organic photodiode including a layer containing an organic compound as the light-receiving devices 160. An organic photodiode, which is easily made thin, lightweight, and large in area and has a high degree of freedom for shape and design, can be used in a variety of display apparatuses.

In one embodiment of the present invention, organic EL elements are used as the light-emitting devices 150, and organic photodiodes are used as the light-receiving devices 160. The organic EL elements and the organic photodiodes can be formed over one substrate. Thus, the organic photodiodes can be incorporated in a display apparatus including the organic EL elements. A photolithography method is preferably employed to separate the organic EL elements from each other, separate the organic photodiodes from each other, and separate the organic EL element from the organic photodiode. This can reduce the distance between the light-emitting devices, that between the organic photodiodes, and that between the light-emitting device and the organic photodiode, enabling fabrication of a display apparatus having a higher aperture ratio than that formed using, for example, a shadow mask such as a metal mask.

FIG. 35A shows the conductor 123 functioning as a common electrode and the conductor 121CM functioning as a connection electrode. The conductor 121CM is electrically connected to the conductor 123. The conductor 121CM is provided outside a display portion where the light-emitting devices 150 and the light-receiving devices 160 are arranged. In FIG. 35A, the conductor 123 having a region overlapping with the light-emitting devices 150, the light-receiving devices 160, and the conductor 121CM is shown by dashed lines.

The conductor 121CM can be provided along the outer periphery of the display portion. For example, the conductor 121CM may be provided along one side of the outer periphery of the display portion or two or more sides of the outer periphery of the display portion. That is, the top surface shape of the conductor 121CM can be, for example, a band shape, an L shape, a square bracket shape, or a quadrangle in the case where the top surface shape of the display portion is a rectangle.

FIG. 35B is a schematic plan view illustrating a structure example of the display apparatus 1000, which is a modification example of the display apparatus 1000 illustrated in FIG. 35A. The display apparatus 1000 illustrated in FIG. 35B is different from the display apparatus 1000 in FIG. 35A in that light-emitting devices 150IR that emit infrared light are included. The light-emitting devices 150IR can emit near-infrared light (light with a wavelength greater than or equal to 750 nm to less than or equal to 1300 nm), for example.

In the example illustrated in FIG. 35B, the light-emitting devices 150IR as well as the light-emitting devices 150R, 150G, and 150B are arranged in the X direction, and the light-receiving devices 160 are arranged thereunder. The light-receiving devices 160 each have a function of detecting infrared light.

Figure 36A:
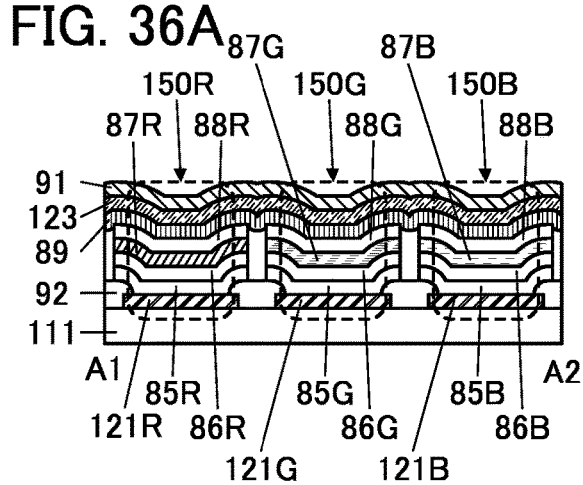
FIGS. 36A to 36D are schematic cross-sectional views illustrating a structure example of a light-emitting device, a light-receiving device, and a connection electrode included in a display apparatus.
Figure 36B:
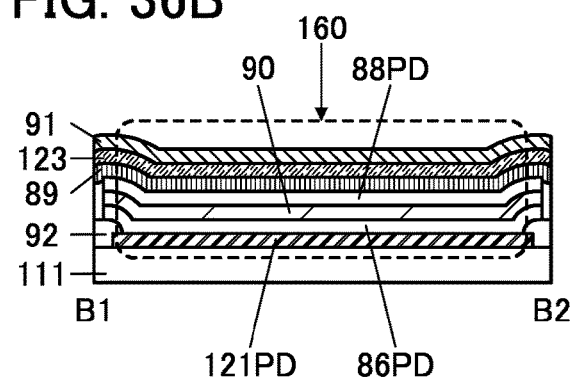
Figure 36C:
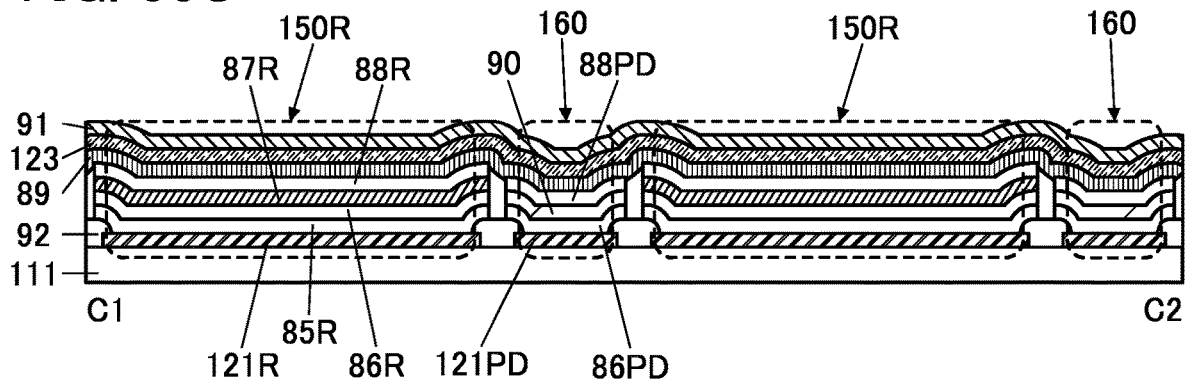
Figure 36D:
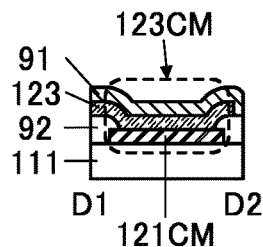

FIG. 36A is a cross-sectional view taken along dashed-dotted line A1-A2 in FIG. 35A, and FIG. 36B is a cross-sectional view taken along dashed-dotted line B1-B2 in FIG. 35A. FIG. 36C is a cross-sectional view taken along dashed-dotted line C1-C2 in FIG. 35A, and FIG. 36D is a cross-sectional view taken along dashed-dotted line D1-D2 in FIG. 35A. The light-emitting devices 150R, the light-emitting devices 150G, the light-emitting devices 150B, and the light-receiving devices 160 are provided over the insulator 111. In the case where the display apparatus 1000 includes the light-emitting devices 150IR, the light-emitting devices 150IR are provided over the insulator 111.

In the case where the expression "B over A" or "B under A" is used in this specification and the like, for example, A and B do not always need to include a region where they are in contact with each other.

FIG. 36A illustrates a cross-sectional structure example of the light-emitting devices 150R, 150G, and 150B shown in FIG. 35A. FIG. 36B illustrates a cross-sectional structure example of the light-receiving device 160 shown in FIG. 35A.

The light-emitting device 150R includes a conductor 121R functioning as a pixel electrode, a hole-injection layer 85R, a hole-transport layer 86R, a light-emitting layer 87R, an electron-transport layer 88R, a common layer 89, and the conductor 123.

The light-emitting device 150G includes a conductor 121G functioning as a pixel electrode, a hole-injection layer 85G, a hole-transport layer 86G, a light-emitting layer 87G, an electron-transport layer 88G, the common layer 89, and the conductor 123. The light-emitting device 150B includes a conductor 121B functioning as a pixel electrode, a hole-injection layer 85B, a hole-transport layer 86B, a light-emitting layer 87B, an electron-transport layer 88B, the common layer 89, and the conductor 123. The light-receiving device 160 includes a conductor 121PD functioning as a pixel electrode, a hole-transport layer 86PD, a light-receiving layer 90, an electron-transport layer 88PD, the common layer 89, and the conductor 123.

As the conductor 121R, the conductor 121G, and the conductor 121B, for example, the conductor 121a, the conductor 121b, and the conductor 121c shown in FIGS. 29A to 30B can be used.

The common layer 89 has a function of an electron-injection layer in the light-emitting device 150. Meanwhile, the common layer 89 has a function of an electron-transport layer in the light-receiving device 160. Therefore, the light-receiving device 160 does not necessarily have to include the electron-transport layer 88PD.

The hole-injection layer 85, the hole-transport layer 86, the electron-transport layer 88, and the common layer 89 can also be referred to as functional layers.

The conductor 121, the hole-injection layer 85, the hole-transport layer 86, the light-emitting layer 87, and the electron-transport layer 88 can each be separately provided for each device. The light-emitting devices 150R, 150G, and 150B and the light-receiving devices 160 include the common layer 89 and the conductor 123 in common.

The light-emitting devices 150 and the light-receiving devices 160 may each include a hole-blocking layer and an electron-blocking layer other than the layers illustrated in FIG. 36A. The light-emitting devices 150 and the light-receiving devices 160 may each include a layer containing a bipolar substance (a substance with a high electron-transport property and a high hole-transport property).

An insulating layer 92 is provided to cover an end portion of the conductor 121R, an end portion of the conductor 121G, an end portion of the conductor 121B, and an end portion of the conductor 121PD. End portions of the insulating layer 92 are preferably tapered. Note that the insulating layer 92 is not necessarily provided.

The insulating layer 92 may be provided to prevent adjacent pixels (e.g., the light-emitting devices 150R and 150G or the light-emitting devices 150G and 150B) from being electrically short-circuited and emitting light unintentionally, for example. In the case where the light-emitting device is formed using a metal mask, the insulating layer 92 may be provided to cover end portions of the conductors 121R, 121G, 121B, and 121PD so as to prevent the metal mask from being in contact with the conductors 121R, 121G, 121B, and 121PD. With this structure, the top surface of the insulating layer 92 is higher than the top surfaces of the conductors 121R, 121G, 121B, and 121PD, and thus the metal mask is not in contact with the conductors 121R, 121G, 121B, and 121PD, whereby damage on the surfaces of the conductors 121R, 121G, 121B, and 121PD can be prevented.

The hole-injection layer 85R, the hole-injection layer 85G, the hole-injection layer 85B, and the hole-transport layer 86PD each have, for example, a region in contact with a top surface of the conductor 121 and a region in contact with a surface of the insulating layer 92. Furthermore, an end portion of the hole-injection layer 85R, an end portion of the hole-injection layer 85G, an end portion of the hole-injection layer 85B, and an end portion of the hole-transport layer 86PD are positioned over the insulating layer 92.

A gap is provided between the common layer 89 and the insulating layer 92. This can inhibit contact between the common layer 89 and each of a side surface of the light-emitting layer 87, a side surface of the light-receiving layer 90, a side surface of the hole-transport layer 86, and a side surface of the hole-injection layer 85. Thus, a short circuit in the light-emitting devices 150 and a short circuit in the light-receiving devices 160 can be inhibited.

The shorter the distance between the light-emitting layers 87 is, the more easily the gap is formed, for example. For example, when the distance is less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm, the gap can be favorably formed.

A protective layer 91 is provided over the conductor 123. The protective layer 91 has a function of preventing diffusion of impurities such as water into each light-emitting device from the above.

The protective layer 91 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 91.

A stack of an inorganic insulating film and an organic insulating film can be used as the protective layer 91. For example, a structure where an organic insulating film is provided between a pair of inorganic insulating films is preferably employed. Furthermore, an organic insulating film preferably functions as a planarization film. In that case, a top surface of the organic insulating film can be flat, resulting in improved coverage with an inorganic insulating film thereover and an enhanced barrier property. A top surface of the protective layer 91 is flat; thus, in the case where a structure (e.g., a color filter, an electrode of a touch sensor, or a lens array) is provided above the protective layer 91, the influence of an uneven shape due to a structure below the protective layer 91 can be reduced.

FIG. 36A shows the light-emitting device 150 in which the conductor 121, the hole-injection layer 85, the hole-transport layer 86, the light-emitting layer 87, the electron-transport layer 88, the common layer (electron-injection layer) 89, and the conductor 123 are provided in this order from the bottom, and the light-receiving device 160 in which the conductor 121PD, the hole-transport layer 86PD, the light-receiving layer 90, the electron-transport layer 88PD, the common layer 89, and the conductor 123 are provided in this order from the bottom; however, one embodiment of the present invention is not limited to this example. For example, in the light-emitting device 150, a conductor functioning as a pixel electrode, an electron-injection layer, an electron-transport layer, a light-emitting layer, a hole-transport layer, a hole-injection layer, and a conductor functioning as a common electrode may be provided in this order from the bottom; in the light-receiving device 160, a conductor functioning as a pixel electrode, an electron-transport layer, a light-receiving layer, a hole-transport layer, and the conductor functioning as the common electrode may be provided in this order from the bottom. In this case, the hole-injection layer of the light-emitting device 150 can be a common layer, which can be provided between the hole-transport layer and the common electrode of the light-receiving device 160. The electron-injection layer can be provided separately for each light-emitting device 150.

<Pixel Layout>

Here, a pixel layout which is different from that in FIGS. 35A and 35B is described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and PenTile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

Figure 37A:
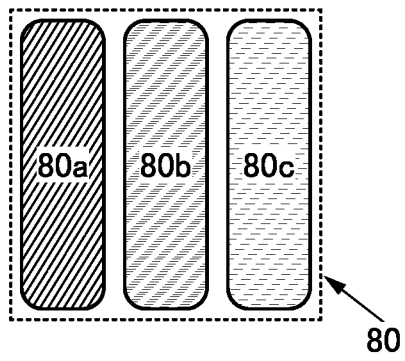
FIGS. 37A to 37G are plan views each illustrating an example of a pixel.
Figure 38A:
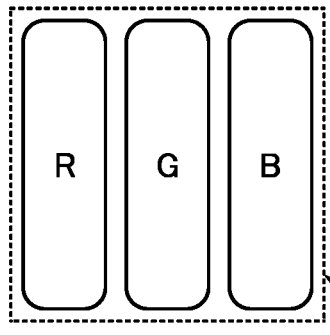
FIGS. 38A to 38F are plan views each illustrating an example of a pixel.

The pixel 80 in FIG. 37A employs stripe arrangement. The pixel 80 in FIG. 37A includes three subpixels: a subpixel 80*a*, a subpixel 80*b*, and a subpixel 80*c*. For example, the subpixel 80*a* may be a red subpixel R, the subpixel 80*b* may be a green subpixel G, and the subpixel 80*c* may be a blue subpixel B, as illustrated in FIG. 38A.

Figure 37B:
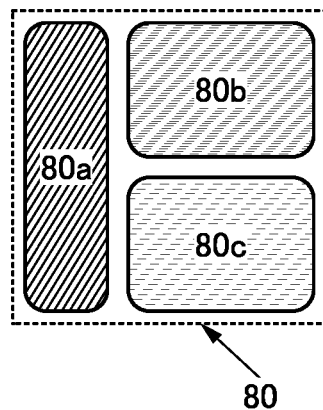
Figure 38B:
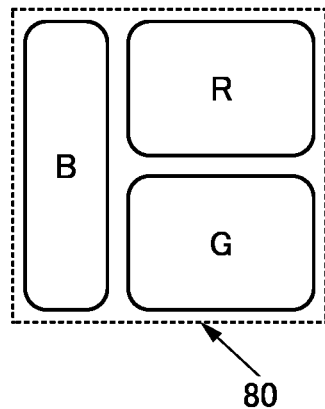

The pixel 80 in FIG. 37B employs S-stripe arrangement. The pixel 80 in FIG. 37B includes three subpixels: the subpixel 80*a*, the subpixel 80*b*, and the subpixel 80*c*. For example, the subpixel 80*a* may be the blue subpixel B, the subpixel 80*b* may be the red subpixel R, and the subpixel 80*c* may be the green subpixel G, as illustrated in FIG. 38B.

Figure 37C:
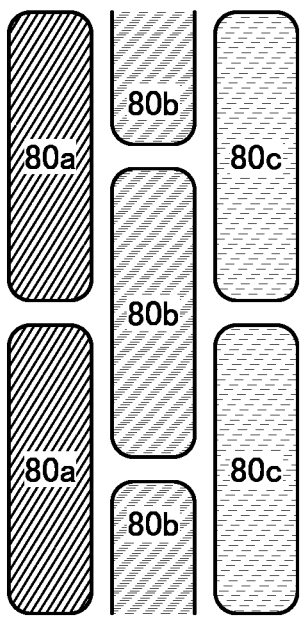
Figure 38C:
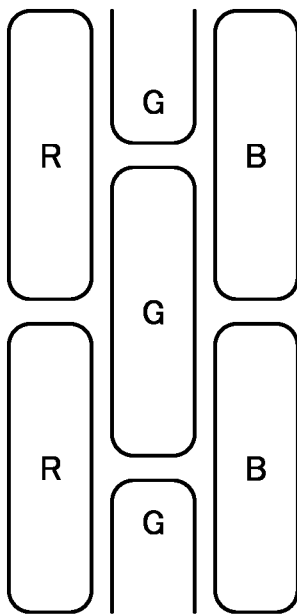

FIG. 37C illustrates an example where subpixels of different colors are arranged in a zigzag manner. Specifically, the positions of the top sides of two subpixels arranged in the column direction (e.g., the subpixel 80*a* and the subpixel 80*b* or the subpixel 80*b* and the subpixel 80*c*) are not aligned in the top view. For example, the subpixel 80*a* may be a red subpixel R, the subpixel 80*b* may be a green subpixel G, and the subpixel 80*c* may be a blue subpixel B, as illustrated in FIG. 38C.

Figure 37D:
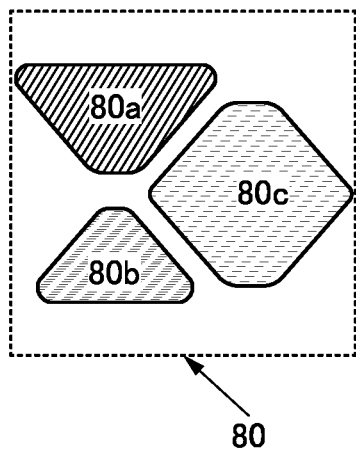
Figure 38D:
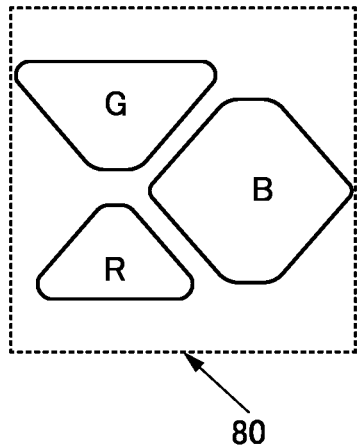

The pixel 80 illustrated in FIG. 37D includes the subpixel 80*a* whose top surface has a rough trapezoidal shape with rounded corners, the subpixel 80*b* whose top surface has a rough triangle shape with rounded corners, and the subpixel 80*c* whose top surface has a rough tetragonal or rough hexagonal shape with rounded corners. The subpixel 80*a* has a larger light-emitting area than the subpixel 80*b*. In this manner, the shapes and sizes of the subpixels can be determined independently. For example, the size of a subpixel including a light-emitting device with higher reliability can be smaller. For example, the subpixel 80*a* may be the green subpixel G, the subpixel 80*b* may be the red subpixel R, and the subpixel 80*c* may be the blue subpixel B, as illustrated in FIG. 38D.

Figure 37E:
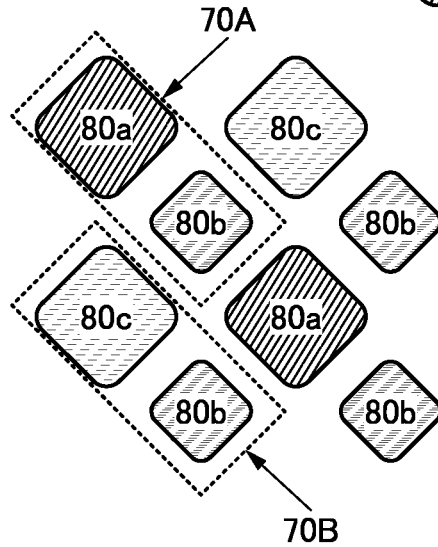
Figure 38E:
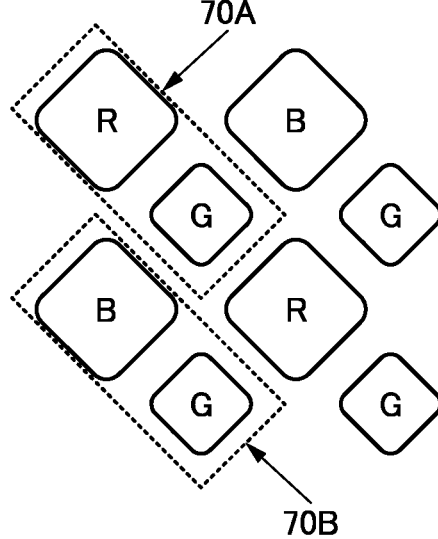

A pixel 70A and a pixel 70B in FIG. 37E employs PenTile arrangement. FIG. 37E illustrates an example in which the pixels 70A each including the subpixel 80*a* and the subpixel 80*b* and the pixels 70B each including the subpixel 80*b* and the subpixel 80*c* are alternately arranged. For example, the subpixel 80*a* may be the red subpixel R, the subpixel 80*b* may be the green subpixel G, and the subpixel 80*c* may be the blue subpixel B, as illustrated in FIG. 38E.

Figure 37F:
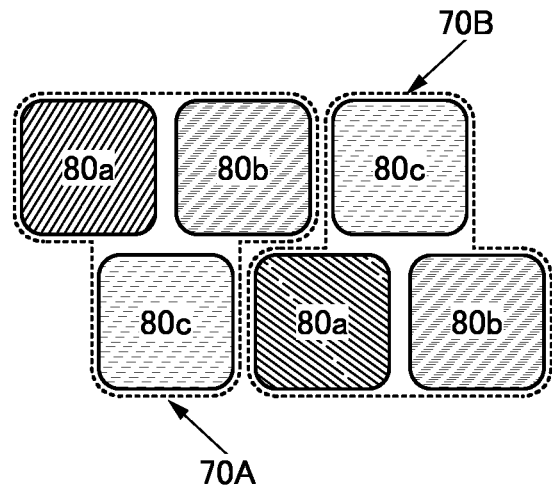
Figure 37G:
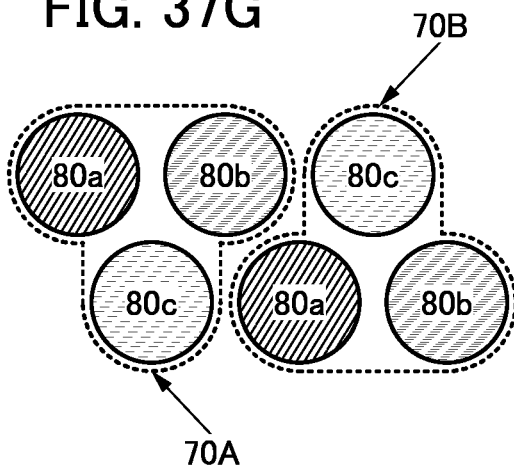
Figure 38F:
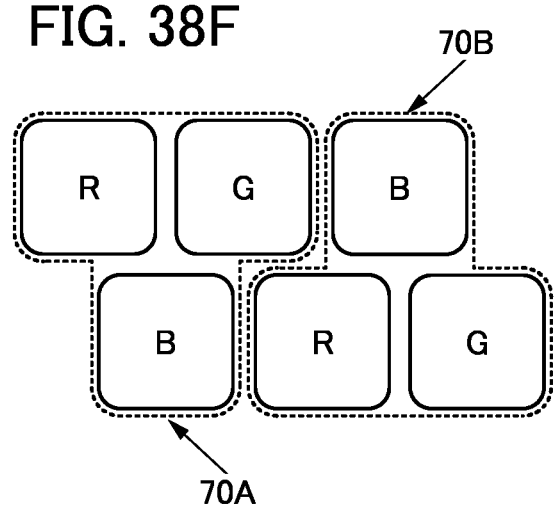

The pixel 70A and the pixel 70B in FIGS. 37F and 37G employ delta arrangement. The pixel 70A includes two subpixels (the subpixels 80*a* and 80*b*) in the upper row (first row) and one subpixel (the subpixel 80*c*) in the lower row (second row). The pixel 70B includes one subpixel (the subpixel 80*c*) in the upper row (first row) and two subpixels (the subpixels 80*a* and 80*b*) in the lower row (second row). For example, the subpixel 80*a* may be the red subpixel R, the subpixel 80*b* may be the green subpixel G, and the subpixel 80*c* may be the blue subpixel B, as illustrated in FIG. 38F.

FIG. 37F shows an example where the top surface of each subpixel has a rough tetragonal shape with rounded corners, and FIG. 37G shows an example where the top surface of each subpixel is circular.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, or a circular shape.

Furthermore, in the method for manufacturing the display apparatus of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, or a circular shape. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

Figure 39A:
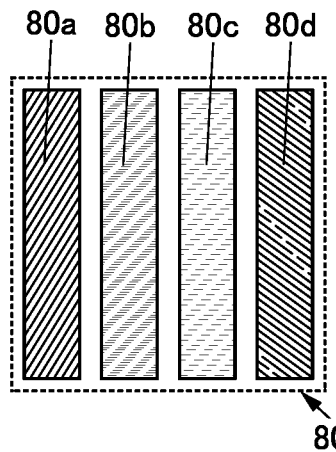
FIGS. 39A to 39H are plan views each illustrating an example of a pixel.
Figure 39B:
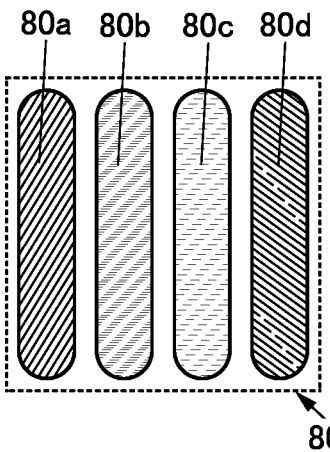
Figure 39C:
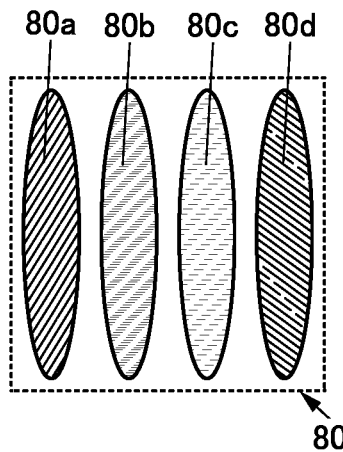

Each of the pixels 80 in FIGS. 39A to 39C employs stripe arrangement.

FIG. 39A illustrates an example in which each subpixel has a rectangular top surface shape, FIG. 39B illustrates an example in which each subpixel has a top surface shape formed by combining two half circles and a rectangle, and FIG. 39C illustrates an example in which each subpixel has an elliptical top surface shape.

Figure 39D:
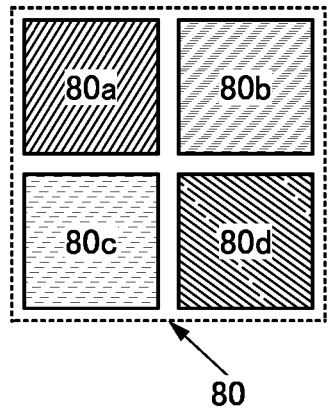
Figure 39E:
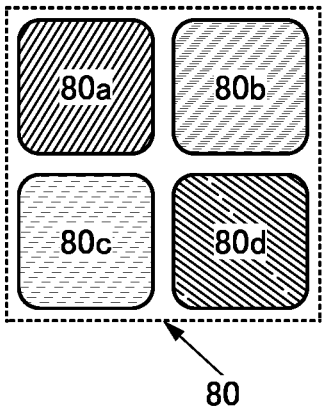
Figure 39F:
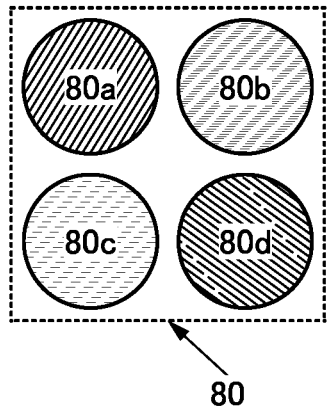

Each of the pixels 80 in FIGS. 39D to 39F employs matrix arrangement.

FIG. 39D illustrates an example in which each subpixel has a square top surface shape, FIG. 39E illustrates an example in which each subpixel has a substantially square top surface shape with rounded corners, and FIG. 39F illustrates an example in which each subpixel has a circular top surface shape.

Each of the pixels 80 in FIGS. 39A to 39F includes four subpixels: the subpixel 80*a*, the subpixel 80*b*, the subpixel 80*c*, and a subpixel 80*d*. The subpixels 80*a*, 80*b*, 80*c*, and 80*d* emit light of different colors. For example, the subpixels 80*a*, 80*b*, 80*c*, and 80*d* can be subpixels for red, green, blue, and white, respectively, as illustrated in FIGS. 40A and 40B. Alternatively, the subpixels 80*a*, 80*b*, 80*c*, and 80*d* can be subpixels for red, green, blue, and infrared light, respectively.

The subpixel 80*d* includes a light-emitting device. The light-emitting device includes, for example, a pixel electrode, an EL layer, and a conductor 121CM functioning as a common electrode. For the pixel electrode, a material similar to that of the conductors 121*a*, 121*b*, 121*c*, 122*a*, 122*b*, and 122*c* may be used. For the EL layer, a material similar to that of the EL layers 141*a*, 141*b*, and 141*c* may be used, for example.

Figure 39G:
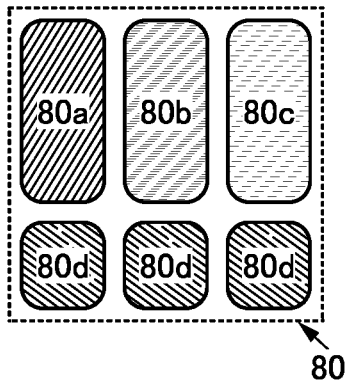

FIG. 39G illustrates an example in which one pixel 80 consists of two rows and three columns. The pixel 80 includes three subpixels (the subpixels 80*a*, 80*b*, and 80*c*) in the upper row (first row) and three subpixels 80*d* in the lower row (second row). In other words, the pixel 80 includes the subpixel 80*a* and the subpixel 80*d* in the left column (first column), the subpixel 80*b* and another subpixel 80*d* in the center column (second column), and the subpixel 80*c* and another subpixel 80*d* in the right column (third column). Matching the positions of the subpixels in the upper row and the lower row as illustrated in FIG. 39G enables dust and the like that would be produced in the manufacturing process to be removed efficiently. Thus, a display apparatus having high display quality can be provided.

Figure 39H:
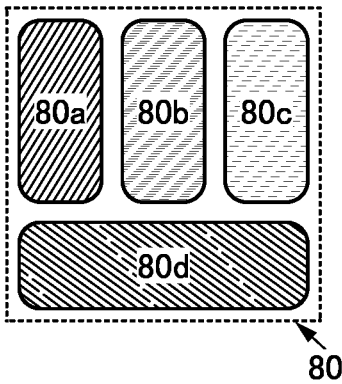

FIG. 39H illustrates an example in which one pixel 80 consists of two rows and three columns. The pixel 80 includes three subpixels (the subpixels 80*a*, 80*b*, and 80*c*) in the upper row (first row) and one subpixel (the subpixel 80*d*) in the lower row (second row). In other words, the pixel 80 includes the subpixel 80*a* in the left column (the first column), the subpixel 80*b* in the center column (the second column), the subpixel 80*c* in the right column (the third column), and the subpixel 80*d* across these three columns.

In the pixel 80 in each of FIGS. 39G and 39H, for example, the subpixel 80*a* can be the red subpixel R, the subpixel 80*b* can be the green subpixel G, the subpixel 80*c* can be the blue subpixel B, and the subpixel 80*d* can be a white subpixel W, as illustrated in FIGS. 40C and 40D.

The display apparatus of one embodiment of the present invention may include a light-receiving device in the pixel.

Three of the four subpixels included in the pixel 80 in FIG. 39G may include a light-emitting device and the other one may include a light-receiving device.

As the light-receiving device, a PN photodiode or a PIN photodiode can be used, for example. The light-receiving device functions as a photoelectric conversion device (also referred to as a photoelectric conversion element) that senses light entering the light-receiving device and generates electric charge. The amount of electric charge generated from the light-receiving device depends on the amount of light incident on the light-receiving device.

It is particularly preferable to use an organic photodiode including a layer containing an organic compound as the light-receiving device. An organic photodiode, which is easily made thin, lightweight, and large in area, for example, and has a high degree of freedom for shape and design, can be used in a variety of display apparatuses.

In one embodiment of the present invention, organic EL devices are used as the light-emitting devices, and organic photodiodes are used as the light-receiving devices. The organic EL device and the organic photodiode can be formed over one substrate. Thus, the organic photodiode can be incorporated into the display apparatus including the organic EL device.

The light-receiving device includes an active layer functioning as a photoelectric conversion layer between a pair of electrodes. In this specification and the like, one of the pair of electrodes is referred to as a pixel electrode and the other is referred to as a common electrode in some cases.

For example, the subpixels 80*a*, 80*b*, and 80*c* may be subpixels for three colors of R, G, and B, and the subpixel 80*d* may include a light-receiving device. In that case, the subpixel 80*d* includes at least an active layer.

One of the pair of electrodes of the light-receiving device functions as an anode, and the other electrode functions as a cathode. The case where the pixel electrode functions as an anode and the common electrode functions as a cathode is described below as an example. The light-receiving device is driven by application of reverse bias between the pixel electrode and the common electrode, whereby light incident on the light-receiving device can be sensed and electric charge can be generated and extracted as current. Alternatively, the pixel electrode may function as a cathode and the common electrode may function as an anode.

To the light-receiving device, a manufacturing method similar to that of the light-emitting device can be applied. An island-shaped active layer (also referred to as a photoelectric conversion layer) included in the light-receiving device is formed not by patterning with use of a metal mask but by depositing a film to be an active layer over an entire surface and processing it, whereby the island-shaped active layer can have a uniform thickness. Moreover, providing the sacrificial layer over the active layer can reduce damage to the active layer in the manufacturing process of the display apparatus, resulting in an improvement in reliability of the light-receiving device.

Here, a layer shared by the light-receiving device and the light-emitting device may have a different function. In this specification, the name of a component is sometimes based on its function in the light-emitting device. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device may have the same function in both the light-receiving device and the light-emitting device. The hole-transport layer functions as a hole-transport layer in both of the light-emitting device and the light-receiving device, and the electron-transport layer functions as an electron-transport layer in both of the light-emitting device and the light-receiving device.

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When Tc-electron conjugation (resonance) spreads in a plane as in benzene, the electron-donating property (donor property) usually increases. Although Tc-electron conjugation widely spreads in fullerene having a spherical shape, its electron-accepting property is high. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger T-electron conjugation system and a wider absorption band in the long wavelength region than $C_{60}$. Other examples of fullerene derivatives include [6,6]-phenyl-$C_{71}$-butyric acid methyl ester (abbreviation: PC$_{70}$BM), [6,6]-phenyl-$C_{61}$-butyric acid methyl ester (abbreviation: PC$_{60}$BM), and 1',1",4',4"-tetrahydro-di[1,4]methanonaphthaleno[1,2:2',3',56,60:2", 3"][5,6]fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing a substance with a high hole-transport property, a substance with a high electron-transport property, or a substance with a bipolar property (a substance with a high electron- and hole-transport property). The layer included in the light-receiving device is not limited to the above, and a layer containing a substance with a high hole-injection property, a hole-blocking material, a material with a high electron-injection property, or an electron-blocking material may be further included.

Either a low molecular compound or a high molecular compound can be used in the light-receiving device, and an inorganic compound may also be included. Each layer included in the light-receiving device can be formed by any of the following methods: an evaporation method (including a vacuum evaporation method), a transfer method, a printing method, an inkjet method, and a coating method.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]]polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. The third material may be a low molecular compound or a high molecular compound.

The display apparatus can detect the touch or approach of an object while displaying an image because the pixel included in the display apparatus includes the light-emitting device and the light-receiving device and thus has a light-receiving function. For example, not only a structure in which all the subpixels included in the display apparatus display an image, but also a structure in which some subpixels emit light as a light source and the other subpixels display an image can be employed.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by sensing light with the display portion, an image can be captured or the approach or contact of an object (e.g., a finger, a hand, or a pen) can be sensed. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can sense the reflected light (or the scattered light); thus, image capturing or touch sensing is possible even in a dark place.

When the light-receiving device is used as an image sensor, the display apparatus can capture an image with use of the light-receiving device. For example, the display apparatus of this embodiment can be used as a scanner.

For example, data on biological information, such as a fingerprint or a palm print, can be acquired with the image sensor. That is, a biological authentication sensor can be incorporated in the display apparatus. When the display apparatus incorporates a biological authentication sensor, the number of components of an electronic device can be reduced as compared to the case where a biological authentication sensor is provided separately from the display apparatus; thus, the size and weight of the electronic device can be reduced.

When the light-receiving device is used as the touch sensor, the display apparatus can sense the approach or contact of an object with use of the light-receiving device.

Each of the pixels in FIGS. 41A to 41D includes the subpixel G, the subpixel B, the subpixel R, and the subpixel PS.

Figure 41A:
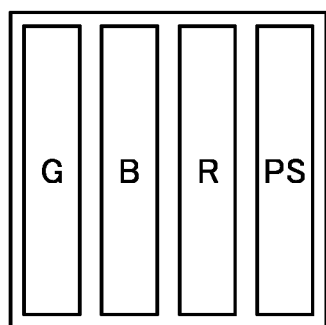
FIGS. 41A to 41D are plan views each illustrating an example of a pixel.
Figure 41B:
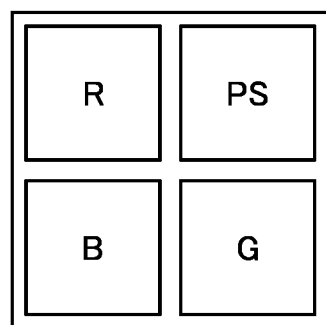

The pixel illustrated in FIG. 41A employs stripe arrangement. The pixel illustrated in FIG. 41B employs matrix arrangement.

Figure 41C:
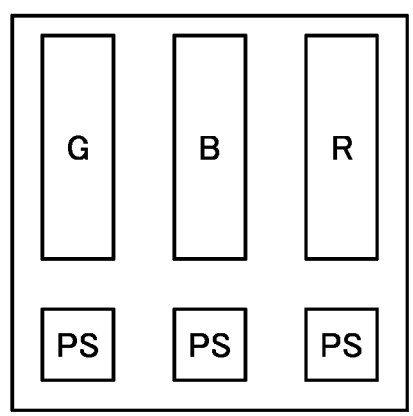
Figure 41D:
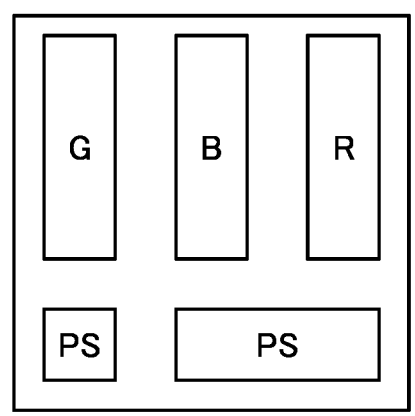

FIGS. 41C and 41D illustrate examples in which one pixel is provided in two rows and three columns. Three subpixels (the subpixel G, the subpixel B, and the subpixel R) are provided in the upper row (first row). In FIG. 41C, three subpixels PS are provided in the lower row (second row). In FIG. 41D, two subpixels PS are provided in the lower row (second row). Matching the positions of the subpixels in the upper row and the lower row as illustrated in FIG. 41C enables dust and the like that would be produced in the manufacturing process to be removed efficiently. Thus, a display apparatus having high display quality can be provided. Note that the layout of the subpixels is not limited to the layouts illustrated in FIGS. 41A to 41D.

Each of the subpixels R, G, and B includes a light-emitting device that emits white light. In each of the subpixels R, G, and B, the corresponding coloring layer is provided to overlap with the light-emitting device.

The subpixel PS includes a light-receiving device. The wavelength of light detected by the subpixel PS is not particularly limited.

The light-receiving device included in the subpixel PS preferably detects visible light, and preferably detects at least one of blue, violet, bluish violet, green, greenish yellow, yellow, orange, and red. The light-receiving device included in the subpixel PS may detect infrared light.

Figure 41E:
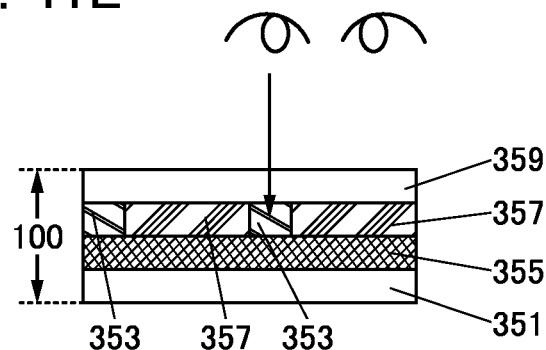
FIG. 41E is a cross-sectional view illustrating an example of a display apparatus.

The display apparatus 1000 illustrated in FIG. 41E includes, between a substrate 351 and a substrate 359, a layer 353 including a light-receiving device, a functional layer 355, and a layer 357 including a light-emitting device.

The functional layer 355 includes a circuit for driving a light-receiving device and a circuit for driving a light-emitting device. One or more selected from a switch, a transistor, a capacitor, a resistor, a wiring, and a terminal can be provided in the functional layer 355. Note that in the case where the light-emitting device and the light-receiving device are driven by a passive-matrix method, a structure not provided with a switch and a transistor may be employed.

For example, as illustrated in FIG. 41E, when light emitted by the light-emitting device included in the layer 357 is reflected by a human eye and its surroundings, the light-receiving device included in the layer 353 detects the reflected light. Accordingly, information of the surroundings, surface, or inside of the human eye (e.g., the number of blinks, the movement of an eyeball, and the movement of an eyelid) can be detected.

Note that the insulators, the conductors, and the semiconductors disclosed in this specification and the like can be formed by a physical vapor deposition (PVD) method or a CVD method. Examples of a PVD method include a sputtering method, a resistance heating evaporation method, an electron beam evaporation method, and a PLD method. Examples of a CVD method include a plasma CVD method and a thermal CVD method. Examples of a thermal CVD method include a metal organic chemical vapor deposition (MOCVD) method and an ALD method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and the source gas and the oxidizer react with each other in the vicinity of a substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching of corresponding switching valves (also referred to as high-speed valves) such that the source gases are not mixed. For example, a first source gas is introduced, an inert gas (e.g., argon or nitrogen) or the like is introduced at the same time as or after the introduction of the first source gas, and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on a surface of a substrate to form a first thin layer, and then the second source gas is introduced to react with the first thin layer; thus, a second thin layer is stacked over the first thin layer, and a thin film is formed as a result. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to adjust a thickness accurately and thus is suitable for manufacturing a minute FET.

A variety of films such as the metal film, the semiconductor film, and the inorganic insulating film described in this embodiment and the foregoing embodiments can be formed by a thermal CVD method such as an MOCVD method or an ALD method. For example, to form an In—Ga—Zn—O film, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, when a hafnium oxide film is formed by a deposition apparatus using an ALD method, two kinds of gases, i.e., ozone (O$_3$) as an oxidizer and a source gas obtained by vaporization of a liquid containing a solvent and a hafnium precursor compound (hafnium alkoxide or hafnium amide such as tetrakis(dimethylamide)hafnium (TDMAH, Hf[N(CH$_3$)$_2$]$_4$)) are used. Alternatively, tetrakis(ethylmethylamide)hafnium may be used, for instance.

For example, when an aluminum oxide film is formed by a deposition apparatus using ALD, two kinds of gases, i.e., H$_2$O as an oxidizer and a source gas obtained by vaporization of a liquid containing a solvent and an aluminum precursor compound (e.g., trimethylaluminum (e.g., TMA or Al(CH$_3$)$_3$)) are used. Alternatively, tris(dimethylamide)aluminum, triisobutylaluminum, aluminum tris(2,2,6,6-tetramethyl-3,5-heptanedionate), or the like may be used.

For example, when a silicon oxide film is formed by a deposition apparatus using an ALD method, hexachlorodisilane is adsorbed on a surface where the film is to be formed, and radicals of an oxidizing gas (e.g., O$_2$ or dinitrogen monoxide) are supplied to react with the adsorbate.

For example, when a tungsten film is formed by a deposition apparatus using an ALD method, a WF$_6$ gas and a B$_2$H$_6$ gas are sequentially introduced to form an initial tungsten film, and then a WF$_6$ gas and an H$_2$ gas are sequentially introduced to form a tungsten film. Note that a SiH$_4$ gas may be used instead of a B$_2$H$_6$ gas.

In the case where an In—Ga—Zn—O film is formed as an oxide semiconductor film with a deposition apparatus using an ALD method, a precursor (sometimes called a metal precursor) and an oxidizer (sometimes called a reactant or a non-metal precursor) are sequentially and repetitively introduced. Specifically, for example, an In(CH$_3$)$_3$ gas as a precursor and as an O$_3$ gas) as an oxidizer are introduced to form an In—O layer; a Ga(CH$_3$)$_3$ gas as a precursor and an O$_3$ gas) as an oxidizer are introduced to form a GaO layer; and then, a Zn(CH$_3$)$_2$ gas as a precursor and an O$_3$ gas) as an oxidizer are introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an H$_2$O gas that is obtained by bubbling water with an inert gas (e.g., Ar) may be used instead of an O$_3$ gas), it is preferable to use an O$_3$ gas), which does not contain H. An In(C$_2$H$_5$)$_3$ gas may be used instead of an In(CH$_3$)$_3$ gas. A Ga(C$_2$H$_5$)$_3$ gas may be used instead of a Ga(CH$_3$)$_3$ gas. Moreover, a Zn(CH$_3$)$_2$ gas may be used.

The display portion of the display apparatus of one embodiment of the present invention can have a freely selected screen ratio (aspect ratio). For example, the display portion is compliant with any of various screen ratios such as 1:1 (square), 4:3, 16:9, and 16:10.

The shape of the display portion of the display apparatus of one embodiment of the present invention is not particularly limited. The display portion can have any of various shapes such as a rectangular shape, a polygonal shape (e.g., octagon), a circular shape, and an elliptical shape.

Note that this embodiment can be combined with any of the other embodiments in this specification as appropriate.

Embodiment 5

This embodiment will describe a display module that can be used in the electronic device of one embodiment of the present invention.

Structure Example of Display Module

First, a display module including the display apparatus that can be used in an electronic device of one embodiment of the present invention is described.

Figure 42A:
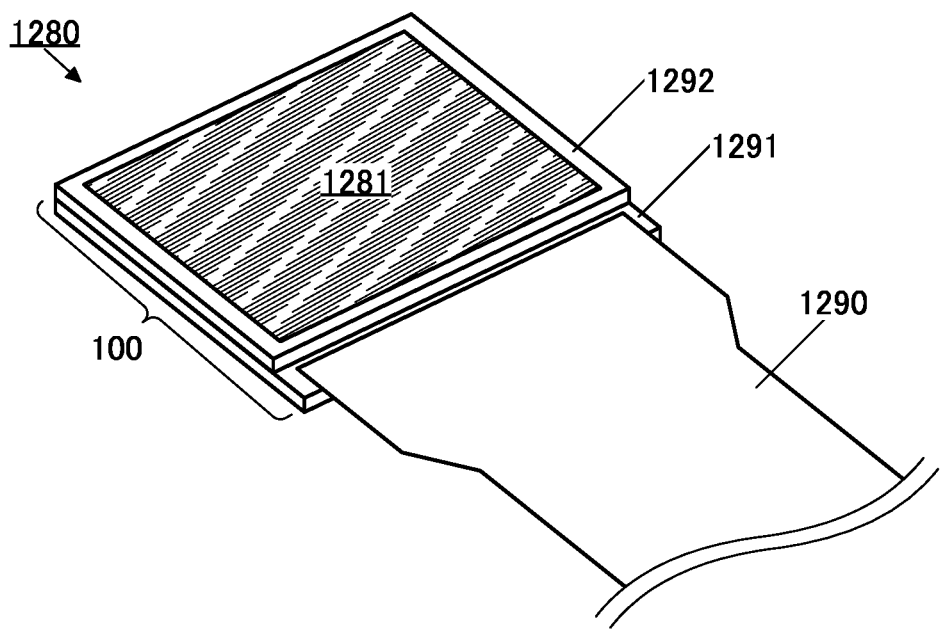
FIGS. 42A and 42B illustrate a structure example of a display module.

FIG. 42A is a perspective view of a display module 1280. The display module 1280 includes the display apparatus 1000 and an FPC 1290.

The display module 1280 includes a substrate 1291 and a substrate 1292. The display module 1280 includes a display portion 1281. The display portion 1281 is a region of the display module 1280 where an image is displayed and is a region where light emitted from pixels provided in a pixel portion 1284 described later can be seen.

Figure 42B:
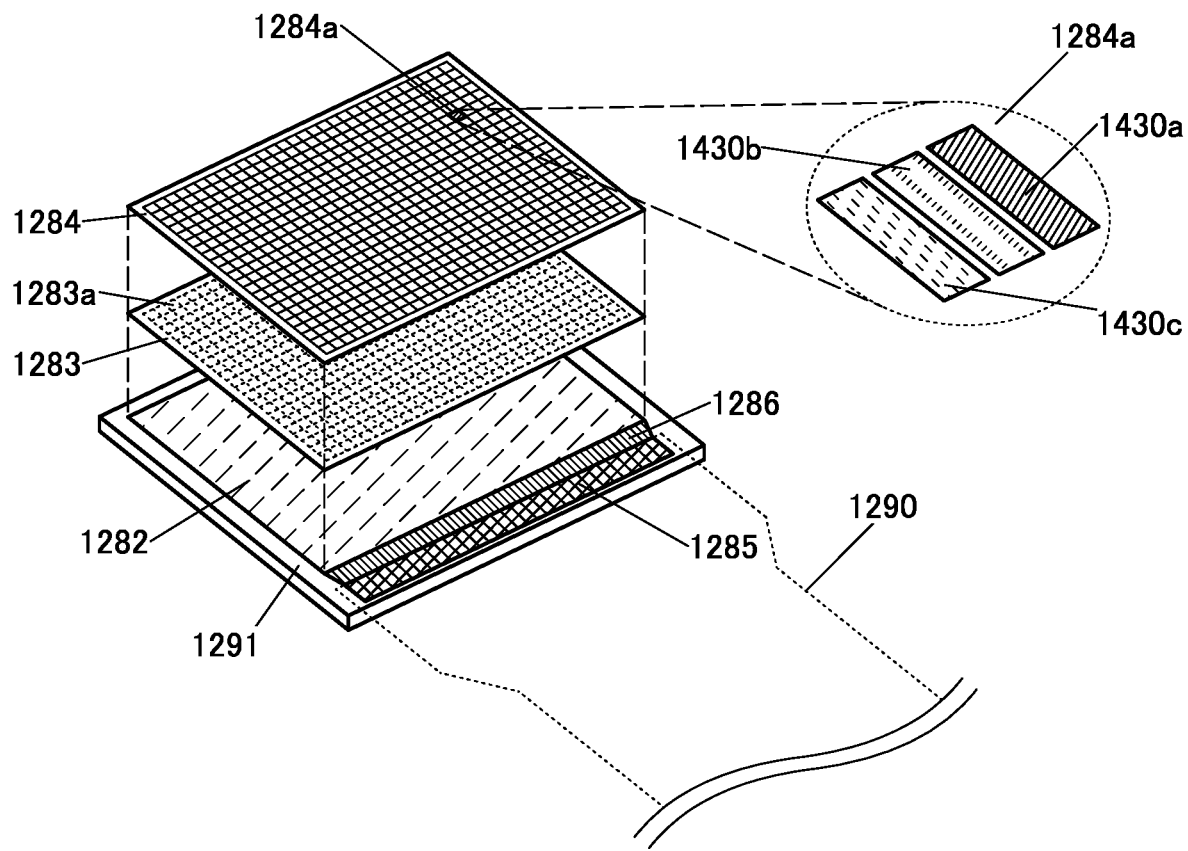

FIG. 42B is a perspective view schematically illustrating a structure on the substrate 1291 side. Over the substrate 1291, a circuit portion 1282, a pixel circuit portion 1283 over the circuit portion 1282, and the pixel portion 1284 over the pixel circuit portion 1283 are stacked. In addition, a terminal portion 1285 for connection to the FPC 1290 is included in a portion not overlapping with the pixel portion 1284 over the substrate 1291. The terminal portion 1285 and the circuit portion 1282 are electrically connected to each other through a wiring portion 1286 formed of a plurality of wirings.

Note that the pixel portion 1284 and the pixel circuit portion 1283 correspond to the pixel layer PXAL described above, for example. The circuit portion 1282 corresponds to the circuit layer SICL described above, for example.

The pixel portion 1284 includes a plurality of pixels 1284*a* arranged periodically. An enlarged view of one pixel 1284*a* is shown on the right side in FIG. 42B. The pixel 1284*a* includes a light-emitting device 1430*a*, a light-emitting device 1430*b*, and a light-emitting device 1430*c* which are different in the emission color. Note that the light-emitting devices 1430*a*, 1430*b*, and 1430*c* correspond to the above-described light-emitting devices 150*a*, 150*b*, and 150*c*. The above-described light emitting devices may be arranged in a stripe pattern as shown in FIG. 42B. Alternatively, a variety of kinds of patterns such as a delta pattern or a PenTile pattern can be employed.

The pixel circuit portion 1283 includes a plurality of pixel circuits 1283*a* arranged periodically.

One pixel circuit 1283*a* is a circuit that controls light emission from three light-emitting devices included in one pixel 1284*a*. One pixel circuit 1283*a* may be provided with three circuits each of which controls light emission of one light-emitting device. For example, the pixel circuit 1283*a* can include at least one selection transistor, one current control transistor (driving transistor), and a capacitor for one light-emitting device. A gate signal is input to a gate of the selection transistor, and a source signal is input to one of a source and a drain of the selection transistor. With such a structure, an active-matrix display apparatus is achieved.

The circuit portion 1282 includes a circuit for driving the pixel circuits 1283*a* in the pixel circuit portion 1283. For example, one or both of a gate line driver circuit and a source line driver circuit are preferably included. In addition, at least one of an arithmetic circuit, a memory circuit, a power supply circuit, and the like may be included.

The FPC 1290 serves as a wiring for supplying an image signal, a power supply potential, or the like to the circuit portion 1282 from the outside. An IC may be mounted on the FPC 1290.

The display module 1280 can have a structure in which one or both of the pixel circuit portion 1283 and the circuit portion 1282 are stacked below the pixel portion 1284; thus, the aperture ratio (the effective display area ratio) of the display portion 1281 can be significantly high. For example, the aperture ratio of the display portion 1281 can be higher than or equal to 40% and lower than 100%, preferably higher than or equal to 50% and lower than or equal to 95%, and further preferably higher than or equal to 60% and lower than or equal to 95%. Furthermore, the pixels 1284*a* can be arranged extremely densely and thus the display portion 1281 can have greatly high resolution. For example, the pixels 1284*a* are preferably arranged in the display portion 1281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 1280 has extremely high resolution, and thus can be suitably used for a device for VR such as a head-mounted display or a glasses-type device for AR. For example, even in the case of a structure in which the display portion of the display module 1280 is seen through a lens, pixels of the extremely-high-resolution display portion 1281 included in the display module 1280 are prevented from being seen when the display portion is enlarged by the lens, so that display providing a high sense of immersion can be performed. Without being limited thereto, the display module 1280 can be suitably used for electronic devices including a relatively small display portion. For example, the display module 1280 can be favorably used in a display portion of an electronic device to be worn on a human body, such as a wrist-watch type electronic device.

Note that this embodiment can be combined with any of the other embodiments in this specification as appropriate.

Embodiment 6

In this embodiment, an example of a head-mounted display including a display apparatus will be described as an example of an electronic device of one embodiment of the present invention.

Figure 43A:
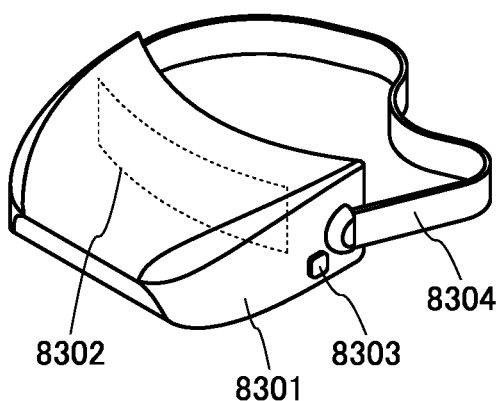
FIGS. 43A to 43F illustrate structure examples of an electronic device.
Figure 43B:
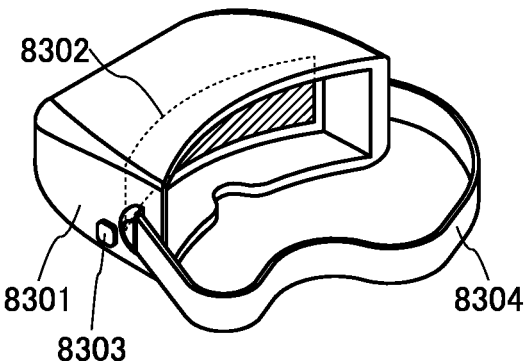

FIGS. 43A and 43B are external views of an electronic device 8300, which is a head-mounted display.

The electronic device 8300 includes a housing 8301, a display portion 8302, an operation button 8303, and a band-like fixing member 8304.

The operation button 8303 functions as a power button or the like. The electronic device 8300 may include another button in addition to the operation button 8303.

Figure 43C:
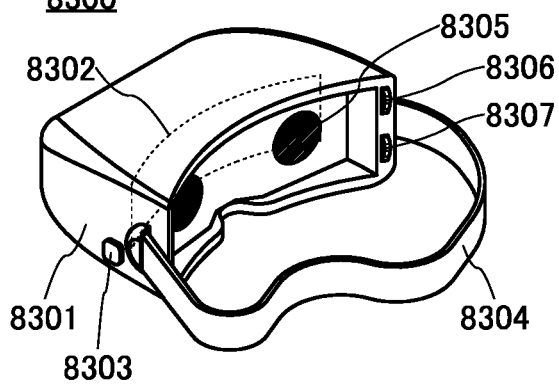

As shown in FIG. 43C, lenses 8305 may be provided between the display portions 8302 and the user's eyes. The user can see magnified images on the display portions 8302 through the lenses 8305, thereby having a more realistic sensation. In this case, as shown in FIG. 43C, a dial 8306 for changing the position of the lenses and adjusting visibility may be provided.

As the display portion 8302, a display apparatus with extremely high resolution is preferably used, for example. With use of a display apparatus with extremely high resolution for the display portion 8302, even when the display portion 8302 is enlarged by the lens 8305 as illustrated in FIG. 43C, a more realistic image can be displayed without user's visual recognition of pixels.

FIGS. 43A to 43C show examples in which the head-mounted display includes one display portion 8302. Such a structure can reduce the number of components.

The display portion 8302 can display an image for the right eye and an image for the left eye side by side on a right region and a left region, respectively. Thus, a three-dimensional image using binocular disparity can be displayed.

One image which can be seen with both eyes may be displayed on the entire display portion 8302. Thus, a panorama image can be displayed from end to end of the field of view, which can provide a higher sense of reality.

Here, the electronic device 8300 preferably has a mechanism for optimizing the curvature of the display portion 8302 in accordance with the size of the user's head, the position of the user's eyes, or the like. For example, the user himself/herself may adjust the curvature of the display portion 8302 by operating a dial 8307 for adjusting the curvature of the display portion 8302. Alternatively, the electronic device 8300 may include a sensor for detecting the size of the user's head, the position of the user's eyes, or the like (e.g., a camera, a contact sensor, and a noncontact sensor) on the housing 8301 and have a mechanism for adjusting the curvature of the display portion 8302 on the basis of data detected by the sensor.

In the case where the lenses 8305 are used, the electronic device 8300 preferably has a mechanism for adjusting the position and angle of the lenses 8305 in synchronization with the curvature of the display portion 8302. Alternatively, the dial 8306 may have a function of adjusting the angle of the lenses.

Figure 43D:
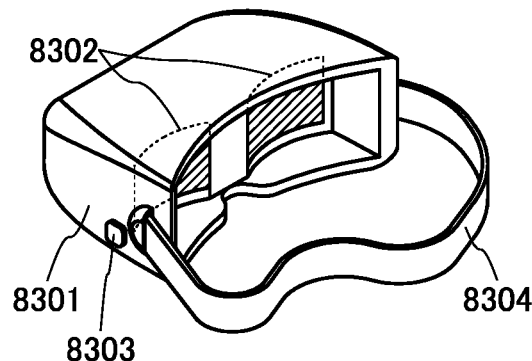
Figure 43E:
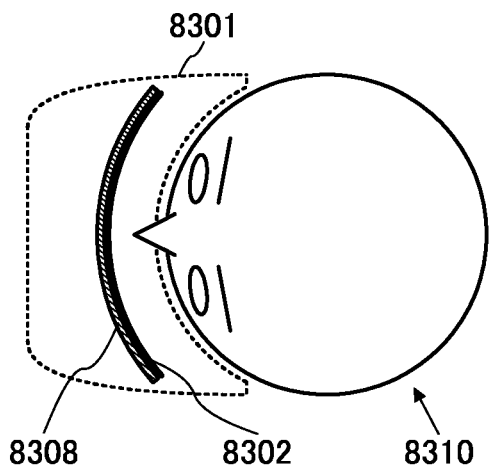
Figure 43F:
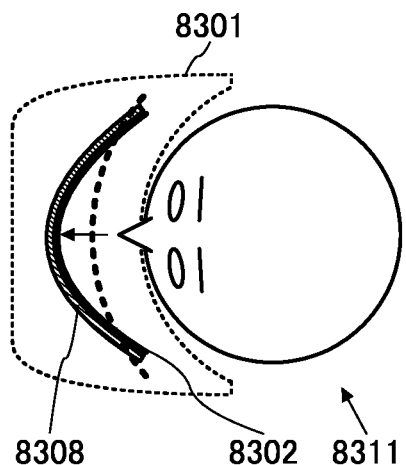

FIGS. 43E and 43F show an example of including a driver portion 8308 that controls the curvature of the display portion 8302. The driver portion 8308 is fixed to at least a part of the display portion 8302. The driver portion 8308 has a function of changing the shape of the display portion 8302 when the part of the driver portion 8308 that is fixed to the display portion 8302 changes in shape or moves.

FIG. 43E is a schematic view showing the case where a user 8310 having a relatively large head wears the housing 8301. In that case, the driver portion 8308 adjusts the shape of the display portion 8302 so that the curvature is relatively small (the radius of curvature is large).

By contrast, FIG. 43F shows the case where a user 8311 having a smaller head than the user 8310 wears the housing 8301. The user 8311 has a shorter distance between the eyes than the user 8310. In that case, the driver portion 8308 adjusts the shape of the display portion 8302 so that the curvature is large (the radius of curvature is small). In FIG. 43F, the position and shape of the display portion 8302 in FIG. 43E are denoted by a dashed line.

When the electronic device 8300 has such a mechanism for adjusting the curvature of the display portion 8302, optimal display can be offered to a variety of users of all ages and genders.

When the curvature of the display portion 8302 is changed in accordance with contents displayed on the display portion 8302, the user can feel high realistic sensation. For example, shaking can be expressed by vibrating the curvature of the display portion 8302. In this way, it is possible to produce various effects according to the scene in contents, and provide the user with new experiences. Further realistic display can be provided in conjunction with a vibration module provided in the housing 8301.

Note that the electronic device 8300 may include two display portions 8302 as shown in FIG. 43D.

When the two display portions 8302 are provided, the user's eyes can see the respective display portions. This allows a high-resolution image to be displayed even when three-dimensional display using parallax is performed. In addition, the display portion 8302 is curved around an arc with an approximate center at the user's eye. This keeps a certain distance between the user's eye and the display surface of the display portion, enabling the user to see a more natural image. Furthermore, the user's eye is positioned in the normal direction of the display surface of the display portion; therefore, even when the luminance or chromaticity of light from the display portion is changed with the viewing angle, the influence of the change can be substantially ignorable and thus a more realistic image can be displayed.

Figure 44A:
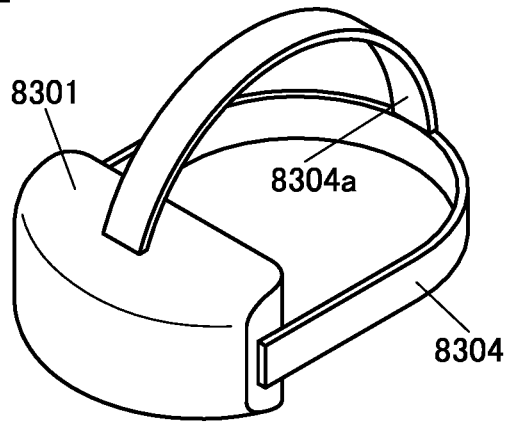
FIGS. 44A to 44D illustrate structure examples of electronic devices.
Figure 44B:
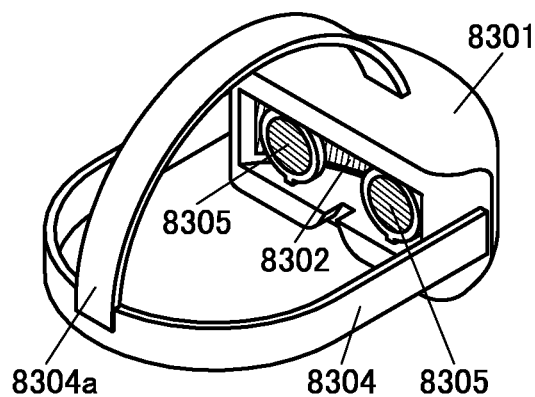
Figure 44C:
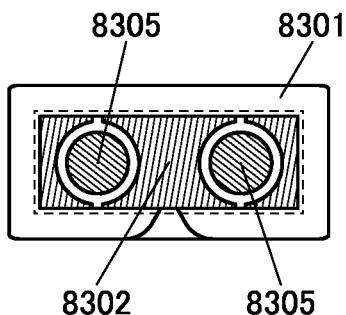

FIGS. 44A to 44C are external views of another electronic device 8300, which is different from the electronic devices 8300 in FIGS. 43A to 43D. Specifically, the electronic device 8300 in FIGS. 44A to 44C is different from those in FIGS. 43A to 43D in including a fixture means 8304a worn on a head and a pair of lenses 8305, for example.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax can be performed. Note that the number of the display portions 8302 is not limited to one; two display portions 8302 may be provided for user's respective eyes.

As the display portion 8302, a display apparatus with extremely high resolution is preferably used, for example.

With use of a display apparatus with extremely high resolution for the display portion 8302, even when the display portion 8302 is enlarged by the lens 8305 as illustrated in FIG. 44C, a more realistic image can be displayed without user's visual recognition of pixels.

Figure 44D:
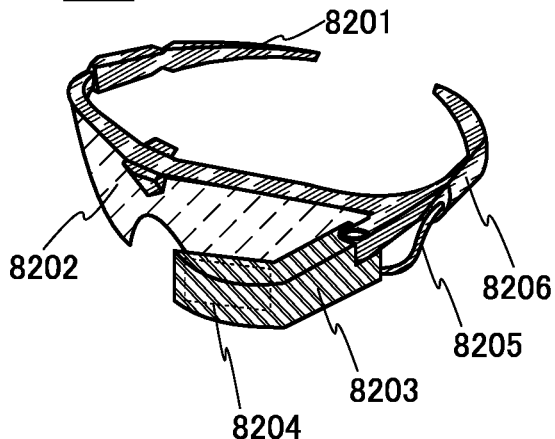

The head-mounted display, which is an electronic device of one embodiment of the present invention, may be an electronic device 8200 in FIG. 44D, which is a glasses-type head-mounted display.

The electronic device 8200 includes a mounting portion 8201, a lens 8202, a main body 8203, a display portion 8204, and a cable 8205. The mounting portion 8201 includes a battery 8206.

Power is supplied from the battery 8206 to the main body 8203 through the cable 8205. The main body 8203 includes a wireless receiver to receive image data and display it on the display portion 8204. The main body 8203 includes a camera, and data on the movement of the eyeballs or the eyelids of the user can be used as an input means.

The mounting portion 8201 may include a plurality of electrodes capable of sensing the current flowing accompanying with the movement of the user's eyeball at a position in contact with the user to recognize the user's sight line. The mounting portion 8201 may also have a function of monitoring the user's pulse with use of the current flowing in the electrodes. The mounting portion 8201 may include a sensor, such as a temperature sensor, a pressure sensor, or an acceleration sensor; thus, the electronic device 8200 may have a function of displaying the user's biological information on the display portion 8204. For example, the electronic device 8200 may have a function of changing images displayed on the display portion 8204 in accordance with the movement of the user's head.

Figure 45A:
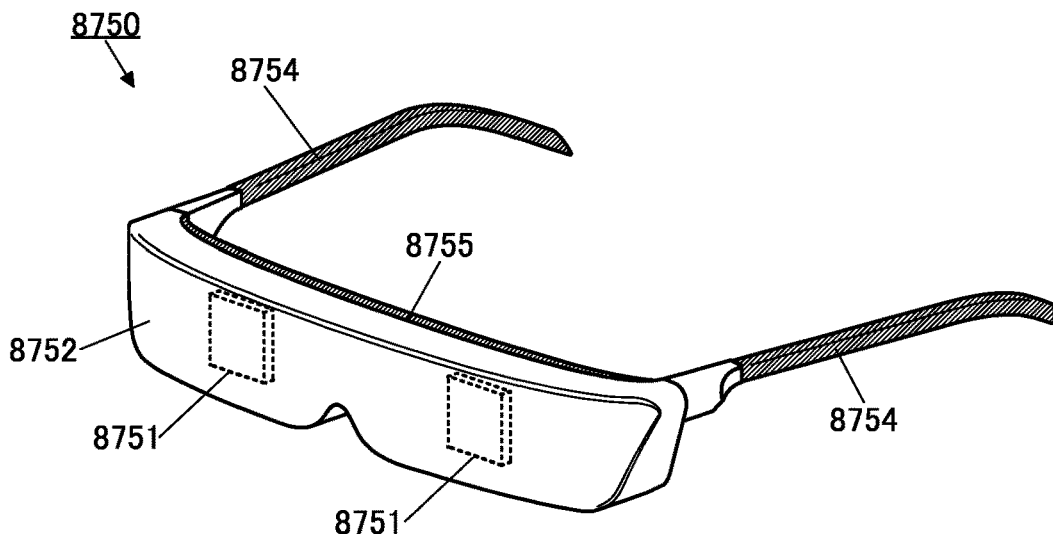
FIGS. 45A to 45C illustrate structure examples of an electronic device.
Figure 45B:
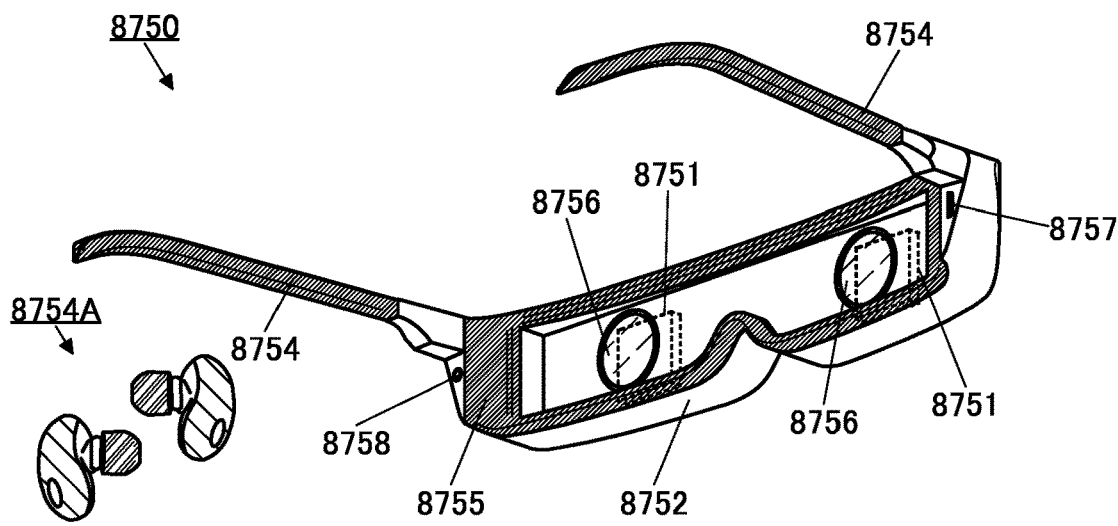
Figure 45C:
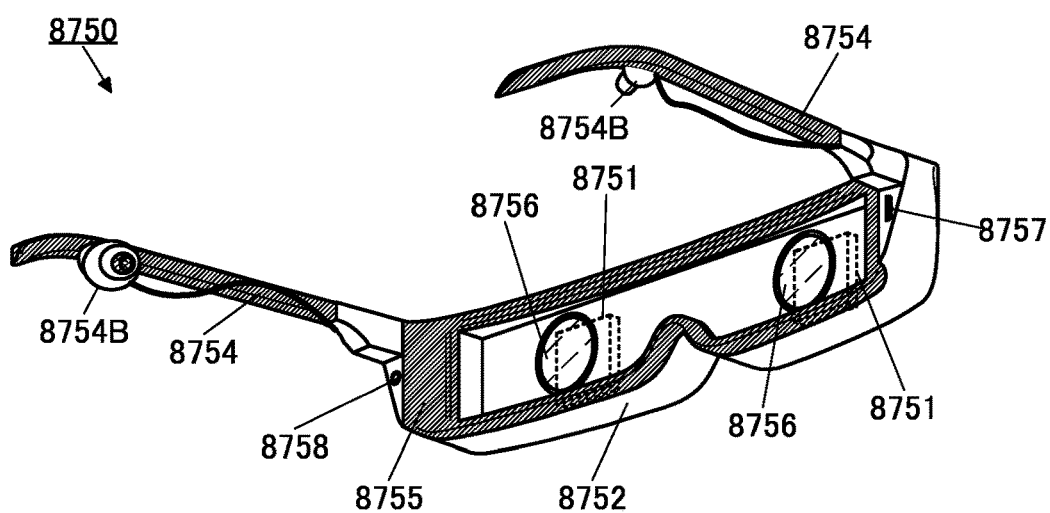

FIGS. 45A to 45C each illustrate an external view of an electronic device 8750, which is different from the electronic devices 8300 illustrated in FIGS. 43A to 43D and FIGS. 44A to 44C and the electronic device 8200 illustrated in FIG. 44D.

FIG. 45A is a perspective view illustrating the front surface, the top surface, and the left side surface of the electronic device 8750, and FIGS. 45B and 45C are perspective views each illustrating the back surface, the bottom surface, and the right side surface of the electronic device 8750.

The electronic device 8750 includes a pair of display apparatuses 8751, a housing 8752, a pair of temples 8754, a cushion 8755, a pair of lenses 8756, and the like. The pair of display apparatuses 8751 is positioned to be seen through the lenses 8756 inside the housing 8752.

Here, one of the pair of display apparatuses 8751 corresponds to the display apparatus DSP in FIG. 19 and the like. Although not illustrated, the electronic device 8750 in FIGS. 45A to 45C includes an electronic component (e.g., a circuit included in the functional circuit region MFNC or the driver circuit region DRV in FIG. 19). Although not illustrated, the electronic device 8750 in FIGS. 45A to 45C includes a camera (e.g., the sensor PDA in FIG. 19). The camera can take an image of the user's eye and its vicinity. Although not illustrated, in the housing 8752 of the electronic device 8750 in FIGS. 45A to 45C, a motion detection portion, an audio, a control portion, a communication portion, and a battery are provided.

The electronic device 8750 is an electronic device for VR. A user wearing the electronic device 8750 can see an image displayed on the display apparatus 8751 through the lens 8756. Furthermore, when the pair of display apparatuses

8751 displays different images, three-dimensional display using parallax can be performed.

An input terminal 8757 and an output terminal 8758 are provided on the back surface side of the housing 8752. A cable for supplying an image signal from a video output device or power for charging a battery provided in the housing 8752 can be connected to the input terminal 8757. The output terminal 8758 can function as, for example, an audio output terminal to which earphones or headphones can be connected.

The housing 8752 preferably includes a mechanism by which the left and right positions of the lens 8756 and the display apparatus 8751 can be adjusted to the optimal positions in accordance with the position of the user's eye. In addition, the housing 8752 preferably includes a mechanism for adjusting focus by changing the distance between the lens 8756 and the display apparatus 8751.

With use of the camera, the display apparatus 8751, and the above electronic component, the electronic device 8750 can estimate the state of a user of the electronic device 8750 and can display information on the estimated user's state on the display apparatus 8751. Alternatively, information on a user of an electronic device connected to the electronic device 8750 through a network can be displayed on the display apparatus 8751.

The cushion 8755 is a portion in contact with the user's face (specifically, forehead, cheek, or the like). The cushion 8755 is in close contact with the user's face, so that light leakage can be prevented, which increases the sense of immersion. A soft material is preferably used for the cushion 8755 so that the cushion 8755 is in close contact with the face of the user wearing the electronic device 8750. For example, a material such as rubber, silicone rubber, urethane, or sponge can be used. Furthermore, when a material whose surface is covered with cloth, leather (e.g., natural leather or synthetic leather), or the like is used, a gap is unlikely to be generated between the user's face and the cushion 8755, whereby light leakage can be suitably prevented. Furthermore, using such a material is preferable because it has a soft texture and the user does not feel cold when wearing the device in a cold season. The member in contact with user's skin, such as the cushion 8755 or the temple 8754, is preferably detachable because cleaning or replacement can be easily performed.

The electronic device in this embodiment may further include earphones 8754A. The earphones 8754A include a communication portion (not illustrated) and has a wireless communication function. The earphones 8754A can output audio data with the wireless communication function. Note that the earphones 8754A may include a vibration mechanism to function as bone-conduction earphones.

Like earphones 8754B illustrated in FIG. 45C, the earphones 8754A can be connected to the temple 8754 directly or by wiring. The earphones 8754B and the temple 8754 may each have a magnet. This is preferred because the earphones 8754B can be fixed to the temple 8754 with magnetic force and thus can be easily housed.

The earphones 8754A may include a sensor portion. With use of the sensor portion, the state of the user of the electronic device can be estimated.

The electronic device of one embodiment of the present invention may include one or more of an antenna, a battery, a camera, a speaker, a microphone, a touch sensor, and an operation button, in addition to any one of the above components.

The electronic device of one embodiment of the present invention may include a secondary battery. It is preferable that the secondary battery be capable of being charged by non-contact power transmission.

Examples of the secondary battery include a lithium ion secondary battery (such as a lithium polymer battery using a gel electrolyte (lithium ion polymer battery)), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display an image, information, or the like on a display portion. When the electronic device includes an antenna and a secondary battery, the antenna may be used for contactless power transmission.

The display portion of the electronic device of one embodiment of the present invention can display, for example, an image with full high definition, 4K2K, 8K4K, 16K8K, or higher resolution.

Note that this embodiment can be combined with any of the other embodiments in this specification as appropriate.

Embodiment 7

In this embodiment, electronic devices each including a display apparatus fabricated using one embodiment of the present invention will be described.

Electronic devices described below as examples are each provided with a display apparatus of one embodiment of the present invention in a display portion. Thus, the electronic devices achieve high resolution. In addition, the electronic devices can achieve both high resolution and a large screen.

One embodiment of the present invention includes the display apparatus and one or more selected from an antenna, a battery, a housing, a camera, a speaker, a microphone, a touch sensor, and an operation button.

The electronic device of one embodiment of the present invention may include a secondary battery. It is preferable that the secondary battery be capable of being charged by non-contact power transmission.

Examples of the secondary battery include a lithium ion secondary battery (such as a lithium polymer battery using a gel electrolyte (lithium ion polymer battery)), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display an image, information, or the like on a display portion. When the electronic device includes an antenna and a secondary battery, the antenna may be used for contactless power transmission.

The display portion of the electronic device of one embodiment of the present invention can display, for example, an image with full high definition, 4K2K, 8K4K, 16K8K, or higher resolution.

Examples of electronic devices include electronic devices having relatively large screens, such as a television device, a laptop personal computer, a monitor, digital signage, a pachinko machine, and a game machine; a digital camera; a digital video camera; a digital photo frame; a mobile phone; a portable game machine; a portable information terminal; and an audio reproducing device.

The electronic device using one embodiment of the present invention can be incorporated along a flat surface or a curved surface of an inside or outside wall surface of a house or a building, an interior or exterior surface of a car, or the like.

[Mobile Phone]

Figure 46A:
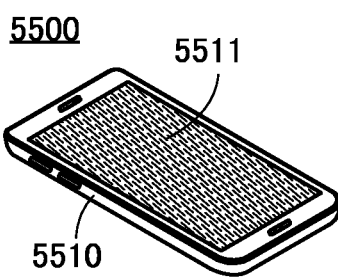
FIGS. 46A to 46H each illustrate a structure example of an electronic device.

An information terminal 5500 illustrated in FIG. 46A is a mobile phone (a smartphone), which is a type of information terminal. The information terminal 5500 includes a housing 5510 and a display portion 5511. As input interfaces, a touch panel and a button are provided in the display portion 5511 and the housing 5510, respectively.

The information terminal 5500 can display an image with high display quality on the display portion 5511 by including the display apparatus described in the above embodiment.

[Wearable Terminal]

Figure 46B:
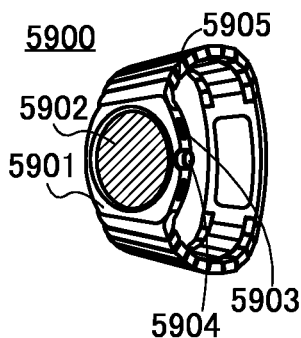

FIG. 46B is an external view of an information terminal 5900 as an example of a wearable terminal. The information terminal 5900 includes a housing 5901, a display portion 5902, an operation button 5903, a crown 5904, a band 5905, and the like.

The wearable terminal can display an image with high display quality on the display portion 5902 by including the display apparatus described in the above embodiment.

[Information Terminal]

Figure 46C:
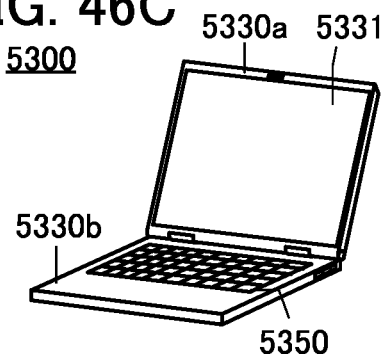

FIG. 46C illustrates a notebook information terminal 5300. The notebook information terminal 5300 in FIG. 46C includes, for example, a display portion 5331 in a housing 5330a and a keyboard portion 5350 in a housing 5330b.

Like the information terminal 5500 described above, the notebook information terminal 5300 can display an image with high display quality on the display portion 5331 by including the display apparatus described in the above embodiment.

Note that although FIGS. 46A to 46C illustrate a smartphone, a wearable terminal, and a notebook information terminal as examples of electronic device, one embodiment of the present invention can also be applied to an information terminal other than a smartphone, a wearable terminal, and a notebook information terminal. Examples of the information terminals other than a smartphone, a wearable terminal, and a notebook information terminal include a personal digital assistant (PDA), a desktop information terminal, and a workstation.

[Camera]

Figure 46D:
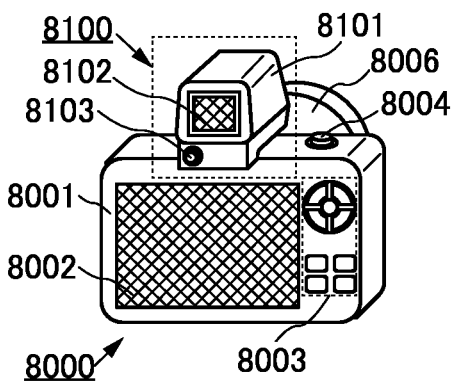

FIG. 46D is an external view of a camera 8000 to which a finder 8100 is attached.

The camera 8000 includes a housing 8001, a display portion 8002, operation buttons 8003, and a shutter button 8004. Furthermore, a detachable lens 8006 is attached to the camera 8000.

Note that the lens 8006 may be included in the housing of the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, and a button 8103.

The housing 8101 is attached to the camera 8000 by a mount for engagement with the mount of the camera 8000. The finder 8100 can display an image or the like received from the camera 8000 on the display portion 8102.

The button 8103 functions as a power supply button or the like.

A display apparatus of one embodiment of the present invention can be used in the display portion 8002 of the camera 8000 and the display portion 8102 of the finder 8100. Note that a finder may be incorporated in the camera 8000.

[Game Machine]

Figure 46E:
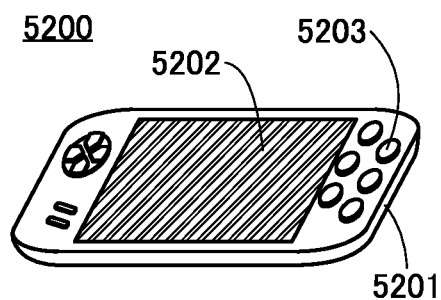

FIG. 46E is an external view of a portable game machine 5200 as an example of a game machine. The portable game machine 5200 includes a housing 5201, a display portion 5202, a button 5203, and the like.

An image displayed on the portable game machine 5200 can be output with a display apparatus such as a television device, a personal computer display, a game display, or a head-mounted display.

The portable game machine 5200 can display an image with high display quality on the display portion 5202 by including the display apparatus described in the above embodiment. In addition, the portable game machine 5200 with low power consumption can be provided. Furthermore, heat generation from a circuit can be reduced owing to low power consumption; thus, the influence of heat generation on the circuit, the peripheral circuit, and the module can be reduced.

Although FIG. 46E illustrates the portable game machine as an example of a game machine, the electronic device of one embodiment of the present invention is not limited thereto. Examples of the electronic device of one embodiment of the present invention include a stationary game machine, an arcade game machine installed in an entertainment facility (a game center, an amusement park, or the like), and a throwing machine for batting practice installed in sports facilities.

[Television Device]

Figure 46F:
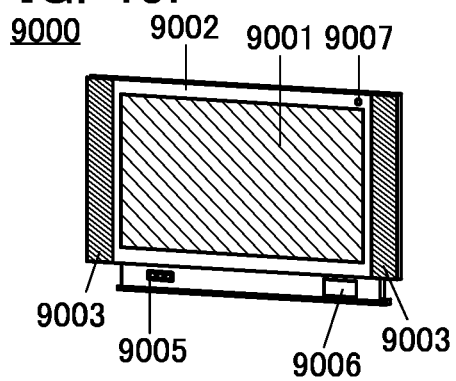

FIG. 46F is a perspective view illustrating a television device. The television device 9000 includes a housing 9002, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), and the like. The semiconductor device of one embodiment of the present invention can be provided in the television device. The television device can include the display portion 9001 having a screen size of, for example, 50 inches or more, or 100 inches or more.

The television device 9000 can display an image with high display quality on the display portion 9001 by including the display apparatus described in the above embodiment. In addition, the television device 9000 with low power consumption can be provided. Furthermore, heat generation from a circuit can be reduced owing to low power consumption; thus, the influence of heat generation on the circuit, the peripheral circuit, and the module can be reduced.

[Moving Vehicle]

The display apparatus of one embodiment of the present invention can be used around a driver's seat in a car, which is a moving vehicle.

Figure 46G:
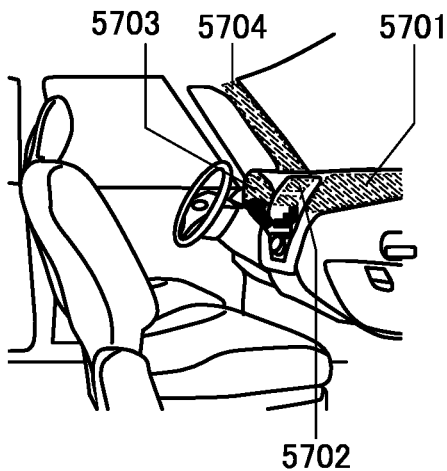

FIG. 46G illustrates a windshield and its vicinity inside a car. FIG. 46G shows a display panel 5701, a display panel 5702, and a display panel 5703 which are attached to a dashboard, and a display panel 5704 attached to a pillar.

The display panels 5701 to 5703 can provide various kinds of information by displaying navigation data, a speedometer, a tachometer, a mileage, a fuel meter, a gearshift state, air-conditioning settings, and the like. Items displayed on the display panel and their layout can be changed as appropriate to suit the user's preferences, resulting in more sophisticated design. The display panels 5701 to 5703 can also be used as lighting devices.

The display panel 5704 can compensate for the view obstructed by the pillar (blind areas) by showing an image taken by an imaging unit provided for the car body. That is, displaying an image taken by the imaging unit provided on the outside of the car body leads to elimination of blind areas and enhancement of safety. Displaying an image to compensate for the area which a driver cannot see, makes it possible for the driver to confirm safety easily and comfortably. The display panel 5704 can also be used as a lighting device.

The display apparatus of one embodiment of the present invention can be used for the display panels 5701 to 5704, for example.

Although a car is described above as an example of a moving vehicle, moving vehicles are not limited to a car. Examples of the moving vehicles include a train, a monorail train, a ship, and a flying object (a helicopter, an unmanned aircraft (a drone), an airplane, and a rocket), and these moving vehicles can use the display apparatus of one embodiment of the present invention.

[Digital Signage]

Figure 46H:
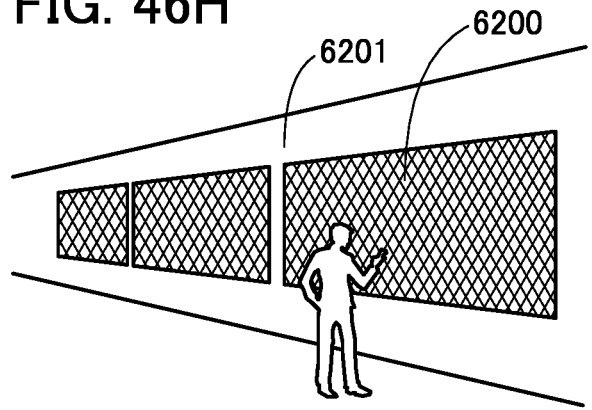

FIG. 46H illustrates an example of a digital signage that can be attached to a wall. FIG. 46H illustrates a state where a digital signage 6200 is attached to a wall 6201. The display apparatus of one embodiment of the present invention can be used in a display portion in the digital signage 6200, for example. An interface such as a touch panel may be provided in the digital signage 6200.

Note that an electronic device attachable to a wall is described above as an example of a digital signage, the kind of the digital signage is not limited thereto. Examples of the digital signage include a digital signage mounted on a pillar, a freestanding digital signage placed on the ground, and a digital signage mounted on a rooftop or a side wall of a building.

Note that this embodiment can be combined with any of the other embodiments in this specification as appropriate.

This application is based on Japanese Patent Application Serial No. 2021-081532 filed with Japan Patent Office on May 13, 2021, the entire contents of which are hereby incorporated by reference.

What is claimed is:

1. A semiconductor device comprising:
 a circuit comprising a first transistor, a second transistor, a third transistor, a fourth transistor, a fifth transistor, and a sixth transistor,
 wherein a first gate of the first transistor is electrically connected to a first wiring,
 wherein a first gate of the fourth transistor is electrically connected to the first wiring,
 wherein one of a source and a drain of the first transistor is electrically connected to one of a source and a drain of the second transistor without passing through any transistor,
 wherein the one of the source and the drain of the first transistor is electrically connected to a first gate of the fifth transistor without passing through any transistor,
 wherein a first gate of the second transistor is electrically connected to one of a source and a drain of the third transistor, one of a source and a drain of the fourth transistor, and a first gate of the sixth transistor,
 wherein one of a source and a drain of the fifth transistor is electrically connected to one of a source and a drain of the sixth transistor,
 wherein each of the second transistor, the fourth transistor, and the sixth transistor comprises the first gate which is one of a front gate and a back gate, and a second gate which is the other of the front gate and the back gate,
 wherein the second gate of the second transistor and the second gate of the sixth transistor are electrically connected to a second wiring, and
 wherein the second gate of the fourth transistor is electrically connected to a third wiring.

2. The semiconductor device according to claim 1,
 wherein the circuit further comprises a first capacitor and a second capacitor,
 wherein a first terminal of the first capacitor is electrically connected to the first gate of the second transistor,
 wherein a first terminal of the second capacitor is electrically connected to the first gate of the fifth transistor, and
 wherein a second terminal of the second capacitor is electrically connected to the one of the source and the drain of the fifth transistor.

3. The semiconductor device according to claim 1,
 wherein each of the first transistor and the fifth transistor comprises the first gate which is one of a front gate and a back gate, and a second gate which is the other of the front gate and the back gate,
 wherein the first gate of the first transistor is electrically connected to the second gate of the first transistor, and
 wherein the first gate of the fifth transistor is electrically connected to the second gate of the fifth transistor.

4. The semiconductor device according to claim 1,
 wherein the third transistor comprises a first gate which is one of a front gate and a back gate, and a second gate which is the other of the front gate and the back gate, and
 wherein the first gate of the third transistor is electrically connected to the second gate of the third transistor.

5. A semiconductor device comprising:
 a circuit comprising a first transistor, a second transistor, a third transistor, a fourth transistor, a fifth transistor, and a sixth transistor,
 wherein a first gate of the first transistor is electrically connected to a first wiring,
 wherein a first gate of the fourth transistor is electrically connected to the first wiring,
 wherein one of a source and a drain of the first transistor is electrically connected to one of a source and a drain of the second transistor and a first gate of the fifth transistor,
 wherein a first gate of the second transistor is electrically connected to one of a source and a drain of the third transistor without passing through any transistor,
 wherein the first gate of the second transistor is electrically connected to one of a source and a drain of the fourth transistor without passing through any transistor, and
 wherein the first gate of the second transistor is electrically connected to a first gate of the sixth transistor without passing through any transistor,
 wherein one of a source and a drain of the fifth transistor is electrically connected to one of a source and a drain of the sixth transistor,
 wherein each of the second transistor, the fourth transistor, and the sixth transistor comprises the first gate which is one of a front gate and a back gate, and a second gate which is the other of the front gate and the back gate, wherein the second gate of the second transistor and the second gate of the sixth transistor are electrically connected to a second wiring, and wherein the second gate of the fourth transistor is electrically connected to a third wiring.

6. The semiconductor device according to claim 5, wherein the circuit further comprises a first capacitor and a second capacitor, wherein a first terminal of the first capacitor is electrically connected to the first gate of the second transistor, wherein a first terminal of the second capacitor is electrically connected to the first gate of the fifth transistor, and wherein a second terminal of the second capacitor is electrically connected to the one of the source and the drain of the fifth transistor.

7. The semiconductor device according to claim 5, wherein each of the first transistor and the fifth transistor comprises the first gate which is one of a front gate and a back gate, and a second gate which is the other of the front gate and the back gate, wherein the first gate of the first transistor is electrically connected to the second gate of the first transistor, and wherein the first gate of the fifth transistor is electrically connected to the second gate of the fifth transistor.

8. The semiconductor device according to claim 5, wherein the third transistor comprises a first gate which is one of a front gate and a back gate, and a second gate which is the other of the front gate and the back gate, and wherein the first gate of the third transistor is electrically connected to the second gate of the third transistor.

\* \* \* \* \*